United States Patent
Tomeba et al.

(10) Patent No.: US 8,715,903 B2
(45) Date of Patent: May 6, 2014

(54) ACTINIC RAY-SENSITIVE OR RADIATION-SENSITIVE RESIN COMPOSITION, AND RESIST FILM AND PATTERN FORMING METHOD USING THE SAME

(75) Inventors: Hisamitsu Tomeba, Shizuoka (JP); Akinori Shibuya, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 32 days.

(21) Appl. No.: 13/117,293

(22) Filed: May 27, 2011

(65) Prior Publication Data

US 2011/0293900 A1    Dec. 1, 2011

(30) Foreign Application Priority Data

Jun. 1, 2010   (JP) .................. 2010-126352

(51) Int. Cl.
*G03F 7/00* (2006.01)
*G03F 7/004* (2006.01)

(52) U.S. Cl.
USPC ........................ 430/270.1; 430/913

(58) Field of Classification Search
USPC ............................. 430/270.1, 913
See application file for complete search history.

(56) References Cited

U.S. PATENT DOCUMENTS

| | | | | |
|---|---|---|---|---|
| 7,524,609 B2 * | 4/2009 | Wada | .................. | 430/270.1 |
| 7,691,558 B2 * | 4/2010 | Wada | .................. | 430/270.1 |
| 8,080,363 B2 * | 12/2011 | Kanda | .................. | 430/270.1 |
| 8,252,877 B2 * | 8/2012 | Hirano et al. | .................. | 526/270 |
| 2006/0228648 A1 | 10/2006 | Ohsawa et al. | | |
| 2007/0141512 A1 * | 6/2007 | Wada et al. | ................. | 430/270.1 |
| 2008/0318160 A1 | 12/2008 | Ohsawa et al. | | |
| 2009/0047602 A1 * | 2/2009 | Furuya et al. | .............. | 430/285.1 |
| 2009/0162787 A1 | 6/2009 | Seshimo et al. | | |
| 2010/0021847 A1 | 1/2010 | Masuyama et al. | | |
| 2010/0081088 A1 | 4/2010 | Kawaue et al. | | |
| 2010/0304293 A1 | 12/2010 | Ichikawa et al. | | |
| 2011/0183263 A1 * | 7/2011 | Takahashi et al. | ......... | 430/270.1 |

FOREIGN PATENT DOCUMENTS

| | | | |
|---|---|---|---|
| JP | 2003-195504 A | | 7/2003 |
| JP | 2003-207895 A | | 7/2003 |
| JP | 2006-306856 A | | 11/2006 |
| JP | 2007-145797 A | | 6/2007 |
| JP | 2009-008824 A | | 1/2009 |
| JP | 2009-137873 A | | 6/2009 |
| JP | 2010-107955 A | | 5/2010 |
| JP | 2011-006401 A | | 1/2011 |
| JP | 2011-121937 A | | 6/2011 |
| JP | 2011209660 A | * | 10/2011 |

OTHER PUBLICATIONS

Office Action dated Feb. 4, 2014 issued in corresponding Japanese Patent Application No. 2010-126352.

* cited by examiner

*Primary Examiner* — Amanda C. Walke
(74) *Attorney, Agent, or Firm* — Sughrue Mion, PLLC

(57) ABSTRACT

An actinic ray-sensitive or radiation-sensitive resin composition comprising (A) a fluorine-containing compound capable of generating an acid upon irradiation with an actinic ray or radiation, wherein the acid has a polarity converting group, and the fluorine content of the fluorine-containing compound (A) is 20% or more based on the molecular weight of the fluorine-containing compound (A).

12 Claims, No Drawings

ACTINIC RAY-SENSITIVE OR RADIATION-SENSITIVE RESIN COMPOSITION, AND RESIST FILM AND PATTERN FORMING METHOD USING THE SAME

BACKGROUND OF THE INVENTION

1. Field of the Invention

The present invention relates to an actinic ray-sensitive or radiation-sensitive resin composition used in the production of an electronic device such as semiconductor device or a liquid crystal device or thermal head or the process of producing a semiconductor such as IC or the production of a circuit board such as thermal head and further in other photofabrication processes, and a resist film and a pattern forming method each using the composition. More specifically, the present invention relates to an actinic ray-sensitive or radiation-sensitive resin composition suitable when using an irradiation source having a wavelength of 250 nm or less, such as far ultraviolet ray and electron beam, and a resist film and a pattern forming method each using the composition.

2. Description of the Related Art

A chemical amplification resist composition forms a pattern on a substrate by producing an acid in the exposed area upon irradiation with radiation such as far ultraviolet light and through a reaction using the acid as a catalyst, changing the developer solubility of the area irradiated with an actinic radiation and that of the non-irradiated area.

In the case of using a KrF excimer laser as the exposure light source, a resin having small absorption in the wavelength region of 248 nm and having a basic skeleton of poly(hydroxystyrene) is predominantly used as the main component, and this is an excellent system capable of forming a good pattern with high sensitivity and high resolution, compared with the conventional naphthoquinone-diazide/novolak resin system.

On the other hand, in the case where a light source of emitting light at a shorter wavelength, for example, an ArF excimer laser (193 nm), is used as the exposure light source, a satisfactory pattern cannot be formed even by the above-described chemical amplification system, because the compound having an aromatic group substantially has large absorption in the region of 193 nm.

In order to solve this problem, various resist compositions for use with an ArF excimer laser, containing an alicyclic hydrocarbon structure, have been developed. However, in view of overall performance as a resist, it is actually very difficult to find out an appropriate combination of a resin, a photoacid generator, additives, a solvent and the like used.

JP-A-2003-207895 (the term "JP-A" as used herein means an "unexamined published Japanese patent application") discloses that when a compound capable of generating an aromatic sulfonic acid substituted with at least one fluorine atom and/or a group having at least one fluorine atom upon irradiation with an actinic ray or radiation and a specific resin are used in combination, an excellent positive photosensitive composition ensuring a small iso/dense bias and a wide side-lobe margin is obtained.

JP-A-2006-306856 describes a fluorine-containing acid generator containing a lactone structure for obtaining good resolution and pattern profile.

However, in the generation where an immersion process is applied and a finer pattern is formed, the above-described related arts are not always sufficient, and it is demanded to satisfy high level performances in terms of all of line width roughness (LWR) and others and with the miniaturization of the pattern size, take measures to reduce a very small defect of several nm or less (referred to as a blob defect or the like).

SUMMARY OF THE INVENTION

An object of the present invention is to provide an actinic ray-sensitive or radiation-sensitive resin composition suitable not only for a normal dry process but also for an immersion process and reduced in the LWR and blob defect, and a resist film and a pattern forming method each using the composition.

The present invention includes the following configurations, and the above-described object of the present invention is achieved by these configurations.

[1] An actinic ray-sensitive or radiation-sensitive resin composition comprising (A) a fluorine-containing compound capable of generating an acid upon irradiation with an actinic ray or radiation, wherein the acid has a polarity converting group, and the fluorine content of the fluorine-containing compound (A) is 20% or more based on the molecular weight of the fluorine-containing compound (A).

[2] The actinic ray-sensitive or radiation-sensitive resin composition as described in [1] above, wherein the fluorine content of the fluorine-containing compound (A) is 25% or more based on the molecular weight of the fluorine-containing compound (A).

[3] The actinic ray-sensitive or radiation-sensitive resin composition as described in [1] or [2] above, wherein the polarity converting group is a group represented by —C(=X)O— in the partial structure represented by the following formula (1) or a group represented by —C(=O)O— in a lactone structure:

wherein X represents an oxygen atom or a sulfur atom and EWG represents an electron-withdrawing group.

[4] The actinic ray-sensitive or radiation-sensitive resin composition as described in any one of [1] to [3] above, wherein the acid generated upon irradiation with an actinic ray or radiation is represented by the following formula (2):

wherein E represents a group containing a polarity converting group;

Q represents a divalent linking group; and

A represents a sulfonic acid group or a group represented by —SO$_2$—NH—SO$_2$—R$_{F1}$, wherein R$_{F1}$ represents a fluorine atom or a fluoroalkyl group.

[5] The actinic ray-sensitive or radiation-sensitive resin composition as described in any one of [1] to [4] above, wherein the fluorine-containing compound (A) is an ionic compound having an anion represented by the following formula (3):

wherein E represents a group containing a polarity converging group;

L represents a single bond or a divalent linking group;

each of R$_{F2}$ and R$_{F3}$ independently represents a fluorine atom or a fluoroalkyl group and when a plurality of R$_{F2}$'s or $R_{F3}$'s are present, each $R_{F2}$ or $R_{F3}$ may be the same as or different from every other $R_{F2}$ or $R_{F3}$;

A⁻ represents a sulfonate anion or a sulfonylamide anion represented by —SO$_2$—N⁻—SO$_2$—$R_{F1}$, wherein $R_{F1}$ represents a fluorine atom or a fluoroalkyl group; and n represents an integer of 1 or more.

[6] The actinic ray-sensitive or radiation-sensitive resin composition as claimed in any one of claims 1 to 5, which further contains (B) a resin capable of increasing solubility for an alkali developer by the action of an acid.

[7] The actinic ray-sensitive or radiation-sensitive resin composition as described in [6] above, wherein the resin (B) contains a repeating unit having a lactone structure.

[8] The actinic ray-sensitive or radiation-sensitive resin composition as described in any one of [1] to [7] above, which further contains (C) a hydrophobic resin.

[9] A resist film formed from the actinic ray-sensitive or radiation-sensitive resin composition described in any one of [1] to [8] above.

[10] A pattern forming method comprising steps of exposing and developing the resist film described in [9] above.

[11] The pattern forming method as described in [10] above, wherein the exposure in the step of exposing the resist film is immersion exposure.

[12] A method for producing an electronic device, comprising the pattern forming method described in [10] or [11].

[13] An electronic device formed by the method described in [12] above.

The present invention preferably further includes the following configurations.

[14] The actinic ray-sensitive or radiation-sensitive resin composition as described in any one of [3] to [8] above, wherein the EWG is an alkyl group substituted with one or more members selected from the group consisting of a halogen atom, a cyano group and a nitro group.

[15] The actinic ray-sensitive or radiation-sensitive resin composition as described in any one of [4] to [8] and [14] above, wherein Q in formula (2) is a linking group represented by the following formula (2-1):

(2-1)

wherein L represents a single bond or a divalent linking group, each of $R_{F2}$ and $R_{F3}$ independently represents a fluorine atom or a fluoroalkyl group, and when a plurality of $R_{F2}$'s or $R_{F3}$'s are present, each $R_{F2}$ or $R_{F3}$ may be the same as or different from every other $R_{F2}$ or $R_{F3}$, n represents an integer of 1 or more, (*1) represents a direct bond to A in formula (2), and (*2) represents a direct bond to the polarity converting group-containing group E of formula (2).

[16] The actinic ray-sensitive or radiation-sensitive resin composition as described in

[15] above, wherein L in formula (2-1) is a linking group represented by the following formula (2-2):

(2-2)

wherein $L_1$ represents —SO$_2$—, —CO— or —CS—, $L_2$ represents a single bond, —O—, —S— or —NR— (wherein R is a hydrogen atom or an alkyl group), $L_3$ represents an alkylene group, an alkenylene group, a cycloalkylene group, a cycloalkenylene group, a divalent nitrogen-containing non-aromatic heterocyclic group, a divalent aromatic ring group, or a linking group formed by connecting a plurality of these groups, (*3) represents a direct bond to —[C($R_{F2}$)($R_{F3}$)]$_n$— of formula (2-1), and (*2) represents a direct bond to the polarity converting group-containing group E of formula (2).

[17] A fluorine-containing compound capable of generating an acid having a polarity converting group upon irradiation with an actinic ray or radiation, wherein the fluorine content is 20% or more based on the molecular weight.

According to the present invention, an actinic ray-sensitive or radiation-sensitive resin composition reduced in the LWR and blob defect, and a resist film and a pattern forming method each using the composition, can be provided.

DETAILED DESCRIPTION OF THE INVENTION

The mode for carrying out the present invention is described below.

In the description of the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the description of the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation. In the description of the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

The actinic ray-sensitive or radiation-sensitive resin composition of the present invention contains a fluorine-containing compound capable of generating an acid upon irradiation with an actinic ray or radiation.

The actinic ray-sensitive or radiation-sensitive resin composition of the present invention is, for example, a positive composition and is typically a positive resist composition. The configuration of this composition is described below.

[1] (A) Fluorine-Containing Compound Capable of Generating an Acid Upon Irradiation with an Actinic Ray or Radiation.

The actinic ray-sensitive or radiation-sensitive resin composition of the present invention contains a fluorine-containing compound capable of generating an acid upon irradiation with an actinic ray or radiation (hereinafter, sometimes referred to as a "compound (A)" or a "fluorine-containing compound (A)").

In the present invention, the fluorine content of the fluorine-containing compound (A) is 20% or more, preferably 25% or more, based on the molecular weight of the fluorine-containing compound (A).

When the fluorine content of the fluorine-containing compound (A) is the lower limit above or more, the fluorine-containing compound (A) can be superficially distributed unevenly to the vicinity of the resist film surface.

Also, the fluorine content of the fluorine-containing compound (A) is preferably 40% or less, more preferably 35% or less, based on the molecular weight of the fluorine-containing compound (A).

When the fluorine content of the fluorine-containing compound (A) is the upper limit above or less, the solvent solubility of the photoacid generator or the coatability of the resist solution is not impaired.

In the present invention, the fluorine content of the fluorine-containing compound (A) can be calculated as a ratio of the total amount of fluorine atom (total number of fluorine atoms×atomic weight of fluorine atom) to the molecular weight of the fluorine-containing compound (A). For the sake of convenience, % is used as the unit of the value obtained here.

With the fluorine content of the fluorine-containing compound (A) in the range above, the compound can be unevenly distributed to the vicinity of the resist film surface without impairing the solvent solubility of the photoacid generator or the coatability of the resist solution.

With respect to why both excellent performances of reducing the blob defect and reducing LWR are achieved by using a resin composition containing such a fluorine-containing compound (A), the operation thereof is not clearly known, but superficial and uneven distribution of the fluorine-containing compound (A) due to fluorine is presumed to affect particularly the performance of reducing the blob defect.

In the present invention, the acid generated from the fluorine-containing compound (A) upon irradiation with an actinic ray or radiation has a polarity converting group.

The term "polarity converting group" as used in the present invention indicates a group capable of decomposing by the action of an alkali developer to increase the solubility in an alkali developer.

Examples of the polarity converting group for use in the present invention include a carbonic acid ester group (—C(=O)O—), a thionoester group (—C(=S)O—), a thioester group (—C(=O)S—), a lactone group, an acid anhydride group (—C(=O)OC(=O)—), an acid imide group (—NHCONH—), a carbonic acid ester group (—OC(=O)O—), a sulfuric acid ester group (—OSO$_2$O—), and a sulfonic acid ester group (—SO$_2$O—), where each of the groups can decompose by the action of an alkali developer to generate an acid group.

The polarity converting group for use in the present invention is preferably a group represented by —C(=X)O— in the partial structure represented by the following formula (1) or a group represented by —C(=O)O—(carbonic acid ester group) in a lactone structure.

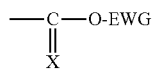
(1)

In formula (1), X represents an oxygen atom or a sulfur atom and EWG represents an electron-withdrawing group.

X is preferably an oxygen atom.

In the present invention, the electron-withdrawing group is a nonionic partial structure represented by the following formula (EW). The "nonionic partial structure" as used herein means that the structure is a partial structure having no ionic group (for example, a carboxylate or a sulfonate). In formula (EW), * indicates a direct bond to the oxygen atom in formula (1).

(EW)

In formula (EW), $n_{ew}$ is a repetition number of the linking group represented by —C($R_{ew1}$)($R_{ew2}$)— and represents an integer of 0 or 1. In the case where $n_{ew}$ is 0, this indicates that the bond is a single bond and $Y_{ew1}$ is directly bonded.

$Y_{ew1}$ is a halogen atom, a cyano group, a nitro group, a halo(cyclo)alkyl group represented by —C($R_{f1}$)($R_{f2}$)—$R_{f3}$ described later, a haloaryl group, an oxy group, a carbonyl group, a sulfonyl group, a sulfinyl group, or a combination thereof (provided that when $Y_{ew1}$ is a halogen atom, a cyano group or a nitro group, $n_{ew}$ is 1).

Each of $R_{ew1}$ and $R_{ew2}$ independently represents an arbitrary substituent, for example, represents a hydrogen atom, an alkyl group (preferably having a carbon number of 1 to 8), a cycloalkyl group (preferably having a carbon number of 3 to 10), or an aryl group (preferably having a carbon number of 6 to 10).

At least two members out of $R_{ew1}$, $R_{ew2}$ and $Y_{ew1}$ may combine with each other to form a ring.

The "halo(cyclo)alkyl group" indicates an alkyl or cycloalkyl group that is at least partially halogenated, and the "haloaryl group" indicates an aryl group that is at least partially halogenated.

$Y_{ew1}$ is preferably a halogen atom or a halo(cyclo)alkyl group represented by —C($R_{f1}$)($R_{f2}$)—$R_{f3}$ or a haloaryl group.

$R_{f1}$ represents a halogen atom, a perhaloalkyl group, a perhalocycloalkyl group or a perhaloaryl group and is preferably a fluorine atom, a perfluoroalkyl group or a perfluorocycloalkyl group, more preferably a fluorine atom or a trifluoromethyl group.

Each of $R_{f2}$ and $R_{f3}$ independently represents a hydrogen atom, a halogen atom or an organic group, and $R_{f2}$ and $R_{f3}$ may combine to form a ring. Examples of the organic group include an alkyl group, a cycloalkyl group and an alkoxy group, and these groups may be substituted with a halogen atom (preferably a fluorine atom). Each of $R_{f2}$ and $R_{f3}$ is preferably a (halo)alkyl group or a (halo)cycloalkyl group. $R_{f2}$ is more preferably the same group as $R_{f1}$ or combines with $R_{f3}$ to form a ring.

Examples of the ring formed by combining $R_{f2}$ and $R_{f3}$ include a (halo)cycloalkyl ring.

The (halo)alkyl group in $R_{f1}$ to $R_{f3}$ may be either linear or branched. The linear (halo)alkyl group is preferably a (halo)alkyl group having a carbon number of 1 to 30, more preferably from 1 to 20, and examples thereof include a methyl group, an ethyl group, an n-propyl group, an n-butyl group, a sec-butyl group, a tert-butyl group, an n-pentyl group, an n-hexyl group, an n-heptyl group, an n-octyl group, an n-nonyl group, an n-decanyl group, and a group formed by halogenation thereof. The branched (halo)alkyl group is preferably a (halo)alkyl group having a carbon number of 3 to 30, more preferably from 3 to 20, and examples thereof include an i-propyl group, an i-butyl group, a tert-butyl group, an i-pentyl group, a tert-pentyl group, an i-hexyl group, a tert-hexyl group, an i-heptyl group, a tert-heptyl group, an i-octyl group, a tert-octyl group, an i-nonyl group, a tert-decanoyl group, and a group formed by halogenation thereof. A (halo)alkyl group having a carbon number of 1 to 4, such as methyl group, ethyl group, n-propyl group, i-propyl group, n-butyl group, i-butyl group and tert-butyl group, and a group formed by halogenation thereof are preferred.

The (halo)cycloalkyl group in $R_{f1}$ to $R_{f3}$ or in the ring formed by combining $R_{f2}$ and $R_{f3}$ may be monocyclic or polycyclic. The polycyclic (halo)cycloalkyl group may be crosslinked. That is, in this case, the (halo)cycloalkyl group may have a bridged structure.

The monocyclic type is preferably a (halo)cycloalkyl group having a carbon number of 3 to 8, and examples thereof include a (halo)cyclopropyl group, a (halo)cyclopentyl group, a (halo)cyclohexyl group, a (halo)cyclobutyl group and a (halo)cyclooctyl group.

The polycyclic type includes a group having a bicyclo, tricyclo or tetracyclo structure or the like and having a carbon number of 5 or more. A (halo)cycloalkyl group having a carbon number of 6 to 20 is preferred, and examples thereof include a (halo)adamantyl group, a (halo)norbornyl group, a (halo)isoboronyl group, a (halo)camphanyl group, a (halo)dicyclopentyl group, a (halo)α-pinel group, a (halo)tricyclodecanyl group, a (halo)tetracyclododecyl group and a (halo)androstanyl group.

These (halo)cycloalkyl groups include, for example, those represented by the following formulae, and groups formed by halogenation thereof. Incidentally, a part of carbon atoms in the cycloalkyl group may be substituted with a heteroatom such as oxygen atom.

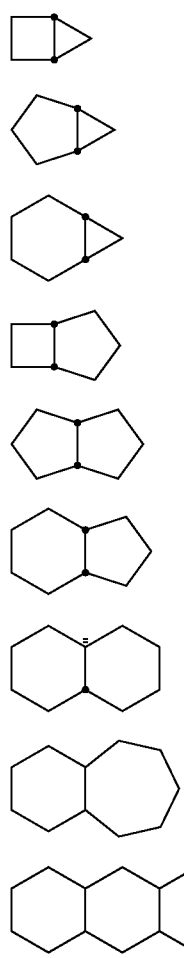

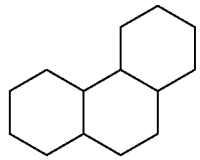

(10)

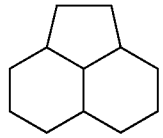

(11)

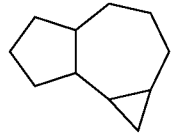

(12)

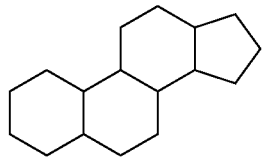

(13)

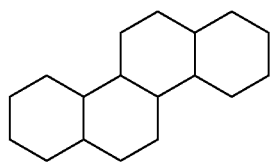

(14)

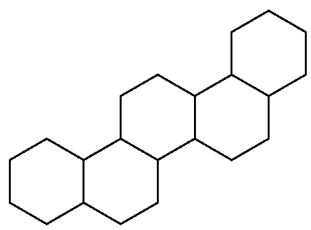

(15)

(16)

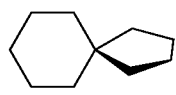

(17)

(18)

(19)

(20)

(21)
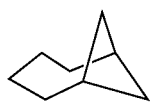
(22)
(23)
(24)
(25)
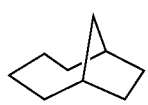
(26)
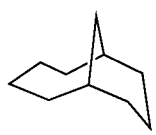
(27)
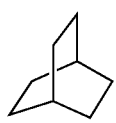
(28)
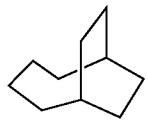
(29)
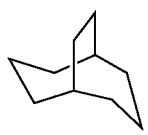
(30)
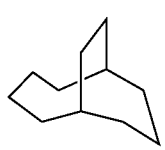
(31)
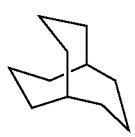
(32)
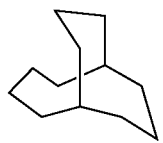
(33)
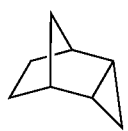
(34)
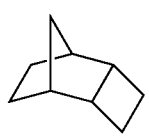
(35)
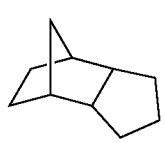
(36)
(37)
(38)
(39)
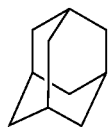
(40)
(41)
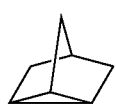
(42)
(43)
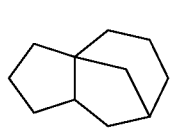
(44)

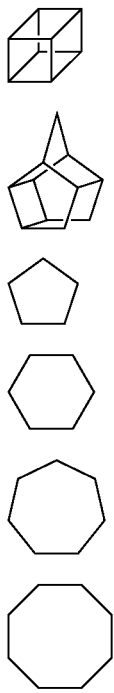

(45)
(46)
(47)
(48)
(49)
(50)

The alicyclic moiety is preferably an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group or a cyclododecanyl group, more preferably an adamantyl group, a decalin group, a norbornyl group, a cedrol group, a cyclohexyl group, a cycloheptyl group, a cyclooctyl group, a cyclodecanyl group, a cyclododecanyl group or a tricyclodecanyl group.

The substituent in such an alicyclic moiety includes an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably a methyl group, an ethyl group, a propyl group or an isopropyl group. The alkoxy group is preferably an alkoxy group having a carbon number of 1 to 4, such as methoxy group, ethoxy group, propoxy group and butoxy group. Examples of the substituent that may be substituted on the alkyl group and alkoxy group include a hydroxyl group, a halogen atom and an alkoxy group (preferably having a carbon number of 1 to 4).

The (halo)cycloalkyl group in $R_{f2}$ and $R_{f3}$ or in the ring formed by combining $R_{f2}$ and $R_{f3}$ is preferably a fluorocycloalkyl group represented by —C(O)F$_{(2n-2)}$H, wherein the carbon number n is not particularly limited but is preferably from 5 to 13, more preferably 6.

The (per)haloaryl group in $Y_{ew1}$ or $R_{f1}$ includes a perfluoroaryl group represented by —C$_{(n)}$F$_{(n-1)}$, wherein the carbon number n is not particularly limited but is preferably from 5 to 13, more preferably 6.

The ring which may be formed by combining at least two members of $R_{ew1}$, $R_{ew2}$ and $Y_{ew1}$ with each other is preferably a cycloalkyl group or a heterocyclic group.

Each of these groups and rings constituting the partial structure represented by formula (EW) may further have a substituent, and examples of the further substituent include a hydroxyl group, a halogen atom (e.g., fluorine, chlorine, bromine, iodine), a nitro group, a cyano group, an alkyl group such as methyl group, ethyl group, n-propyl group, i-propyl group, n-butyl group, i-butyl group and tert-butyl group, an alkoxy group such as methoxy group, ethoxy group, hydroxyethoxy group, propoxy group, hydroxypropoxy group, n-butoxy group, isobutoxy group, sec-butoxy group and tert-butoxy group, an alkoxycarbonyl group such as methoxycarbonyl group and ethoxycarbonyl group, an aralkyl group such as benzyl group, phenethyl group and cumyl group, an aralkyloxy group, an acyl group such as formyl group, acetyl group, butyryl group, benzoyl group, cinnamoyl group and valeryl group, an acyloxy group such as butyryloxy group, an alkenyl group such as vinyl group, propenyl group and allyl group, an alkenyloxy group such as vinyloxy group, propenyloxy group, allyloxy group and butenyloxy group, an aryl group such as phenyl group and naphthyl group, an aryloxy group such as phenoxy group, and an aryloxycarbonyl group such as benzoyloxy group. However, an ionic group is not included in this further substituent.

In formula (1), EWG is preferably an alkyl group substituted with one or more members selected from the group consisting of a halogen atom, a cyano group and a nitro group, more preferably an alkyl group substituted with a halogen atom (a haloalkyl group), still more preferably a fluoroalkyl group. The alkyl group substituted with one or more members selected from the group consisting of a halogen atom, a cyano group and a nitro group preferably has a carbon number of 1 to 10, more preferably from 1 to 5.

More specifically, EWG is preferably an atomic group represented by —C(R'$_1$)(R'$_{f1}$)(R'$_{f2}$) or —C(R'$_1$)(R'$_2$)(R'$_{f1}$), wherein each of R'$_1$ and R'$_2$ independently represents a hydrogen atom or an alkyl group (preferably an unsubstituted alkyl group) not substituted with an electron-withdrawing group, and each of R'$_{f1}$ and R'$_{f2}$ independently represents a halogen atom, a cyano group, a nitro group or a perfluoroalkyl group.

The alkyl group as R'$_1$ and R'$_2$ may be linear or branched and preferably has a carbon number of 1 to 6.

The perfluoroalkyl group as R'$_{f1}$ and R'$_{f2}$ may be linear or branched and preferably has a carbon number of 1 to 6.

Specific preferred examples of EWG include —CF$_3$, —C$_2$F$_5$, —C$_3$F$_7$, —C$_4$F$_9$, —CF(CF$_3$)$_2$, —CF(CF$_3$)C$_2$F$_5$, —CF$_2$CF(CF$_3$)$_2$, —C(CF$_3$)$_3$, —C$_5$F$_{11}$, —C$_6$F$_{13}$, —C$_7$F$_{15}$, —C$_8$F$_{17}$, —CH$_2$CF$_3$, —CH$_2$C$_2$F$_5$, —CH$_2$C$_3$F$_7$, —CH(CF$_3$)$_2$, —CH(CF$_3$)C$_2$F$_5$, —CH$_2$CF(CF$_3$)$_2$, —CH$_2$CN and —CH$_2$NO$_2$. Among these, —CF$_3$, —C$_2$F$_5$, —C$_3$F$_7$, —C$_4$F$_9$, —CH$_2$CF$_3$, —CH$_2$C$_2$F$_5$, —CH$_2$C$_3$F$_7$, —CH(CF$_3$)$_2$, —CH$_2$CN and —CH$_2$NO$_2$ are preferred, —CH$_2$CF$_3$, —CH$_2$C$_2$F$_5$, —CH$_2$C$_3$F$_7$, —CH(CF$_3$)$_2$, —CH$_2$CN and —CH$_2$NO$_2$ are more preferred, —CH$_2$C$_2$F$_5$, —CH(CF$_3$)$_2$ and —CH$_2$CN are still more preferred, and —CH$_2$C$_2$F$_5$ and —CH(CF$_3$)$_2$ are yet still more preferred.

The group represented by —C(=O)O— in a lactone structure, which is a preferred polarity converting group for use in the present invention, is described below.

The lactone structure having a group represented by —C(=O)O— (carbonic acid ester group) is preferably a 5- to 7-membered lactone structure.

In this connection, as in (KA-1-1) to (KA-1-17) shown below, another ring structure may be fused to the 5- to 7-membered lactone structure in the form of forming a bicyclo or spiro structure (the lactone structure above is preferably a structure represented by any one of the following (KA-1-1) to (KA-1-17), more preferably (KA-1-1), (KA-1-4), (KA-1-5) or (KA-1-6)).

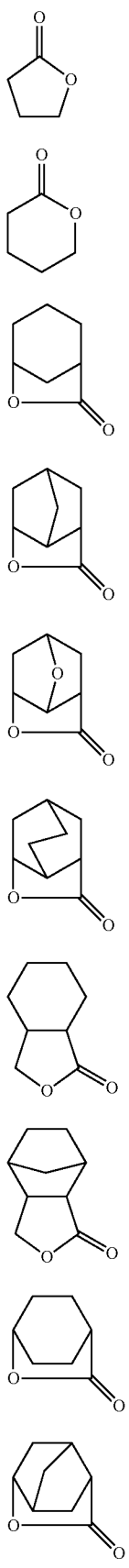
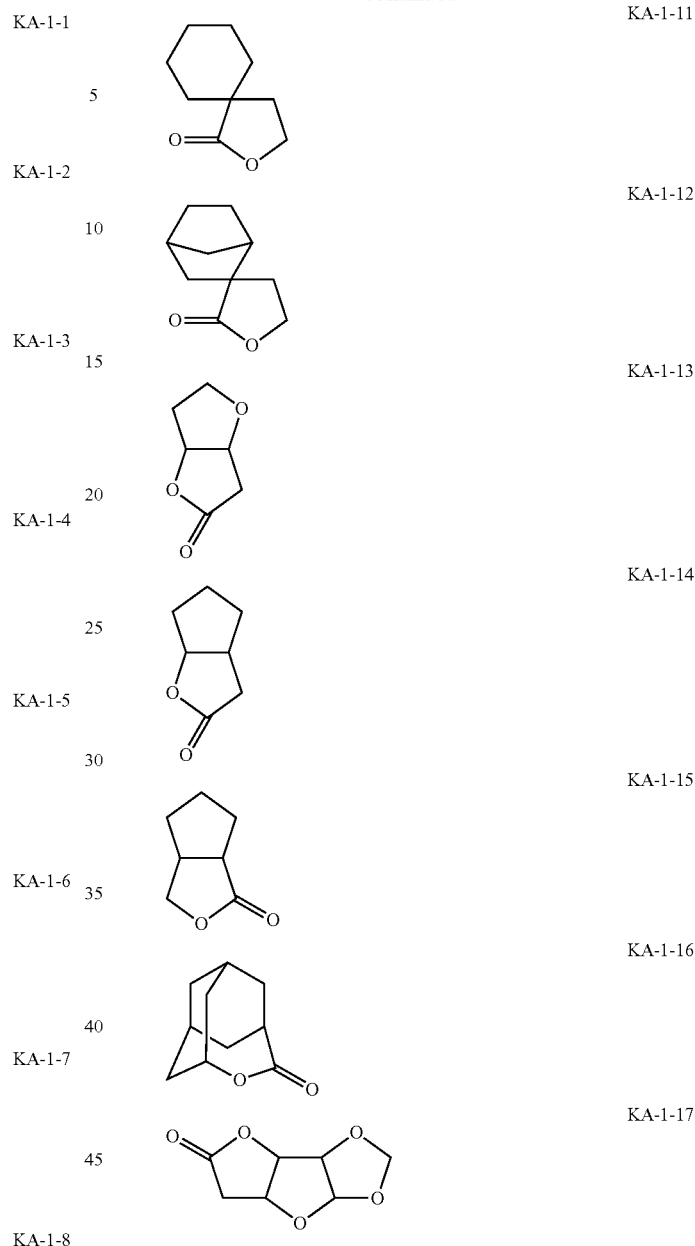

The lactone structure may or may not have one substituent or two or more substituents. The substituent that may be substituted on the lactone structure is a halogen atom, an alkyl group, a cycloalkyl group, an ether group, a hydroxyl group, an amide group, an aryl group, a lactone ring group or an electron-withdrawing group, and when a plurality of substituents are present, each substituent may be the same as or different from every other substituents.

The substituents may combine with each other to form a ring. Examples of the ring formed by combining substituents with each other include a cycloalkyl ring and a heterocyclic ring (e.g., cyclic ether ring, lactone ring).

The electron-withdrawing group as the substituent that may be substituted on the lactone structure has the same meaning as the electron-withdrawing group of EWG in formula (1) (incidentally, the electron-withdrawing group above may be substituted with another electron-withdrawing group).

The substituent that may be substituted on the lactone structure is preferably a halogen atom, an alkyl group, a cycloalkyl group, an ether group, a hydroxyl group or an electron-withdrawing group, more preferably a halogen atom, an alkyl group, a cycloalkyl group or an electron-withdrawing group. The ether group is preferably an ether group substituted, for example, with an alkyl group or a cycloalkyl group, that is, an alkyl ether group or a cycloalkyl ether group. The electron-withdrawing group has the same meaning as above.

Examples of the halogen atom as the substituent that may be substituted on the lactone ring include a fluorine atom, a chlorine atom, a bromine atom and an iodine atom, with a fluorine atom being preferred.

The alkyl group as the substituent that may be substituted on the lactone ring may further have a substituent and may be either linear or branched. The linear alkyl group is preferably an alkyl group having a carbon number of 1 to 30, more preferably from 1 to 20, and examples thereof include a methyl group, an ethyl group, an n-propyl group, an n-butyl group, a sec-butyl group, a tert-butyl group, an n-pentyl group, an n-hexyl group, an n-heptyl group, an n-octyl group, an n-nonyl group and an n-decanyl group. The branched alkyl group is preferably an alkyl group having a carbon number of 3 to 30, more preferably from 3 to 20, and examples thereof include an i-propyl group, an i-butyl group, a tert-butyl group, an i-pentyl group, a tert-pentyl group, an i-hexyl group, a tert-hexyl group, an i-heptyl group, a tert-heptyl group, an i-octyl group, a tert-octyl group, an i-nonyl group and a tert-decanoyl group. An alkyl group having a carbon number of 1 to 4, such as methyl group, ethyl group, n-propyl group, i-propyl group, n-butyl group, i-butyl group and tert-butyl group, is preferred.

The cycloalkyl group as the substituent that may be substituted on the lactone ring may further have a substituent and may be monocyclic or polycyclic. The polycyclic cycloalkyl group may be crosslinked. That is, in this case, the cycloalkyl group may have a bridged structure.

The monocyclic type is preferably a cycloalkyl group having a carbon number of 3 to 8, and examples thereof include a cyclopropyl group, a cyclopentyl group, a cyclohexyl group, a cyclobutyl group and a cyclooctyl group.

The polycyclic type includes a group having a bicyclo, tricyclo or tetracyclo structure or the like and having a carbon number of 5 or more. A cycloalkyl group having a carbon number of 6 to 20 is preferred, and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group.

Examples of these cycloalkyl groups include those represented by formulae (1) to (50) illustrated as specific examples of the (halo)cycloalkyl group of $Y_{ew1}$ in the partial structure of formula (EW), and preferred examples of the alicyclic moieties represented by formula (1) to (50) and examples of the substituent which the alicyclic moiety may have are also the same. Incidentally, a part of carbon atoms in the cycloalkyl group may be substituted with a heteroatom such as oxygen atom.

Examples of the further substituent which the alkyl group and cycloalkyl group as the substituent that may be substituted on the lactone ring may have include a hydroxyl group, a halogen atom (e.g., fluorine, chlorine, bromine, iodine), a nitro group, a cyano group, an alkyl group such as methyl group, ethyl group, n-propyl group, i-propyl group, n-butyl group, i-butyl group and tert-butyl group, an alkoxy group such as methoxy group, ethoxy group, hydroxyethoxy group, propoxy group, hydroxypropoxy group, n-butoxy group, isobutoxy group, sec-butoxy group and tert-butoxy group, an alkoxycarbonyl group such as methoxycarbonyl group and ethoxycarbonyl group, an aralkyl group such as benzyl group, phenethyl group and cumyl group, an aralkyloxy group, an acyl group such as formyl group, acetyl group, butyryl group, benzoyl group, cinnamoyl group and valeryl group, an acyloxy group such as butyryloxy group, an alkenyl group such as vinyl group, propenyl group and allyl group, an alkenyloxy group such as vinyloxy group, propenyloxy group, allyloxy group and butenyloxy group, an aryl group such as phenyl group and naphthyl group, an aryloxy group such as phenoxy group, and an aryloxycarbonyl group such as benzoyloxy group. The further substituent is preferably a fluorine atom.

In the present invention, the acid generated from the fluorine-containing compound (A) upon irradiation with an actinic ray or radiation is preferably represented by the following formula (2):

$$A\text{-}Q\text{-}E \qquad (2)$$

In formula (2), E represents a group containing a polarity converting group.

Q represents a divalent linking group.

A represents a sulfonic acid group or a group represented by $-SO_2-NH-SO_2-R_{F1}$, wherein $R_{F1}$ represents a fluorine atom or a fluoroalkyl group.

Examples of the polarity converting group-containing group E include a partial structure represented by formula (1) and a lactone structure, and specific examples and preferred examples of these structures are as described above. Specific examples and preferred examples of the polarity converting group are also as described above.

From the standpoint that the acid generated from the fluorine-containing compound (A) can be increased in its size and be prevented from diffusing to the unexposed area, the polarity converting group-containing group E is preferably bulky and preferably has, for example, a cyclic structure. The polarity converting group-containing group E having a cyclic structure is suitably a partial structure represented by formula (1) where the electron-withdrawing group EWG has a cyclic structure, or a lactone structure.

The fluoroalkyl group as $R_{F1}$ preferably has a carbon number of 1 to 10, more preferably a carbon number of 1 to 4. Also, the fluoroalkyl group of $R_{F1}$ is preferably a perfluoroalkyl group.

$R_{F1}$ is preferably a fluorine atom or a perfluoroalkyl group having a carbon number of 1 to 4.

Specific examples of $R_{F1}$ include a fluorine atom, $CF_3$, $C_2F_5$, $C_3F_7$, $C_4F_9$, $C_5F_{11}$, $C_6F_{13}$, $C_7F_5$ and $C_8F_{17}$, with a fluorine atom and $CF_3$ being preferred.

The divalent linking group of Q is not particularly limited and includes $-COO-$, $-OCO-$, $-CO-$, $-CS-$, $-O-$, $-S-$, $-SO-$, $-NR-$ (wherein R is a hydrogen atom or an alkyl group), an alkylene group, an alkenylene group, a cycloalkylene group, a cycloalkenylene group, a divalent nitrogen-containing non-aromatic heterocyclic group, a divalent aromatic ring group, and a linking group formed by connecting a plurality of these members, and a linking group having a total carbon number of 12 or less is preferred.

The alkyl group represented by R in $-NR-$ is preferably an alkyl group having a carbon number of 20 or less, such as methyl group, ethyl group, propyl group, isopropyl group, n-butyl group, sec-butyl group, hexyl group, 2-ethylhexyl group, octyl group and dodecyl group, more preferably an alkyl group having a carbon number of 8 or less, still more preferably an alkyl group having a carbon number of 3 or less. R is preferably a hydrogen atom, a methyl group or an ethyl group.

The alkylene group in Q may be linear or branched, and preferred examples thereof include an alkylene group having a carbon number of 1 to 8, such as methylene group, ethylene group, propylene group, butylene group, hexylene group and octylene group. An alkylene group having a carbon number of 1 to 6 is more preferred, and an alkylene group having a carbon number of 1 to 4 is still more preferred.

The alkenylene group in Q includes a group having a double bond at an arbitrary position of the above-described alkylene group.

The cycloalkylene group in Q may be either monocyclic or polycyclic, and preferred examples thereof include a divalent aliphatic hydrocarbon ring group having a carbon number of 3 to 17, such as cyclobutylene group, cyclopentylene group, cyclohexylene group, norbornylene group, adamantylene group and diamantanylene group. A divalent aliphatic hydrocarbon ring group having a carbon number of 5 to 12 is more preferred, and a divalent aliphatic hydrocarbon ring group having a carbon number of 6 to 10 is still more preferred.

The cycloalkenylene group in Q includes a group having a double bond at an arbitrary position of the above-described cycloalkylene group.

The divalent nitrogen-containing non-aromatic heterocyclic group in Q means preferably a 3- to 8-membered non-aromatic heterocyclic group having at least one nitrogen atom, and specific examples thereof include divalent linking groups having the following structures.

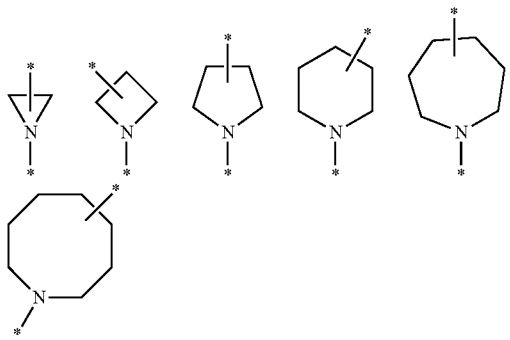

In the structures above, * represents a bond to A or E, and the divalent linking group may be bonded to A or E through another divalent linking group. The divalent linking group is preferably bonded to A at * adjacent to the nitrogen atom in the structure above and in this case, may be bonded to A through another divalent linking group.

Examples of the divalent aromatic ring group in Q include an arylene group having a carbon number of 6 to 14, which may have a substituent, such as phenylene group, tolylene group and naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

The alkyl group in the alkylene group, alkenylene group, cycloalkylene group, cycloalkenylene group, divalent nitrogen-containing non-aromatic heterocyclic group and divalent aromatic ring group of Q and the alkyl group as R in —NR— may further have a substituent, and examples of the further substituent include a hydroxyl group, a halogen atom, a nitro group, a cyano group, an amido group, a sulfonamido group, an alkyl group such as methyl group, ethyl group, propyl group, n-butyl group, sec-butyl group, hexyl group, 2-ethylhexyl group and octyl group, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyryloxy group, and a carboxy group, with a fluorine atom being preferred.

Above all, Q is preferably an alkylene group, a cycloalkylene group, or a cyclic group such as divalent nitrogen-containing non-aromatic heterocyclic group and divalent aromatic ring group.

From the standpoint of enhancing the sensitivity, Q as a divalent linking group in formula (2) is preferably a linking group represented by the following formula (2-1):

(2-1)

L represents a single bond or a divalent linking group.

Each of $R_{F2}$ and $R_{F3}$ independently represents a fluorine atom or a fluoroalkyl group and when a plurality of $R_{F2}$'s or $R_{F3}$'s are present, each $R_{F2}$ or $R_{F3}$ may be the same as or different from every other $R_{F2}$ or $R_{F3}$.

n represents an integer of 1 or more.

(*1) represents a direct bond to A in formula (2), and (*2) represents a direct bond to the polarity converting group-containing group E of formula (2).

The fluoroalkyl group of $R_{F2}$ and $R_{F3}$ preferably has a carbon number of 1 to 10, more preferably a carbon number of 1 to 4. Also, the fluoroalkyl group of $R_{F2}$ and $R_{F3}$ is preferably a perfluoroalkyl group.

Each of $R_{F2}$ and $R_{F3}$ is preferably a fluorine atom or a perfluoroalkyl group having a carbon number of 1 to 4.

Specific examples of $R_{F2}$ and $R_{F3}$ include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with a fluorine atom and $CF_3$ being preferred. In particular, it is preferred that $R_{F2}$ and $R_{F3}$ are a fluorine atom.

n is preferably an integer of 1 to 6, more preferably an integer of 1 to 3.

The divalent linking group of L is not particularly limited, and specific examples thereof are the same as those described for Q in formula (2).

The divalent linking group of L is preferably a linking group represented by the following formula (2-2):

(2-2)

$L_1$ represents —$SO_2$—, —CO— or —CS—.

$L_2$ represents a single bond, —O—, —S— or —NR— (wherein R is a hydrogen atom or an alkyl group).

$L_3$ represents an alkylene group, an alkenylene group, a cycloalkylene group, a cycloalkenylene group, a divalent nitrogen-containing non-aromatic heterocyclic group, a divalent aromatic ring group, or a linking group formed by connecting a plurality of these groups (provided that when $L_3$ is a divalent nitrogen-containing non-aromatic heterocyclic group, $L_2$ is a single bond and the nitrogen atom in the nitrogen-containing non-aromatic heterocyclic group and $L_1$ are bonded directly).

In formula (2-2), (*3) represents a direct bond to —[C($R_{F2}$)($R_{F3}$)]$_n$— of formula (2-1), and (*2) represents a direct bond to the polarity converting group-containing group E of formula (2).

In formula (2-2), specific examples and preferred examples of the alkyl group as R of —NR— are the same as those described for —NR— in formula (2).

Specific examples and preferred examples of the alkylene group, alkenylene group, cycloalkylene group, cycloalkenylene group, divalent nitrogen-containing non-aromatic heterocyclic group and divalent aromatic ring group as $L_3$ are the same as those described for Q in formula (2).

Specific examples of the polarity converting group-containing acid generated from the fluorine-containing compound (A) upon irradiation with an actinic ray or radiation, which is used in the present invention, are illustrated below.

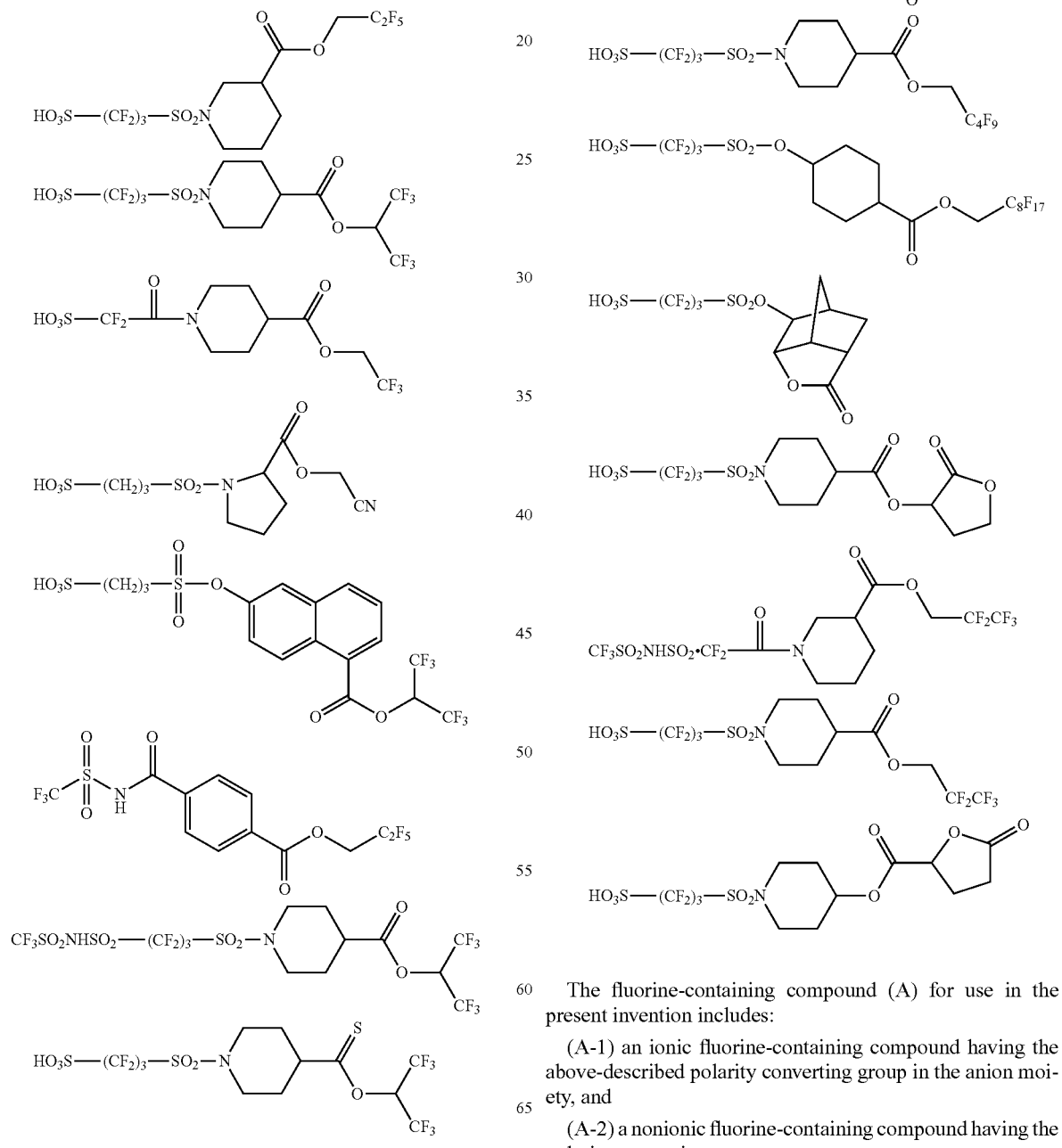

The fluorine-containing compound (A) for use in the present invention includes:

(A-1) an ionic fluorine-containing compound having the above-described polarity converting group in the anion moiety, and (A-2) a nonionic fluorine-containing compound having the polarity converting group.

In the present invention, when the fluorine-containing compound (A) is the fluorine-containing compound (A-1), the compound may further has a polarity converting group also in the cation moiety.

The fluorine-containing compound (A) for use in the present invention is preferably the fluorine-containing compound (A-1), and from the standpoint of achieving a fluorine content of 20% or more in the fluorine-containing compound (A), the compound preferably has a fluorine atom in the cation moiety.

In view of enhancing the sensitivity, the fluorine-containing compound (A-1) is preferably an ionic fluorine-containing compound having an anion represented by the following formula (3):

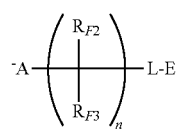

(3)

In formula (3), E represents a group containing a polarity converting group. Examples of the polarity converting group-containing group E include a partial structure represented by formula (1) and a lactone structure, and specific examples and preferred examples of these structures are as described above. Specific examples and preferred examples of the polarity converting group are also as described above.

L, $R_{F2}$ and $R_{F3}$ respectively have the same meanings as L, $R_{F2}$ and $R_{F3}$ of formula (2-1), and specific examples and preferred examples thereof are the same as those described in formula (2-1).

$A^-$ represents a sulfonate anion or a sulfonylamide anion represented by $-SO_2-N^--SO_2-R_{F1}$. $R_{F1}$ has the same meaning as $R_{F1}$ of formula (2), and specific examples and preferred examples are also the same as those described in formula (2).

n represents an integer of 1 or more. n is preferably an integer of 1 to 6, more preferably an integer of 1 to 3.

The fluorine-containing compound (A) for use in the present invention includes fluorine-containing compounds represented by the following formulae (ZI), (ZII) and (ZIII):

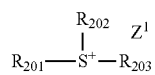

(ZI)

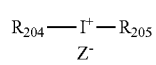

(ZII)

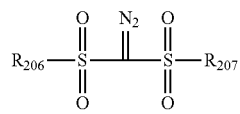

(ZIII)

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene group, pentylene group).

$Z^-$ represents a non-nucleophilic anion having a polarity converting group.

Specific examples and preferred examples of the polarity converting group contained in $Z^-$ are as described above.

The polarity converting group-containing non-nucleophilic anion as $Z^-$ is not particularly limited as long as it has the above-described polarity converting group, but examples thereof include a sulfonate anion, a carboxylate anion, a sulfonylimide anion, a bis(alkylsulfonyl)imide anion and a tris(alkylsulfonyl)methide anion.

$Z^-$ is preferably represented by formula (3).

The non-nucleophilic anion is an anion having an extremely low ability of causing a nucleophilic reaction, and this anion can suppress the decomposition with aging due to an intramolecular nucleophilic reaction. Thanks to this anion, the aging stability of the resist is enhanced.

The sulfonate anion is not particularly limited as long as it has the above-described polarity converting group, but examples thereof include an aliphatic sulfonate anion, an aromatic sulfonate anion and a camphorsulfonate anion.

The carboxylate anion is not particularly limited as long as it has the above-described polarity converting group, but examples thereof include an aliphatic carboxylate anion, an aromatic carboxylate anion and an aralkylcarboxylate anion.

The aliphatic moiety in the aliphatic sulfonate anion may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

The aromatic group in the aromatic sulfonate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion may have a substituent. Examples of the substituent of the alkyl group, cycloalkyl group and aryl group in the aliphatic sulfonate anion and aromatic sulfonate anion include the above-described polarity converting group, a nitro group, a halogen atom (e.g., fluorine atom, chlorine atom, bromine atom, iodine atom), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 1 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group or ring structure in each group, examples of the substituent further include an alkyl group (preferably having a carbon number of 1 to 15) and a cycloalkyl group (preferably having a carbon number of 3 to 15).

Examples of the aliphatic moiety in the aliphatic carboxylate anion include the same alkyl groups and cycloalkyl groups as those in the aliphatic sulfonate anion.

Examples of the aromatic group in the aromatic carboxylate anion include the same aryl groups as those in the aromatic sulfonate anion.

The aralkyl group in the aralkylcarboxylate anion is preferably an aralkyl group having a carbon number of 7 to 12, and examples thereof include a benzyl group, a phenethyl group, a naphthylmethyl group, a naphthylethyl group and a naphthylbutyl group.

The alkyl group, cycloalkyl group, aryl group and aralkyl group in the aliphatic carboxylate anion, aromatic carboxylate anion and aralkylcarboxylate anion may have a substituent. Examples of the substituent of the alkyl group, cycloalkyl group, aryl group and aralkyl group in the aliphatic carboxylate anion, aromatic carboxylate anion and aralkylcarboxylate anion include the same polarity converting group, halogen atom, alkyl group, cycloalkyl group, alkoxy group and alkylthio group as in the aromatic sulfonate anion.

The sulfonylimide anion is not particularly limited as long as it has the above-described polarity converting group, but examples thereof include saccharin anion substituted with the polarity converting group.

The bis(alkylsulfonyl)imide anion and tris(alkylsulfonyl) methide anion are also not particularly limited as long as they have the above-described polarity converting group, but the alkyl group in the bis(alkylsulfonyl)imide anion and tris (alkylsulfonyl)methide anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include the above-described polarity converting group, a halogen atom, and alkyl, alkoxy, alkylthio, alkyloxysulfonyl, aryloxysulfonyl and cycloalkylaryloxysulfonyl groups each substituted with the above-described polarity converting group and a halogen atom. An alkyl group substituted with the polarity converting group and a fluorine atom is preferred.

Incidentally, two alkyl groups in the bis(alkylsulfonyl)imide anion may be the same or different. Similarly, the plurality of alkyl groups in the tris(alkylsulfonyl)methide anion may be the same or different.

In particular, the bis(alkylsulfonyl)imide anion and tris (alkylsulfonyl)methyl anion include anions represented by the following formulae (A3) and (A4):

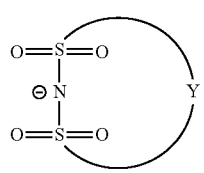

(A3)

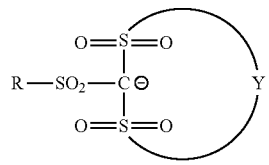

(A4)

In formulae (A3) and (A4), Y is an alkylene group substituted with at least one fluorine atom, preferably an alkylene group having a carbon number of 2 to 4, and preferably contains the above-described polarity converting group. The alkylene chain may contain an oxygen atom. Y is more preferably a perfluoroalkylene group having a carbon number of 2 to 4 and containing the polarity converting group, and most preferably a tetrafluoroethylene group containing the polarity converting group, a hexafluoropropylene group containing the polarity converting group, or an octafluorobutylene group containing the polarity converting group.

In formula (A4), R represents an alkyl group or a cycloalkyl group and preferably has the above-described polarity converting group as the substituent. The alkylene chain in the alkyl or cycloalkyl group may contain an oxygen atom.

Examples of the compound having an anion represented by formula (A3) or (A4) include those described as specific examples in JP-A-2005-221721.

When the compound (A) is the compound (A-1), the non-nucleophilic anion of $Z^-$ is not particularly limited as long as it has the polarity converting group, but the non-nucleophilic anion is preferably an aliphatic sulfonate anion substituted with a fluorine atom at the α-position of sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom, more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

The organic group as $R_{201}$, $R_{202}$ and $R_{203}$ in formula (ZI) includes, for example, corresponding groups in the compounds (ZI-1) to (ZI-4) described later. The organic group preferably has a fluorine atom or a fluorine atom-containing group as the substituent.

Examples of the fluorine atom-containing group include a fluoroalkyl group, a fluoroalkylsulfonic acid ester group and a fluoroalkylsulfonyl group. Specific examples and preferred examples of the fluoroalkyl group are the same as those described above for $R_{F1}$ of formula (2) and $R_{F2}$ and $R_{F3}$ of formula (2-1). The same applies to the fluoroalkyl group in the fluoroalkylsulfonic acid ester group and the fluoroalkylsulfonyl group.

The compound may be a compound having a plurality of structures represented by formula (ZI). For example, the compound may be a compound having a structure where at least one of $R_{201}$ to $R_{203}$ in a compound represented by formula (ZI) is bonded to at least one of $R_{201}$ to $R_{203}$ in another compound represented by formula (ZI).

As the component (ZI), compounds (ZI-1) to (ZI-4) described below are more preferred.

The compound (ZI-1) is an arylsulfonium compound where at least one of $R_{201}$ to $R_{203}$ of formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the heterocyclic structure include pyrrole, furan, thiophene, indole, benzofuran and benzothiophene structures. In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ preferably has a fluorine atom or a fluorine atom-containing group as the substituent and may additionally have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom except for fluorine atom, a hydroxyl group or a phenylthio group. The fluorine atom-containing group is as described above. The substituent other than the fluorine atom or fluorine atom-containing group is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

Specific examples of the anion when the fluorine-containing compound (A) for use in the present invention is a compound represented by formula (ZI-1) are illustrated below.

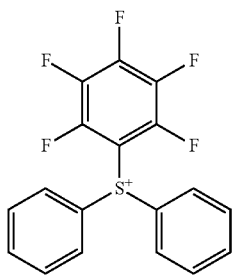

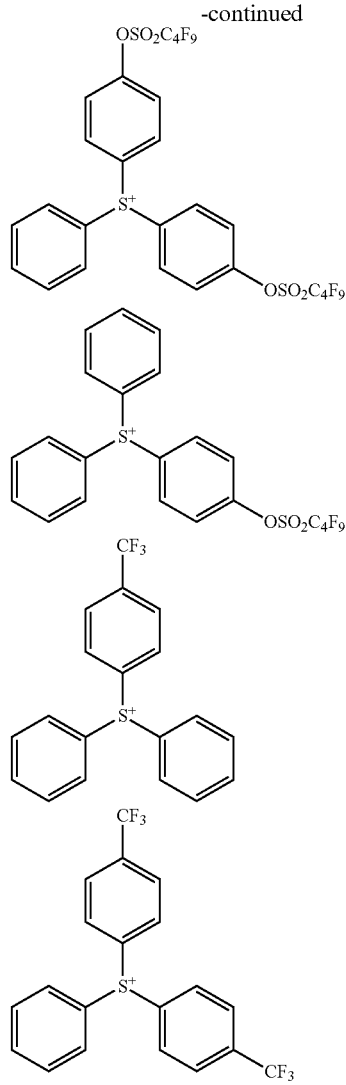

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20. The organic group preferably has a fluorine atom or a fluorine atom-containing group as the substituent. The fluorine atom-containing group is as described above.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl group, ethyl group, propyl group, butyl group, pentyl group), and a cycloalkyl group having a carbon number of 3 to 10 (e.g., cyclopentyl group, cyclohexyl group, norbornyl group). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy group, ethoxy group, propoxy group, butoxy group, pentoxy group).

Each of $R_{201}$ to $R_{203}$ preferably has a fluorine atom or a fluorine atom-containing group as the substituent and may be additionally substituted with a halogen atom except for fluorine atom, an alkoxy group (for example, having a carbon number of 1 to 5), a hydroxyl group, a cyano group or a nitro group.

The compound (ZI-3) is a compound represented by the following formula (ZI-3), and this is a compound having a phenacylsulfonium salt structure.

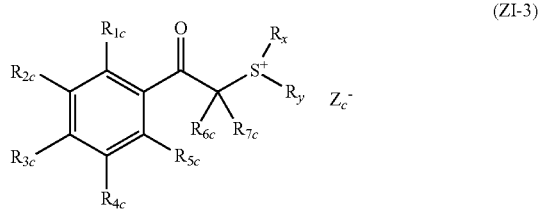

(ZI-3)

In formula (ZI-3), each of $R_{1c}$ to $R_{5c}$ independently represents a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Each of $R_{6c}$ and $R_{7c}$ independently represents a hydrogen atom, an alkyl group, a cycloalkyl group, a halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more members out of $R_{1c}$ to $R_{5c}$, a pair of $R_{5c}$ and $R_{6c}$, a pair of $R_{6c}$ and $R_{7c}$, a pair of $R_{5c}$ and $R_x$, or a pair of $R_x$ and $R_y$ may combine together to form a ring structure. This ring structure may contain an oxygen atom, a sulfur atom, a ketone group, an ester bond or an amide bond.

The ring structure includes an aromatic or non-aromatic hydrocarbon ring, an aromatic or non-aromatic heterocyclic ring, and a polycyclic condensed ring formed by combining two or more of these rings. The ring structure includes a 3- to 10-membered ring and is preferably a 4- to 8-membered ring, more preferably a 5- or 6-membered ring.

Examples of the group formed by combining any two or more members out of $R_{1c}$ to $R_{5c}$, a pair of $R_{6c}$ and $R_{7c}$ or a pair of $R_x$ and $R_y$ include a butylene group and a pentylene group.

The group formed by combining a pair of $R_{5c}$ and $R_{6c}$ or a pair of $R_{5c}$ and $R_x$ is preferably a single bond or an alkylene group, and examples of the alkylene group include a methylene group and an ethylene group.

$Zc^-$ represents a non-nucleophilic anion having a polarity converting group and has the same meaning as $Z^-$ in formula (ZI), and this non-nucleophilic anion is preferably represented by formula (3).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl group, ethyl group, linear or branched propyl group, linear or branched butyl group, linear or branched pentyl group). The cycloalkyl group is, for example, a cycloalkyl group having a carbon number of 3 to 10 (e.g., cyclopentyl group, cyclohexyl group).

The aryl group as $R_{1c}$ to $R_{7c}$ is preferably an aryl group having a carbon number of 6 to 15, and examples thereof include a phenyl group and a naphthyl group.

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy group, ethoxy group, linear or branched propoxy group, linear or branched butoxy group, linear or branched pentoxy group), or a cyclic alkoxy group having a carbon number of 3 to 10 (e.g., cyclopentyloxy group, cyclohexyloxy group).

Specific examples of the alkoxy group in the alkoxycarbonyl group of $R_{1c}$ to $R_{5c}$ are the same as specific examples of the alkoxy group of $R_{1c}$ to $R_{5c}$.

Specific examples of the alkyl group in the alkylcarbonyloxy group and alkylthio group of $R_{1c}$ to $R_{5c}$ are the same as specific examples of the alkyl group of $R_{1c}$ to $R_{5c}$.

Specific examples of the cycloalkyl group in the cycloalkylcarbonyloxy group of $R_{1c}$ to $R_{5c}$ are the same as specific examples of the cycloalkyl group of $R_{1c}$ to $R_{5c}$.

Specific examples of the aryl group in the aryloxy group and arylthio group of $R_{1c}$ to $R_{5c}$ are the same as specific examples of the aryl group of $R_{1c}$ to $R_{5c}$.

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

The ring structure which may be formed by combining any two or more members out of $R_{1c}$ to $R_{5c}$ with each other is preferably a 5- or 6-membered ring, more preferably a 6-membered ring (for example, a phenyl ring).

The ring structure which may be formed by combining $R_{5c}$ and $R_6$, with each other includes a 4- or higher-membered ring (preferably a 5- or 6-membered ring) formed together with the carbonyl carbon atom and carbon atom in formula (I) by combining $R_{5c}$ and $R_{6c}$ with each other to constitute a single bond or an alkylene group (e.g., methylene group, ethylene group).

In the case where $R_{6c}$ and $R_{7c}$ are combined to form a ring, the group formed by combining $R_{6c}$ and $R_{7c}$ is preferably an alkylene group having a carbon number of 2 to 10, and examples thereof include an ethylene group, a propylene group, a butylene group, a pentylene group and a hexylene group. Also, the ring formed by combining $R_{6c}$ and $R_{7c}$ may contain a heteroatom such as oxygen atom in the ring.

Examples of the alkyl group and cycloalkyl group as $R_x$ and $R_y$ are the same as those of the alkyl group and cycloalkyl group in $R_{1c}$ to $R_{7c}$.

Examples of the 2-oxoalkyl group and 2-oxocycloalkyl group as $R_x$ and $R_y$ include a group having >C=O at the 2-position of the alkyl group or cycloalkyl group as $R_{1c}$ to $R_{7c}$.

Examples of the alkoxy group in the alkoxycarbonylalkyl group as $R_x$ and $R_y$ are the same as those of the alkoxy group in $R_{1c}$ to $R_{5c}$. The alkyl group is, for example, an alkyl group having a carbon number of 1 to 12, preferably a linear alkyl group having a carbon number of 1 to 5 (e.g., methyl group, ethyl group).

The allyl group as $R_x$ and $R_y$ is not particularly limited but is preferably an unsubstituted allyl group or an allyl group substituted with a monocyclic or polycyclic cycloalkyl group (preferably a cycloalkyl group having a carbon number of 3 to 10).

The vinyl group as $R_x$ and $R_y$ is not particularly limited but is preferably an unsubstituted vinyl group or a vinyl group substituted with a monocyclic or polycyclic cycloalkyl group (preferably a cycloalkyl group having a carbon number of 3 to 10).

The ring structure which may be formed by combining $R_{5c}$ and $R_x$ with each other includes a 5- or higher-membered ring (preferably a 5-membered ring) formed together with the sulfur atom and carbonyl carbon atom in formula (ZI-3) by combining $R_{5c}$ and $R_x$ with each other to constitute a single bond or an alkylene group (e.g., methylene group, ethylene group).

The ring structure which may be formed by combining $R_x$ and $R_y$ with each other includes a 5- or 6-membered ring formed by divalent $R_x$ and $R_y$ (for example, a methylene group, an ethylene group or a propylene group) together with the sulfur atom in formula (ZI-3), and a 5-membered ring (that is, a tetrahydrothiophene ring) is particularly preferred.

Each of $R_x$ and $R_y$ is an alkyl or cycloalkyl group having a carbon number of preferably 4 or more, more preferably 6 or more, still more preferably 8 or more.

In formula (ZI-3), an arbitrary atom or group, particularly $R_{1c}$ to $R_{7c}$, $R_x$ or $R_y$, is preferably substituted with a fluorine atom or a fluorine atom-containing group. The fluorine atom-containing group is as described above.

$R_{1c}$ to $R_{7c}$, $R_x$ and $R_y$ may further have a substituent, and examples of such a substituent include a halogen atom (e.g., fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group and an aryloxycarbonyloxy group.

The alkyl group above includes, for example, a linear or branched alkyl group having a carbon number of 1 to 12, such as methyl group, ethyl group, n-propyl group, i-propyl group, n-butyl group, 2-methylpropyl group, 1-methylpropyl group and tert-butyl group.

The cycloalkyl group above includes, for example, a cycloalkyl group having a carbon number of 3 to 10, such as cyclopentyl group and cyclohexyl group.

The aryl group above includes, for example, an aryl group having a carbon number of 6 to 15, such as phenyl group and naphthyl group.

The alkoxy group above includes, for example, a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

The aryloxy group above includes, for example, an aryloxy group having a carbon number of 6 to 10, such as phenyloxy group and naphthyloxy group.

The acyl group above includes, for example, a linear or branched acyl group having a carbon number of 2 to 12, such as acetyl group, propionyl group, n-butanoyl group, i-butanoyl group, n-heptanoyl group, 2-methylbutanoyl group, 1-methylbutanoyl group and tert-heptanoyl group.

The arylcarbonyl group above includes, for example, an arylcarbonyl group having a carbon number of 6 to 10, such as phenylcarbonyl group and naphthylcarbonyl group.

The alkoxyalkyl group above includes, for example, a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

The aryloxyalkyl group above includes, for example, an aryloxyalkyl group having a carbon number of 7 to 12, such as phenyloxymethyl group, phenyloxyethyl group, naphthyloxymethyl group and naphthyloxyethyl group.

The alkoxycarbonyl group above includes, for example, a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

The aryloxycarbonyl group above includes, for example, an aryloxycarbonyl group having a carbon number of 7 to 11, such as phenyloxycarbonyl group and naphthyloxycarbonyl group.

The alkoxycarbonyloxy group above includes, for example, a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

The aryloxycarbonyloxy group above includes, for example, an aryloxycarbonyloxy group having a carbon number of 7 to 11, such as phenyloxycarbonyloxy group and naphthyloxycarbonyloxy group.

In formula (ZI-3), it is more preferred that each of $R_{1c}$, $R_{2c}$, $R_{4c}$ and $R_{5c}$ independently represents a hydrogen atom and $R_{3c}$ represents a group except for hydrogen atom, that is, a fluorine atom, a fluorine atom-containing group, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom except for fluorine atom, a hydroxyl group, a nitro group, an alkylthio group or an arylthio group.

Specific examples of the cation when the fluorine-containing compound (A) for use in the present invention is a compound represented by formula (ZI-2) or (ZI-3) are illustrated below.

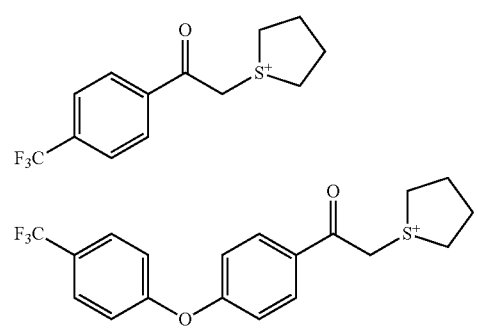

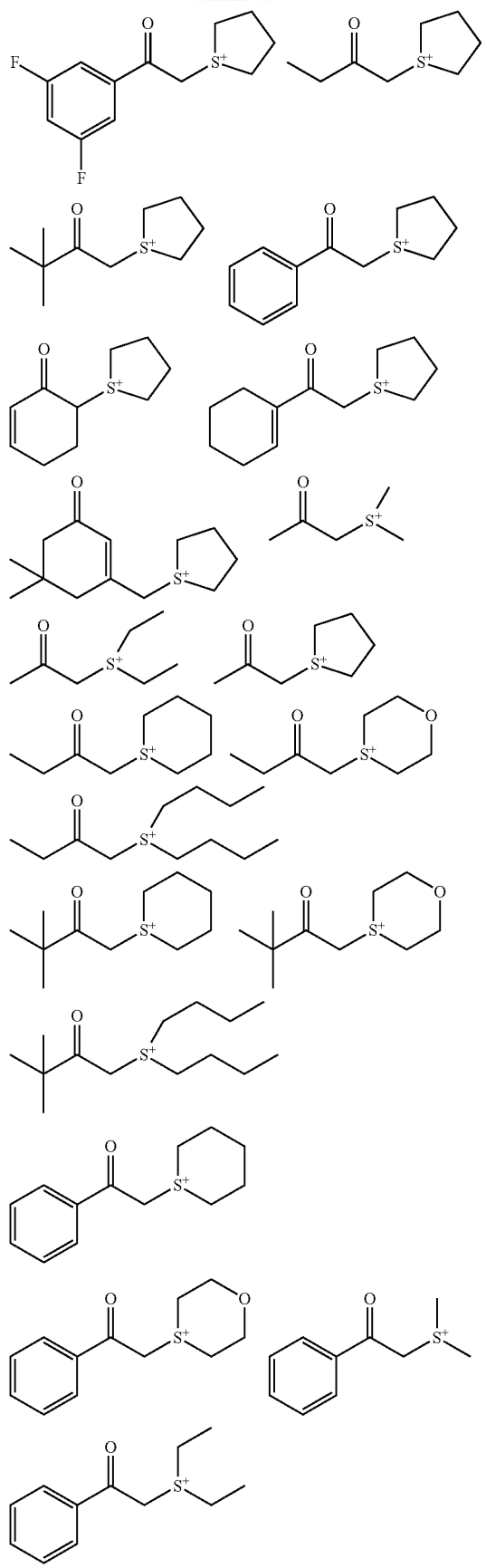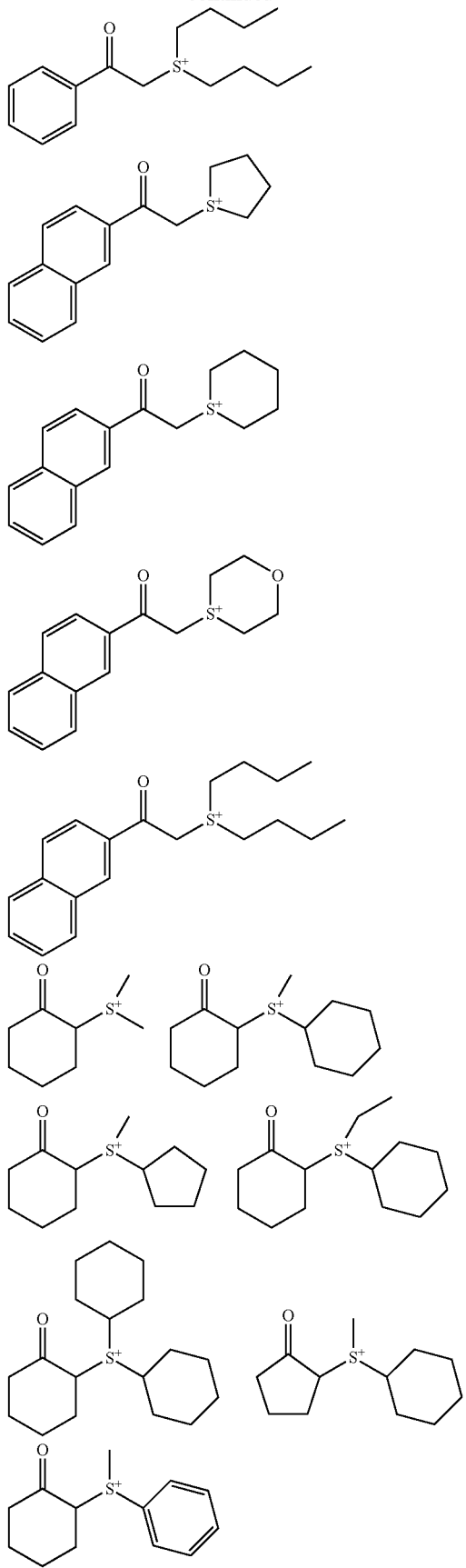

33
-continued
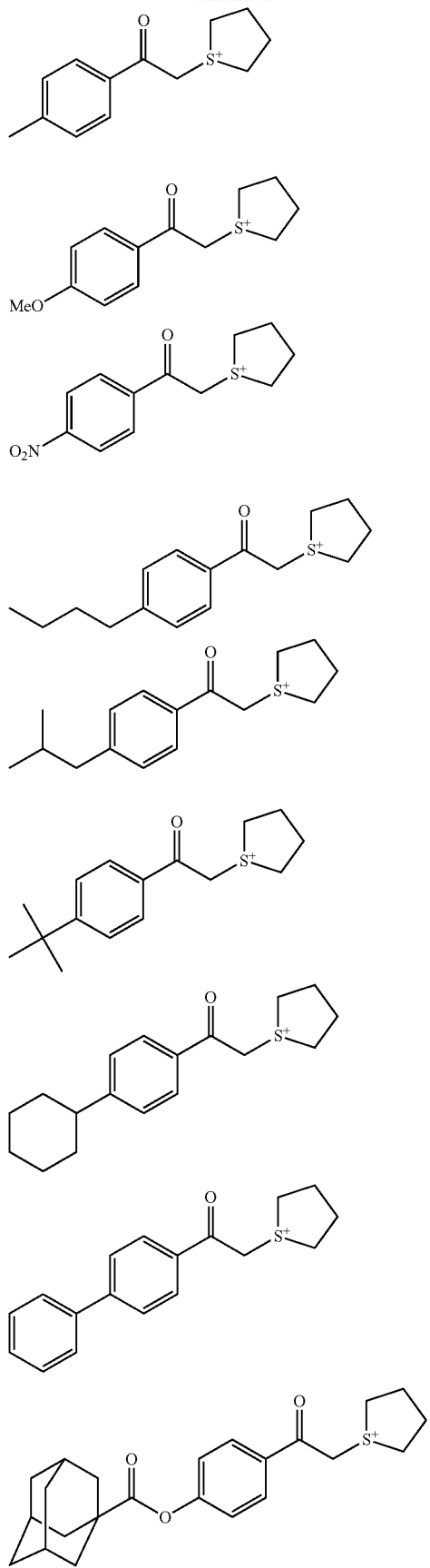
34
-continued
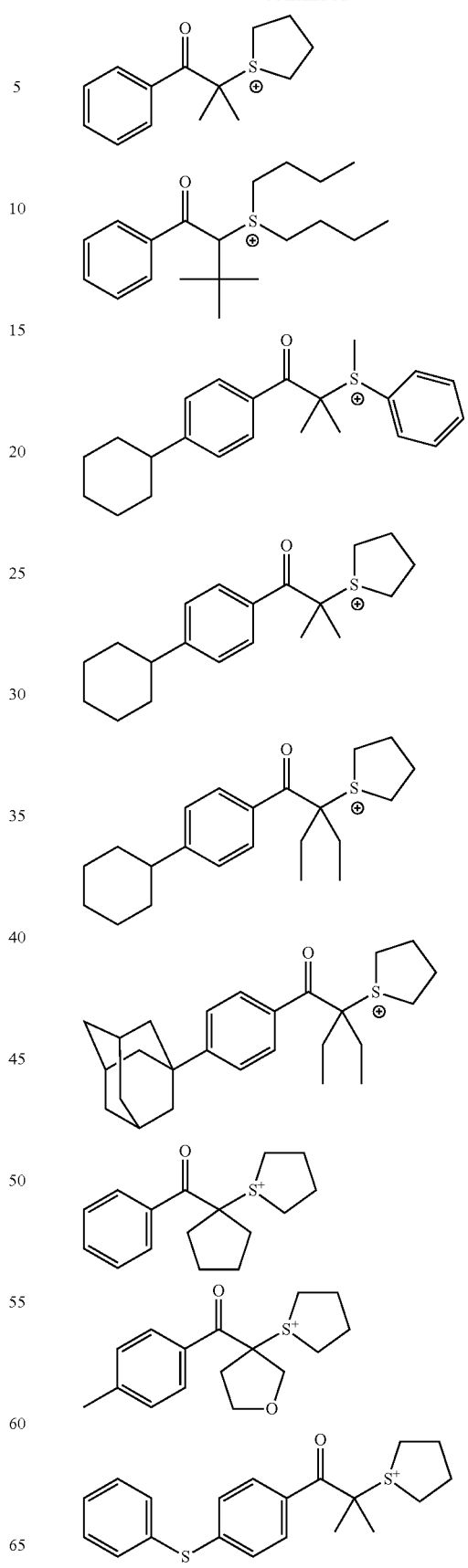

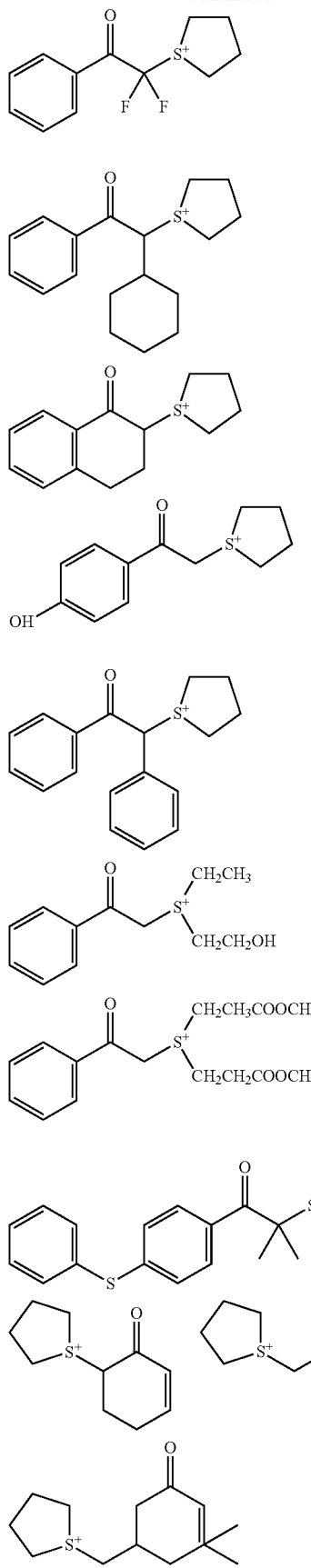
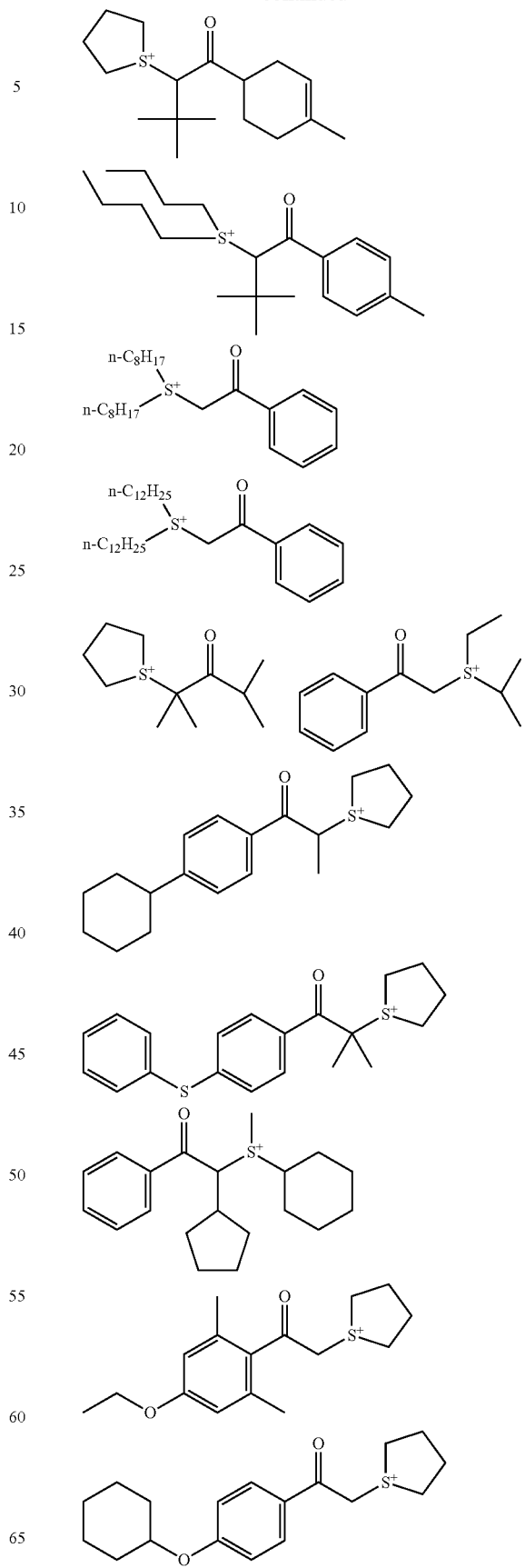

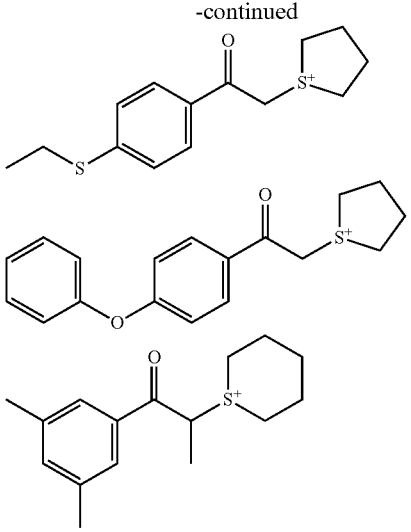

The compound (ZI-4) is a compound represented by the following formula (ZI-4):

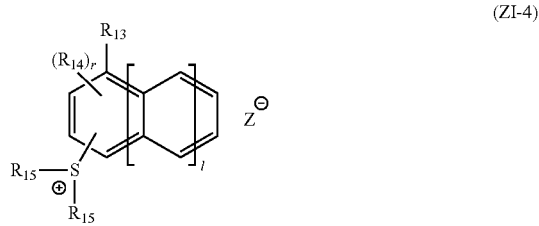

In formula (ZI-4), $R_{13}$ represents a hydrogen atom, a fluorine atom, a hydroxyl group, an alkyl group, a cycloalkyl group, an alkoxy group, an alkoxycarbonyl group, or a cycloalkyl group-containing group. These groups may have a substituent.

$R_{14}$ represents, when a plurality of $R_{14}$'s are present, each independently represents, a hydroxyl group, an alkyl group, a cycloalkyl group, an alkoxy group, an alkoxycarbonyl group, an alkylcarbonyl group, an alkylsulfonyl group, a cycloalkylsulfonyl group, or a cycloalkyl group-containing group. These groups may have a substituent.

Each $R_{15}$ independently represents an alkyl group, a cycloalkyl group or a naphthyl group. Two $R_{15}$'s may combine with each other to form a ring. These groups may have a substituent.

l represents an integer of 0 to 2.

r represents an integer of 0 to 8.

$Z^-$ represents an anion having a polarity converting group and has the same meaning as $Z^-$ in formula (ZI), and this anion is preferably represented by formula (3).

In formula (ZI-4), the alkyl group of $R_{13}$, $R_{14}$ and $R_{15}$ is preferably a linear or branched alkyl group having a carbon number of 1 to 10, and examples thereof include a methyl group, an ethyl group, an n-propyl group, an i-propyl group, an n-butyl group, a 2-methylpropyl group, a 1-methylpropyl group, a tert-butyl group, an n-pentyl group, a neopentyl group, an n-hexyl group, an n-heptyl group, an n-octyl group, a 2-ethylhexyl group, an n-nonyl group and an n-decyl group. Among these alkyl groups, a methyl group, an ethyl group, an n-butyl group and a tert-butyl group are preferred.

The cycloalkyl group of $R_{13}$, $R_{14}$ and $R_{15}$ includes a monocyclic or polycyclic cycloalkyl group (preferably a cycloalkyl group having a carbon number of 3 to 20), and examples thereof include cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl and adamantyl. Above all, cyclopropyl, cyclopentyl, cyclohexyl, cycloheptyl and cyclooctyl are preferred.

The alkoxy group of $R_{13}$ and $R_{14}$ is preferably a linear or branched alkoxy group having a carbon number of 1 to 10, and examples thereof include a methoxy group, an ethoxy group, an n-propoxy group, an i-propoxy group, an n-butoxy group, a 2-methylpropoxy group, a 1-methylpropoxy group, a tert-butoxy group, an n-pentyloxy group, a neopentyloxy group, an n-hexyloxy group, an n-heptyloxy group, an n-octyloxy group, a 2-ethylhexyloxy group, an n-nonyloxy group and an n-decyloxy group. Among these alkoxy groups, a methoxy group, an ethoxy group, an n-propoxy group and an n-butoxy group are preferred.

The alkoxycarbonyl group of $R_{13}$ and $R_{14}$ is preferably a linear or branched alkoxycarbonyl group having a carbon number of 2 to 11, and examples thereof include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a tert-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group and an n-decyloxycarbonyl group. Among these alkoxycarbonyl groups, a methoxycarbonyl group, an ethoxycarbonyl group and an n-butoxycarbonyl group are preferred.

The cycloalkyl group-containing group of $R_{13}$ and $R_{14}$ includes a group having a monocyclic or polycyclic cycloalkyl group (preferably a cycloalkyl group having a carbon number of 3 to 20), and examples thereof include a monocyclic or polycyclic cycloalkyloxy group and an alkoxy group containing a monocyclic or polycyclic cycloalkyl group. These groups may further have a substituent.

The monocyclic or polycyclic cycloalkyloxy group of $R_{13}$ and $R_{14}$ preferably has a total carbon number of 7 or more, more preferably a total carbon number of 7 to 15, and preferably contains a monocyclic cycloalkyl group. The monocyclic cycloalkyloxy group having a total carbon number of 7 or more indicates a monocyclic cycloalkyloxy group where a cycloalkyloxy group such as cyclopropyloxy group, cyclobutyloxy group, cyclopentyloxy group, cyclohexyloxy group, cyclobutyloxy group, cyclooctyloxy group and cyclododecanyloxy group arbitrarily has a substituent such as alkyl group (e.g., methyl group, ethyl group, propyl group, butyl group, pentyl group, hexyl group, heptyl group, octyl group, dodecyl group, 2-ethylhexyl group, isopropyl group, sec-butyl group, tert-butyl group, isoamyl group), hydroxyl group, halogen atom (e.g., fluorine, chlorine, bromine, iodine), nitro group, cyano group, amido group, sulfonamido group, alkoxy group (e.g., methoxy group, ethoxy group, hydroxyethoxy group, propoxy group, hydroxypropoxy group, butoxy group), alkoxycarbonyl group (e.g., methoxycarbonyl group, ethoxycarbonyl group), acyl group (e.g., formyl group, acetyl group, benzoyl group), acyloxy group (e.g., acetoxy group, butyryloxy group) and carboxy group and where the total carbon number inclusive of the carbon number of an arbitrary substituent on the cycloalkyl group is 7 or more.

Examples of the polycyclic cycloalkyloxy group having a total carbon number of 7 or more include a norbornyloxy group, a tricyclodecanyloxy group, a tetracyclodecanyloxy group and an adamantyloxy group.

The alkoxy group having a monocyclic or polycyclic cycloalkyl group of $R_{13}$ and $R_{14}$ preferably has a total carbon number of 7 or more, more preferably a total carbon number of 7 to 15, and is preferably an alkoxy group having a monocyclic cycloalkyl group. The alkoxy group having a total carbon number of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, tert-butoxy and isoamyloxy and where the total carbon number inclusive of the carbon number of the substituent is 7 or more. Examples thereof include a cyclohexylmethoxy group, a cyclopentylethoxy group and a cyclohexylethoxy group, with a cyclohexylmethoxy group being preferred.

Examples of the alkoxy group having a total carbon number of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$ above.

The alkylsulfonyl and cycloalkylsulfonyl group of $R_{14}$ are preferably a linear, branched or cyclic alkylsulfonyl group having a carbon number of 1 to 10, and examples thereof include a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group and a cyclohexanesulfonyl group. Among these alkylsulfonyl groups and cycloalkylsulfonyl groups, a methanesulfonyl group, an ethanesulfonyl group, an n-propanesulfonyl group, an n-butanesulfonyl group, a cyclopentanesulfonyl group and a cyclohexanesulfonyl group are preferred.

In formula (ZI-4), an arbitrary atom or group, particularly $R_{13}$, $R_{14}$ or $R_{15}$, is preferably substituted with a fluorine atom or a fluorine atom-containing group. The fluorine atom-containing group is as described above.

Examples of the substituent that may be substituted on each of the groups of $R_{13}$, $R_{14}$ and $R_{15}$ include a halogen atom (e.g., fluorine atom), a hydroxyl group, a carboxyl group, a cyano group, a nitro group, an alkoxy group, an alkoxyalkyl group, an alkoxycarbonyl group and an alkoxycarbonyloxy group.

The alkoxy group includes, for example, a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

The alkoxyalkyl group includes, for example, a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

The alkoxycarbonyl group includes, for example, a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

The alkoxycarbonyloxy group includes, for example, a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

The ring structure which may be formed by combining two $R_{15}$'s with each other includes a 5- or 6-membered ring, preferably a 5-membered ring (that is, tetrahydrothiophene ring), formed by two divalent $R_{15}$'s together with the sulfur atom in formula (ZI-4) and may be fused with an aryl group or a cycloalkyl group. This divalent $R_{15}$ may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group and an alkoxycarbonyloxy group.

In formula (ZI-4), $R_{15}$ is preferably, for example, a methyl group, an ethyl group, a naphthyl group, or a divalent group capable of forming a tetrahydrothiophene ring structure together with the sulfur atom when two $R_{15}$'s are combined.

The substituent that may be substituted on $R_{13}$ and $R_{14}$ is preferably a hydroxyl group, an alkoxy group, an alkoxycarbonyl group or a halogen atom (particularly a fluorine atom).

l is preferably 0 or 1, more preferably 1.

r is preferably 0 to 2.

Specific examples of the cation in the compound represented by formula (ZI-4) are illustrated below.

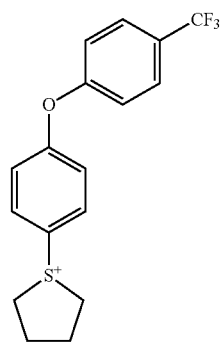

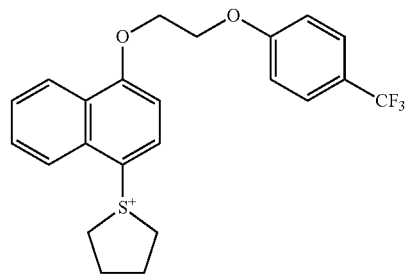

-continued
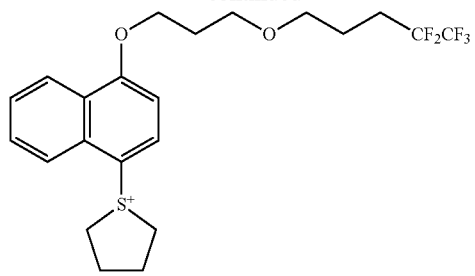
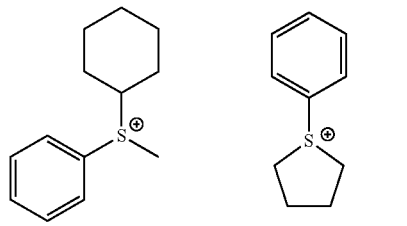
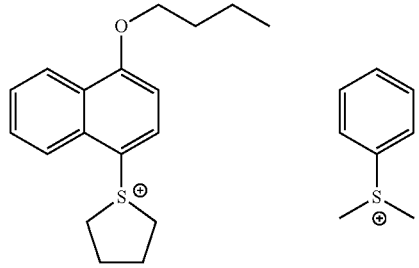
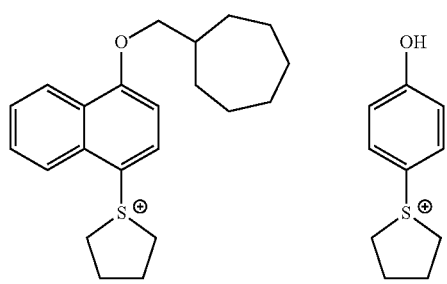
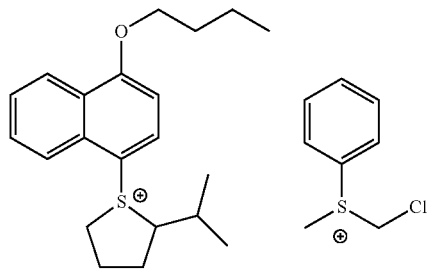
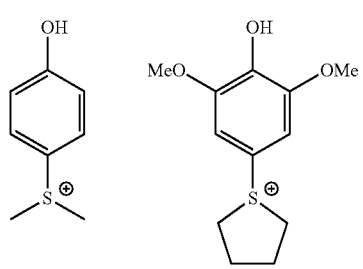
-continued
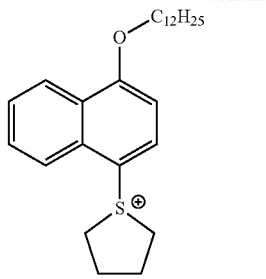
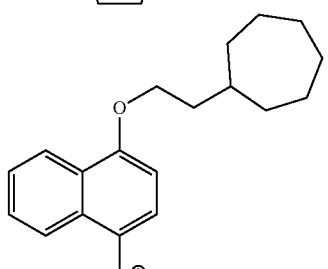
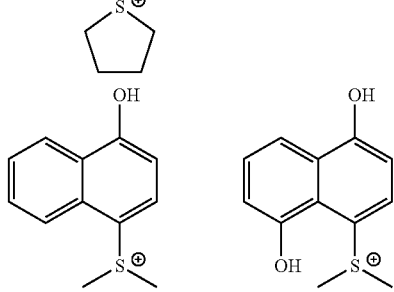
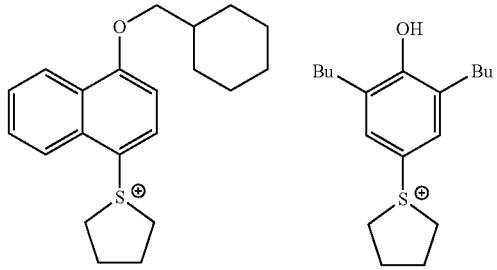
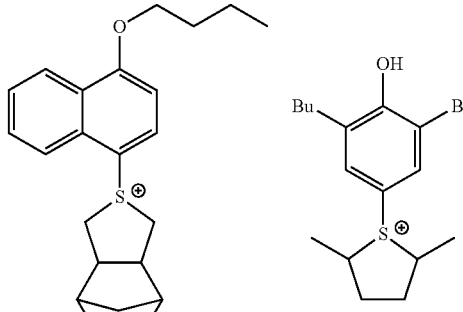
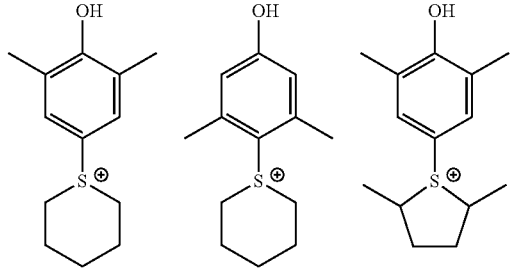

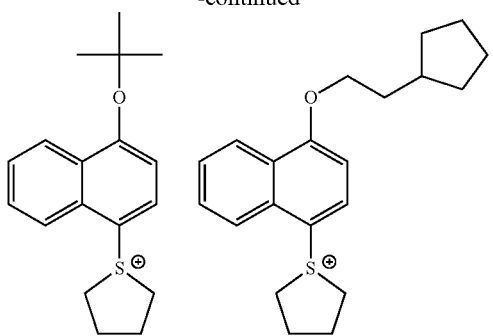
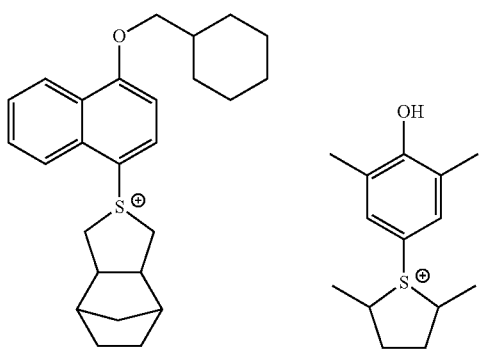
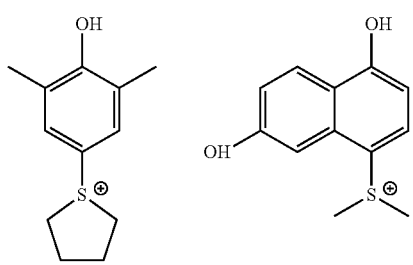
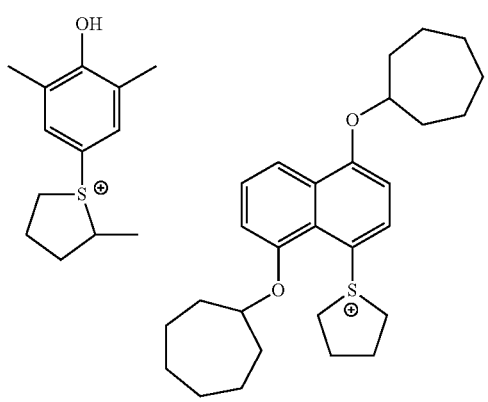
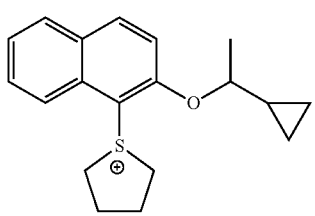
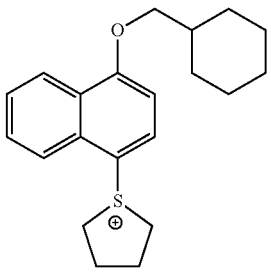
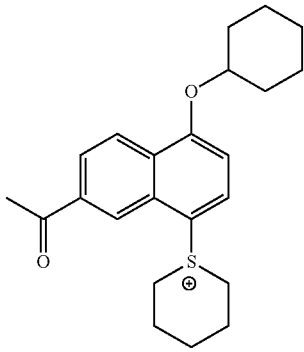
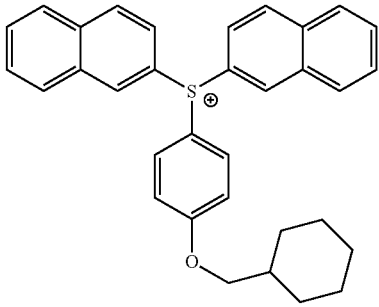
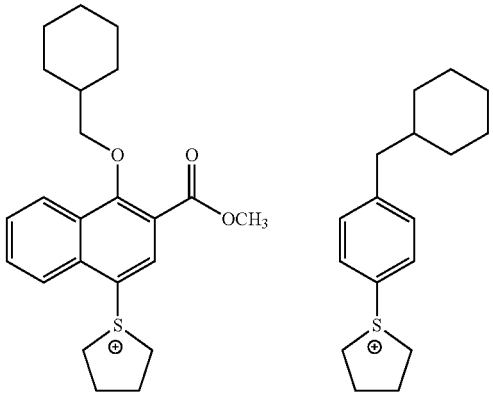
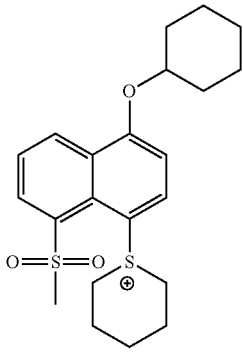

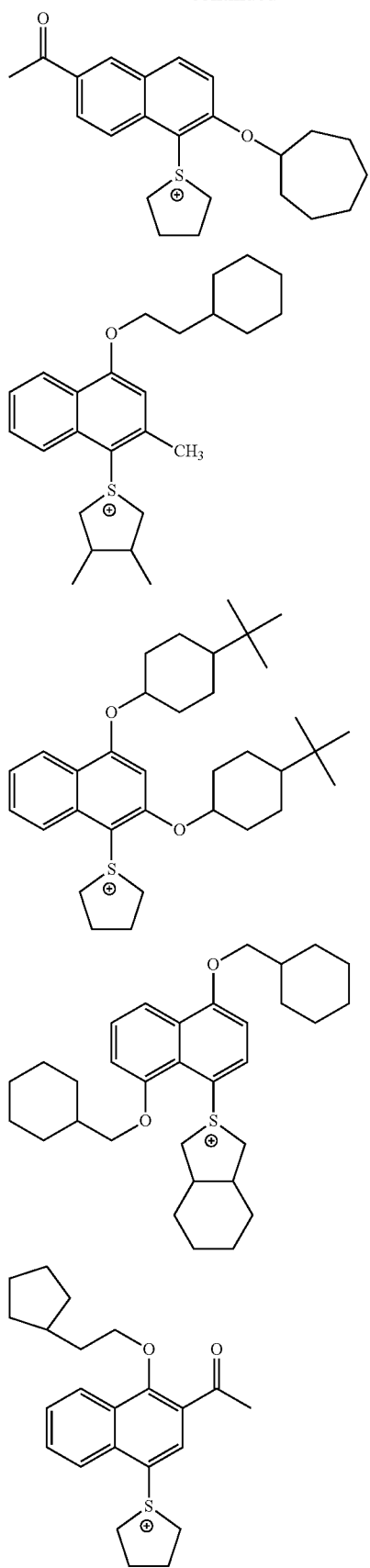
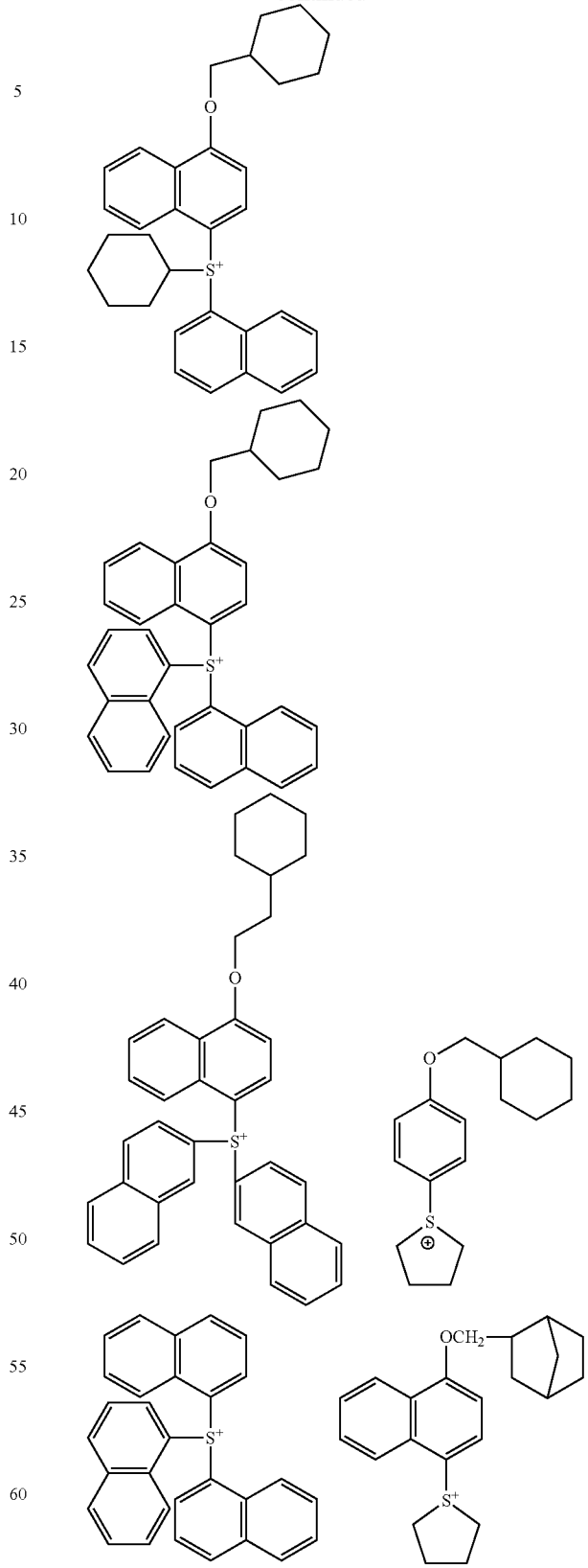
In formulae (ZII) and (ZIII), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the aryl group having a heterocyclic structure include a pyrrole residue group (a group formed by removing one hydrogen atom from a pyrrole), a furan residue group (a group formed by removing one hydrogen atom from a furan), a thiophene residue group (a group formed by removing one hydrogen atom from a thiophene), an indole residue group (a group formed by removing one hydrogen atom from an indole), a benzofuran residue group (a group formed by removing one hydrogen atom from a benzofuran) and a benzothiophene residue group (a group formed by removing one hydrogen atom from a benzothiophene).

The alkyl group and cycloalkyl group of $R_{204}$ to $R_{207}$ are preferably a linear or branched alkyl group having a carbon number of 1 to 10 (e.g., methyl group, ethyl group, propyl group, butyl group, pentyl group) and a cycloalkyl group having a carbon number of 3 to 10 (e.g., cyclopentyl group, cyclohexyl group, norbornyl group).

In formula (ZII), at least either one of $R_{204}$ and $R_{205}$ has, as the substituent, a fluorine atom or a fluorine atom-containing group to satisfy a fluorine content of 20% or more based on the molecular weight of the fluorine-containing compound (A). The fluorine atom-containing group is as described above.

Also, in formula (ZIII), at least either one of $R_{206}$ and $R_{207}$ has, as the substituent, a fluorine atom or a fluorine atom-containing group to satisfy a fluorine content of 20% or more based on the molecular weight of the fluorine-containing compound (A).

The aryl group, alkyl group and cycloalkyl group of $R_{204}$ to $R_{207}$ may have a substituent other than a fluorine atom or a fluorine atom-containing group. Examples of the substituent that may be substituted on the aryl group, alkyl group and cycloalkyl group of $R_{204}$ to $R_{207}$ include, as the substituent other than a fluorine atom and a fluorine atom-containing group, an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom except for fluorine atom, a hydroxyl group and a phenylthio group.

$Z^-$ represents a non-nucleophilic anion having a polarity converting group and has the same meaning as the non-nucleophilic anion of $Z^-$ in formula (ZI), and this non-nucleophilic anion is preferably represented by formula (3).

In the case where the fluorine-containing compound (A) has the above-described polarity converting group not only in the anion moiety but also in the cation moiety, examples of the compound include a compound represented by formula (ZI) (preferably the compounds (ZI-1) to (ZI-4)) and a compound represented by formula (ZII) where an arbitrary atom or group in the cation moiety is substituted with a group containing the polarity converting group. The polarity converting group-containing group is as described above.

Also, a compound represented by formula (ZIII) where an arbitrary atom or group in at least either one of $R_{206}$ and $R_{207}$ is substituted with the polarity converting group corresponds to the compound (A-2).

The acid generator further includes compounds represented by the following formulae (ZIV), (ZV) and (ZVI):

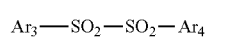

ZIV

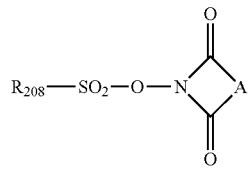

ZV

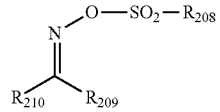

ZVI

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formula (ZI-1).

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI-2).

The alkylene group of A includes an alkylene group having a carbon number of 1 to 12 (e.g., methylene group, ethylene group, propylene group, isopropylene group, butylenes group, isobutylene group); the alkenylene group of A includes an alkenylene group having a carbon number of 2 to 12 (e.g., ethynylene group, propenylene group, butenylene group); and the arylene group of A includes an arylene group having a carbon number of 6 to 10 (e.g., phenylene group, tolylene group, naphthylene group).

In formula (ZIV), at least either one of $Ar_3$ and $Ar_4$ has, as the substituent, a fluorine atom or a fluorine atom-containing group to satisfy a fluorine content of 20% or more based on the molecular weight of the fluorine-containing compound (A). The fluorine atom-containing group is as described above.

Also, in formula (ZV), at least either one of $R_{208}$ and A has, as the substituent, a fluorine atom or a fluorine atom-containing group to satisfy a fluorine content of 20% or more based on the molecular weight of the fluorine-containing compound (A).

Furthermore, in formula (ZVI), at least any one of $R_{208}$, $R_{209}$ and $R_{210}$ has, as the substituent, a fluorine atom or a fluorine atom-containing group to satisfy a fluorine content of 20% or more based on the molecular weight of the fluorine-containing compound (A).

A compound represented by formulae (ZIV) to (ZVI) where an arbitrary atom or group in at least one group is substituted with the polarity converting group corresponds to the compound (A-2).

Among the fluorine-containing compounds (A), more preferred are the compounds represented by formulae (ZI) to (ZIII).

The fluorine-containing compound (A) is not particularly limited as long as it is a fluorine-containing compound having the above-described polarity converting group, being capable of generating an acid upon irradiation with an actinic ray or radiation and having a fluorine content of 20% or more, but the fluorine-containing compound is preferably an ionic fluorine-containing compound (A-1) having the polarity converting group in the anion moiety and having a fluorine content of 20% or more, more preferably an ionic fluorine-containing compound having an anion represented by formula (3) and having a fluorine content of 20% or more, still more preferably an ionic fluorine-containing compound having a fluorine atom in the cation moiety, at the same time, having an anion represented by formula (3) and having a fluorine content of 20% or more.

Specific examples of the fluorine-containing compound (A) for use in the present invention are illustrated below.

PAG-A

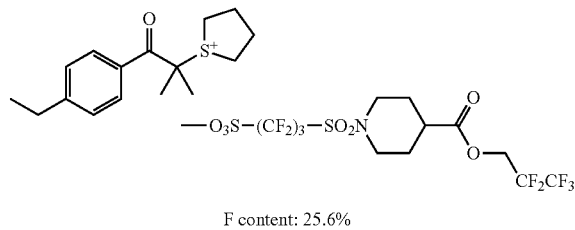

F content: 25.6%

PAG-B

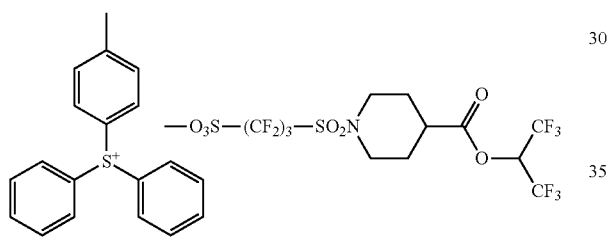

F content: 26.8%

PAG-C

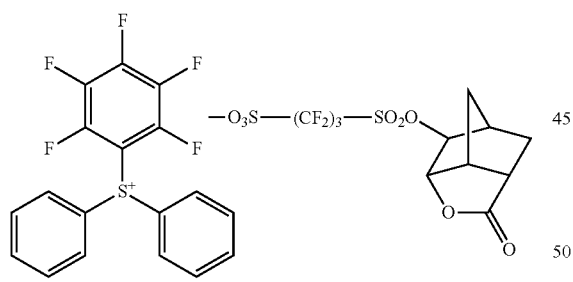

F content: 26.1%

PAG-D

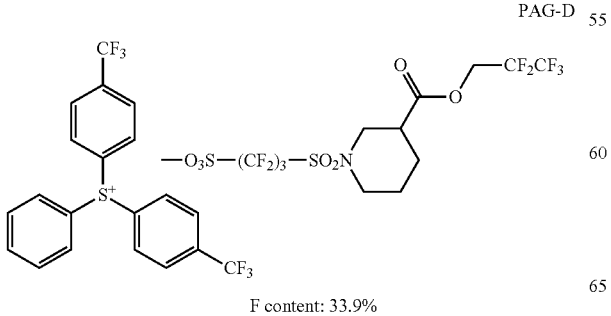

F content: 33.9%

PAG-E

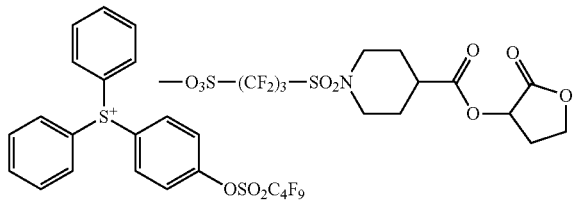

F content: 26.7%

PAG-F

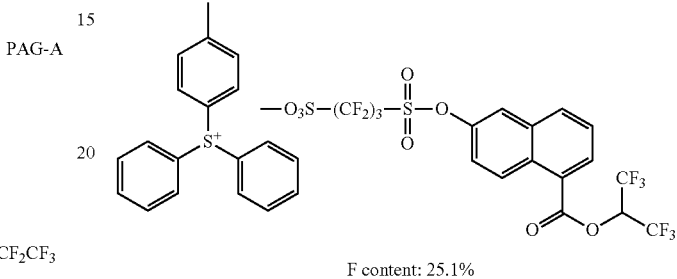

F content: 25.1%

PAG-G

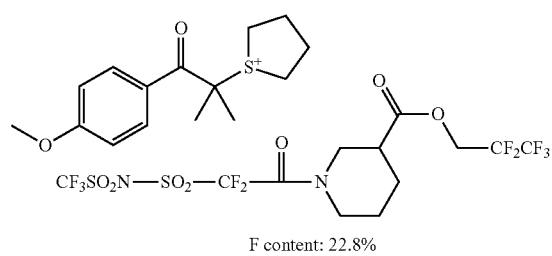

F content: 22.8%

PAG-H

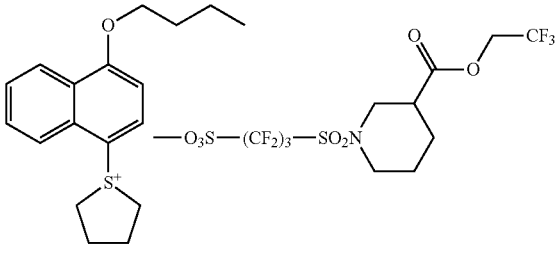

F content: 21.6%

PAG-I

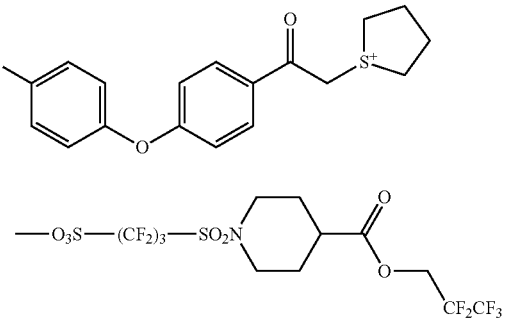

F content: 28.9%

PAG-J

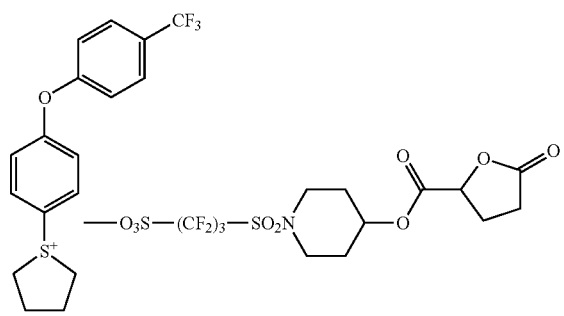

F content: 20.6%

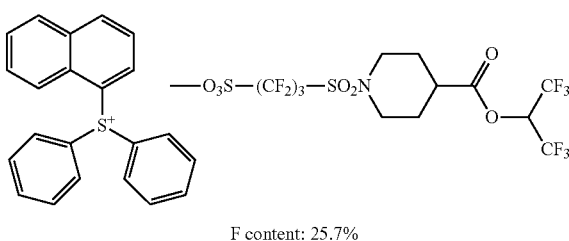

F content: 25.7%

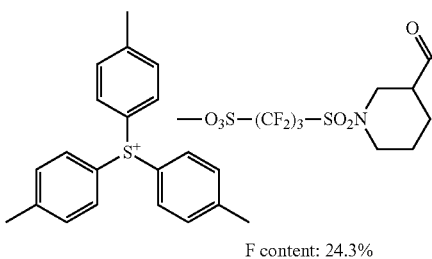

F content: 24.3%

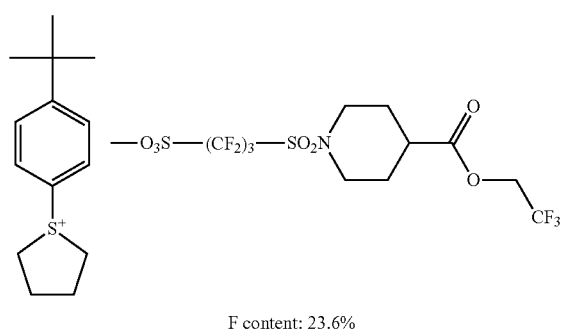

F content: 23.6%

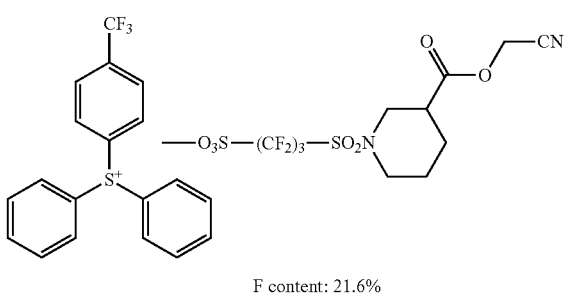

F content: 21.6%

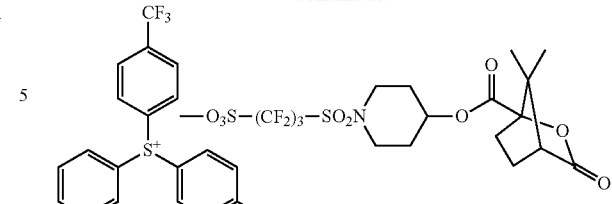

F content: 23.4%

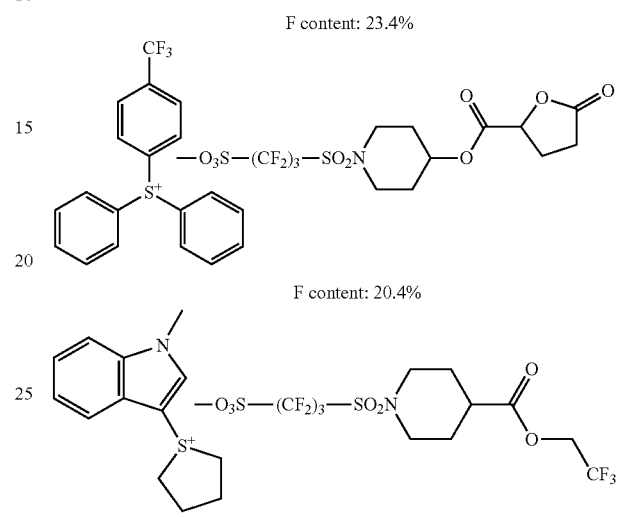

F content: 20.4%

F content: 23.7%

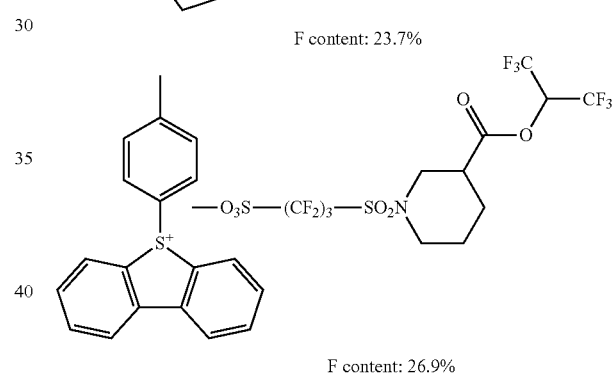

F content: 26.9%

As for the fluorine-containing compound (A), one kind of a compound may be used alone, or two or more kinds of compounds may be used in combination.

The content of the fluorine-containing compound (A) in the actinic ray-sensitive or radiation-sensitive resin composition is preferably from 0.1 to 20 mass %, more preferably from 0.5 to 18 mass %, still more preferably from 1 to 18 mass %, yet still more preferably from 3 to 16 mass %, based on the entire solid content of the actinic ray-sensitive or radiation-sensitive resin composition.

The compound (A) may be also used in combination with an acid generator (hereinafter, sometimes referred to as a "compound (A')") other than the compound (A).

The compound (A') is not particularly limited as long as it is a known compound, but compounds represented by the following formulae (ZI') (ZII') and (ZIII') are preferred.

(ZI')

-continued

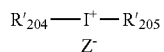
(ZII')

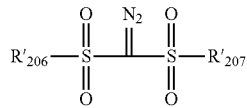
(ZIII')

In formulae (ZI') (ZII') and (ZIII'), R'$_{201}$ to R'$_{207}$ respectively have the same meanings as R$_{201}$ to R$_{207}$ in formulae (ZI), (ZII) and (ZIII), and specific examples and preferred examples are also the same. However, R'$_{201}$ to R'$_{207}$ in formulae (ZI') (ZII') and (ZIII') may not have the above-described polarity converting group and may not be substituted with a fluorine atom or a fluorine atom-containing group.

Also, in formulae (ZI') and (ZII'), Z$^-$ represents a non-nucleophilic anion (an anion having an extremely low ability of causing a nucleophilic reaction) and has the same meaning as Z$^-$ described in formula (ZI) and (ZII), but here, Z$^-$ does not have the above-described polarity converting group.

Furthermore, the compound (A') includes compounds represented by the following formulae (ZIV'), (ZV') and (ZVI'):

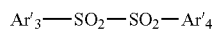
(ZIV')

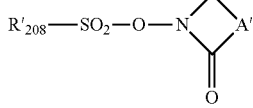
(ZV')

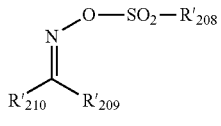
(ZVI')

In formulae (ZV') and (ZVI'), Ar'$_3$ and Ar'$_4$ respectively have the same meanings as Ar$_3$ and Ar$_4$ of formula (ZIV), and specific examples are also the same. However, Ar'$_3$ and Ar'$_4$ of formula (ZIV') may not have the above-described polarity converting group and may not be substituted with a fluorine atom or a fluorine atom-containing group.

In formulae (ZV') and (ZVI'), A', R'$_{208}$, R'$_{209}$ and R'$_{210}$ respectively have the same meanings as A, R$_{208}$, R$_{209}$ and R$_{210}$ of formulae (ZV) and (ZVI), and specific examples are also the same. However, A', R'$_{208}$, R'$_{209}$ and R'$_{210}$ of formulae (ZV') and (ZVI') may not have the above-described polarity converting group and may not be substituted with a fluorine atom or a fluorine atom-containing group.

Specific examples of the compound (A') are illustrated below.

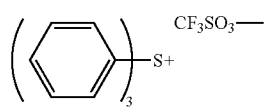
(z1)

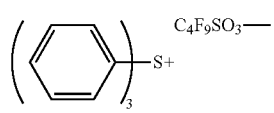
(z2)

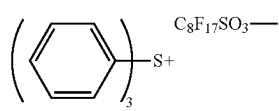
(z3)

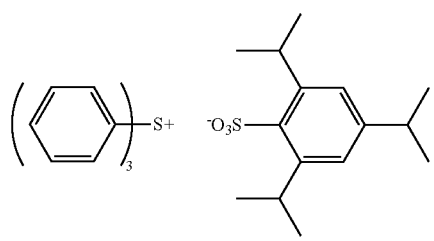
(z4)

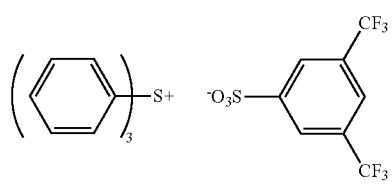
(z5)

-continued
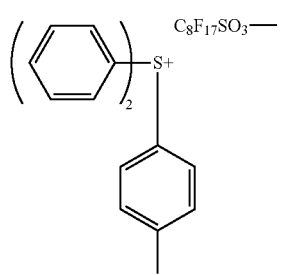
(z6)
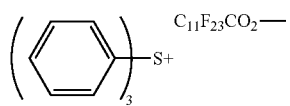
(z7)
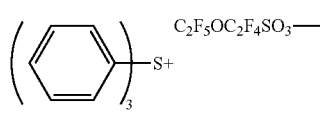
(z8)
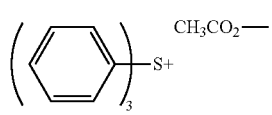
(z9)
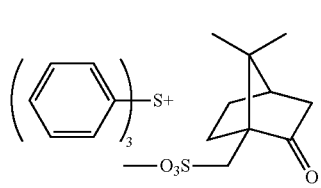
(z10)
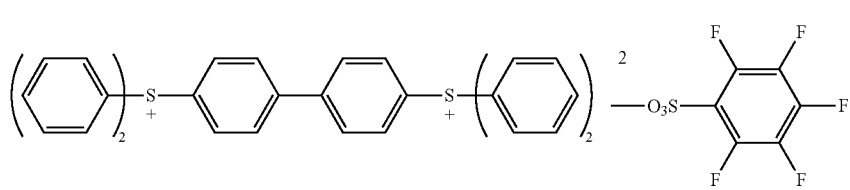
(z11)
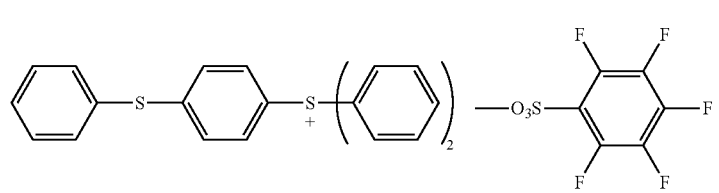
(z12)
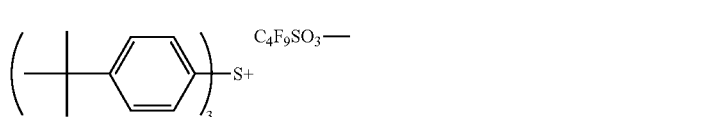
(z13)
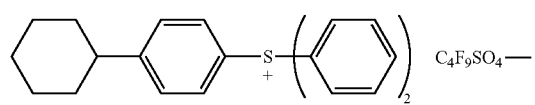
(z14)
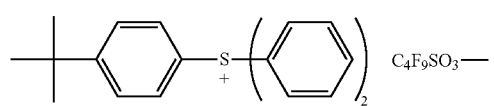
(z15)
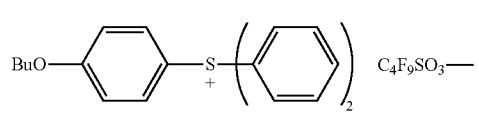
(z16)

-continued
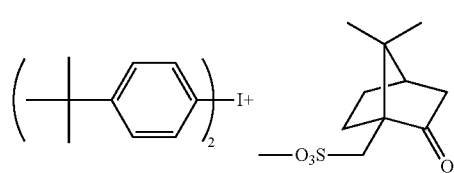 (z17)
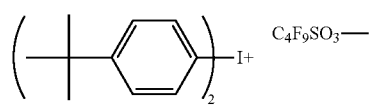 (z18)
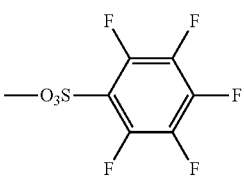 (z19)
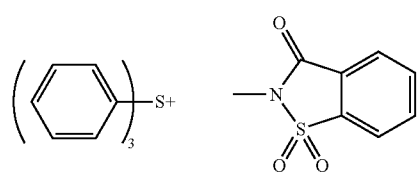 (z20)
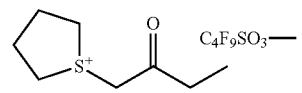 (z21)
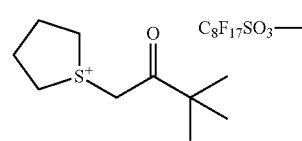 (z22)
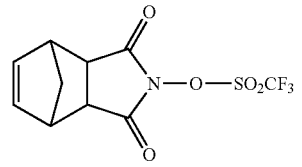 (z23)
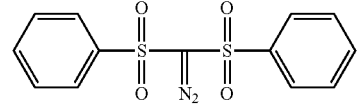 (z24)
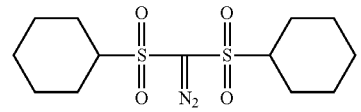 (z25)
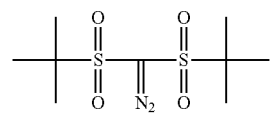 (z26)
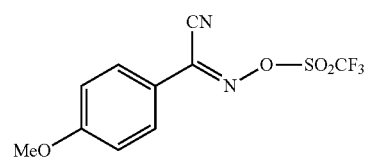 (z27)

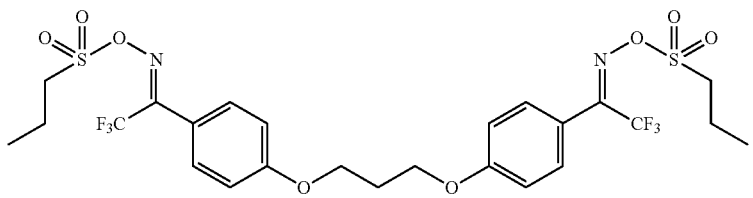 (z28)
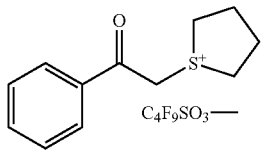 (z29)
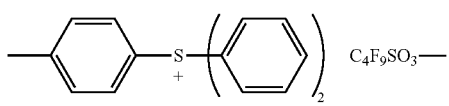 (z30)
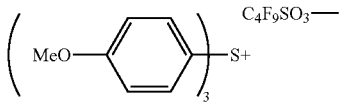 (z31)
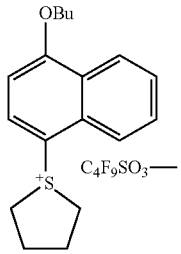 (z32)
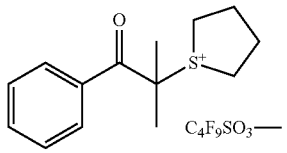 (z33)
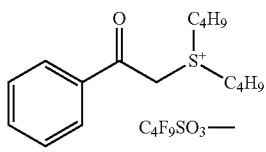 (z34)
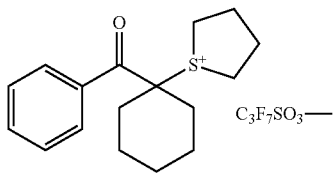 (z35)
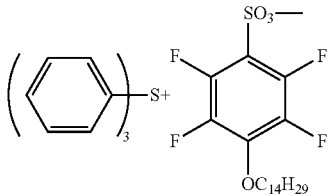 (z36)

-continued
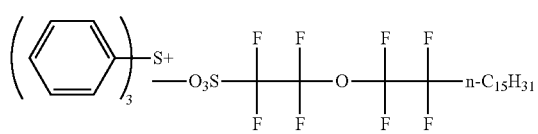
(z37)
(z38)
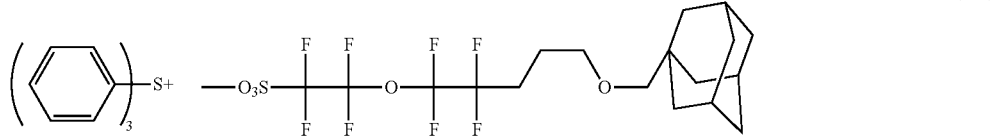
(z39)
(z40)
(z41)
(z42)
(z43)
(z44)
(z45)
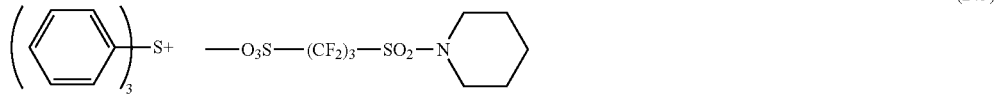

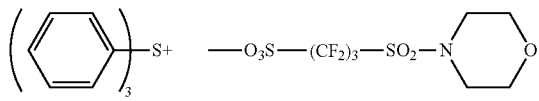
(z46)
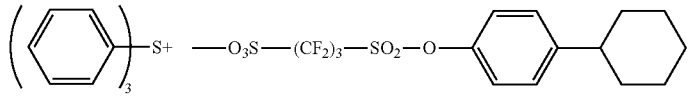
(z47)
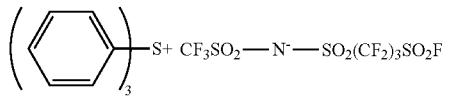
(z48)
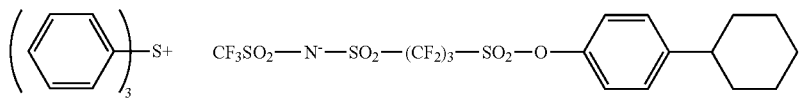
(z49)
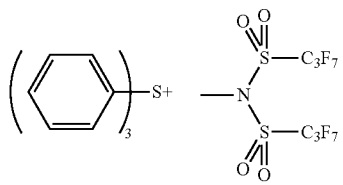
(z50)
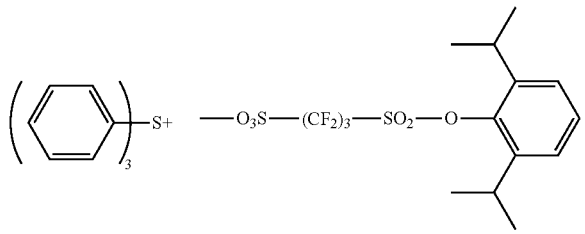
(z51)
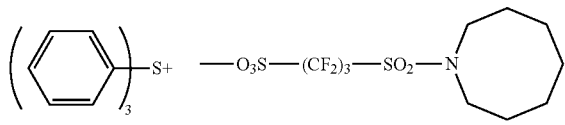
(z52)
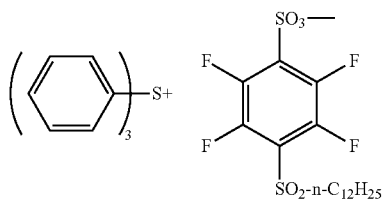
(z53)
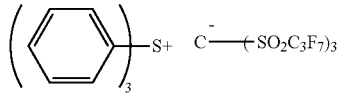
(z54)
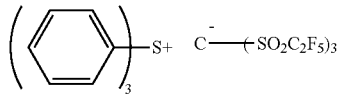
(z55)
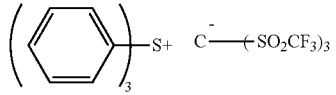
(z56)

-continued
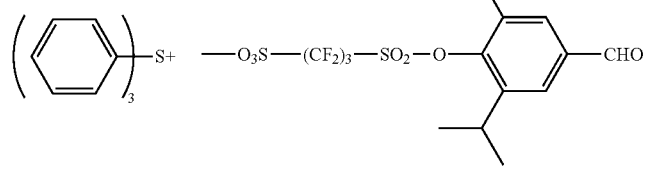
(z57)
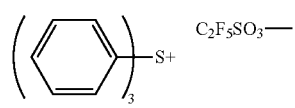
(z58)
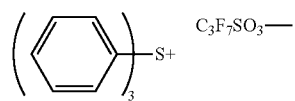
(z59)
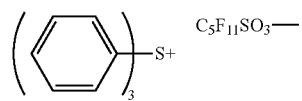
(z60)
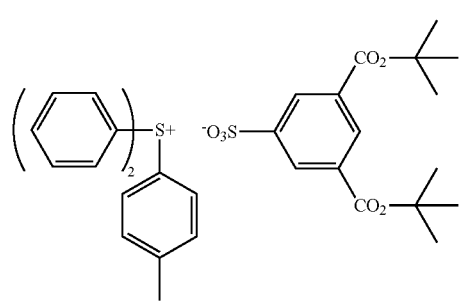
(z61)
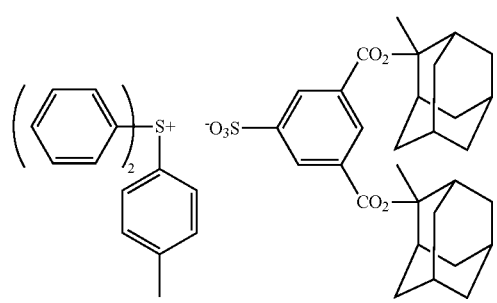
(z62)
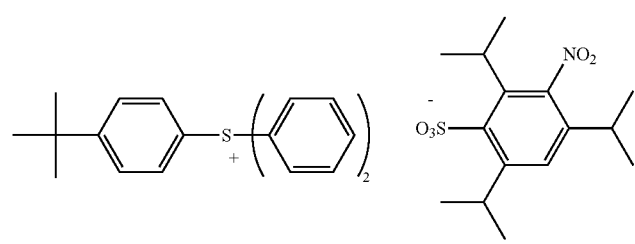
(z63)

-continued

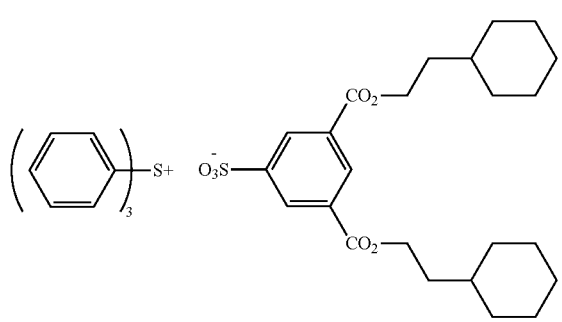
(z64)

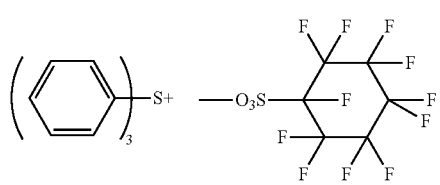
(z65)

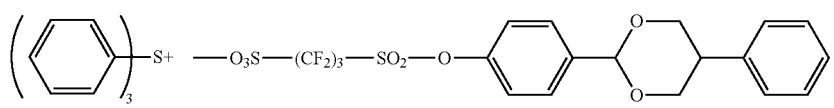
(z66)

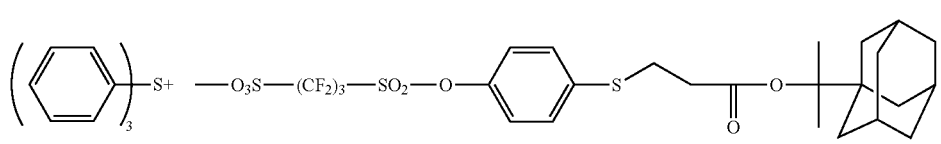
(z67)

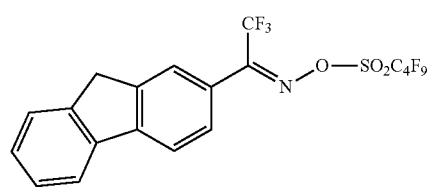
(z68)

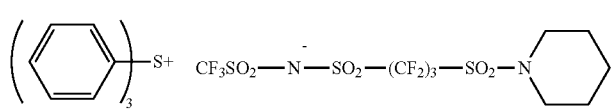
(z69)

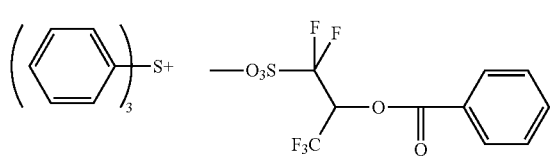
(z70)

The total amount of the acid generator (in the case of using an acid generator other than the compound (A) in combination, including the amount of this acid generator) is preferably from 0.1 to 25 mass %, more preferably from 0.5 to 20 mass %, still more preferably from 1 to 20 mass %, yet still more preferably from 2 to 18 mass %, even yet still more preferably from 2 to 16 mass %, based on the entire solid content of the resist composition.

In the case of using the compound (A) and the compound (A') in combination, the amount of acid generators used is, in terms of the molar ratio (compound (A)/compound (A')), usually from 99/1 to 20/80, preferably from 99/1 to 40/60, more preferably from 99/1 to 50/50.

[2] (B) Resin Capable of Increasing the Solubility for an Alkali Developer by the Action of an Acid The actinic ray-sensitive or radiation-sensitive resin composition of the present invention contains (B) a resin capable of increasing the solubility for an alkali developer by the action of an acid.

The resin capable of increasing the solubility for an alkali developer by the action of an acid (acid-decomposable resin) has a group which decomposes by the action of an acid to produce an alkali-soluble group (hereinafter sometimes referred to as an "acid-decomposable group"), on either one or both of the main chain and the side chain of the resin.

The resin (B) is preferably insoluble or sparingly soluble in an alkali developer.

The acid-decomposable group preferably has a structure where an alkali-soluble group is protected by a group capable of decomposing and leaving by the action of an acid.

Examples of the alkali-soluble group include a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred alkali-soluble groups include a carboxyl group, a fluorinated alcohol group (preferably hexafluoroisopropanol) and a sulfonic acid group.

The group preferred as the acid-decomposable group is a group where a hydrogen atom of the alkali-soluble group above is substituted for by a group capable of leaving by the action of an acid.

Examples of the group capable of leaving by the action of an acid include $-C(R_{36})(R_{37})(R_{38})$, $-C(R_{36})(R_{37})(OR_{39})$ and $-C(R_{01})(R_{02})(OR_{39})$.

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like, more preferably a tertiary alkyl ester group.

The acid-decomposable group-containing repeating unit which the resin (B) may contain is preferably a repeating unit represented by the following formula (AI):

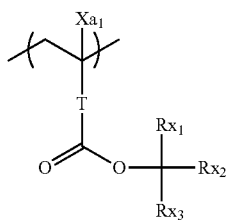

(AI)

In formula (AI), $Xa_1$ represents a hydrogen atom, a methyl group which may have a substituent, or a group represented by $-CH_2-R_9$. $R_9$ represents a hydroxyl group or a monovalent organic group. Examples of the monovalent organic group include an alkyl group having a carbon number of 5 or less and an acyl group having a carbon number of 5 or less. Of these, an alkyl group having a carbon number of 3 or less is preferred, and a methyl group is more preferred. $Xa_1$ is preferably a hydrogen atom, a methyl group, a trifluoromethyl group or a hydroxymethyl group.

T represents a single bond or a divalent linking group.

Each of $Rx_1$ to $Rx_3$ independently represents an alkyl group (linear or branched) or a cycloalkyl group (monocyclic or polycyclic).

Two members out of $Rx_1$ to $Rx_3$ may combine to form a cycloalkyl group (monocyclic or polycyclic).

Examples of the divalent linking group of T include an alkylene group, a $-COO-Rt-$ group, a $-O-Rt-$ group, and a divalent linking group formed by combining two or more thereof. In the formulae, Rt represents an alkylene group or a cycloalkylene group. The total carbon number of the divalent linking group of T is preferably from 1 to 20, more preferably from 1 to 15, still more preferably from 2 to 10.

T is preferably a single bond or a $-COO-Rt-$ group. Rt is preferably an alkylene group having a carbon number of 1 to 5, more preferably a $-CH_2-$ group, $-(CH_2)_2-$ group or a $-(CH_2)_3-$ group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group. Above all, a monocyclic cycloalkyl group having a carbon number of 5 to 6 is preferred.

An embodiment where $Rx_1$ is a methyl group or an ethyl group and $Rx_2$ and $Rx_3$ are combined to form the above-described cycloalkyl group is preferred.

Each of the groups above may have a substituent, and examples of the substituent include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). The carbon number is preferably 8 or less.

The total content of the repeating unit having an acid-decomposable group is preferably from 20 to 70 mol %, more preferably from 25 to 65 mol %, based on all repeating units in the resin.

Specific preferred examples of the repeating unit having an acid-decomposable group are illustrated below, but the present invention is not limited thereto.

In specific examples, each of Rx and $Xa_1$ represents a hydrogen atom, $CH_3$, $CF_3$ or $CH_2OH$, and each of Rxa and Rxb represents an alkyl group having a carbon number of 1 to 4. Z represents a substituent containing a polar group, and when a plurality of Z's are present, each Z may be the same as or different from every other Z. p represents 0 or a positive integer. Specific examples and preferred examples of Z are the same as specific examples and preferred examples of $R_{10}$ in formula (II-1) described later.

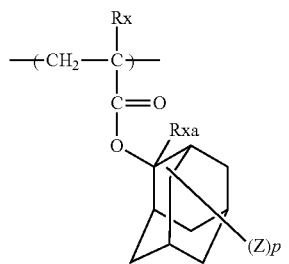
1
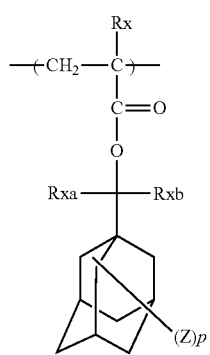
2
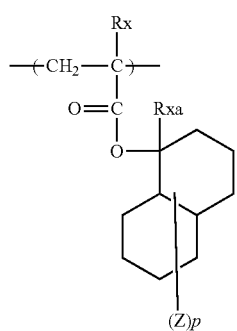
3
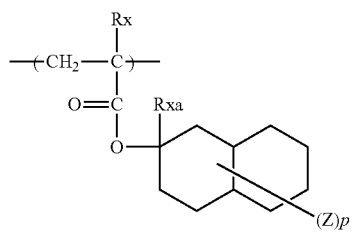
4
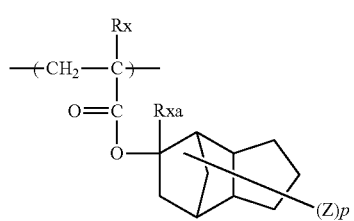
5
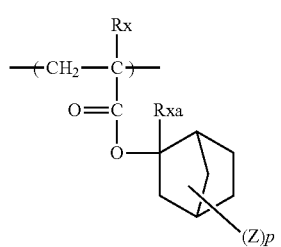
6
-continued
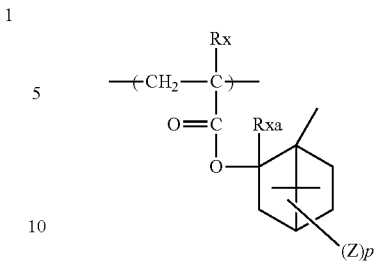
7
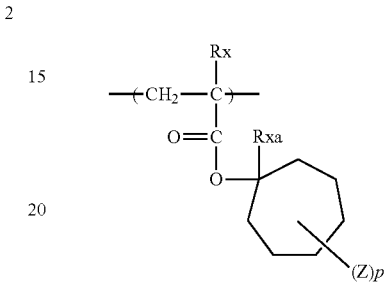
8
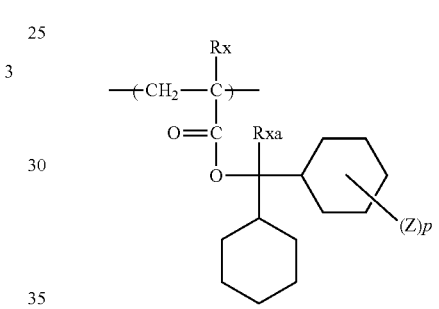
9
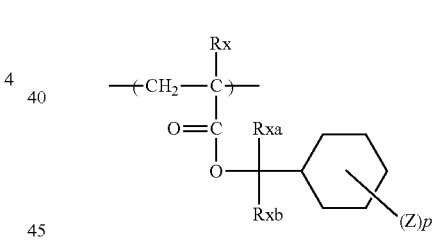
10
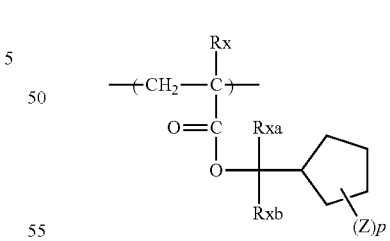
11
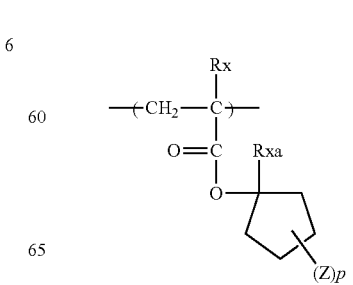
12

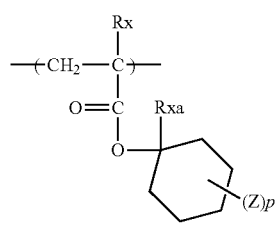
13
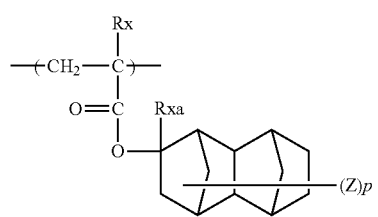
14
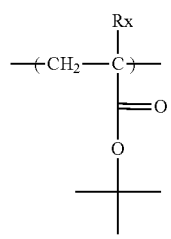
15
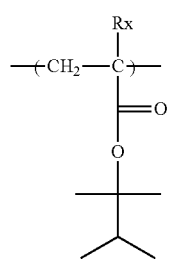
16
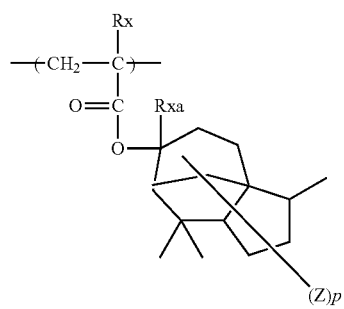
17
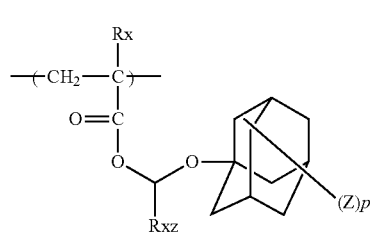
18
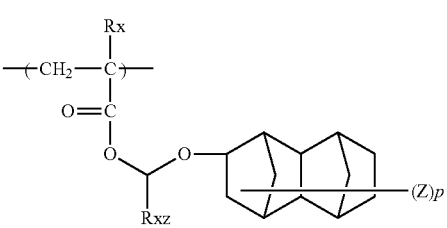
19
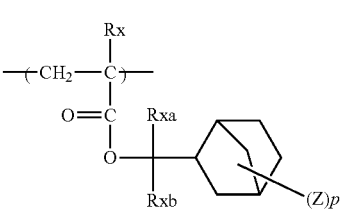
20
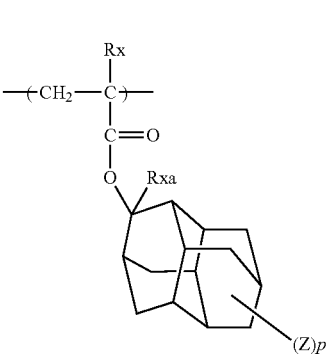
21
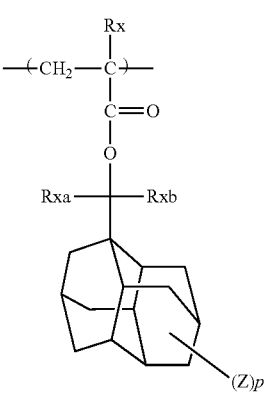
22
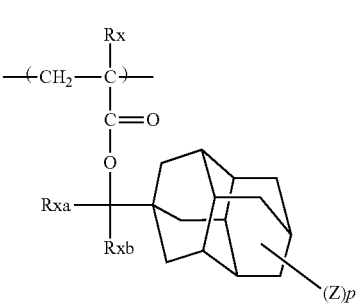
23

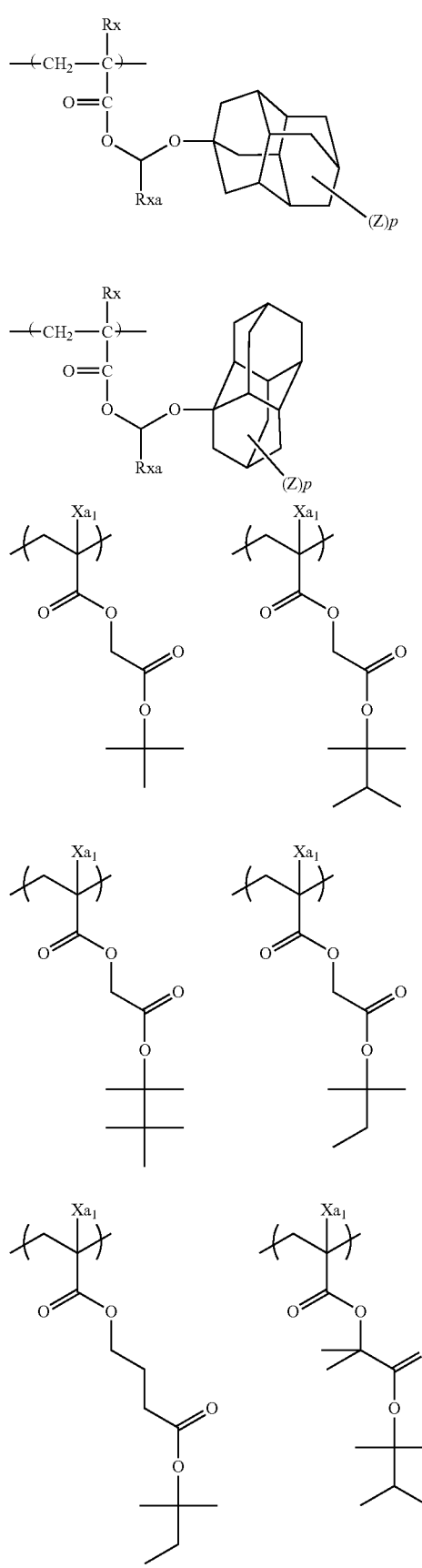
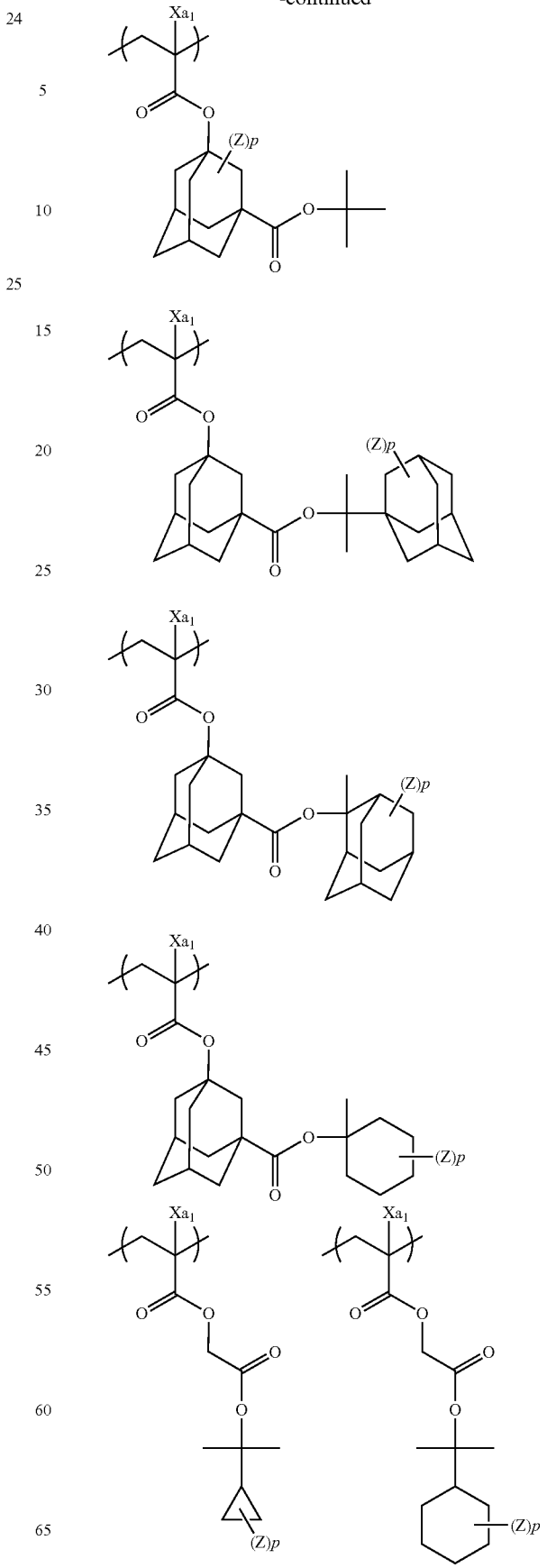

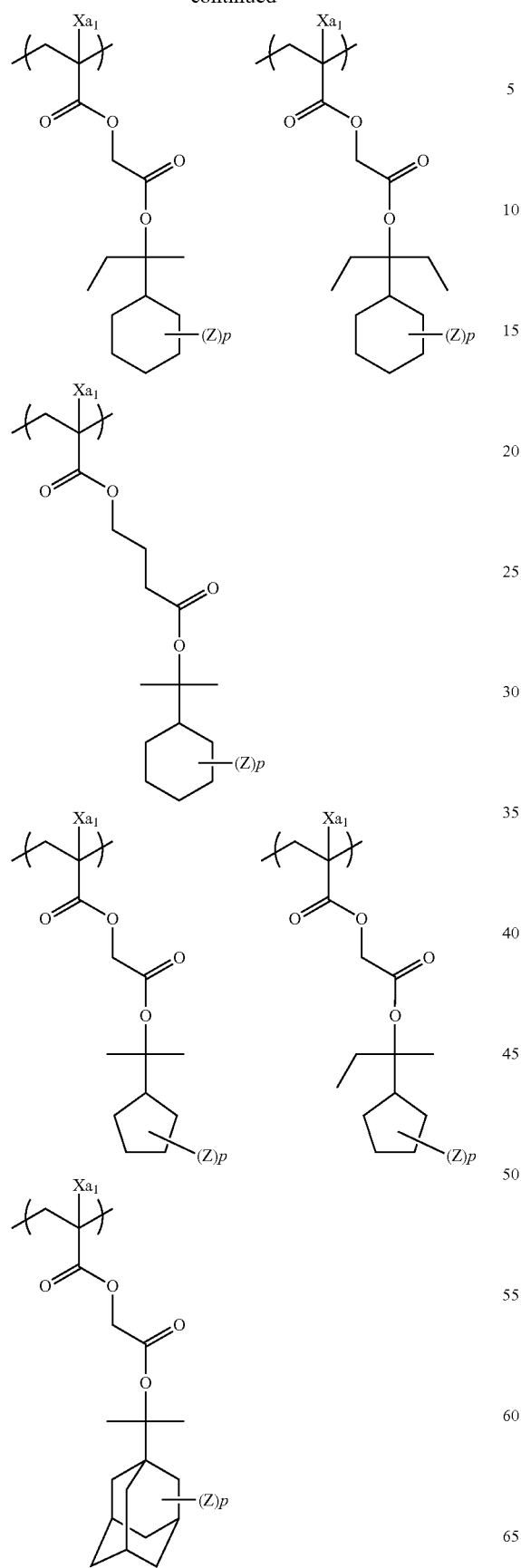
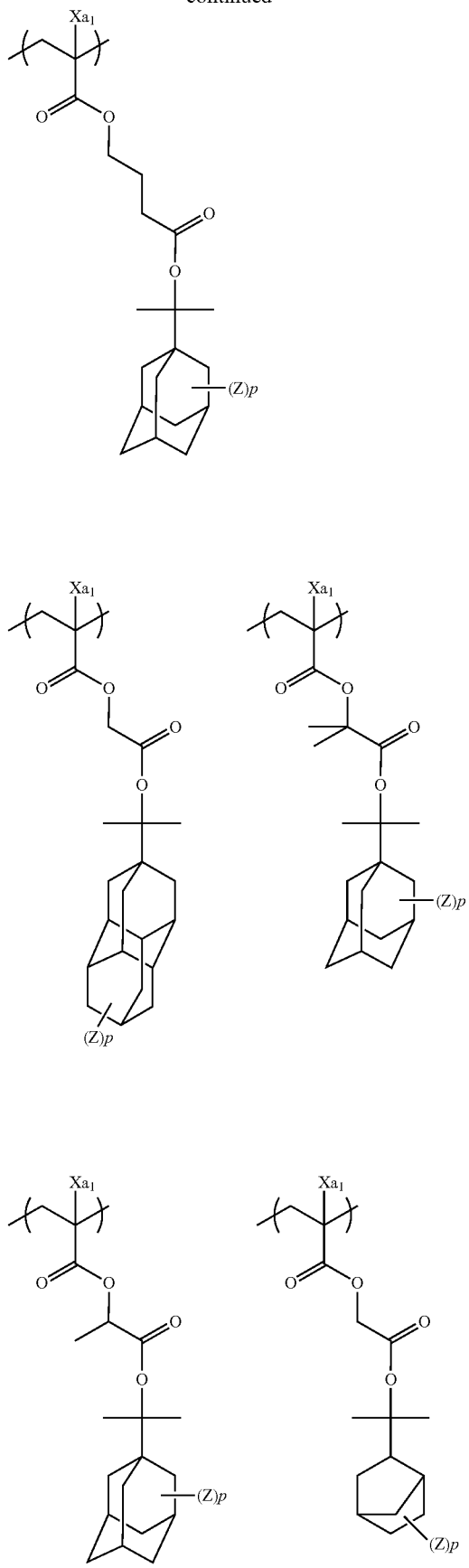

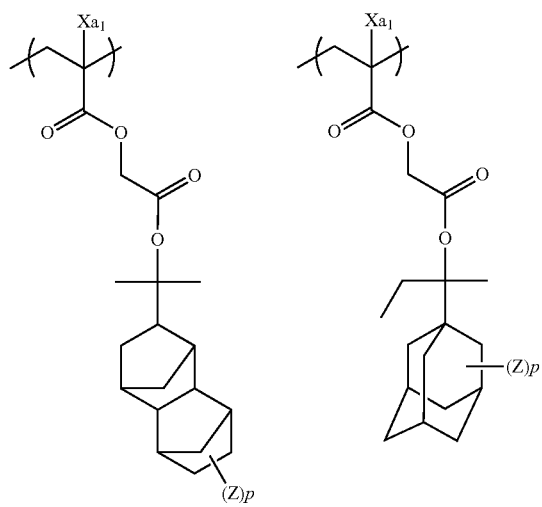
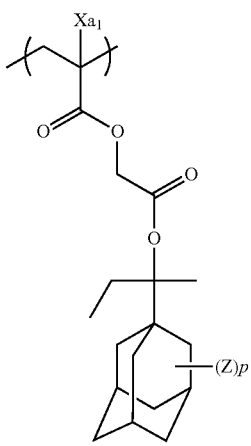
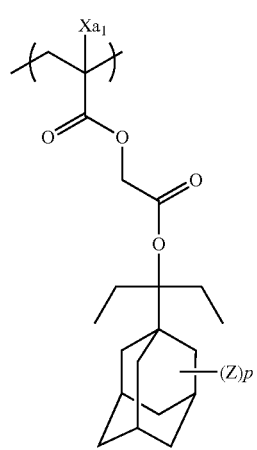
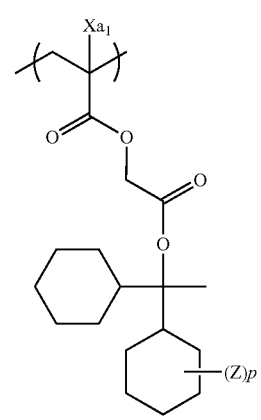
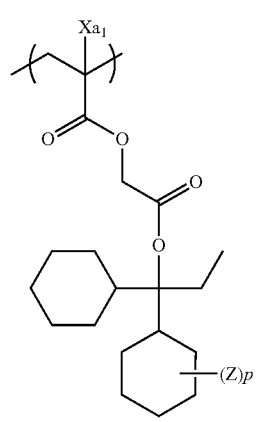
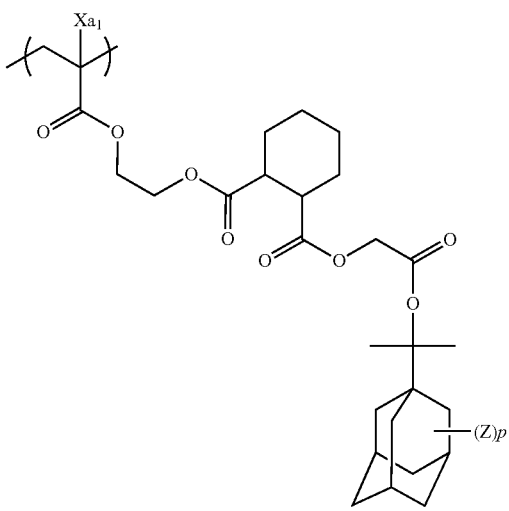
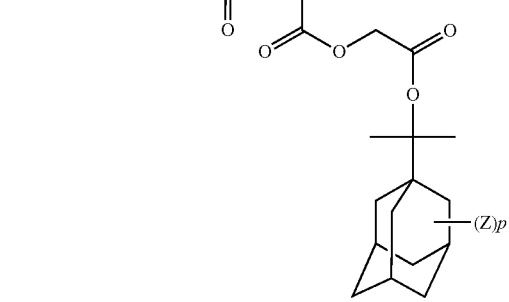
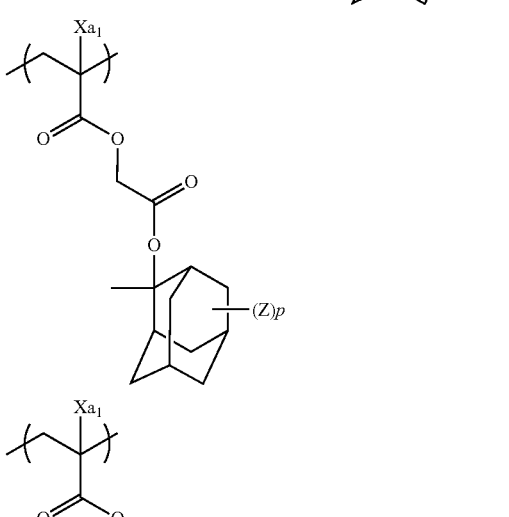
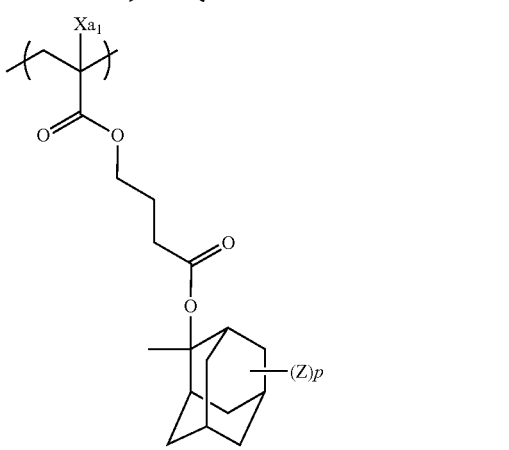
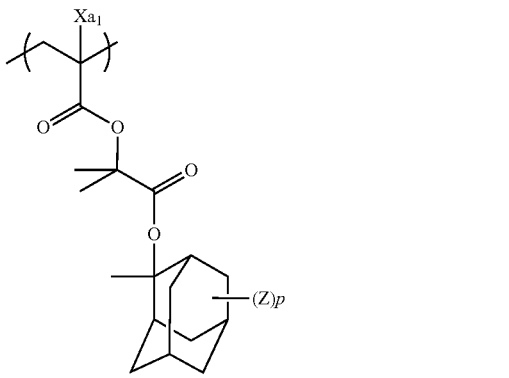

81
-continued
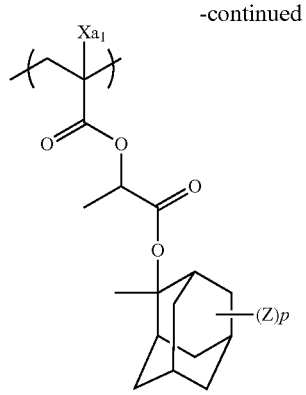
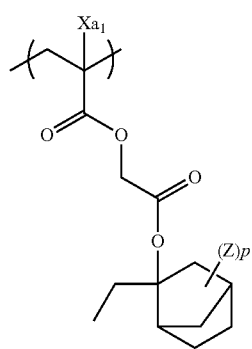
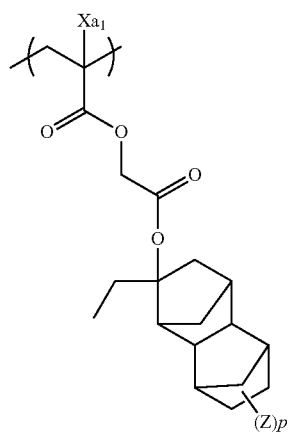
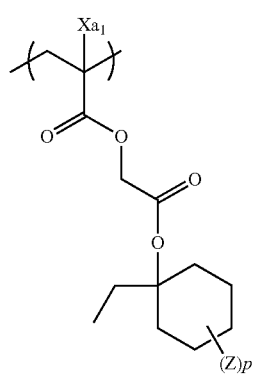
82
-continued
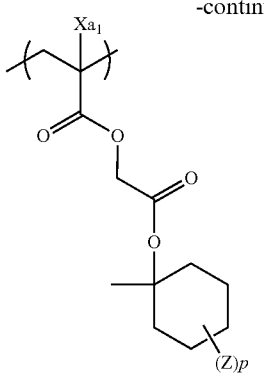
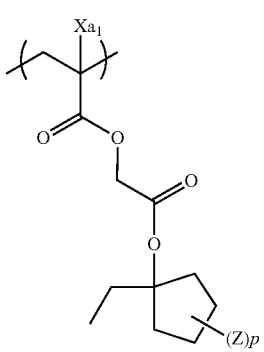
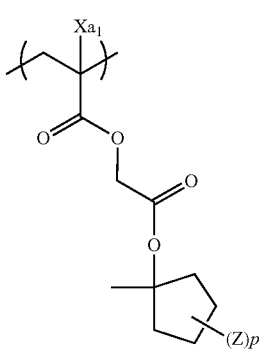
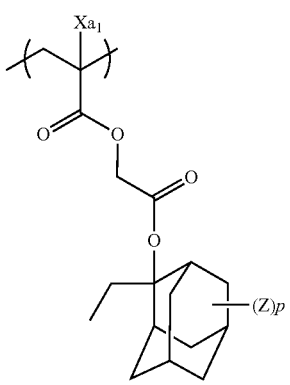

-continued

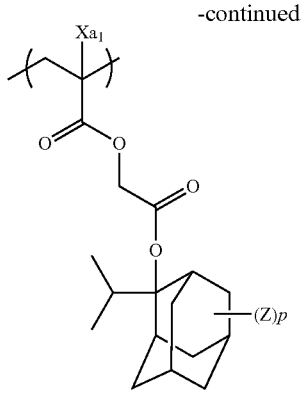

The resin (B) is more preferably a resin containing, as the repeating unit represented by formula (AI), at least either a repeating unit represented by formula (I) or a repeating unit represented by formula (II).

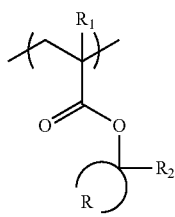

(I)

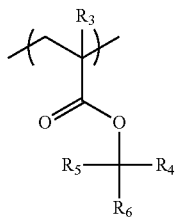

(II)

In formulae (I) and (II), each of $R_1$ and $R_3$ independently represents a hydrogen atom, a methyl group which may have a substituent, or a group represented by —$CH_2$—$R_9$. $R_9$ represents a hydroxyl group or a monovalent organic group.

Each of $R_2$, $R_4$, $R_5$ and $R_6$ independently represents an alkyl group or a cycloalkyl group.

R represents an atomic group necessary for forming an alicyclic structure together with the carbon atom.

Each of $R_1$ and $R_3$ is preferably a hydrogen atom, a methyl group, a trifluoromethyl group or a hydroxymethyl group. Specific examples and preferred examples of the monovalent organic group in $R_9$ are the same as those described for $R_9$ in formula (AI).

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having a carbon number of 1 to 10, still more preferably an alkyl group having a carbon number of 1 to 5, and examples thereof include a methyl group and an ethyl group.

R represents an atomic group necessary for forming an alicyclic structure together with the carbon atom. The alicyclic structure formed by R is preferably a monocyclic alicyclic structure, and the carbon number thereof is preferably from 3 to 7, more preferably 5 or 6.

The alkyl group in $R_4$, $R_5$ and $R_6$ may be linear or branched and may have a substituent. The alkyl group is preferably an alkyl group having a carbon number of 1 to 4, such as methyl group, ethyl group, n-propyl group, isopropyl group, n-butyl group, isobutyl group and tert-butyl group.

The cycloalkyl group in $R_4$, $R_5$ and $R_6$ may be monocyclic or polycyclic and may have a substituent. The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

Examples of the substituent which the alkyl group of $R_2$, $R_4$, $R_5$ and $R_6$ may further have include an aryl group (e.g., phenyl group, naphthyl group), an aralkyl group, a hydroxyl group, an alkoxy group (e.g., methoxy group, ethoxy group, butoxy group, octyloxy group, dodecyloxy group), an acyl group (e.g., acetyl group, propanoyl group, benzoyl group), and an oxo group, and the carbon number of the substituent is preferably 15 or less.

Examples of the substituent which the cycloalkyl group of $R_2$, $R_4$, $R_5$ and $R_6$ may further have include an alkyl group (e.g., methyl group, ethyl group, propyl group, isopropyl group, butyl group, tert-butyl group, hexyl group) and the groups described above as the substituent which the alkyl group of $R_2$ may further have, and the carbon number of the substituent is preferably 15 or less.

The repeating unit represented by formula (I) includes, for example, a repeating unit represented by the following formula (1-a):

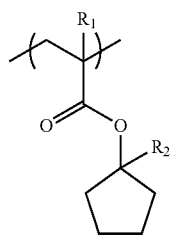

(1-a)

In the formula, $R_1$ and $R_2$ have the same meanings as those in formula (I).

The repeating unit represented by formula (II) is preferably a repeating unit represented by the following formula (II-1):

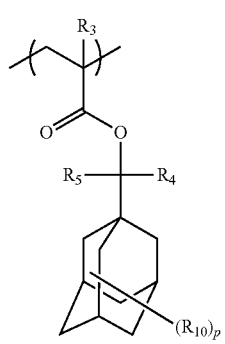

(II-1)

In formula (II-1), $R_3$ to $R_5$ have the same meanings as those in formula (II).

$R_{10}$ represents a polar group-containing substituent. In the case where a plurality of $R_{10}$'s are present, these may be the same or different. Examples of the polar group-containing substituent include a hydroxyl group, a cyano group, an amino group, an alkylamide group, a sulfonamide group itself, and a linear or branched alkyl group or cycloalkyl group having at least one of the groups above. An alkyl group having a hydroxyl group is preferred, and a branched alkyl group having a hydroxyl group is more preferred. The branched alkyl group is preferably an isopropyl group.

p represents an integer of 0 to 15. p is preferably an integer of 0 to 2, more preferably 0 or 1.

The resin (B) is preferably a resin containing, as the repeating unit represented by formula (AI), at least either a repeating unit represented by formula (I) or a repeating unit represented by formula (II). In another embodiment, the resin is preferably a resin containing, as the repeating unit represented by formula (AI), at least two kinds of repeating units represented by formula (I).

As for the acid decomposable group-containing repeating unit of the resin (B), one kind of a repeating unit may be used, or two or more kinds of repeating units may be used in combination.

In the case of using the repeating units in combination, preferred examples of the combination are illustrated below. In the formulae below, each R independently represents a hydrogen atom or a methyl group.

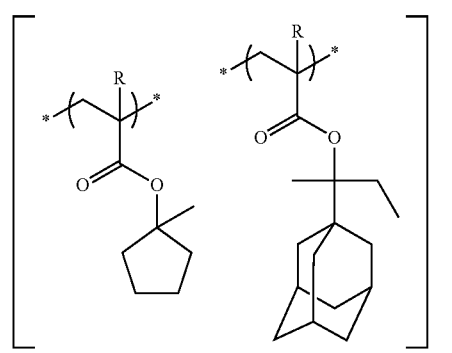

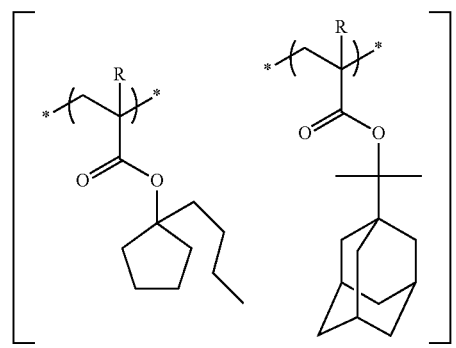

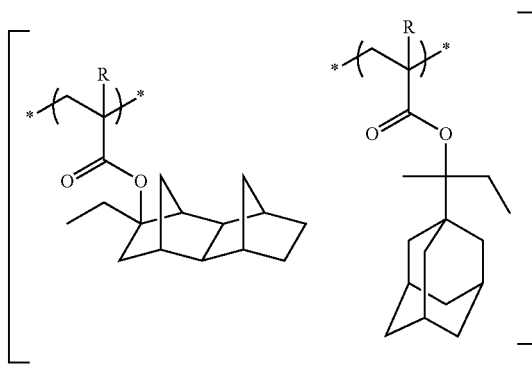

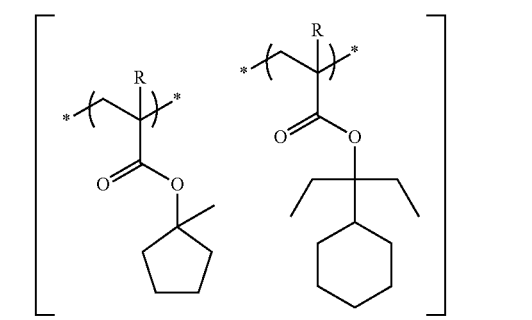

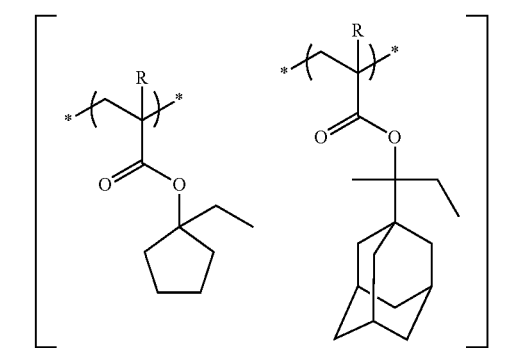

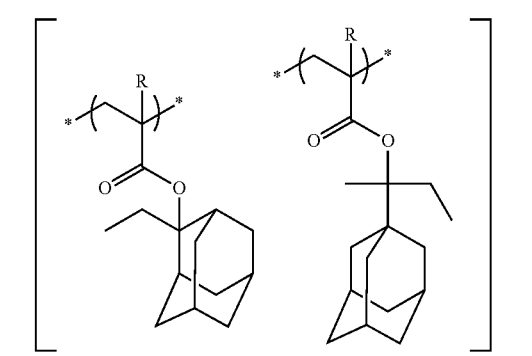

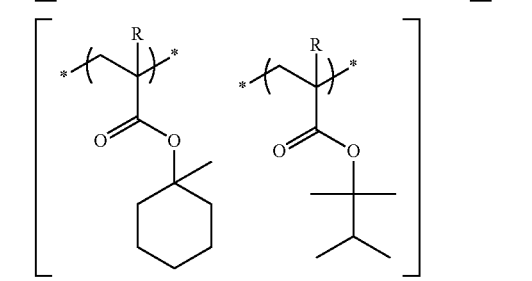

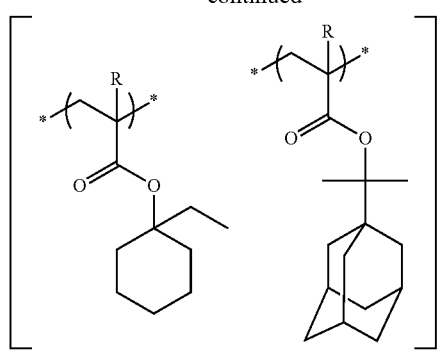
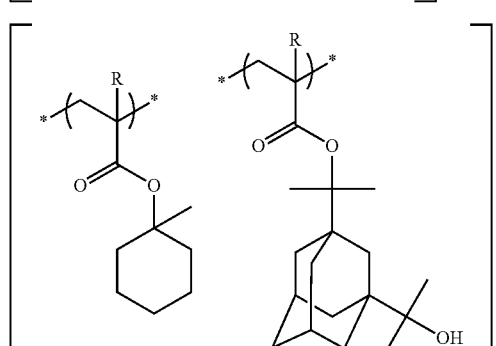
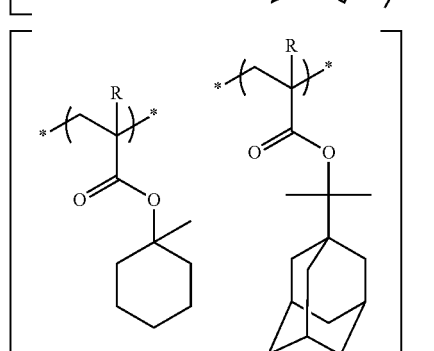
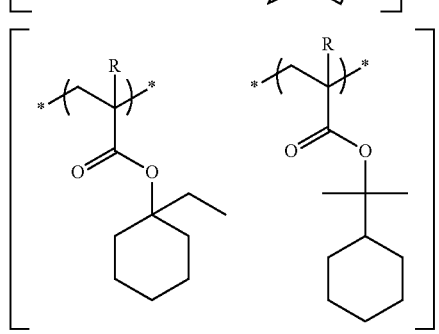
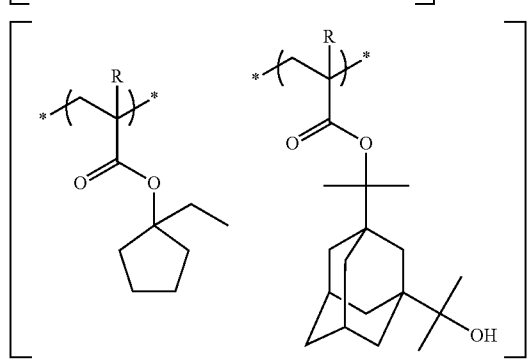
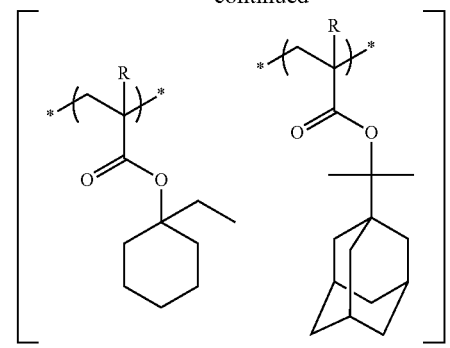
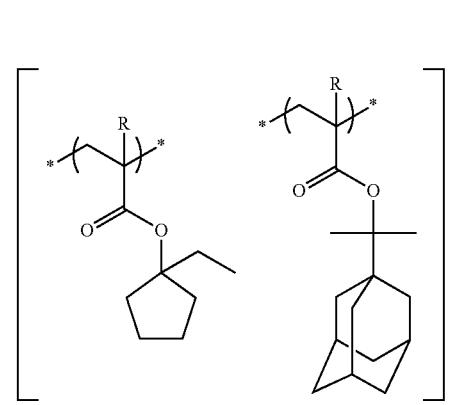
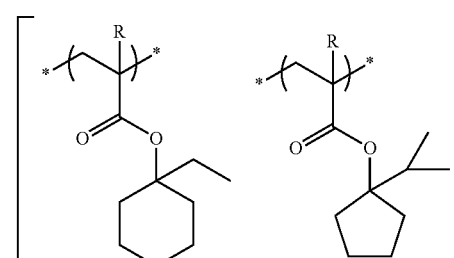
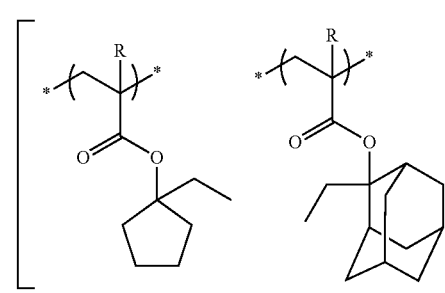
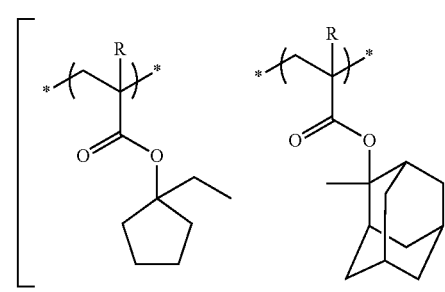

-continued

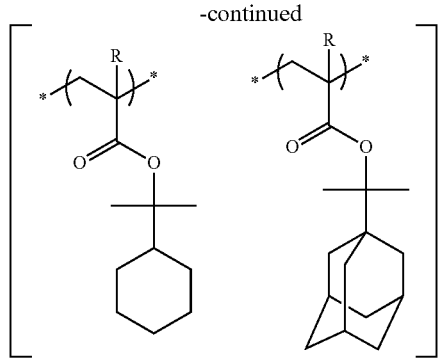

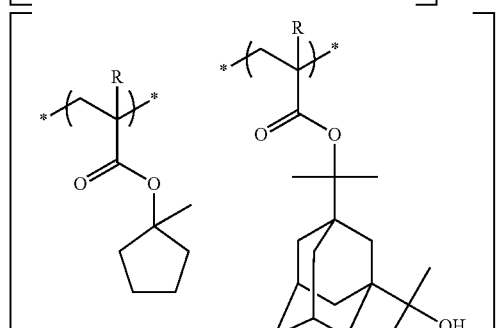

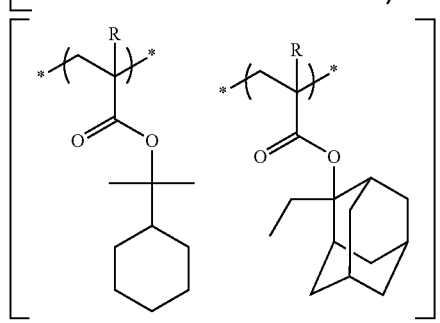

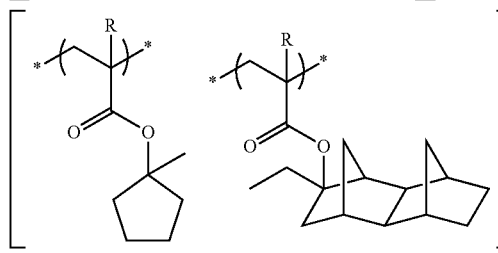

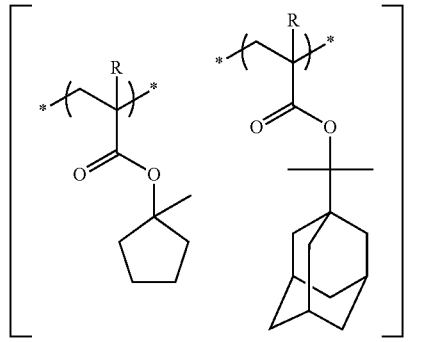

It is also preferred that the resin (B) contains a repeating unit having lactone structure.

As for the lactone structure, any repeating unit may be used as long as it has a lactone structure, but a 5- to 7-membered ring lactone structure is preferred, and a structure where another ring structure is fused to a 5- to 7-membered ring lactone structure in the form of forming a bicyclo or spiro structure is more preferred. The resin more preferably contains a repeating unit having a lactone structure represented by any one of the following formulae (LC1-1) to (LC1-17). The lactone structure may be bonded directly to the main chain. Preferred lactone structures are (LC1-1), (LC1-4), (LC1-5), (LC1-6), (LC1-13), (LC1-14) and (LC1-17), with a lactone structure of (LC1-4) being more preferred. By using such a specific lactone structure, LWR and development defect are improved.

LC1-1

LC1-2

LC1-3

LC1-4

LC1-5

LC1-6

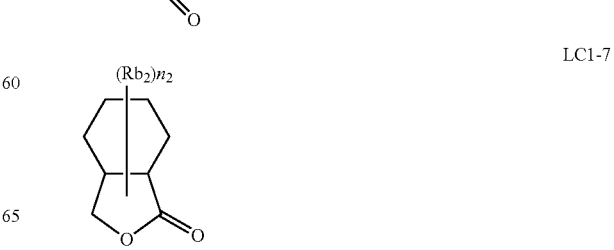

LC1-7

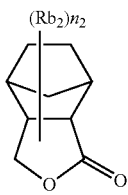
LC1-8

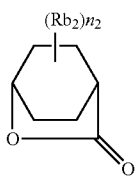
LC1-9

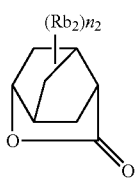
LC1-10

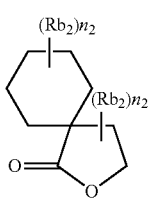
LC1-11

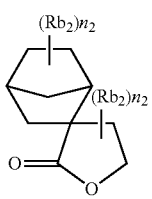
LC1-12

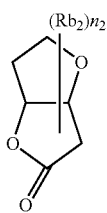
LC1-13

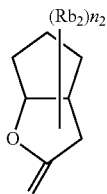
LC1-14

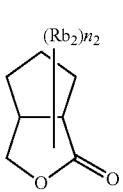
LC1-15

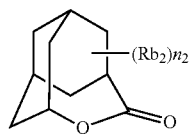
LC1-16

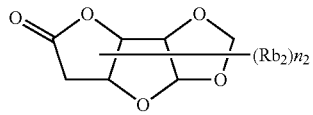
LC1-17

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are preferred. $n_2$ represents an integer of 0 to 4. When $n_2$ is 2 or more, each substituent ($Rb_2$) may be the same as or different from every other substituent $Rb_2$. Also, in this case, the plurality of substituents ($Rb_2$) may combine with each other to form a ring.

The repeating unit having a lactone group usually has an optical isomer, but any optical isomer may be used. One optical isomer may be used alone or a mixture of a plurality of optical isomers may be used. In the case of mainly using one optical isomer, the optical purity (ee) thereof is preferably 90% or more, more preferably 95% or more.

The repeating unit having a lactone structure is preferably a repeating unit represented by the following formula (AII):

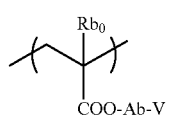

(AII)

In formula (AII), $Rb_0$ represents a hydrogen atom, a halogen atom, or an alkyl group having a carbon number of 1 to 4, which may have a substituent. Preferred examples of the substituent that may be substituted on the alkyl group of $Rb_0$ include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic alicyclic hydrocarbon structure, an ether bond, an ester bond, a carbonyl group, or a divalent linking group formed by a combination thereof and is preferably a single bond or a divalent linking group represented by -$Ab_1$-$CO_2$—.

$Ab_1$ represents a linear or branched alkylene group or a monocyclic or polycyclic cycloalkylene group and is preferably a methylene group, an ethylene group, a cyclohexylene group, an adamantylene group or a norbornylene group.

V represents a group having a lactone structure and specifically includes, for example, a group having a structure represented by any one of formulae (LC1-1) to (LC1-17).

Specific examples of the repeating unit having a lactone structure are illustrated below, but the present invention is not limited thereto.
(In the formulae, Rx represents H, CH$_3$, CH$_2$OH or CF$_3$.)
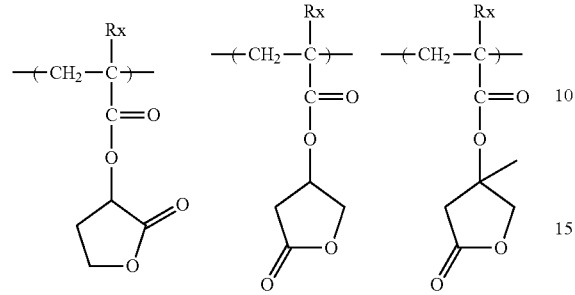
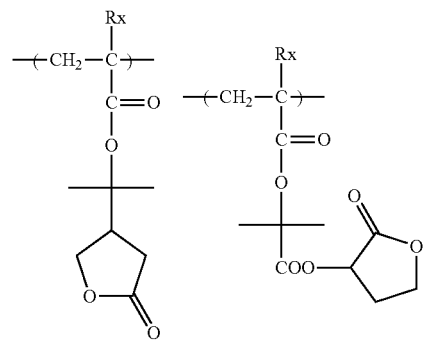
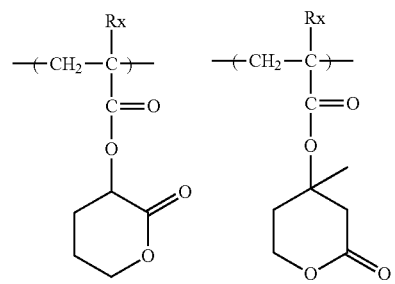
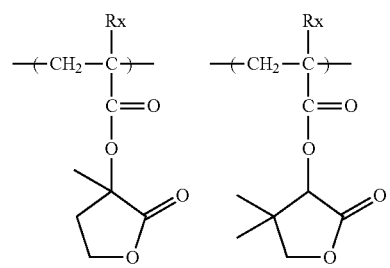
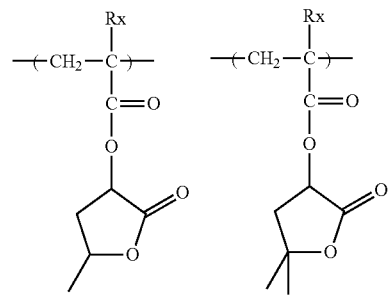
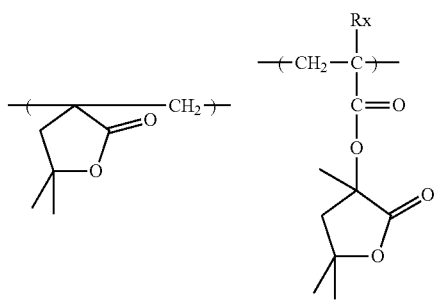
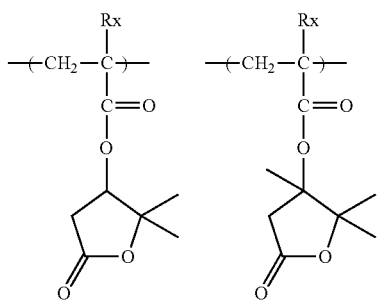
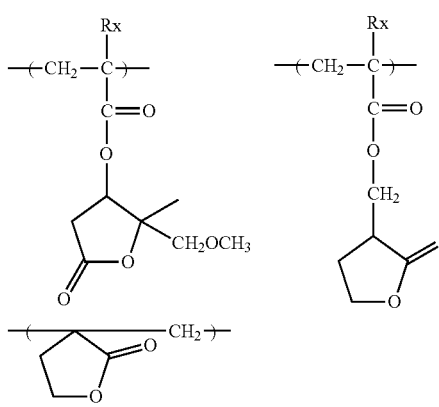
(In the formulae, Rx represents H, CH$_3$, CH$_2$OH or CF$_3$.)
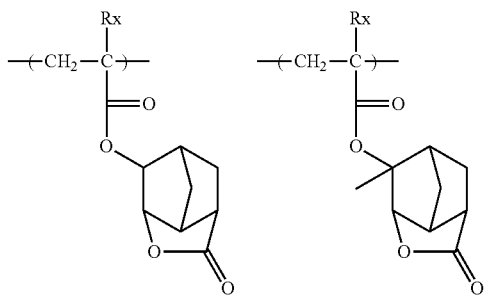
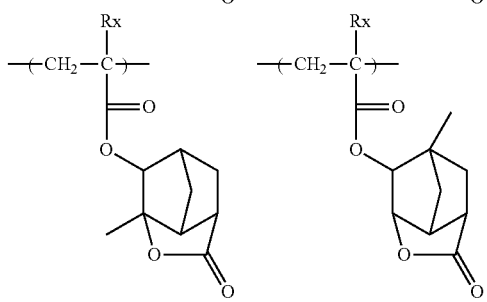

95
-continued
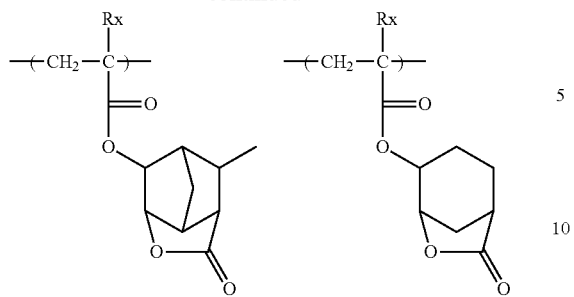
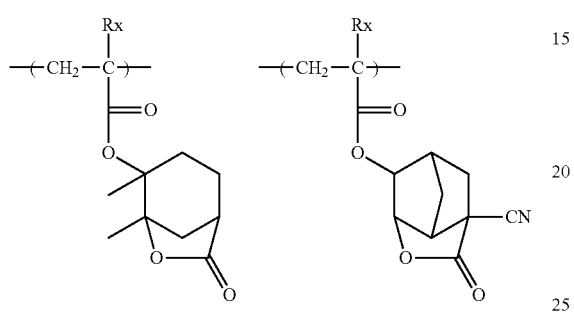
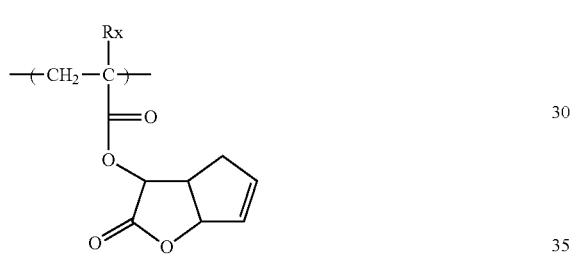
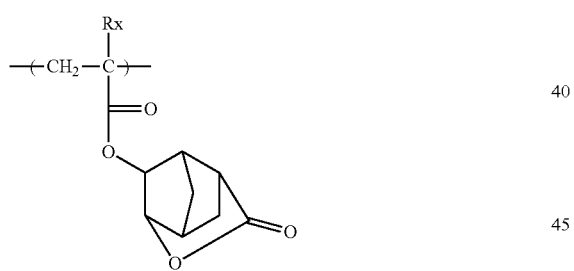
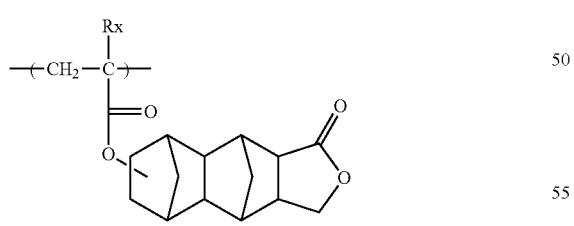
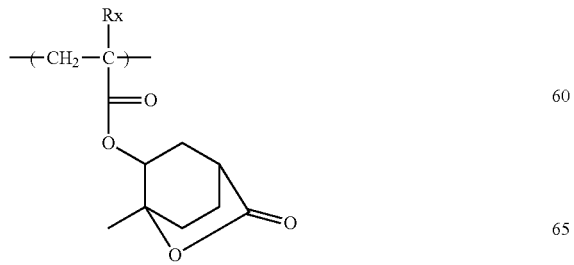
96
-continued
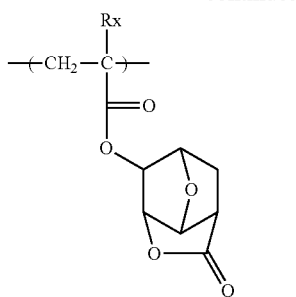
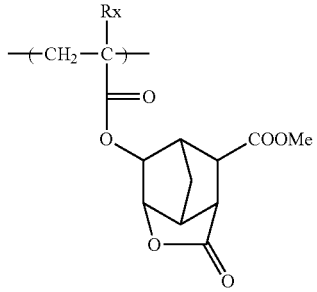
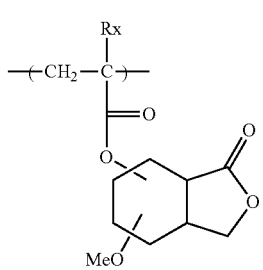
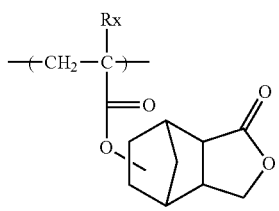
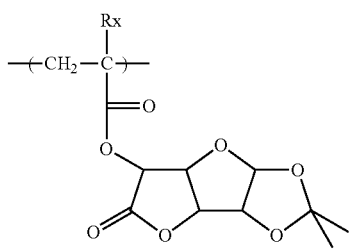
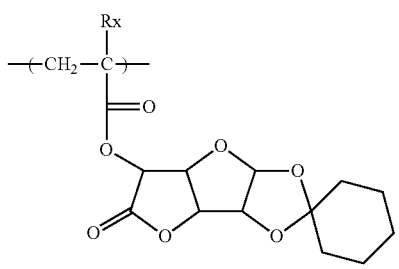

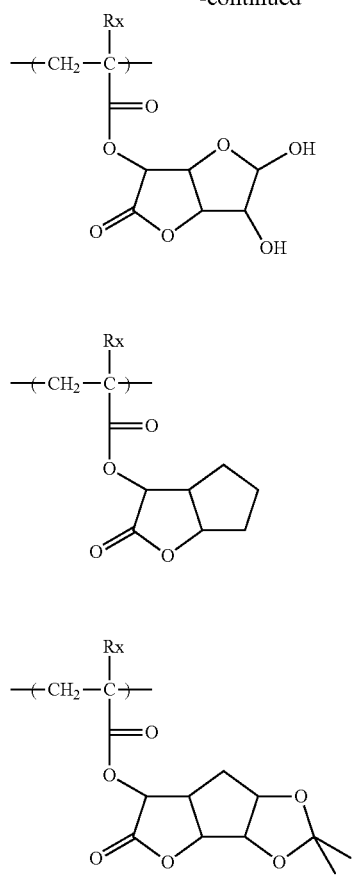
(In the formulae, Rx represents H, CH₃, CH₂OH or CF₃.)
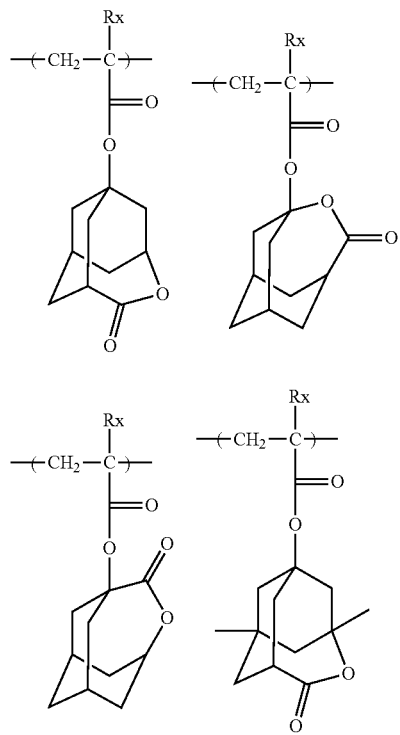
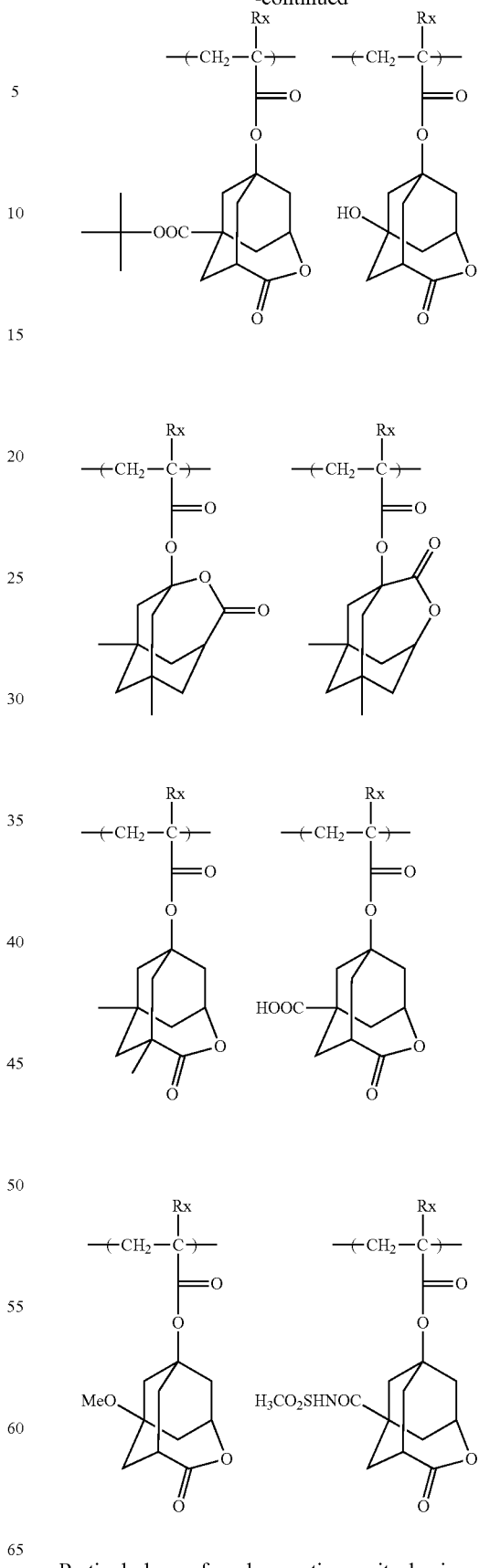
Particularly preferred repeating units having a lactone structure include the following repeating units. By selecting an optimal lactone structure, the pattern profile and the iso/dense bias are improved.

(In the formulae, Rx represents H, CH$_3$, CH$_2$OH or CF$_3$.)

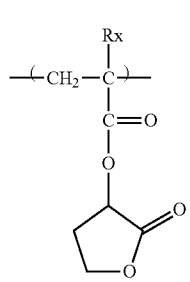
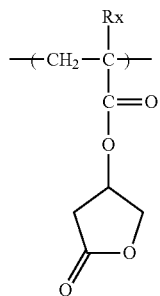
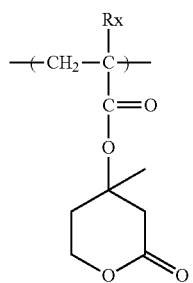
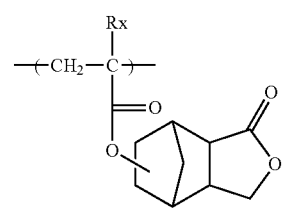
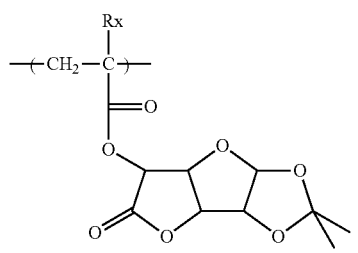
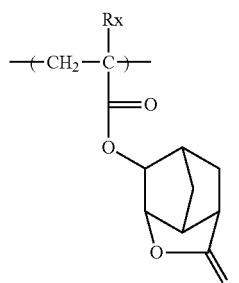
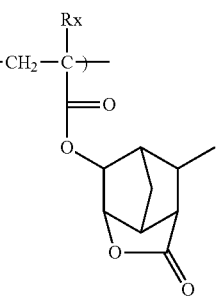
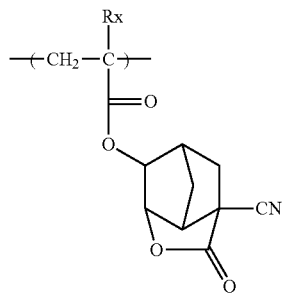
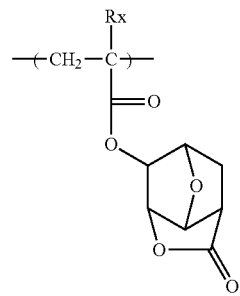

-continued

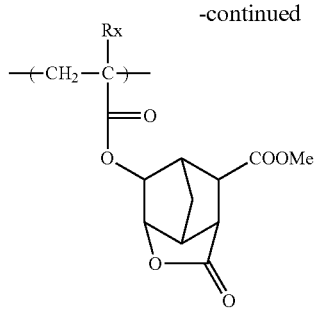
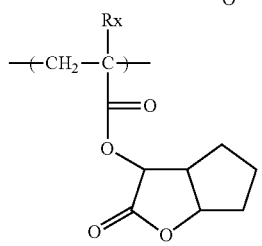

The repeating unit having a lactone structure is preferably a unit represented by the following formula (III):

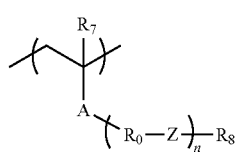

(III)

In formula (III), A represents an ester bond (a group represented by —COO—) or an amido bond (a group represented by —CONH—).

R$_0$ represents, when a plurality of R$_0$'s are present, each independently represents, an alkylene group, a cycloalkylene group or a combination thereof.

Z represents, when a plurality of Z's are present, each independently represents, an ether bond, an ester bond, an amide bond, a urethane bond
(a group represented by

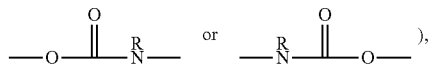

or a urea bond
(a group represented by

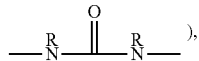

wherein each R independently represents a hydrogen atom, an alkyl group, a cycloalkyl group or an aryl group.

R$_8$ represents a monovalent organic group having a lactone structure.

n is the repetition number of the structure represented by —R$_0$—Z— and represents an integer of 1 to 5, preferably 1.

R$_7$ represents a hydrogen atom, a halogen atom or an alkyl group.

The alkylene group and cycloalkylene group of R$_0$ may have a substituent.

Z is preferably an ether bond or an ester bond, more preferably an ester bond.

The alkyl group of $R_7$ is preferably an alkyl group having a carbon number of 1 to 4, more preferably a methyl group or an ethyl group, still more preferably a methyl group.

The alkyl group in the alkylene group and cycloalkylene group of $R_0$ and in $R_7$ may be substituted, and examples of the substituent include a halogen atom such as fluorine atom, chlorine atom and bromine atom, a mercapto group, a hydroxyl group, an alkoxy group such as methoxy group, ethoxy group, isopropoxy group, tert-butoxy group and benzyloxy group, and an acyloxy group such as acetyloxy group and propionyloxy group.

$R_7$ is preferably a hydrogen atom, a methyl group, a trifluoromethyl group or a hydroxymethyl group.

The chain alkylene group in $R_0$ is preferably a chain alkylene group having a carbon number of 1 to 10, more preferably a carbon number of 1 to 5, and examples thereof include a methylene group, an ethylene group and a propylene group. The cycloalkylene group is preferably a cycloalkylene group having a carbon number of 3 to 20, and examples thereof include a cyclohexylene group, a cyclopentylene group, a norbornylene group and an adamantylene group. For bringing out the effects of the present invention, a chain alkylene group is more preferred, and a methylene group is still more preferred.

The lactone structure-containing monovalent organic group represented by $R_8$ is not limited as long as it has a lactone structure. Specific examples thereof include lactone structures represented by formulae (LC1-1) to (LC1-17) and among these, a structure represented by (LC1-4) is preferred. Also, structures where $n_2$ in (LC1-1) to (LC1-17) is an integer of 2 or less are more preferred.

$R_8$ is preferably a monovalent organic group having an unsubstituted lactone structure or a monovalent organic group having a lactone structure containing a methyl group, a cyano group or an alkoxycarbonyl group as the substituent, more preferably a monovalent organic group having a lactone structure containing a cyano group as the substituent (cyanolactone).

Specific examples of the repeating unit containing a group having a lactone structure represented by formula (III) are illustrated below, but the present invention is not limited thereto.

In specific examples, R represents a hydrogen atom, an alkyl group which may have a substituent, or a halogen atom, preferably a hydrogen atom, a methyl group, a hydroxymethyl group or an acetyloxymethyl group.

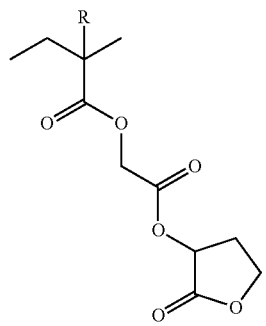

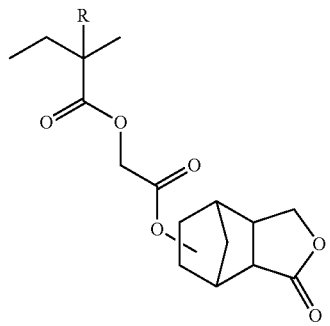

-continued

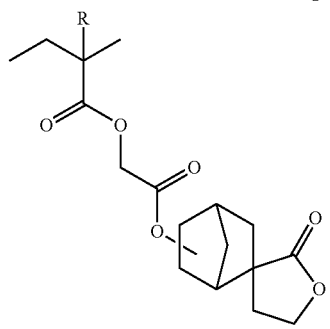

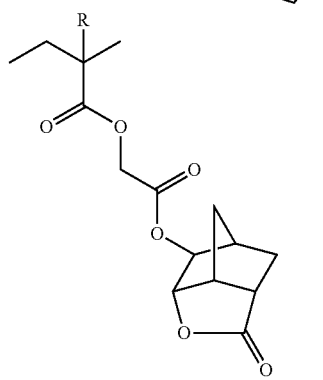

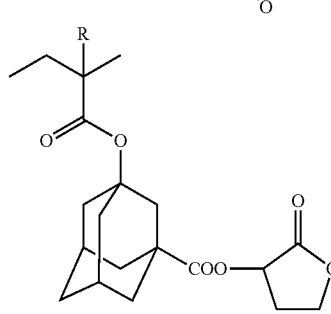

The repeating unit having a lactone structure is more preferably a repeating unit represented by the following formula (III-1):

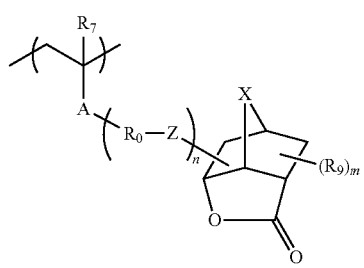

(III-1)

In formula (III-1), $R_7$, A, $R_0$, Z and n have the same meanings as in formula (III).

$R_9$ represents, when a plurality of $R_9$'s are present, each independently represents, an alkyl group, a cycloalkyl group, an alkoxycarbonyl group, a cyano group, a hydroxyl group or an alkoxy group, and when a plurality of $R_9$'s are present, two members thereof may combine to form a ring.

X represents an alkylene group, an oxygen atom or a sulfur atom.

m is the number of substituents and represents an integer of 0 to 5. m is preferably 0 or 1.

The alkyl group of $R_9$ is preferably an alkyl group having a carbon number of 1 to 4, more preferably a methyl group or an ethyl group, and most preferably a methyl group. Examples of the cycloalkyl group include a cyclopropyl group, a cyclobutyl group, a cyclopentyl group and a cyclohexyl group. Examples of the alkoxycarbonyl group include a methoxycarbonyl group, an ethoxycarbonyl group, an n-butoxycarbonyl group and a tert-butoxycarbonyl group. Examples of the alkoxy group include a methoxy group, an ethoxy group, a propoxy group, an isopropoxy group and a butoxy group. These groups may have a substituent, and the substituent includes a hydroxyl group, an alkoxy group such as methoxy group and ethoxy group, a cyano group, and a halogen atom such as fluorine atom. $R_9$ is preferably a methyl group, a cyano group or an alkoxycarbonyl group, more preferably a cyano group.

Examples of the alkylene group of X include a methylene group and an ethylene group. X is preferably an oxygen atom or a methylene group, more preferably a methylene group.

When m is 1 or more, at least one $R_9$ is preferably substituted on the α- or β-position, more preferably the α-position, of the carbonyl group of lactone.

Specific examples of the repeating unit having a lactone structure-containing group represented by formula (III-1) are illustrated below, but the present invention is not limited thereto. In specific examples, R represents a hydrogen atom, an alkyl group which may have a substituent, or a halogen atom, preferably a hydrogen atom, a methyl group, a hydroxymethyl group or an acetyloxymethyl group.

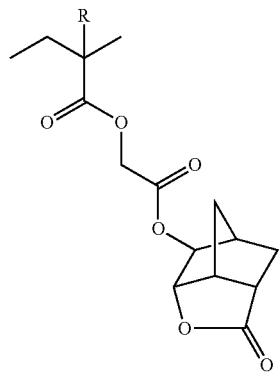

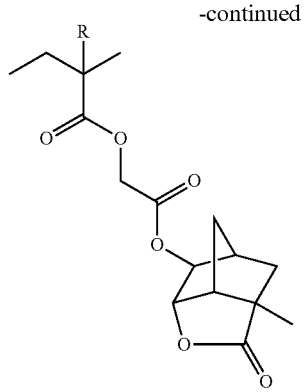

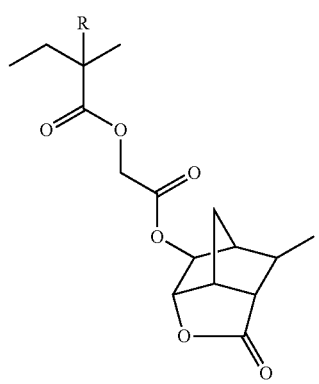

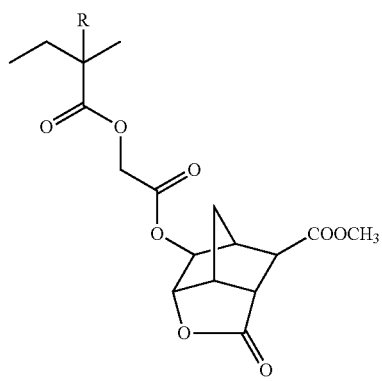

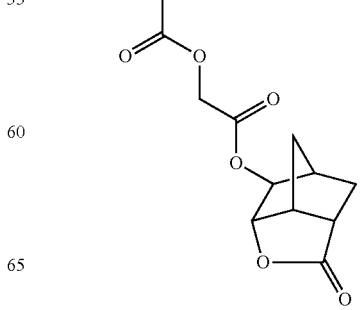

105
-continued
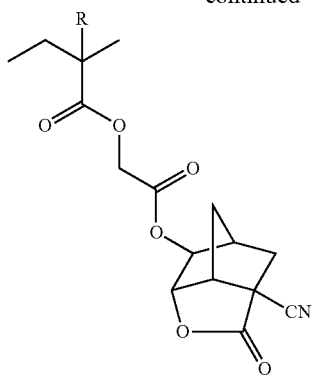
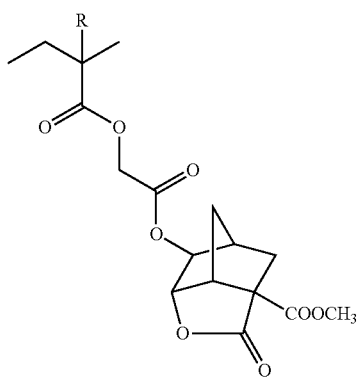
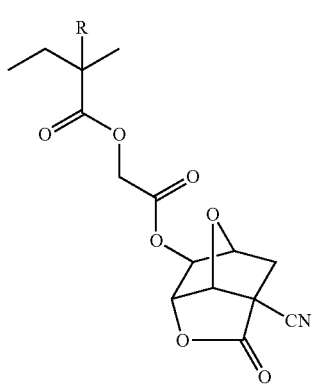
106
-continued
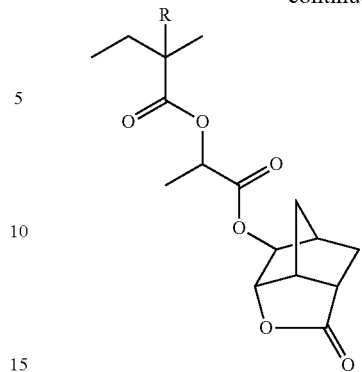
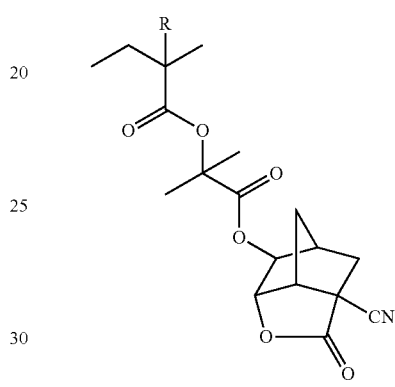
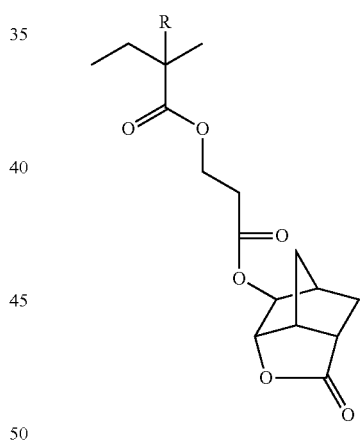
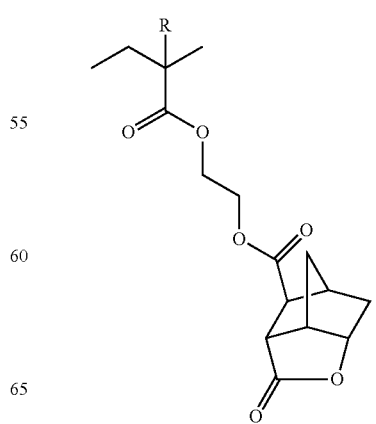

107
-continued
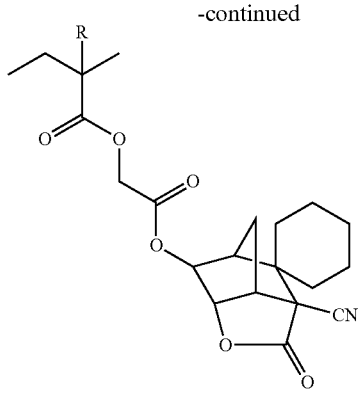
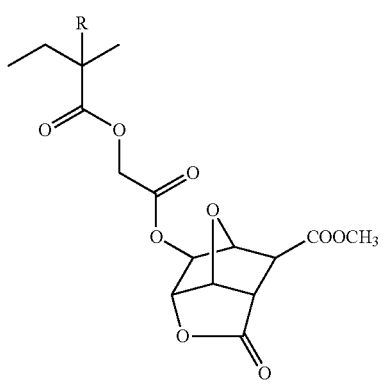
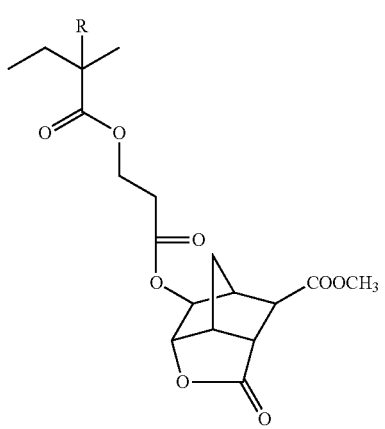
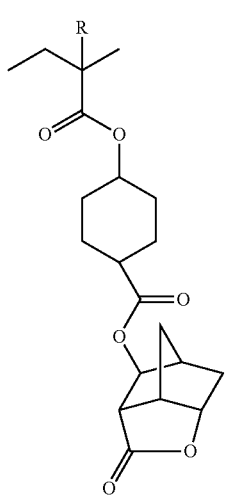
108
-continued
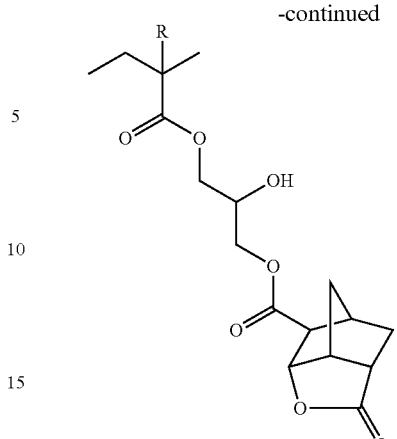
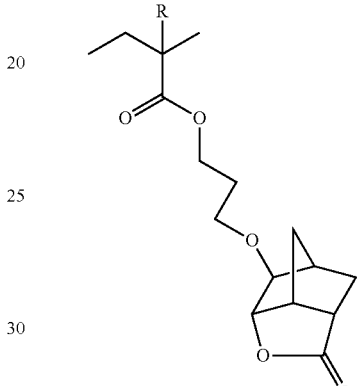
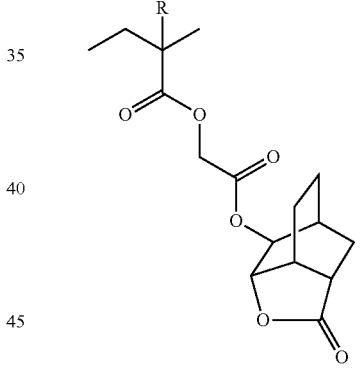
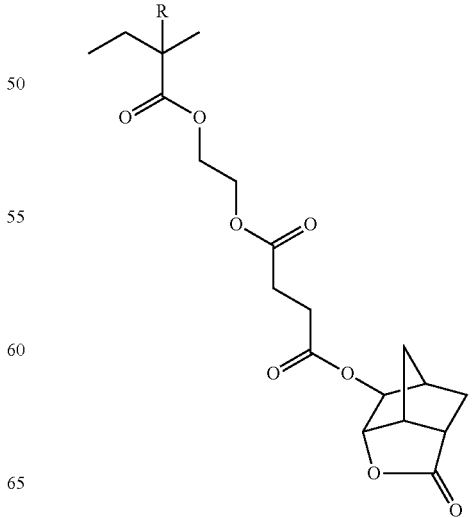

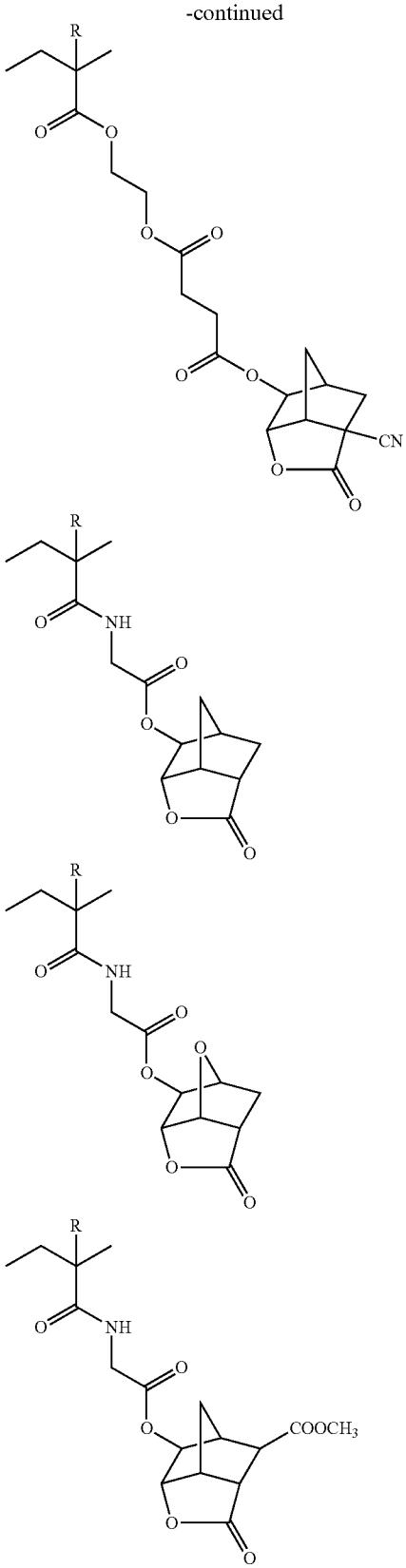

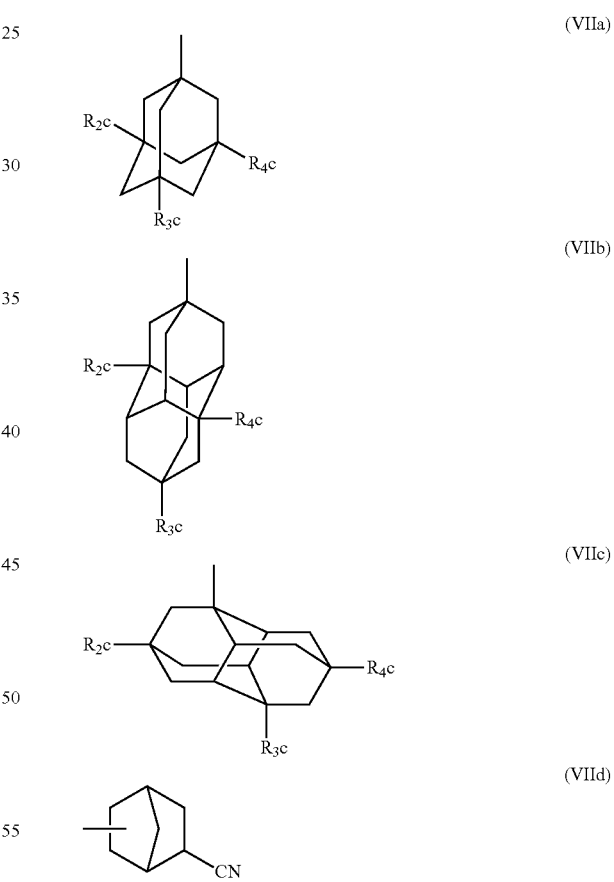

repeating units in combination, it is also preferred that out of formula (III), two or more kinds of lactone repeating units where n is 1 are selected and used in combination.

The content of the repeating unit having a lactone group is preferably from 15 to 60 mol %, more preferably from 20 to 55 mol %, still more preferably from 30 to 55 mol %, based on all repeating units in the resin (B).

The resin (B) preferably contains a repeating unit having a hydroxyl group or a cyano group, other than formulae (AI) and (III). Thanks to this repeating unit, the adherence to substrate and affinity for developer are enhanced. The repeating unit having a hydroxyl group or a cyano group is preferably a repeating unit having an alicyclic hydrocarbon structure substituted with a hydroxyl group or a cyano group and preferably has no acid-decomposable group. The alicyclic hydrocarbon structure in the alicyclic hydrocarbon structure substituted with a hydroxyl group or a cyano group is preferably an adamantyl group, a diamantyl group or a norbornane group. The alicyclic hydrocarbon structure substituted with a hydroxyl group or a cyano group is preferably a partial structure represented by the following formulae (VIIa) to (VIId):

Two or more kinds of lactone structure-containing repeating units may be also used in combination for increasing the effects of the present invention. In the case of using the In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by formulae (VIIa) to (VIId) includes repeating units represented by the following formulae (AIIa) to (AIId):

(AIIa)
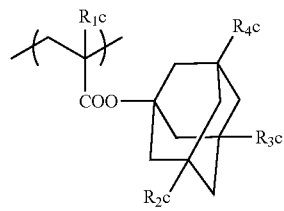

(AIIb)
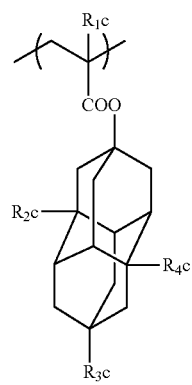

(AIIc)
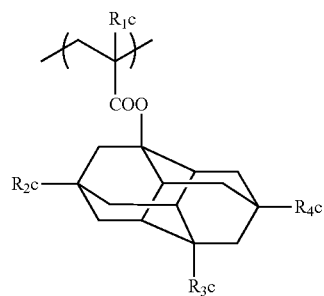

(AIId)
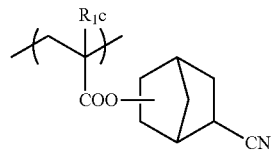

In formulae (AIIa) to (AIId), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

The content of the repeating unit having a hydroxyl group or a cyano group is preferably from 5 to 45 mol %, more preferably from 5 to 40 mol %, still more preferably from 5 to 35 mol %, based on all repeating units in the resin (B).

Specific examples of the repeating unit having a hydroxyl group or a cyano group are illustrated below, but the present invention is not limited thereto.

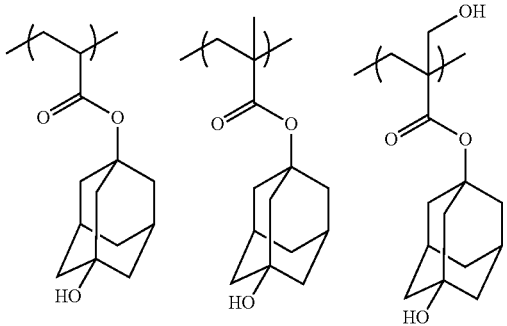

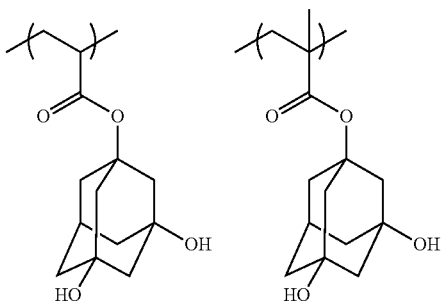

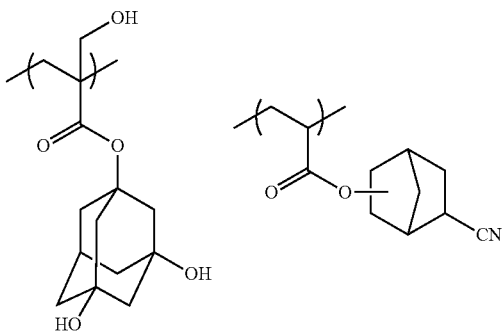

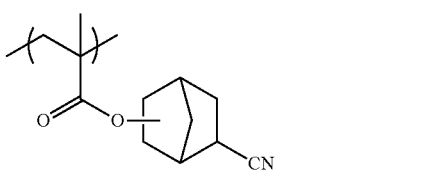

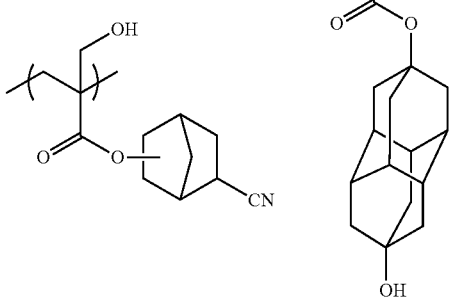

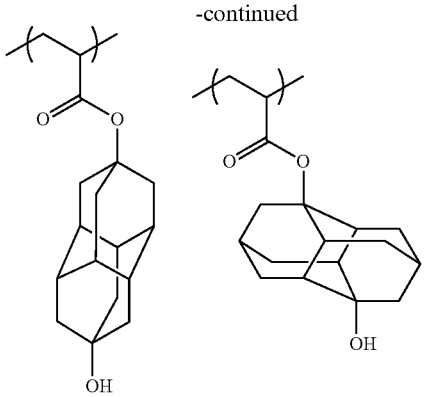

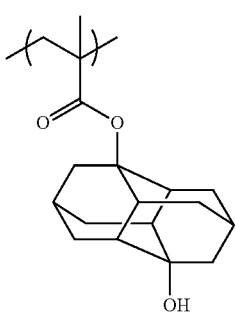

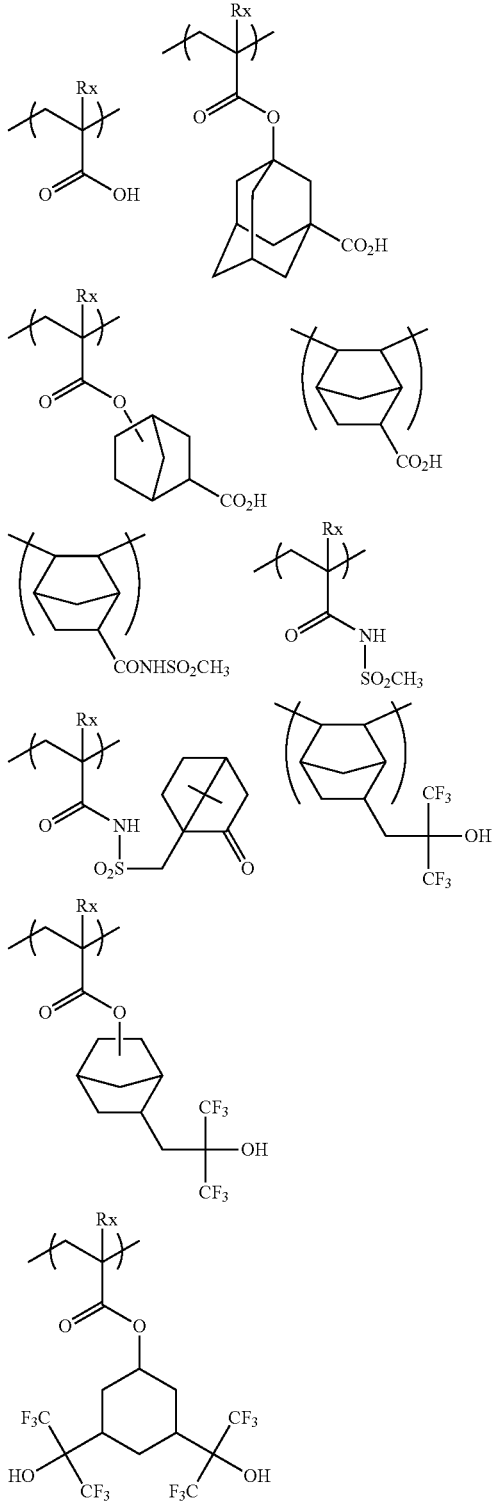

The resin (B) may contain a repeating unit having an alkali-soluble group. The alkali-soluble group includes a carboxyl group, a sulfonamide group, a sulfonylimide group, a bissulfonylimide group, and an aliphatic alcohol substituted with an electron-withdrawing group at the α-position (for example, hexafluoroisopropanol group), and a repeating unit having a carboxyl group is preferred. By virtue of containing a repeating unit having an alkali-soluble group, the resolution increases in the usage of forming contact holes. As for the repeating unit having an alkali-soluble group, all of a repeating unit where an alkali-soluble group is directly bonded to the main chain of the resin, such as repeating unit by an acrylic acid or a methacrylic acid, a repeating unit where an alkali-soluble group is bonded to the main chain of the resin through a linking group, and a repeating unit where an alkali-soluble group is introduced into the polymer chain terminal by using an alkali-soluble group-containing polymerization initiator or chain transfer agent at the polymerization, are preferred. The linking group may have a monocyclic or polycyclic cyclohydrocarbon structure. In particular, a repeating unit by an acrylic acid or a methacrylic acid is preferred.

The resin (B) may or may not contain a repeating unit having an alkali-soluble group, but in the case of containing a repeating unit having an alkali-soluble group, the content thereof is preferably from 1 to 20 mol %, more preferably from 3 to 15 mol %, still more preferably from 5 to 10 mol %, based on all repeating units in the resin (B).

Specific examples of the repeating unit having an alkali-soluble group are illustrated below, but the present invention is not limited thereto.

In specific examples, Rx represents H, $CH_3$, $CH_2OH$ or $CF_3$.

The resin (B) for use in the present invention may further contain a repeating unit having an alicyclic hydrocarbon structure free from a polar group (for example, the above-described alkali-soluble group, a hydroxyl group or a cyano group) and not exhibiting acid decomposability. Such a repeating unit includes a repeating unit represented by formula (IV):

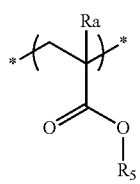
(IV)

In formula (IV), $R_5$ represents a hydrocarbon group having at least one cyclic structure and having no polar group.

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.0$^{2,6}$]decane ring and tricyclo[4.3.1.1$^{2,5}$]undecane ring, and a tetracyclic hydrocarbon ring such as tetracyclo[4.4.0.1$^{2,5}$.1$^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricyclo[5.2.1.0$^{2,6}$]decanyl group. Among these crosslinked cyclic hydrocarbon rings, a norbornyl group and an adamantyl group are more preferred.

Such an alicyclic hydrocarbon group may have a substituent, and preferred examples of the substituent include a halogen atom, an alkyl group, a hydroxyl group with a hydrogen atom being substituted for, and an amino group with a hydrogen atom being substituted for. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group with a hydrogen atom being substituted for, and an amino group with a hydrogen atom being substituted for.

Examples of the substituent for the hydrogen atom include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group is, for example, an alkoxycarbonyl group having a carbon number of 1 to 4.

The resin (B) may or may not contain a repeating unit having an alicyclic hydrocarbon structure free from a polar group and not exhibiting acid decomposability, but in the case of containing this repeating unit, the content thereof is preferably from 1 to 40 mol %, more preferably from 5 to 20 mol %, based on all repeating units in the resin (B).

Specific examples of the repeating unit having an alicyclic hydrocarbon structure free from a polar group and not exhibiting acid decomposability are illustrated below, but the present invention is not limited thereto. In the formulae, Ra represents H, $CH_3$, $CH_2OH$ or $CF_3$.

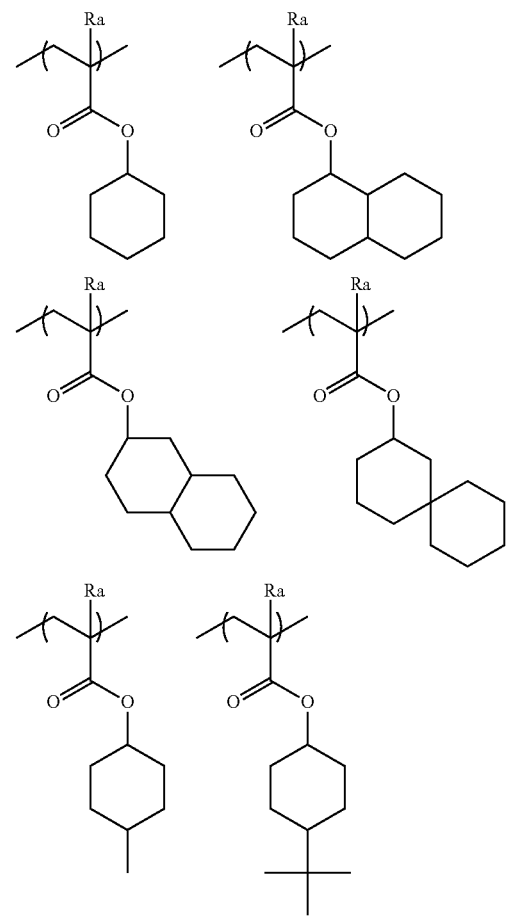

-continued

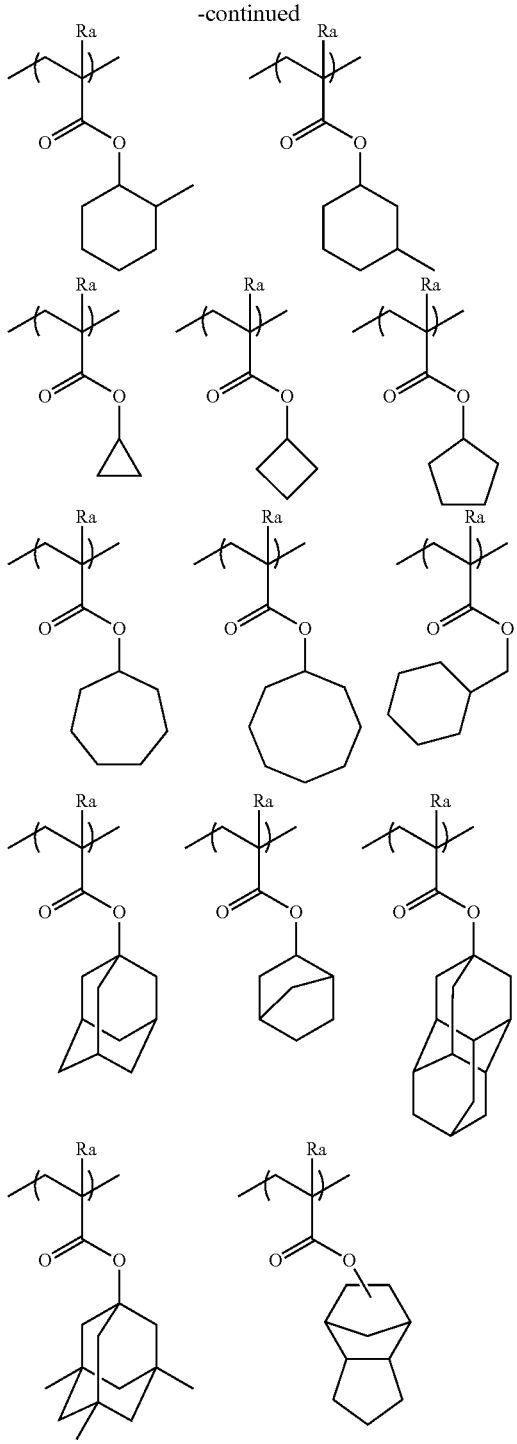

The resin (B) for use in the composition of the present invention may contain, in addition to the above-described repeating structural units, various repeating structural units for the purpose of controlling the dry etching resistance, suitability for standard developer, adherence to substrate, resist profile and properties generally required of a resist, such as resolution, heat resistance and sensitivity.

Examples of such a repeating structural unit include, but are not limited to, repeating structural units corresponding to the monomers described below.

Thanks to such a repeating structural unit, the performance required of the resin used in the composition of the present invention, particularly (1) solubility for the coating solvent,
(2) film-forming property (glass transition point),
(3) alkali developability,
(4) film loss (selection of hydrophilic, hydrophobic or alkali-soluble group),
(5) adherence of unexposed area to substrate,
(6) dry etching resistance, and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin (B) for use in the composition of the present invention, the molar ratio of respective repeating structural units contained is appropriately set to control the dry etching resistance of resist, suitability for standard developer, adherence to substrate, resist profile and performances generally required of a resist, such as resolution, heat resistance and sensitivity.

In the case where the composition of the present invention is used for ArF exposure, in view of transparency to ArF light, the resin (B) for use in the composition of the present invention preferably has substantially no aromatic ring (specifically, the ratio of an aromatic group-containing repeating unit in the resin is preferably 5 mol % or less, more preferably 3 mol % or less, and ideally 0 mol %, that is, the resin does not have an aromatic group), and the resin (B) preferably has a monocyclic or polycyclic alicyclic hydrocarbon structure.

Also, in the case where the composition of the present invention contains a hydrophobic resin (C) described later, the resin (B) preferably contains no fluorine atom and no silicon atom in view of compatibility with the resin (C).

The resin (B) for use in the composition of the present invention is preferably a resin where all repeating units are composed of a (meth)acrylate-based repeating unit. In this case, all repeating units may be a methacrylate-based repeating unit, all repeating units may be an acrylate-based repeating unit, or all repeating units may be composed of a methacrylate-based repeating unit and an acrylate-based repeating unit, but the content of the acrylate-based repeating unit is preferably 50 mol % or less based on all repeating units. A copolymerized polymer containing from 20 to 50 mol % of an acid decomposable group-containing (meth)acrylate-based repeating unit, from 20 to 50 mol % of a lactone group-containing (meth)acrylate-based repeating unit, from 5 to 30 mol % of a (meth)acrylate-based repeating unit having an alicyclic hydrocarbon structure substituted with a hydroxyl group or a cyano group, and from 0 to 20 mol % of other (meth)acrylate-based repeating units is also preferred.

In the case of irradiating the composition of the present invention with KrF excimer laser light, electron beam, X-ray or high-energy beam at a wavelength of 50 nm or less (e.g., EUV), the resin (B) preferably further contains a hydroxystyrene-based repeating unit. It is more preferred to contain a hydroxystyrene-based repeating unit, a hydroxystyrene-based repeating unit protected by an acid-decomposable group, and an acid-decomposable repeating unit such as tertiary alkyl (meth)acrylate.

Preferred examples of the hydroxystyrene-based repeating unit having an acid-decomposable group include repeating units composed of a tert-butoxycarbonyloxystyrene, a 1-alkoxyethoxystyrene and a tertiary alkyl (meth)acrylate. Repeating units composed of a 2-alkyl-2-adamantyl (meth)acrylate and a dialkyl(1-adamantyl)methyl (meth)acrylate are more preferred.

The resin (B) for use in the present invention can be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the photosensitive composition of the present invention. By the use of the same solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction solution is poured in a solvent, and the desired polymer is collected by powder or solid recovery or the like method. The concentration at the reaction is from 5 to 50 mass %, preferably from 10 to 30 mass %, and the reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of applying water washing or combining an appropriate solvent to remove residual monomers or oligomer components; a purification method in a solution sate, such as ultrafiltration of extracting and removing only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent for the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

The weight average molecular weight of the resin (B) for use in the present invention is preferably from 1,000 to 200,000, more preferably from 2,000 to 20,000, still more preferably from 3,000 to 15,000, yet still more preferably from 3,000 to 12,000, in terms of polystyrene by the GPC method. When the weight average molecular weight is from 1,000 to 200,000, reduction in the heat resistance and dry etching resistance can be avoided and at the same time, the film-forming property can be prevented from deterioration due to impairment of developability or increase in the viscosity.

The polydispersity (molecular weight distribution) is usually from 1.0 to 3.0, preferably from 1.0 to 2.6, more preferably from 1 to 2, still more preferably from 1.4 to 2.0. As the molecular weight distribution is smaller, the resolution and resist profile are more excellent, the side wall of the resist pattern is smoother, and the roughness is more improved.

In the present invention, the blending ratio of the resin (B) in the entire composition is preferably from 30 to 99 mass %, more preferably from 60 to 95 mass %, based on the entire solid content.

As for the resin (B), one kind of a resin may be used or a plurality of kinds of resins may be used in combination.

[3] (C) Hydrophobic Resin

The actinic ray-sensitive or radiation-sensitive resin composition of the present invention may contain a hydrophobic resin having at least either a fluorine atom or a silicon atom (hereinafter sometimes referred to as a "hydrophobic resin (C)" or simply as a "resin (C)") particularly when the resist composition is applied to immersion exposure. The hydrophobic resin (C) is unevenly distributed to the film surface layer and when the immersion medium is water, the static/dynamic contact angle on the resist film surface for water as well as the followability of immersion liquid can be enhanced.

The hydrophobic resin (C) is, as described above, unevenly distributed to the interface but unlike a surfactant, need not have necessarily a hydrophilic group in the molecule and may not contribute to uniform mixing of polar/nonpolar substances.

The hydrophobic resin typically contains a fluorine atom and/or a silicon atom. The fluorine atom and/or silicon atom in the hydrophobic resin (C) may be contained in the main chain of the resin or contained in the side chain.

In the case where the hydrophobic resin (C) contains a fluorine atom, the resin preferably contains, as a fluorine atom-containing partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably from 1 to 4) is a linear or branched alkyl group with at least one hydrogen atom being substituted for by a fluorine atom and may further have a substituent other than the fluorine atom.

The fluorine atom-containing cycloalkyl group is a monocyclic or polycyclic cycloalkyl group with at least one hydrogen atom being substituted for by a fluorine atom and may further have a substituent other than the fluorine atom.

The fluorine atom-containing aryl group is an aryl group (e.g., phenyl group, naphthyl group) with at least one hydrogen atom being substituted for by a fluorine atom and may further have a substituent other than the fluorine atom.

Preferred examples of the fluorine atom-containing alkyl group, fluorine atom-containing cycloalkyl group and fluorine atom-containing aryl group include the groups represented by the following formulae (F2) to (F4), but the present invention is not limited thereto.

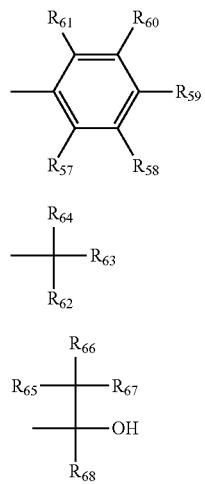

In formulae (F2) to (F4), each of $R_{57}$ to $R_{68}$ independently represents a hydrogen atom, a fluorine atom or an alkyl group (linear or branched). However, each of at least one of $R_{57}$ to $R_{61}$, at least one of $R_{62}$ to $R_{64}$, and at least one of $R_{65}$ to $R_{68}$ independently represents a fluorine atom or an alkyl group (preferably having a carbon number of 1 to 4) with at least one hydrogen atom being substituted for by a fluorine atom.

It is preferred that all of $R_{57}$ to $R_{61}$ and $R_{65}$ to $R_{67}$ are a fluorine atom. Each of $R_{62}$, $R_{63}$ and $R_{68}$ is preferably an alkyl group (preferably having a carbon number of 1 to 4) with at least one hydrogen atom being substituted for by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

The fluorine atom-containing partial structure may be bonded directly to the main chain or may be bonded to the main chain through a group selected from the group consisting of an alkylene group, a phenylene group, an ether bond, a thioether bond, a carbonyl group, an ester bond, an amide bond, a urethane bond and a ureylene bond, or a group formed by combining two or more of these groups and bonds.

As the repeating unit having a fluorine atom, those shown below are preferred.

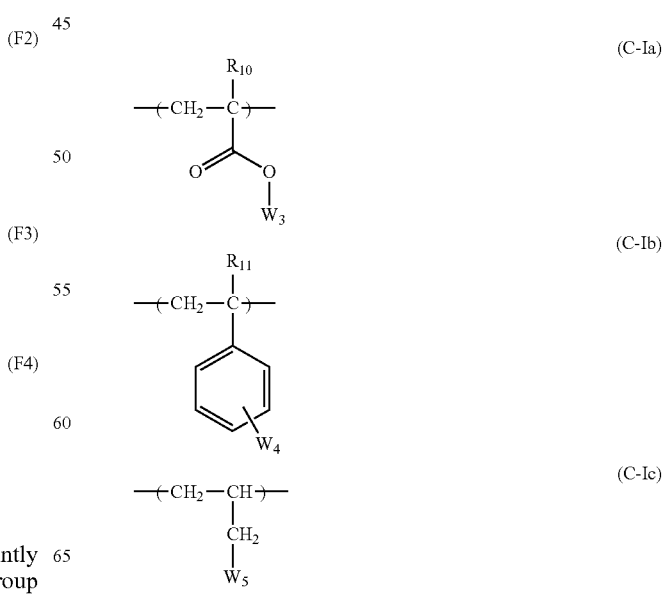

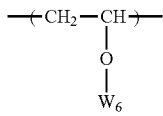
(C-Id)

In the formulae, each of $R_{10}$ and $R_{11}$ independently represents a hydrogen atom, a fluorine atom or an alkyl group. The alkyl group is preferably a linear or branched alkyl group having a carbon number of 1 to 4 and may have a substituent, and the alkyl group having a substituent includes, in particular, a fluorinated alkyl group.

Each of $W_3$ to $W_6$ independently represents an organic group having at least one or more fluorine atoms and specifically includes the atomic groups of (F2) to (F4).

Other than these, the hydrophobic resin (C) may contain a unit shown below as the repeating unit having a fluorine atom.

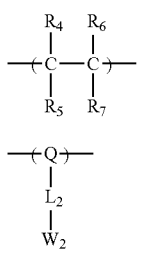

(C-II)

(C-III)

In the formulae, each of $R_4$ to $R_7$ independently represents a hydrogen atom, a fluorine atom or an alkyl group. The alkyl group is preferably a linear or branched alkyl group having a carbon number of 1 to 4 and may have a substituent, and the alkyl group having a substituent includes, in particular, a fluorinated alkyl group.

However, at least one of $R_4$ to $R_7$ represents a fluorine atom. $R_4$ and $R_5$, or $R_6$ and $R_7$ may form a ring.

$W_2$ represents an organic group having at least one fluorine atom and specifically includes the atomic groups of (F2) to (F4).

$L_2$ represents a single bond or a divalent linking group. The divalent linking group is a substituted or unsubstituted arylene group, a substituted or unsubstituted alkylene group, a substituted or unsubstituted cycloalkylene group, —O—, —SO$_2$—, —CO—, —N(R)— (wherein R represents a hydrogen atom or an alkyl group), —NHSO$_2$—, or a divalent linking group formed by combining a plurality of these groups.

Q represents an alicyclic structure. The alicyclic structure may have a substituent and may be monocyclic or polycyclic, and in the case of a polycyclic structure, the structure may be a crosslinked structure. The monocyclic structure is preferably a cycloalkyl group having a carbon number of 3 to 8, and examples thereof include a cyclopentyl group, a cyclohexyl group, a cyclobutyl group and a cyclooctyl group. Examples of the polycyclic structure include a group containing a bicyclo, tricyclo or tetracyclo structure having a carbon number of 5 or more. A cycloalkyl group having a carbon number of 6 to 20 is preferred, and examples thereof include an adamantyl group, a norbornyl group, a dicyclopentyl group, a tricyclodecanyl group and a tetracyclododecyl group. A part of carbon atoms in the cycloalkyl group may be substituted with a heteroatom such as oxygen atom. In particular, Q is preferably a norbornyl group, a tricyclodecanyl group, a tetracyclododecyl group or the like.

Specific examples of the repeating unit containing a fluorine atom are illustrated below, but the present invention is not limited thereto.

In specific examples, $X_1$ represents a hydrogen atom, —CH$_3$, —F or —CF$_3$, and $X_2$ represents —F or —CF$_3$.

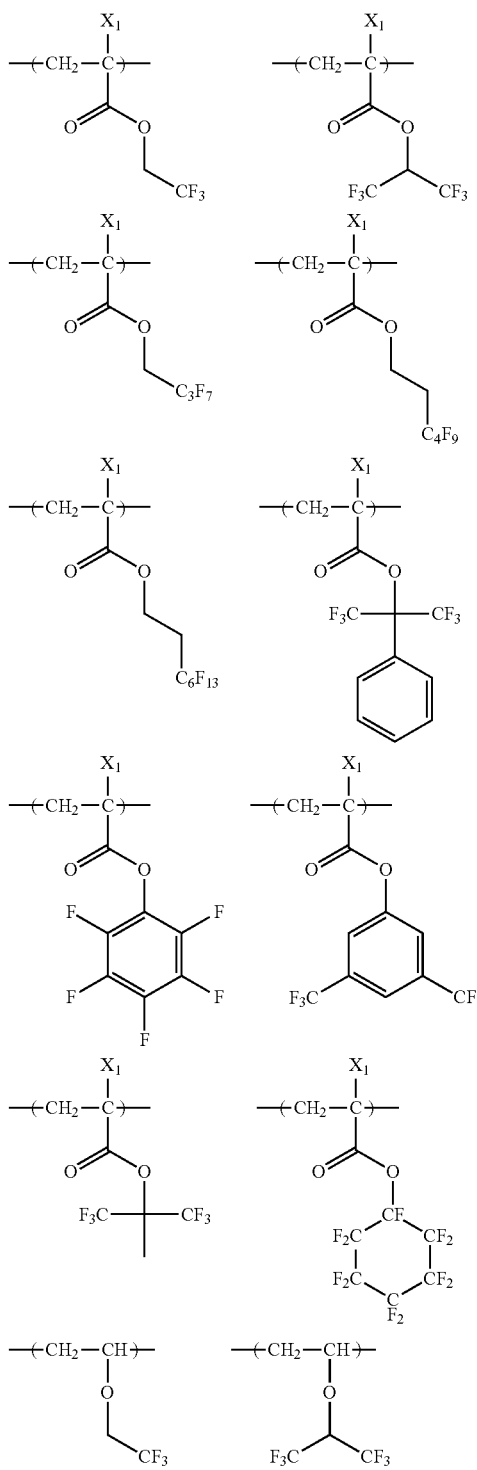

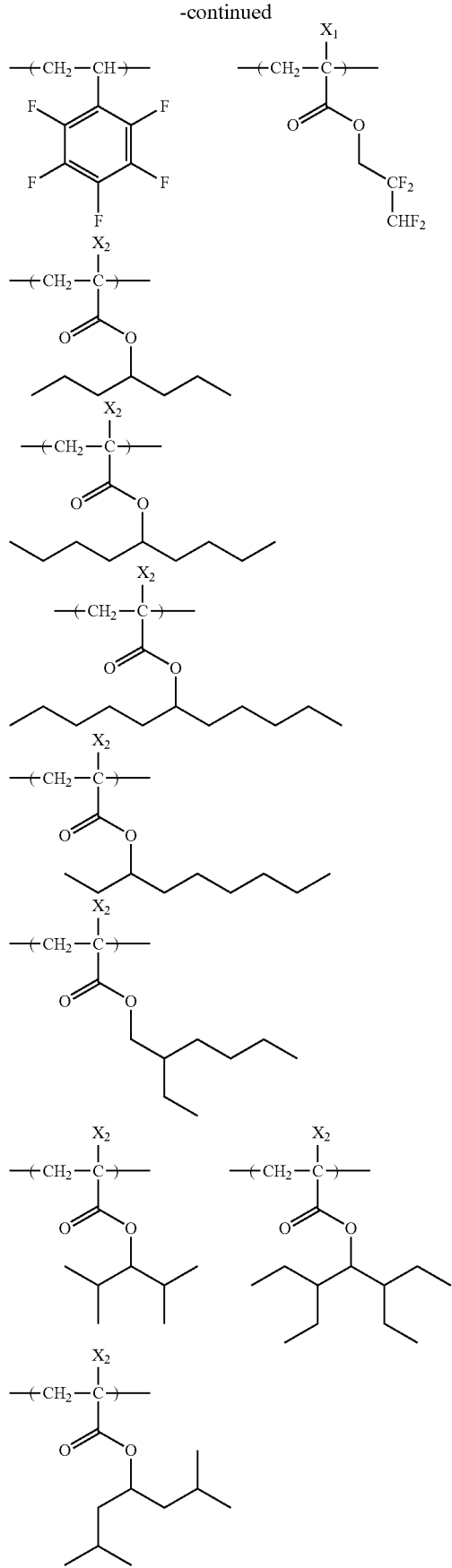
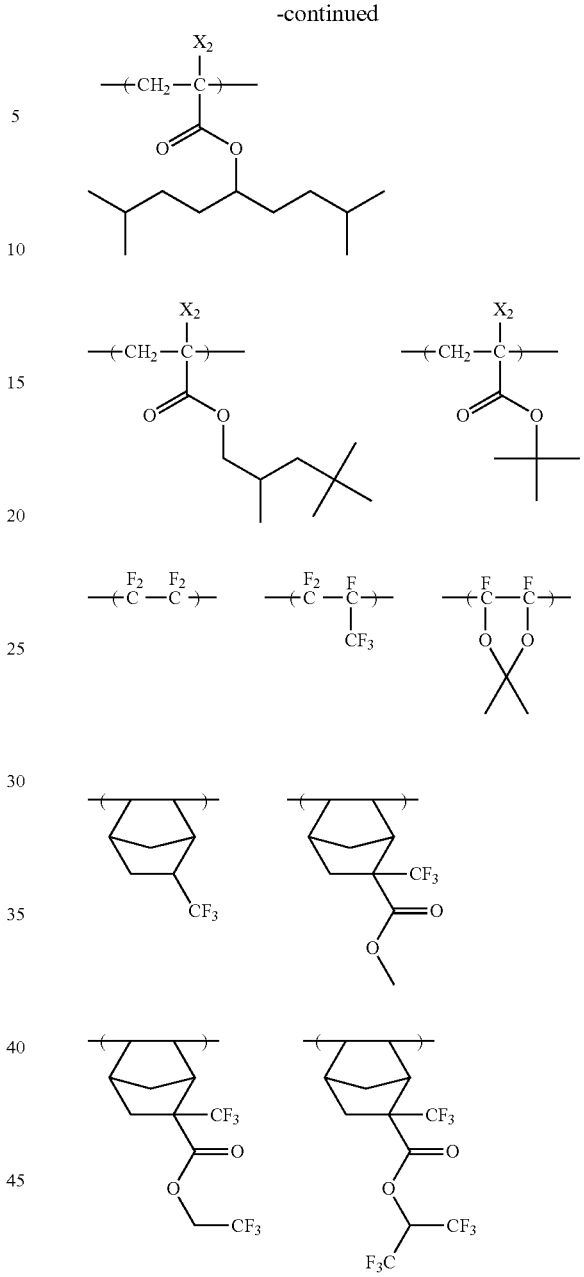

The hydrophobic resin (C) may contain a silicon atom. The resin preferably has, as a silicon atom-containing partial structure, an alkylsilyl structure (preferably a trialkylsilyl group) or a cyclic siloxane structure.

The alkylsilyl structure and cyclic siloxane structure specifically include, for example, the groups represented by the following formulae (CS-1) to (CS-3):

(CS-1)

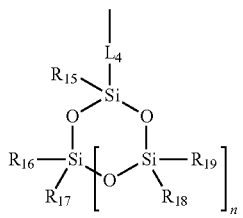
(CS-2)

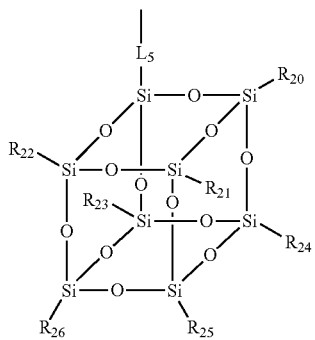
(CS-3)

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a sole group or a combination of two or more groups (the total carbon number is preferably 12 or less), selected from the group consisting of an alkylene group, a phenylene group, an ether bond, a thioether bond, a carbonyl group, an ester bond, an amide bond, a urethane bond and a urea bond.

n represents an integer of 1 to 5. n is preferably an integer of 2 to 4.

Specific examples of the repeating unit having a group represented by formulae (CS-1) to (CS-3) are illustrated below, but the present invention is not limited thereto. In specific examples, $X_1$ represents a hydrogen atom, —$CH_3$, —F or —$CF_3$.

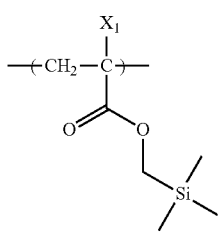

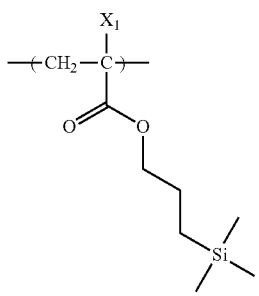

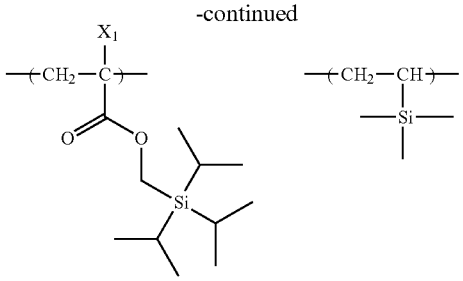

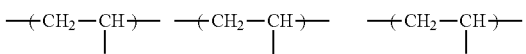

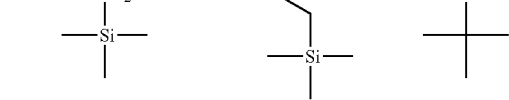

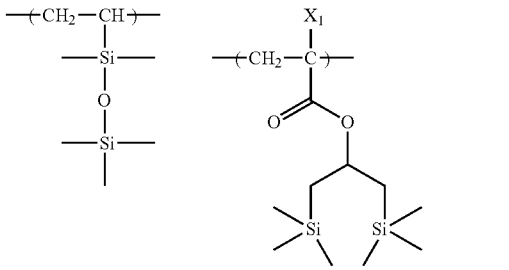

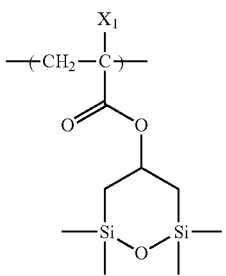

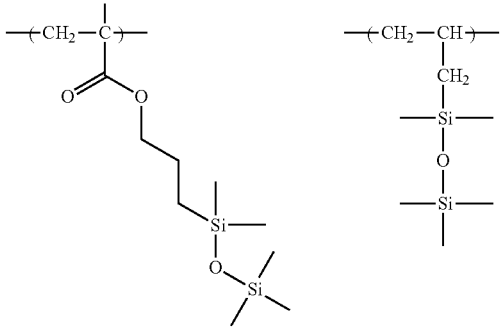

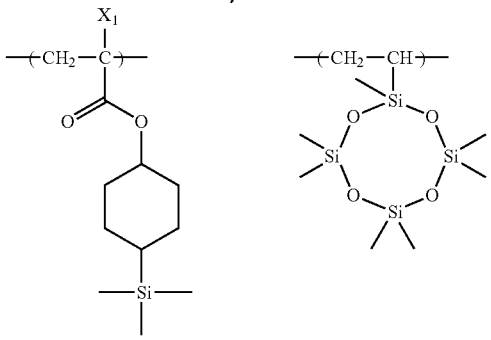

-continued

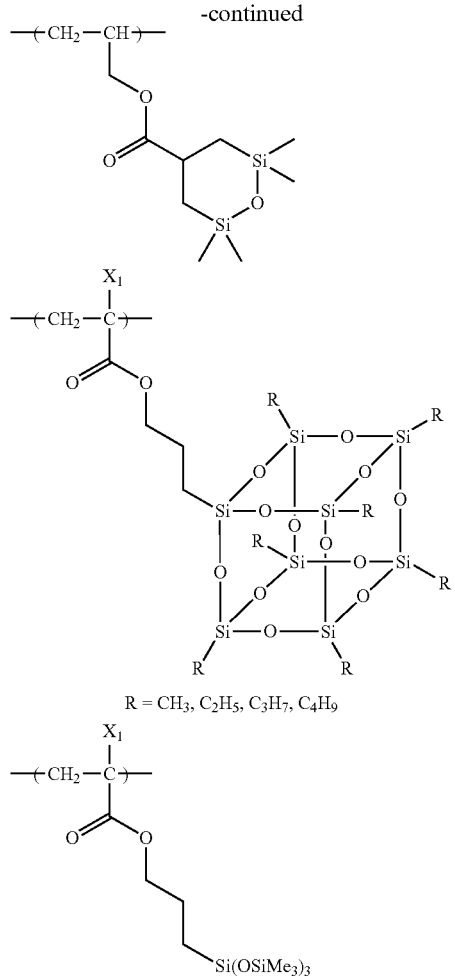

R = CH₃, C₂H₅, C₃H₇, C₄H₉

The hydrophobic resin (C) may further contain at least one group selected from the group consisting of the following (x) to (z):

(x) an alkali-soluble group,
(y) a group capable of decomposing by the action of an alkali developer to increase the solubility in an alkali developer (hereinafter, sometimes referred to as a "polarity converting group"), and
(z) a group capable of decomposing by the action of an acid.

Examples of the (x) alkali-soluble group include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred alkali-soluble groups include a fluorinated alcohol group (preferably hexafluoroisopropanol group), a sulfonimide group and a bis(carbonyl)methylene group.

Examples of the repeating unit having (x) an alkali-soluble group include a repeating unit where an alkali-soluble group is directly bonded to the main chain of the resin, such as repeating unit by an acrylic acid or a methacrylic acid, and a repeating unit where an alkali-soluble group is bonded to the main chain of the resin through a linking group. Furthermore, an alkali-soluble group may be introduced into the polymer chain terminal by using an alkali-soluble group-containing polymerization initiator or chain transfer agent at the polymerization. All of these cases are preferred. The repeating unit having (x) an alkali-soluble group may have at least either a fluorine atom or a silicon atom.

The content of the repeating unit having (x) an alkali-soluble group is preferably from 1 to 50 mol %, more preferably from 3 to 35 mol %, still more preferably from 5 to 20 mol %, based on all repeating units in the hydrophobic resin (C).

Specific examples of the repeating unit having (x) an alkali-soluble group are illustrated below, but the present invention is not limited thereto. In the formulae, Rx represents a hydrogen atom, CH₃, CF₃ or CH₂OH.

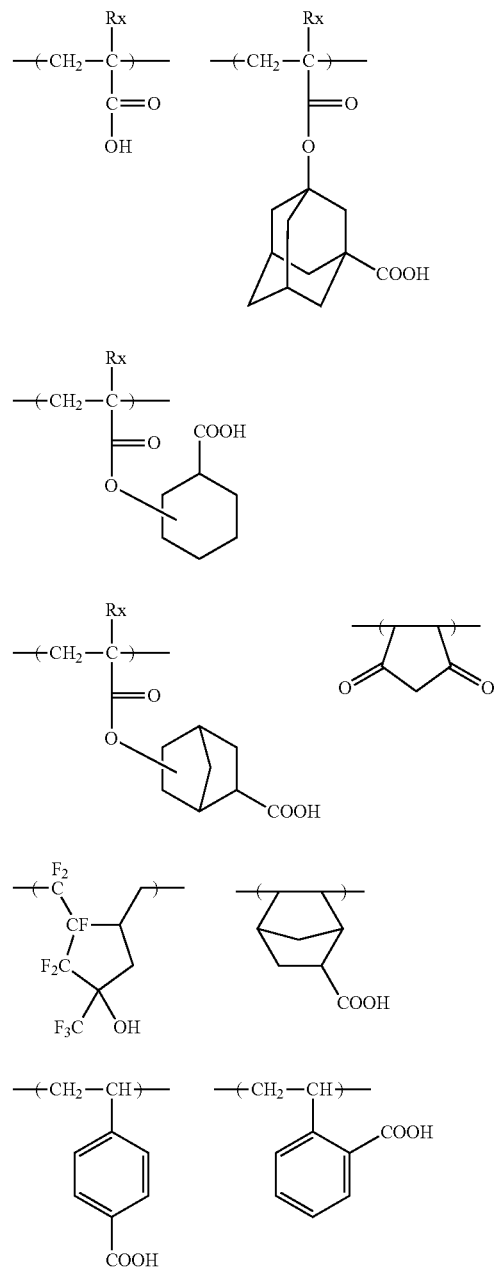

131
-continued
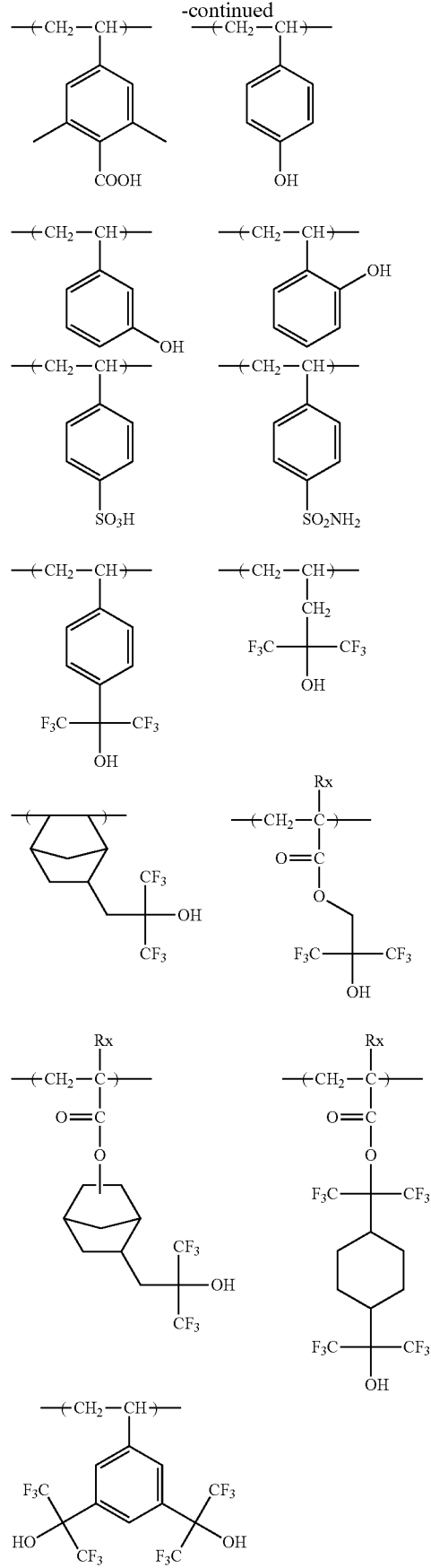
132
-continued
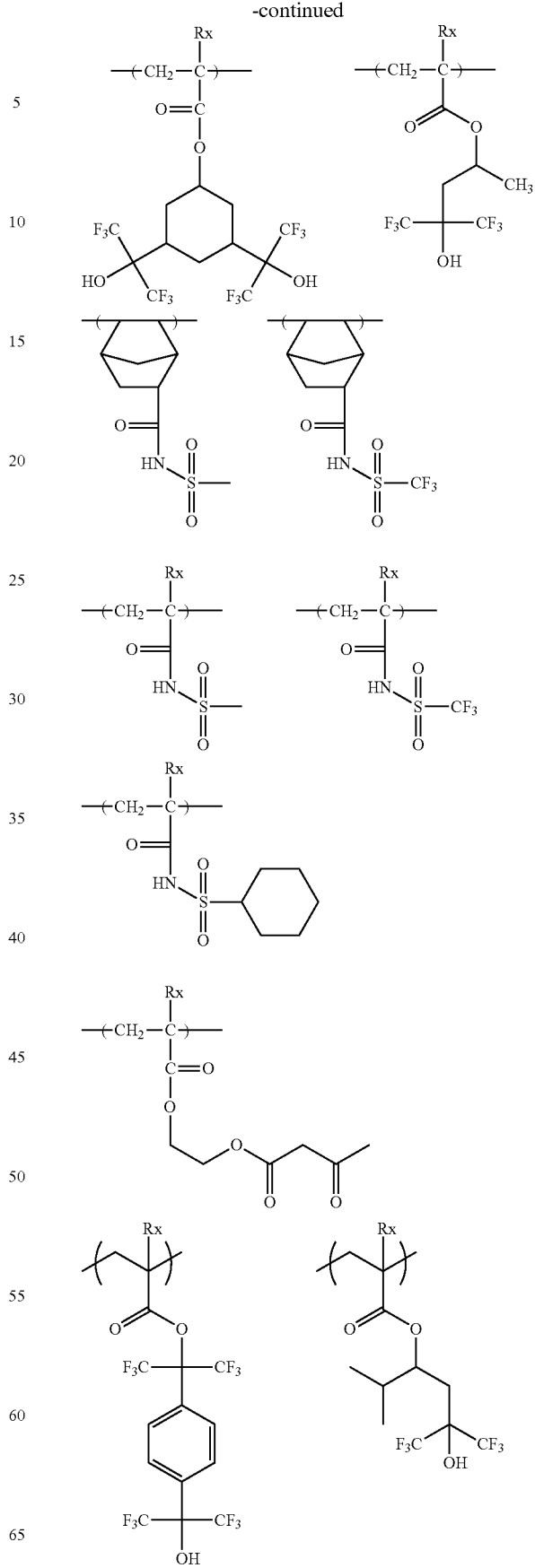

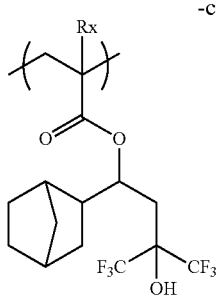

Examples of the group (y) capable of decomposing by the action of an alkali developer to increase the solubility in an alkali developer (polarity converting group (y)) include a lactone group, a carboxylic acid ester group (—COO—), an acid anhydride group (—C(O)OC(O)—), an acid imide group (—NHCONH—), a carboxylic acid thioester group (—COS—), a carbonic acid ester group (—OC(O)O—), a sulfuric acid ester group (—OSO$_2$O—) and a sulfonic acid ester group (—SO$_2$O—), with a lactone group being preferred.

The actinic ray-sensitive or radiation-sensitive resin composition of the present invention preferably contains (Cy) a resin having at least either a fluorine atom or a silicon atom and containing (cy) a repeating unit having at least one polarity converting group (y). The resin (Cy) has hydrophobicity, and addition of the resin (Cy) is preferred particularly from the standpoint of reducing the development defect.

Incidentally, an ester group directly bonded to the main chain of the repeating unit as in an acrylate is poor in the function of decomposing by the action of an alkali developer to increase the solubility in, an alkali developer and is not included in the polarity converting group of the present invention.

As for the polarity converting group (y), both a configuration where the polarity converting group is contained in a repeating unit composed of an acrylic acid ester or a methacrylic acid ester and thereby is introduced into the side chain of the resin, and a configuration where the polarity converting group (y) is introduced into the polymer chain terminal by using a polymerization initiator or chain transfer agent containing the polarity converging group at the polymerization, are preferred.

Specific examples of the repeating unit (cy) having (y) a polarity converting group include the specific examples of the repeating unit having a partial structure represented by formula (AII), which are described in the resin (B).

The repeating unit (cy) includes, for example, a repeating unit represented by formula (K0):

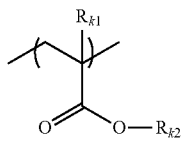

(K0)

In the formula, $R_{k1}$ represents a hydrogen atom, a halogen atom, a hydroxyl group, an alkyl group, a cycloalkyl group, an aryl group, or a polarity converting group-containing group.

$R_{k2}$ represents an alkyl group, a cycloalkyl group, an aryl group, or a polarity converting group-containing group.

However, at least either one of $R_{k1}$ and $R_{k2}$ represents a polarity converting group-containing group.

The polarity converting group is, as described above, a group capable of decomposing by the action of an alkali developer to increase the solubility in an alkali developer. The polarity converting group is preferably a group X in a partial structure represented by formula (KA-1) or (KB-1):

(KA-1)

(KB-1)

In formulae (KA-1) and (KB-1), X represents a carboxylic acid ester group: —COO—, an acid anhydride group: —C(O)OC(O)—, an acid imide group: —NHCONH—, a carboxylic acid thioester group: —COS—, a carbonic acid ester group: —OC(O)O—, a sulfuric acid ester group: —OSO$_2$O—, or a sulfonic acid ester group: —SO$_2$O—.

Each of $Y^1$ and $Y^2$, which may be the same or different, represents an electron-withdrawing group.

Incidentally, the repeating unit (cy) has a preferred group capable of increasing the solubility in an alkali developer by containing a group having a partial structure represented by formula (KA-1) or (KB-1), but as in the case of the partial structure represented by formula (KA-1) or the partial structure represented by formula (KB-1) where $Y^1$ and $Y^2$ are monovalent, when the partial structure does not have a bond, the group having the partial structure is a group having a monovalent or higher valent group formed by removing at least one arbitrary hydrogen atom in the partial structure.

The partial structure represented by formula (KA-1) or (KB-1) is connected to the main chain of the resin (Cy) at an arbitrary position through a substituent.

The partial structure represented by formula (KA-1) is a structure forming a ring structure together with the group as X.

In formula (KA-1), X is preferably a carboxylic acid ester group (that is, a case of forming a lactone ring structure as KA-1), an acid anhydride group or a carbonic acid ester group, more preferably a carboxylic acid ester group.

The ring structure represented by formula (KA-1) may have a substituent and, for example, may have nka substituents $Z_{ka1}$.

Specific examples and preferred examples of the substituent $Z_{ka1}$ are the same as those described above for the substituent which the lactone structure in the fluorine-containing compound (A) may have.

$Z_{ka1}$'s may combine with each other to form a ring. Examples of the ring formed by combining $Z_{ka1}$'s with each other include a cycloalkyl ring and a heterocyclic ring (e.g., cyclic ether ring, lactone ring).

nka represents an integer of 0 to 10 and is preferably an integer of 0 to 8, more preferably an integer of 0 to 5, still more preferably an integer of 1 to 4, and most preferably an integer of 1 to 3.

It is preferred that X in formula (KA-1) is a carboxylic acid ester group and the partial structure represented by formula (KA-1) is a lactone ring, and the lactone ring is preferably a 5- to 7-membered lactone ring.

In this connection, as in (KA-1-1) to (KA-1-17) described above for the lactone structure in the fluorine-containing compound (A), another ring structure is preferably fused to a 5- to 7-membered lactone ring that is the partial structure represented by formula (KA-1), in the form of forming a bicyclo or spiro structure.

Examples of the peripheral ring structure with which the ring structure represented by formula (KA-1) may combine include those in (KA-1-1) to (KA-1-17) and structures based on these structures.

The structure containing the lactone ring structure represented by formula (KA-1) is more preferably a structure represented by any one of the following (KA-1-1) to (KA-1-17) described above for the lactone structure in the fluorine-containing compound (A). More preferred specific examples are also the same as those described above for the lactone structure in the fluorine-containing compound (A). The lactone structure may be bonded directly to the main chain.

The structure containing the above-described lactone ring structure may or may not have a substituent. Preferred examples of the substituent are the same as those of the substituent $Z_{ka1}$ which the ring structure represented by formula (KA-1) may have.

In formula (KB-1), X is preferably a carboxylic acid ester group (—COO—).

In formula (KB-1), each of $Y^1$ and $Y^2$ independently represents an electron-withdrawing group.

The electron-withdrawing group is a partial structure represented by formula (EW) described in the compound (A), and the contents thereof are the same as those described in the compound (A). As to the resin (C), in formula (EW), * indicates a direct bond to (KA-1) or a direct bond to X in (KB-1).

The electron-withdrawing group may be, for example, a structure shown below. In the following structural formulae, $R_{ew1}$, $R_{ew2}$ and $n_{ew}$ have the same meanings as in formula (EW), and each of $R_{ew3}$ and $R_{ew4}$ independently represents an arbitrary structure. The partial structure represented by formula (EW) has an electron-withdrawing group regardless of what structure $R_{ew3}$ or $R_{ew4}$ may take, and each of $R_{ew3}$ and $R_{ew4}$ may be connected, for example, to the main chain of the resin but is preferably an alkyl group, a cycloalkyl group or an alkyl fluoride group.

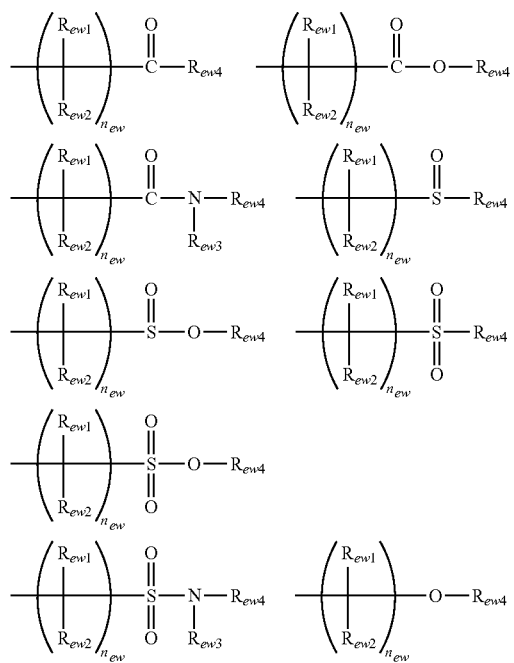

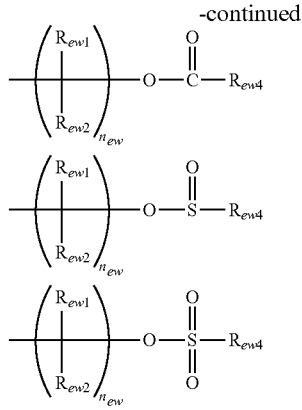

-continued

In formula (EW), when $Y_{ew1}$ is a divalent or higher valent group, the remaining bond forms bonding to an arbitrary atom or substituent. At least any one group of $Y_{ew1}$, $R_{ew1}$ and $R_{ew2}$ may be connected to the main chain of the resin (Cy) through a further substituent.

Specific examples and preferred examples of $R_{ew1}$, $R_{ew2}$ and $Y_{ew1}$ are the same as those described in the compound (A). Also, the ring which may be formed by combining at least two members out of $R_{ew1}$, $R_{ew2}$ and $Y_{ew1}$ with each other is preferably a cycloalkyl group or a heterocyclic group, and the heterocyclic group is preferably a lactone ring group. Examples of the lactone ring include structures represented by formulae (KA-1) to (KA-1-17).

Incidentally, the repeating unit (cy) may have a plurality of partial structures represented by formula (KA-1), a plurality of partial structures represented by formula (KB-1), or both a partial structure of formula (KA-1) and a partial structure of formula (KB-1).

In this connection, the partial structure of formula (KA-1) may partially or entirely serve also as an electron-withdrawing group of $Y^1$ or $Y^2$ in formula (KB-1). For example, in the case where X in formula (KA-1) is a carboxylic acid ester group, the carboxylic acid ester group may function as an electron-withdrawing group of $Y^1$ or $Y^2$ in formula (KB-1).

The repeating unit (cy) may be (cy') a repeating unit having at least either a fluorine atom or a silicon atom and a polarity converting group on the same side chain, (cy*) a repeating unit having a polarity converting group and having neither a fluorine atom nor a silicon atom, or (cy") a repeating unit having a polarity converting group on one side chain and having at least either a fluorine atom or a silicon atom on a side chain different from the side chain above in the same repeating unit, but the resin (Cy) preferably contains the repeating unit (cy') as the repeating unit (cy).

In the case where the resin (Cy) contains the repeating unit (cy*), the resin is preferably a copolymer with a repeating unit having at least either a fluorine atom or a silicon atom (a repeating unit (c1) described later). Also, in the repeating unit (cy"), the side chain having a polarity converting group and the side chain having at least either a fluorine atom or a silicon atom are preferably bonded to the same carbon atom in the main chain, that is, have a positional relationship as in the following formula (K1).

In the formula, B1 represents a partial structure having a group capable of increasing the solubility in an alkali developer, and B2 represents a partial structure having at least either a fluorine atom or a silicon atom.

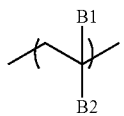
(K1)

Also, in the repeating unit (cy*) and the repeating unit (cy"), the polarity converting group is more preferably a partial structure represented by —COO— in the structure of formula (KA-1).

The repeating unit (cy) may be a repeating unit having a partial structure shown below.

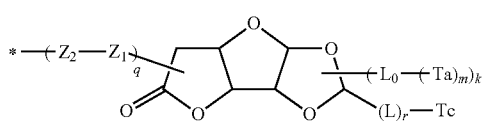
(cc)

In formula (cc), $Z_1$ represents a single bond, an ether bond, an ester bond, an amide bond, a urethane bond or a urea bond, and when a plurality of $Z_1$'s are present, each $Z_1$ may be the same as or different from every other $Z_1$. $Z_1$ is preferably an ester bond.

$Z_2$ represents a chain or cyclic alkylene group and when a plurality of $Z_2$'s are present, each $Z_2$ may be the same as or different from every other $Z_2$. $Z_2$ is preferably an alkylene group having a carbon number of 1 or 2 or a cycloalkylene group having a carbon number of 5 to 10.

Each Ta independently represents an alkyl group, a cycloalkyl group, an alkoxy group, a nitrile group, a hydroxyl group, an amide group, an aryl group or an electron-withdrawing group (having the same meaning as the electron-withdrawing group of $Y^1$ and $Y^2$ in formula (KB-1)) and is preferably an alkyl group, a cycloalkyl group or an electron-withdrawing group, more preferably an electron-withdrawing group. When a plurality of Ta's are present, Ta's may combine with each other to form a ring.

$L_0$ represents a single bond or an (m+1)-valent hydrocarbon group (preferably having a carbon number of 20 or less) and is preferably a single bond. The single bond as $L_0$ is formed when m is 1. The (m+1)-valent hydrocarbon group as $L_0$ represents an (m+1)-valent hydrocarbon group formed by removing m−1 arbitrary hydrogen atoms from, for example, an alkylene group, a cycloalkylene group, a phenylene group or a combination thereof.

Each L independently represents a carbonyl group, a carbonyloxy group or an ether group.

Tc represents a hydrogen atom, an alkyl group, a cycloalkyl group, a nitrile group, a hydroxyl group, an amide group, an aryl group or an electron-withdrawing group (having the same meaning as the electron-withdrawing group of $Y^1$ and $Y^2$ in formula (KB-1)).

* represents a bond to the main or side chain of the resin. That is, a partial structure represented by formula (cc) may be directly bonded to the main chain, or a partial structure represented by formula (cc) may be bonded to the side chain of the resin. In this connection, the bond to the main chain is a bond to an atom present in the bond constituting the main chain, and the bond to the side chain is a bond to an atom present in the portion except for the bond constituting the main chain.

m represents an integer of 1 to 28 and is preferably an integer of 1 to 3, more preferably 1.

k represents an integer of 0 to 2 and is preferably 1.

q is a repetition number of the group ($Z_2$—$Z_1$) and represents an integer of 0 to 5, preferably 0 to 2.

r represents an integer of 0 to 5.

Incidentally, the above-described -$L_0$-(Ta)$_m$ may be substituted in place of -(L)$_r$-Tc.

It is also preferred to have a fluorine atom at the terminal of sugar lactone or have a fluorine atom on a side chain different from the side chain on the sugar lactone side within the same repeating unit (corresponding to the repeating unit (cy")).

The carbon number of the chain alkylene group as $Z_2$ is, in the case of a linear alkylene group, preferably from 1 to 30, more preferably from 1 to 20, and in the case of a branched alkylene group, preferably from 3 to 30, more preferably from 3 to 20. Specific examples of the chain alkylene group as $R_2$ include specific examples of the alkyl group as $Z_{ka1}$ above where one arbitrary hydrogen atom is removed.

The cyclic alkylene group as $Z_2$ is preferably a cyclic alkylene group having a carbon number of 3 to 8, and specific examples thereof include the cycloalkyl group as $Z_{ka1}$ above where one arbitrary hydrogen atom is removed.

The preferred carbon numbers and specific examples of the alkyl group and cycloalkyl group as Ta and Tc are the same as those described above for the alkyl group and cycloalkyl group as $Z_{ka1}$.

The alkoxy group as Ta is preferably an alkoxy group having a carbon number of 1 to 8, and examples thereof include a methoxy group, an ethoxy group, a propoxy group and a butoxy group.

The aryl group as Ta and Tc is preferably an aryl group having a carbon number of 6 to 12, and examples thereof include a phenyl group and a naphthyl group.

The preferred carbon numbers and specific examples of the alkylene group and cycloalkylene group as $L_0$ are the same as those described above for the chain alkylene group and cyclic alkylene group as $Z_2$.

As the more specific structure of the repeating unit (cc), repeating units having a partial structure shown below are preferred.

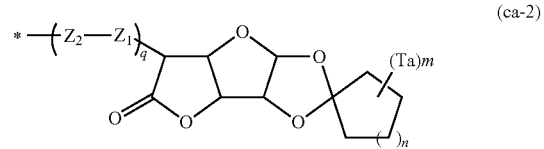
(ca-2)

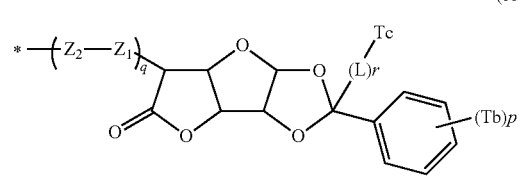
(cb-2)

In formulae (ca-2) and (cb-2), n represents an integer of 0 to 11 and is preferably an integer of 0 to 5, more preferably 1 or 2.

p represents an integer of 0 to 5 and is preferably an integer of 0 to 3, more preferably 1 or 2.

Each Tb independently represents an alkyl group, a cycloalkyl group, an alkoxy group, a nitrile group, a hydroxyl group, an amide group, an aryl group or an electron-withdrawing group (having the same meaning as the electron-withdrawing group of $Y^1$ and $Y^2$ in formula (KB-1)) and is preferably an alkyl group, a cycloalkyl group or an electron-withdrawing group. When a plurality of Tb's are present, Tb's may combine with each other to form a ring.

* represents a bond to the main or side chain of the resin. That is, a partial structure represented by formula (ca-2) or (cb-2) may be directly bonded to the main chain, or a partial structure represented by formula (ca-2) or (cb-2) may be bonded to the side chain of the resin.

$Z_1$, $Z_2$, Ta, Tc, L, m, q and r have the same meanings as those in formula (cc) and preferred embodiments are also the same.

The repeating unit (cy) may be a repeating unit having a partial structure represented by formula (KY-0):

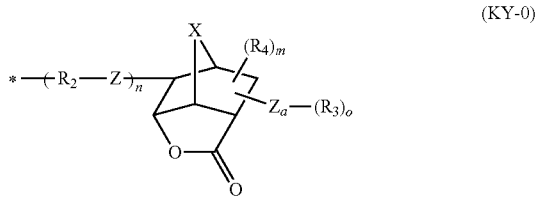

In formula (KY-0), $R_2$ represents a chain or cyclic alkylene group and when a plurality of $R_2$'s are present, each $R_2$ may be the same as or different from every other $R_2$.

$R_3$ represents a linear, branched or cyclic hydrocarbon group where a part or all of hydrogen atoms on the constituent carbons are substituted for by a fluorine atom.

$R_4$ represents a halogen atom, a cyano group, a hydroxy group, an amide group, an alkyl group, a cycloalkyl group, an alkoxy group, a phenyl group, an acyl group, an alkoxycarbonyl group or a group represented by R—C(=O)— or R—C(=O)O— (wherein R represents an alkyl group or a cycloalkyl group). When a plurality of $R_4$'s are present, each $R_4$ may be the same as or different from every other $R_4$, and two or more $R_4$'s may combine to form a ring.

X represents an alkylene group, an oxygen atom or a sulfur atom.

Each of Z and Za represents a single bond, an ether bond, an ester bond, an amide bond, a urethane bond or a urea bond and when a plurality of Z's or Za's are present, each Z or Za may be the same as or different from every other Z or Za.

* represents a bond to the main or side chain of the resin.

o is the number of substituents and represents an integer of 1 to 7.

m is the number of substituents and represents an integer of 0 to 7.

n is a repetition number and represents an integer of 0 to 5.

The structure of —$R_2$—Z— is preferably a structure represented by —$(CH_2)_l$COO— (wherein l represents an integer of 1 to 5).

The preferred carbon number range and specific examples of the chain or cyclic alkylene group as $R_2$ are the same as those described for the chain alkylene group and cyclic alkylene group in $Z_2$ of formula (cc).

The carbon number of the linear, branched or cyclic hydrocarbon group as $R_3$ is, in the case of a linear hydrocarbon group, preferably from 1 to 30, more preferably from 1 to 20; in the case of a branched hydrocarbon group, preferably from 3 to 30, more preferably from 3 to 20; and in the case of a cyclic hydrocarbon group, from 6 to 20. Specific examples of $R_3$ include specific examples of the alkyl group and cycloalkyl group as $Z_{ka1}$ above.

The preferred carbon numbers and specific examples of the alkyl group and cycloalkyl group as $R_4$ and R are the same as those described above for the alkyl group and cycloalkyl group as $Z_{ka1}$.

The acyl group as $R_4$ is preferably an acyl group having a carbon number of 2 to 6, and examples thereof include a formyl group, an acetyl group, a propionyl group, a butyryl group, an isobutyryl group, a valeryl group and a pivaloyl group.

The alkyl moiety in the alkoxy group and alkoxycarbonyl group as $R_4$ includes a linear, branched or cyclic alkyl moiety, and the preferred carbon number and specific examples of the alkyl moiety are the same as those described above for the alkyl group and cycloalkyl group as $Z_{ka1}$.

The alkylene group as X includes a chain or cyclic alkylene group, and the preferred carbon number and specific examples thereof are the same as those described for the chain alkylene group and cyclic alkylene group as $R_2$.

As for the specific structure of the repeating unit (cy), the repeating unit also includes repeating units having a partial structure shown below.

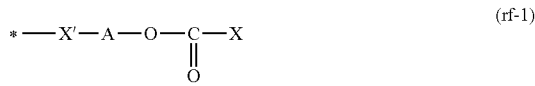

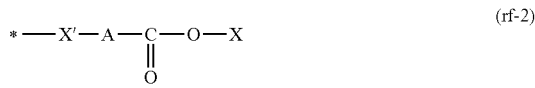

In formulae (rf-1) and (rf-2), X' represents an electron-withdrawing substituent and is preferably a carbonyloxy group, an oxycarbonyl group, a fluorine atom-substituted alkylene group or a fluorine atom-substituted cycloalkylene group.

A represents a single bond or a divalent linking group represented by —C(Rx)(Ry)-, wherein each of Rx and Ry independently represents a hydrogen atom, a fluorine atom, an alkyl group (preferably having a carbon number of 1 to 6; which may be substituted with a fluorine atom or the like), or a cycloalkyl group (preferably having a carbon number of 5 to 12; which may be substituted with a fluorine atom or the like). Each of Rx and Ry is preferably a hydrogen atom, an alkyl group or a fluorine atom-substituted alkyl group.

X represents an electron-withdrawing group and specific examples thereof include those electron-withdrawing groups as $Y^1$ and $Y^2$ above. Among these, an alkyl fluoride group, a cycloalkyl fluoride group, an aryl group substituted with fluorine or an alkyl fluoride group, and an aralkyl group substituted with fluorine or an alkyl fluoride group are preferred.

* represents a bond to the main or side chain of the resin, that is, a bond to the main chain of the resin through a single bond or a linking group.

Incidentally, when X' is a carbonyloxy group or an oxycarbonyl group, A is not a single bond.

The polarity converting group is decomposed by the action of an alkali developer to effect polarity conversion, whereby the receding contact angle with water of the resin composition film after alkali development can be decreased. Decreasing the receding contact angle with water of the film after alkali development is preferred from the standpoint of suppressing the development defect.

The receding contact angle with water of the resin composition film after alkali development is preferably 50° or less, more preferably 40° or less, still more preferably 35° or less, and most preferably 30° or less, at a temperature of 23±3° C. and a humidity of 45±5%.

The receding contact angle is a contact angle measured when a contact line recedes on the liquid droplet-substrate interface, and this is generally known to be useful in simulating the mobility of a liquid droplet in the dynamic state. In a simple manner, the receding contact angle can be defined as a contact angle at the time of the liquid droplet interface receding when a liquid droplet ejected from a needle tip is landed on a substrate and then the liquid droplet is again suctioned into the needle. In general, the receding contact angle can be measured by a contact angle measuring method called an expansion/contraction method.

The above-described receding contact angle of the film after alkali development is a contact angle measured on the film described below by an expansion/contraction method employed in Examples later. That is, an organic antireflection film, ARC29A (produced by Nissan Chemical Industries, Ltd.), is coated on a silicon wafer (8 inches in diameter) and baked at 205° C. for 60 seconds to form a 98 nm-thick antireflection film, the composition of the present invention is coated thereon and baked at 120° C. for 60 seconds to form a film having a thickness of 120 nm, this film is developed with an aqueous tetramethylammonium hydroxide solution (2.38 mass %) for 30 seconds, rinsed with pure water and spin-dried, and the contact angle of the obtained film is measured by the expansion/contraction method.

The hydrolysis rate of the resin (Cy) for an alkali developer is preferably 0.001 nm/sec or more, more preferably 0.01 nm/sec or more, still more preferably 0.1 nm/sec or more, and most preferably 1 nm/sec or more.

Here, the hydrolysis rate of the resin (Cy) for an alkali developer is a rate at which the thickness of a resin film formed of only the resin (Cy) decreases when treated with TMAH (an aqueous tetramethylammonium hydroxide solution) (2.38 mass %) at 23° C.

The repeating unit (cy) is more preferably a repeating having at least two or more polarity converting groups.

In the case where the repeating unit (cy) has at least two polarity converting groups, the repeating unit preferably has a group containing a partial structure having two polarity converting groups represented by the following formula (KY-1). Incidentally, when the structure represented by formula (KY-1) does not have a bond, this is a group containing a monovalent or greater valent group formed by removing at least one arbitrary hydrogen atom from the structure.

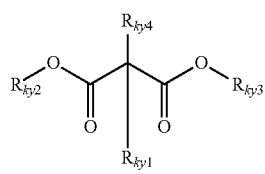
(KY-1)

In formula (KY-1), each of $R_{ky1}$ and $R_{ky4}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amide group or an aryl group. Alternatively, $R_{ky1}$ and $R_{ky4}$ may be bonded to the same atom to form a double bond. For example, $R_{ky1}$ and $R_{ky4}$ may be bonded to the same oxygen atom to form a part (=O) of a carbonyl group.

Each of $R_{ky2}$ and $R_{ky3}$ independently represents an electron-withdrawing group, or while $R_{ky1}$ and $R_{ky2}$ combine to form a lactone ring, $R_{ky3}$ is an electron-withdrawing group. The lactone ring formed is preferably a structure of (KA-1-1) to (KA-1-17). Examples of the electron-withdrawing group is the same as those for $Y^1$ and $Y^2$ in formula (KB-1), and a halogen atom, a halo(cyclo)alkyl and a haloaryl group are preferred. Preferably, $R_{ky3}$ is a halogen atom, a halo(cyclo)alkyl or a haloaryl group and $R_{ky2}$ combines with $R_{ky1}$ to form a lactone ring or is an electron-withdrawing group containing no halogen atom. Specific examples and preferred examples of the halo(cyclo)alkyl and the haloaryl group are the same as those described above for $Y_{ew1}$ in formula (EW) regarding the compound (A).

$R_{ky1}$, $R_{ky2}$ and $R_{ky4}$ may combine with each other to form a monocyclic or polycyclic structure.

Specific examples of $R_{ky1}$ and $R_{ky4}$ include the same groups as those for $Z_{ka1}$ in formula (KA-1).

The lactone ring formed by combining $R_{ky1}$ and $R_{ky2}$ is preferably a structure of (KA-1-1) to (KA-1-17). Examples of the electron-withdrawing group are the same as those for $Y^1$ and $Y^2$ in formula (KB-1).

The structure represented by formula (KY-1) is preferably a structure represented by the following formula (KY-2). Here, the structure represented by formula (KY-2) is a group having a monovalent or higher valent group formed by removing at least one arbitrary hydrogen atom from the structure.

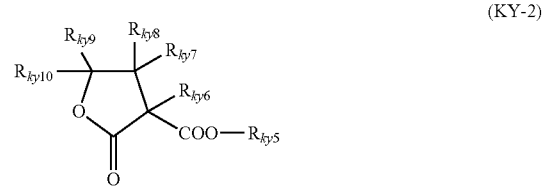
(KY-2)

In formula (KY-2), each of $R_{ky6}$ to $R_{ky10}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amide group or an aryl group.

Two or more members of $R_{ky6}$ to $R_{ky10}$ may combine with each other to form a monocyclic or polycyclic structure.

$R_{ky5}$ represents an electron-withdrawing group. Examples of the electron-withdrawing group are the same as those for $Y^1$ and $Y^2$ above, and among these, a halogen atom, a halo(cyclo)alkyl group, and a haloaryl group are preferred. Specific examples and preferred examples of the halo(cyclo)alkyl group and the haloaryl group are the same as those described above for $Y_{ew1}$ in formula (EW) regarding the compound (A).

Specific examples of $R_{ky5}$ to $R_{ky10}$ include the same groups as those for $Z_{ka1}$ in formula (KA-1).

The structure represented by formula (KY-2) is preferably a partial structure represented by the following formula (KY-3):

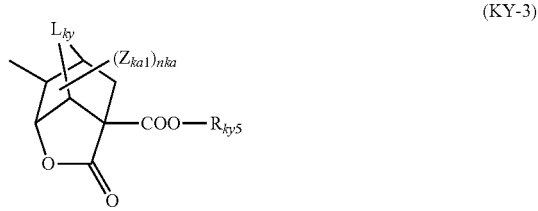
(KY-3)

In formula (KY-3), $Z_{ka1}$ and nka have the same meanings as in formula (KA-1). $R_{ky5}$ has the same meaning as in formula (KY-2).

$L_{ky}$ represents an alkylene group, an oxygen atom or a sulfur atom. Examples of the alkylene group of $L_{ky}$ include a methylene group and an ethylene group. $L_{ky}$ is preferably an oxygen atom or a methylene group, more preferably a methylene group.

The repeating unit (cy) is not limited as long as it is a repeating unit obtained by polymerization such as addition polymerization, condensation polymerization and addition condensation, but this repeating unit is preferably a repeating unit obtained by addition polymerization of a carbon-carbon double bond. Examples thereof include an acrylate-based repeating unit (including a system having a substituent at the α- or β-position), a styrene-based repeating unit (including a system having a substituent at the α- or β-position), a vinyl ether-based repeating unit, a norbornene-based repeating unit, and a maleic acid derivative (such as maleic anhydride, its derivative, and maleimide) repeating unit. An acrylate-based repeating unit, a styrene-based repeating unit, a vinyl ether-based repeating unit and a norbornene-based repeating unit are preferred, an acrylate-based repeating unit, a vinyl ether-based repeating unit and a norbornene-based repeating unit are more preferred, and an acrylate-based repeating unit is most preferred.

In the case where the repeating unit (cy) is a repeating unit having at least either a fluorine atom or a silicon atom (that is, a repeating unit corresponding to the repeating unit (cy') or (cy")), examples of the fluorine atom-containing partial structure in the repeating unit (cy) are the same as those in the repeating unit (c1) described later, and the groups represented by formula (F2) to (F4) are preferred. Also, examples of the silicon atom-containing partial structure in the repeating unit (cy) are the same as those in the repeating unit (c1) described later, and the groups represented by formulae (CS-1) to (CS-3) are preferred.

In the resin (Cy), the content of the repeating unit (cy) is preferably from 10 to 100 mol %, more preferably from 20 to 99 mol %, still more preferably from 30 to 97 mol %, and most preferably from 40 to 95 mol %, based on all repeating units in the resin (Cy).

The content of the repeating unit (cy') is preferably from 10 to 100 mol %, more preferably from 20 to 100 mol %, still more preferably from 30 to 100 mol %, and most preferably from 40 to 100 mol %, based on all repeating units in the resin (Cy).

The content of the repeating unit (cy*) is preferably from 5 to 70 mol %, more preferably from 5 to 60 mol %, still more preferably from 10 to 50 mol %, and most preferably from 10 to 40 mol %, based on all repeating units in the resin (Cy). The content of the repeating unit having at least either a fluorine atom or a silicon atom, which is used together with the repeating unit (cy*), is preferably from 10 to 95 mol %, more preferably from 15 to 85 mol %, still more preferably from 20 to 80 mol %, and most preferably from 25 to 75 mol %, based on all repeating units in the resin (Cy).

The content of the repeating unit (cy") is preferably from 10 to 100 mol %, more preferably from 20 to 100 mol %, still more preferably from 30 to 100 mol %, and most preferably from 40 to 100 mol %, based on all repeating units in the resin (Cy).

Specific examples of the repeating unit (cy) having a group capable of increasing the solubility in an alkali developer are illustrated below, but the present invention is not limited thereto.

Ra represents a hydrogen atom, a fluorine atom, a methyl group or a trifluoromethyl group.

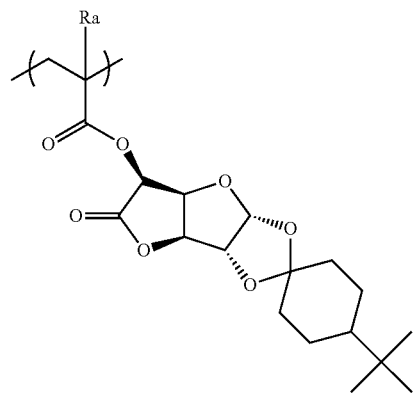

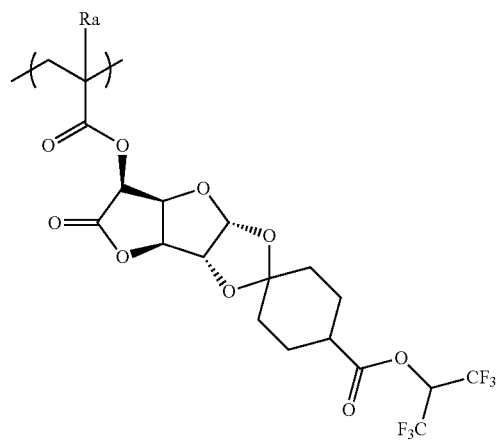

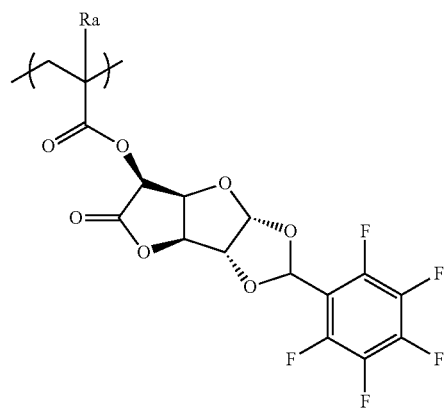

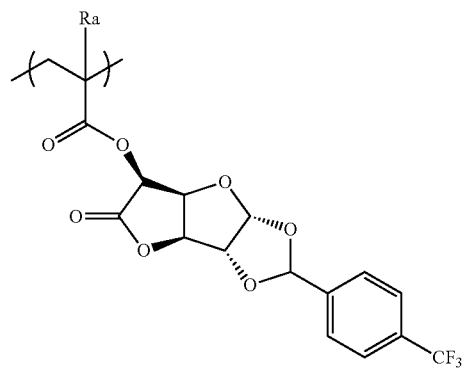

145
-continued
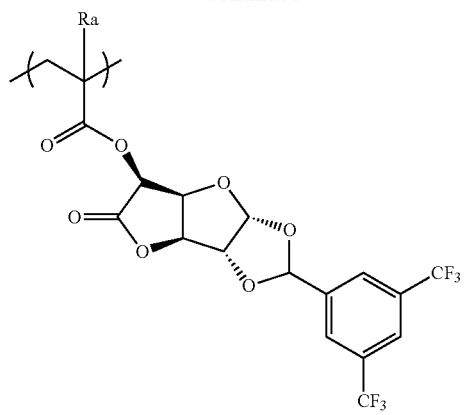
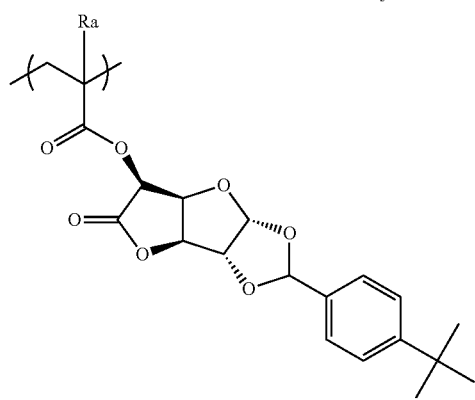
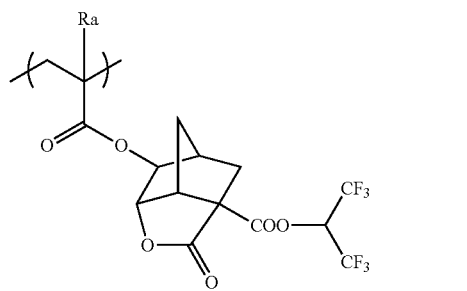
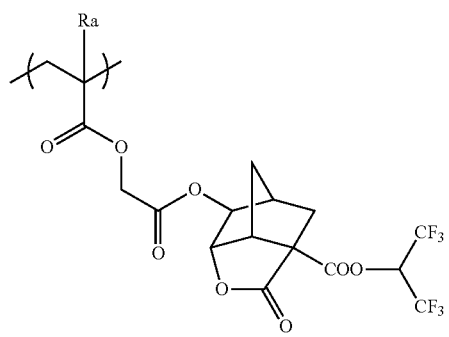
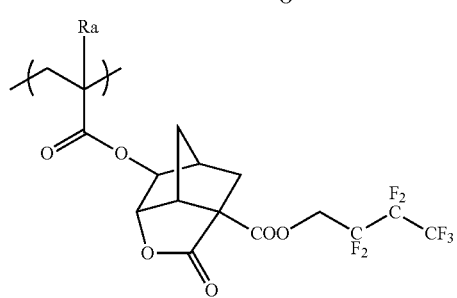
146
-continued
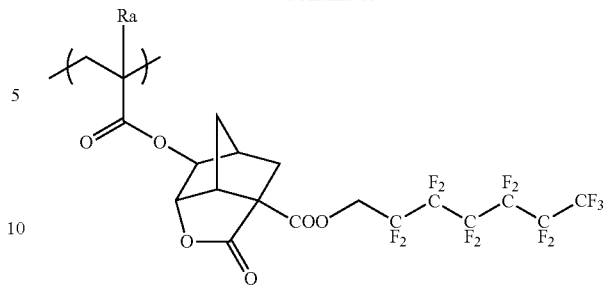
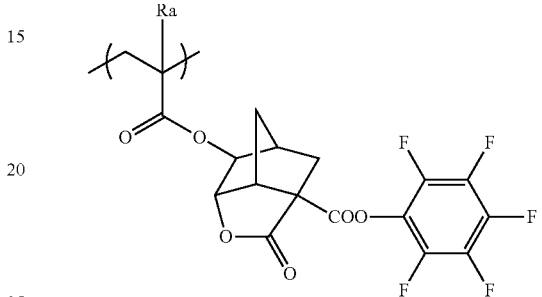
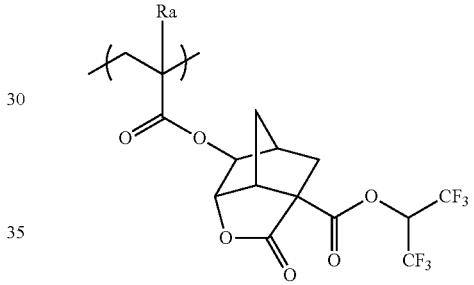
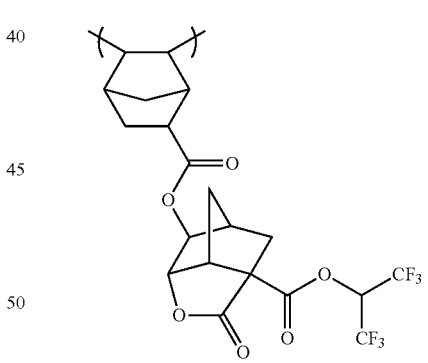
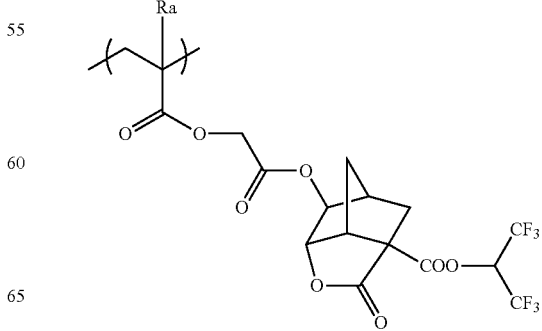

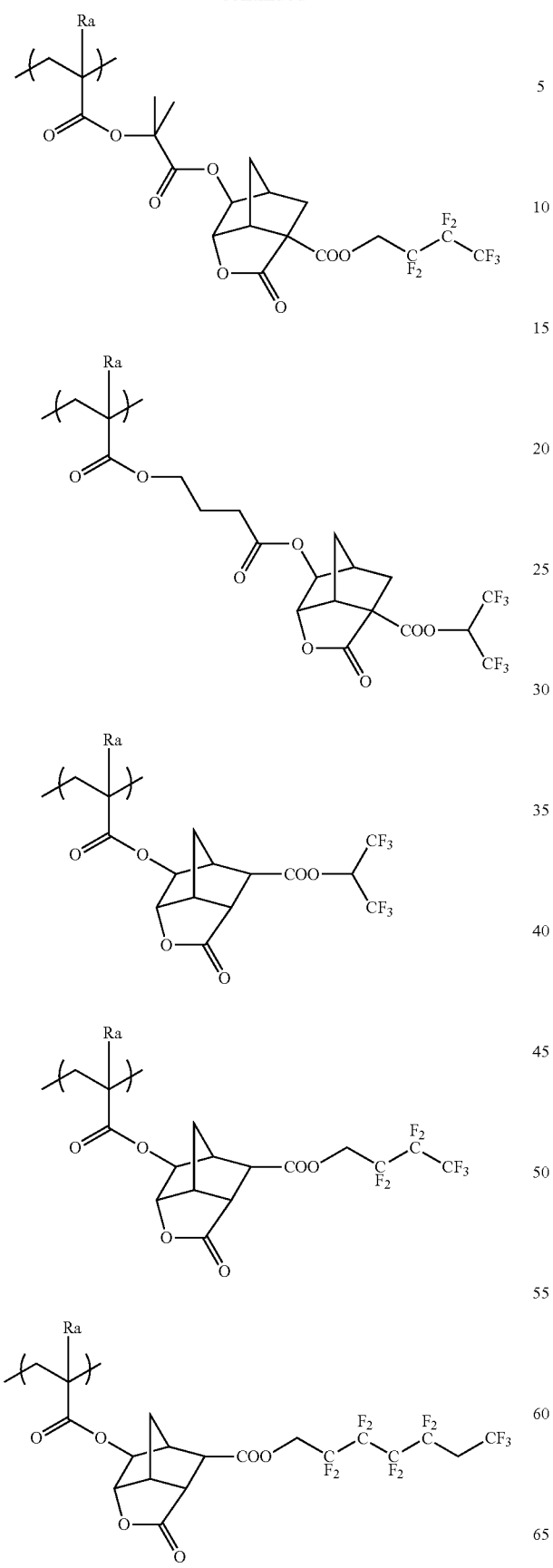
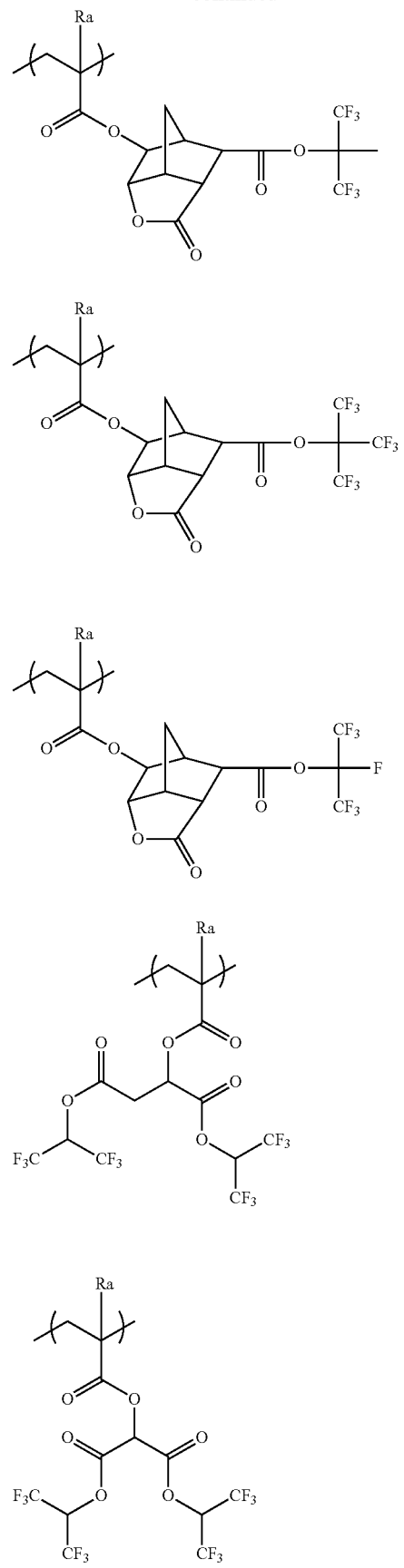

-continued

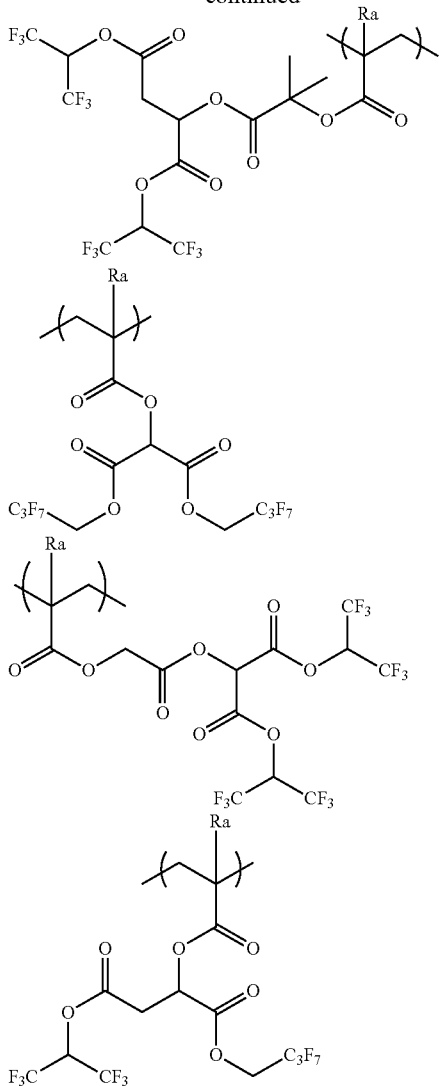

The resin (Cy) may further contain (c1) a repeating unit having at least either a fluorine atom or a silicon atom, which is different from the repeating units (cy') and (cy").

Examples of the fluorine atom-containing partial structure in the repeating unit (c1) are the same as those described above, and the groups represented by formulae (F2) to (F4) are preferred.

Examples of the silicon atom-containing partial structure in the repeating unit (c1) are the same as those described above, and the groups represented by formulae (CS-1) to (CS-3) are preferred.

The repeating unit (c1) having at least either a fluorine atom or a silicon atom is preferably a (meth)acrylate-based repeating unit.

Specific examples of the repeating unit (c1) are the same as specific examples of the repeating unit having a fluorine atom and the repeating unit having a group represented by formulae (CS-1) to (CS-3), but the present invention is not limited thereto.

Examples of the repeating unit having (z) a group capable of decomposing by the action of an acid, contained in the hydrophobic resin (C), are the same as those of the repeating unit having an acid-decomposable group described for the resin (A). The repeating unit having (z) a group capable of decomposing by the action of an acid may contain at least either a fluorine atom or a silicon atom. In the hydrophobic resin (C), the content of the repeating unit having (z) a group capable of decomposing by the action of an acid is preferably from 1 to 80 mol %, more preferably from 10 to 80 mol %, still more preferably from 20 to 60 mol %, based on all repeating units in the resin (C).

The hydrophobic resin (C) may further contain a repeating unit represented by the following formula (III):

In formula (III), $R_{c31}$ represents a hydrogen atom, an alkyl group (which may be substituted with a fluorine atom), a cyano group or a $—CH_2—O—R_{ac2}$ group, wherein $R_{ace}$ represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group, a cycloalkenyl group or an aryl group. Each of these groups may be substituted with a fluorine atom- or silicon atom-containing group.

$L_{c3}$ represents a single bond or a divalent linking group.

In formula (III), the alkyl group of $R_{c32}$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The aryl group is preferably an aryl group having a carbon number of 6 to 20, more preferably a phenyl group or a naphthyl group, and each of these groups may have a substituent.

$R_{c32}$ is preferably an unsubstituted alkyl group or a fluorine atom-substituted alkyl group.

The divalent linking group of $L_{c3}$ is preferably an alkylene group (preferably having a carbon number of 1 to 5), an oxy group, a phenylene group or an ester bond (a group represented by —COO—).

It is also preferred that the hydrophobic resin (C) further contains a repeating unit represented by the following formula (CII-AB):

In formula (CII-AB), each of $R_{c11}'$ and $R_{c12}'$ independently represents a hydrogen atom, a cyano group, a halogen atom or an alkyl group.

$Z_c{}^1$ represents an atomic group for forming an alicyclic structure containing two carbon atoms (C-C) to which $Z_c{}^1$ is bonded.

In the case where each group in the repeating units represented by formulae (III) and (CII-AB) is substituted with a fluorine atom- or silicon atom-containing group, the repeating unit corresponds also to the repeating unit (c1).

Specific examples of the repeating units represented by formulae (III) and (CII-AB) are illustrated below, but the present invention is not limited thereto. In the formulae, Ra represents H, $CH_3$, $CH_2OH$, $CF_3$ or CN. Incidentally, the repeating unit where Ra is $CF_3$ corresponds also to the repeating unit (c1).

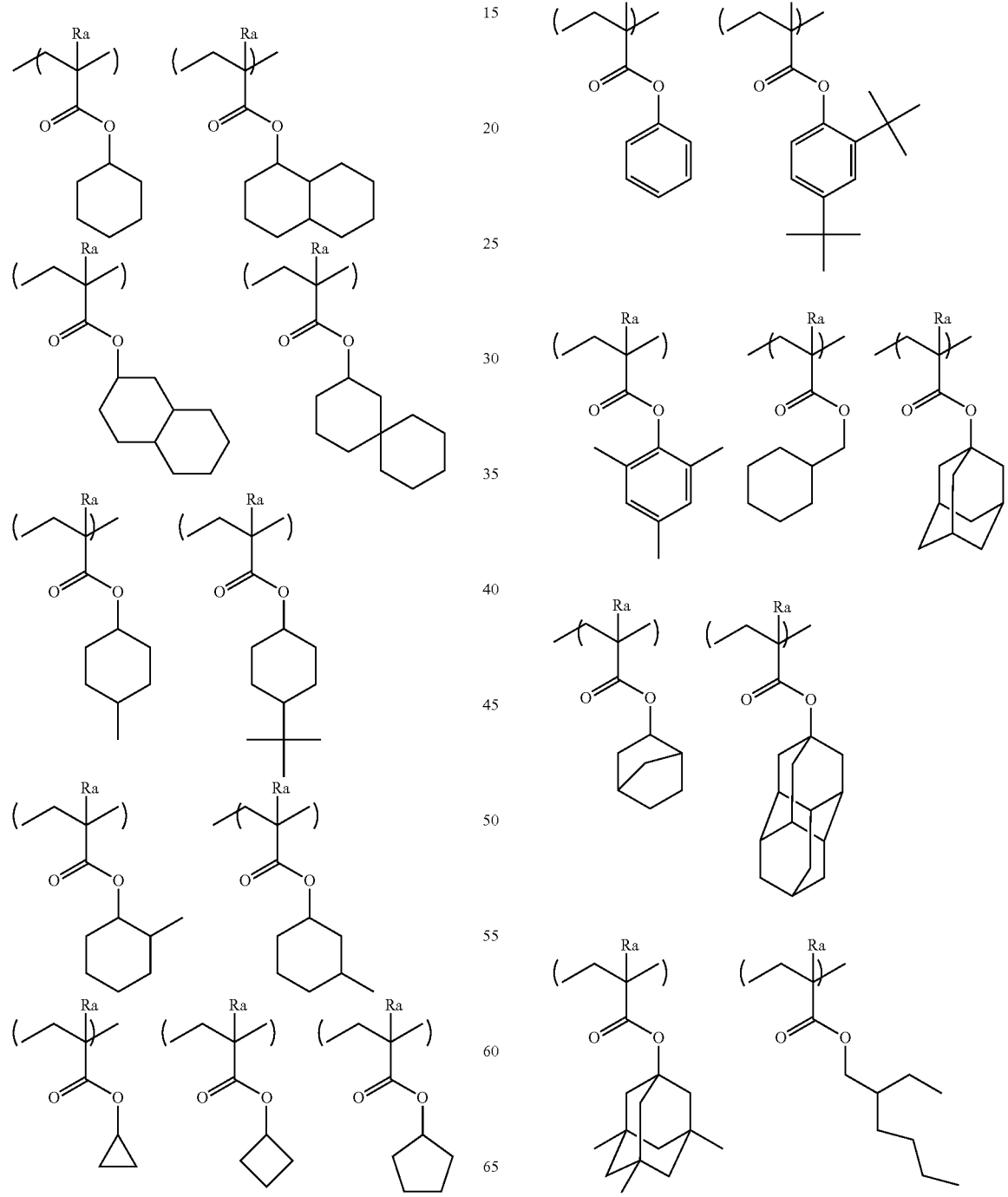

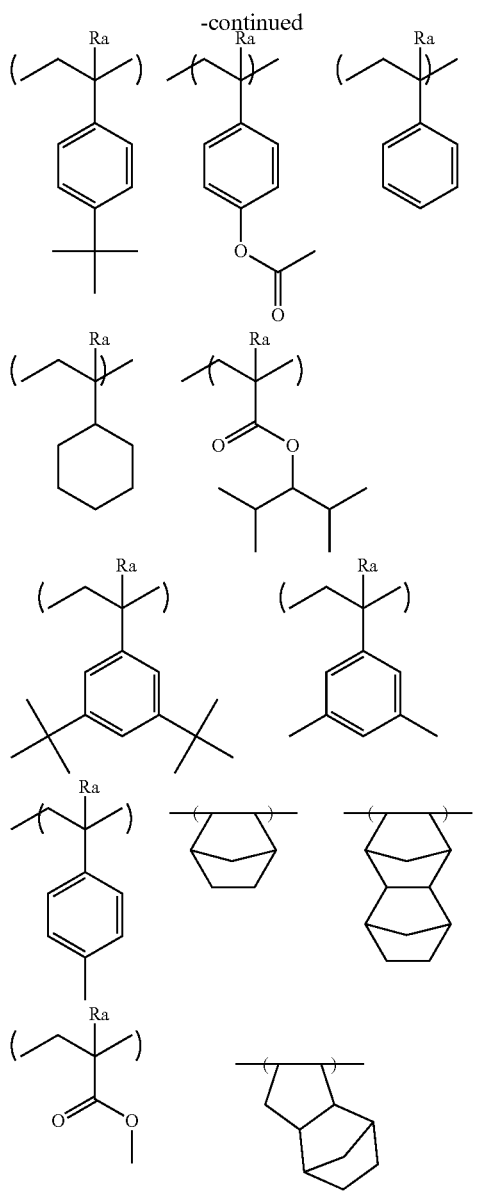

In the case where the hydrophobic resin (C) contains a fluorine atom, the fluorine atom content is preferably from 5 to 80 mass %, more preferably from 10 to 80 mass %, based on the weight average molecular weight of the hydrophobic resin (C). Also, the fluorine atom-containing repeating unit preferably accounts for 10 to 100 mol %, more preferably from 30 to 100 mol %, based on all repeating units contained in the hydrophobic resin (C).

In the case where the hydrophobic resin (C) contains a silicon atom, the silicon atom content is preferably from 2 to 50 mass %, more preferably from 2 to 30 mass %, based on the weight average molecular weight of the hydrophobic resin (C). Also, the silicon atom-containing repeating unit preferably accounts for 10 to 100 mol %, more preferably from 20 to 100 mol %, based on all repeating units contained in the hydrophobic resin (C).

The weight average molecular weight of the hydrophobic resin (C) is preferably from 1,000 to 100,000, more preferably from 1,000 to 50,000, still more preferably from 2,000 to 15,000, in terms of standard polystyrene.

As for the hydrophobic resin (C), one kind of a resin may be used, or a plurality of kinds of resins may be used in combination.

The content of the hydrophobic resin (C) in the composition is preferably from 0.01 to 10 mass %, more preferably from 0.05 to 9 mass %, still more preferably from 0.1 to 8 mass %, based on the entire solid content in the composition of the present invention.

In the hydrophobic resin (C), similarly to the resin (A), it is of course preferred that the content of impurities such as metal is small, but also, the content of residual monomers or oligomer components is preferably from 0.01 to 5 mass %, more preferably from 0.01 to 3 mass %, still more preferably from 0.05 to 1 mass %. When these conditions are satisfied, a resist composition free from extraneous substances in liquid or change with aging of sensitivity or the like can be obtained. Furthermore, in view of resolution, resist profile, side wall of resist pattern, roughness and the like, the molecular weight distribution (Mw/Mn, sometimes referred to as "polydispersity") is preferably from 1 to 5, more preferably from 1 to 3, still more preferably from 1 to 2.

As for the hydrophobic resin (C), various commercially available products may be also used, or the resin may be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred.

The reaction solvent, the polymerization initiator, the reaction conditions (e.g., temperature, concentration) and the purification method after reaction are the same as those described for the resin (A), but in the synthesis of the hydrophobic resin (C), the concentration in reaction is preferably from 30 to 50 mass %.

Specific examples of the hydrophobic resin (C) are illustrated below. Also, the molar ratio of repeating units (corresponding to repeating units starting from the left), weight average molecular weight and polydispersity of each resin are shown in Tables 1 and 2 later.

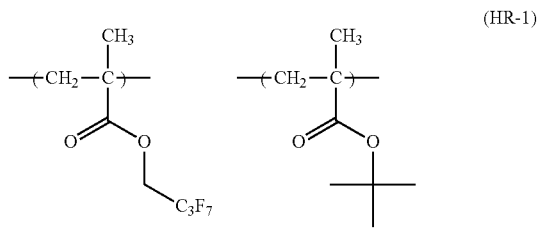

(HR-1)

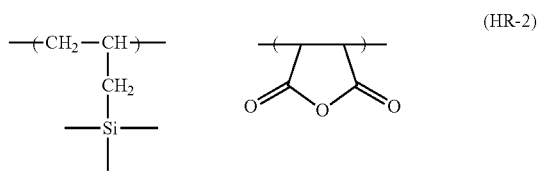

(HR-2)

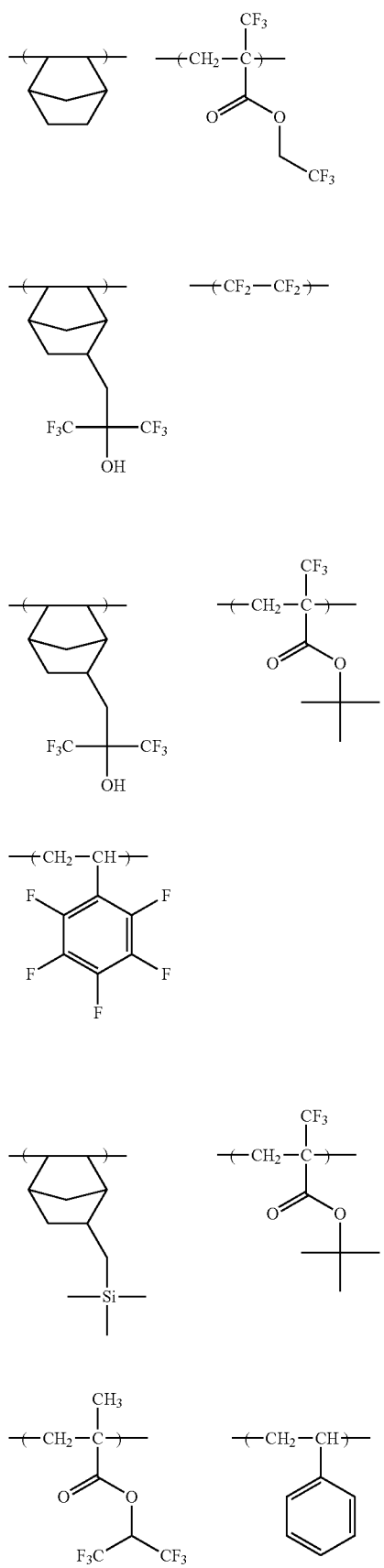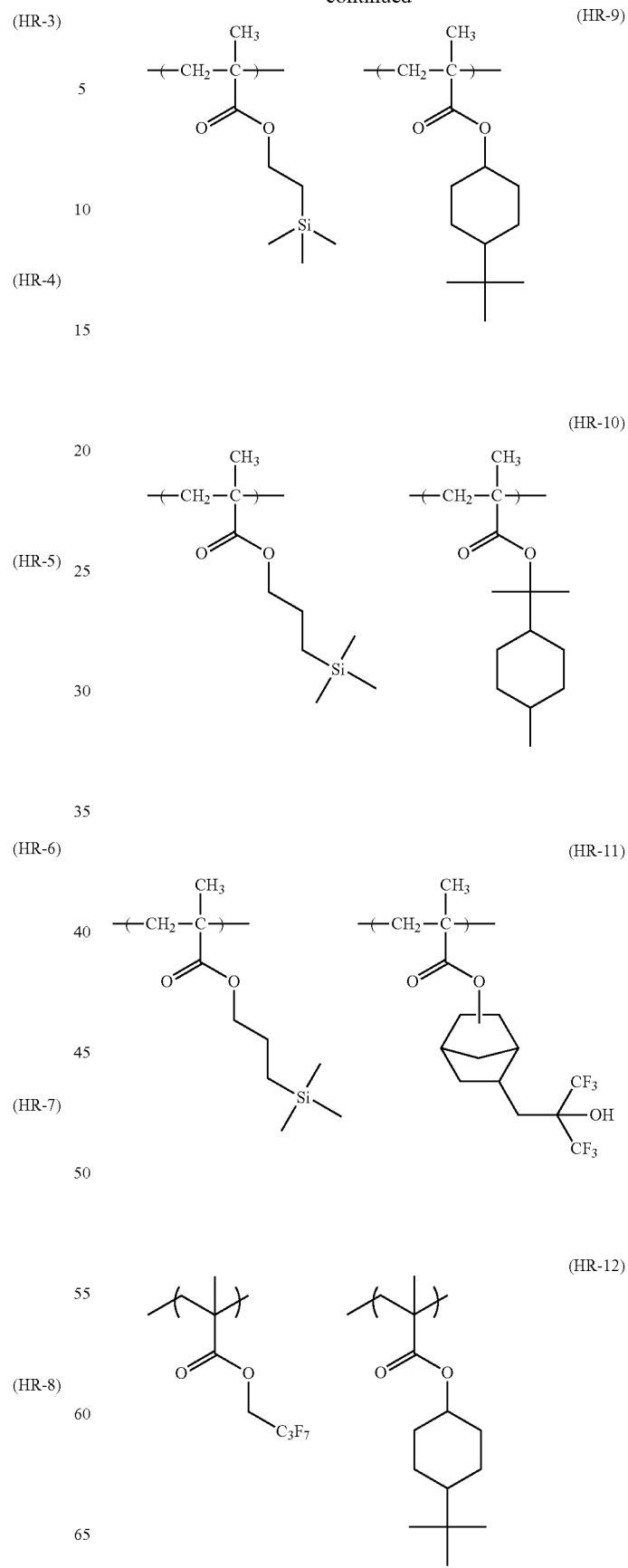

(HR-13) 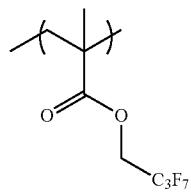 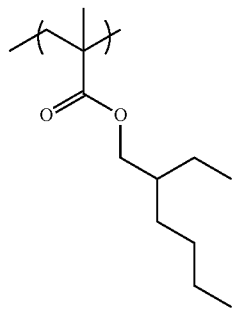
(HR-14) 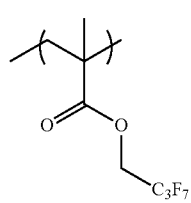 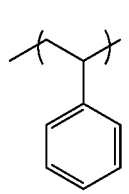
(HR-15) 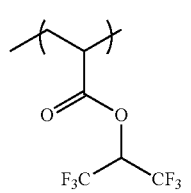 
(HR-16) 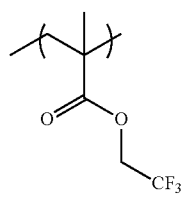 
(HR-17) 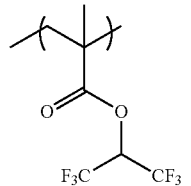 
(HR-18) 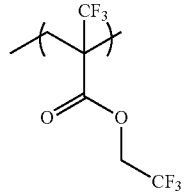 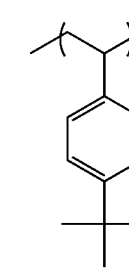
(HR-19) 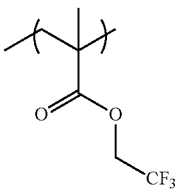 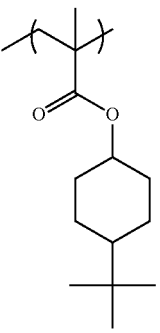
(HR-20) 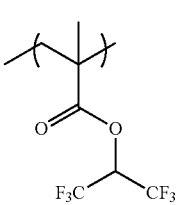 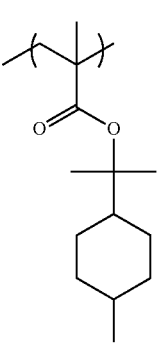
(HR-21) 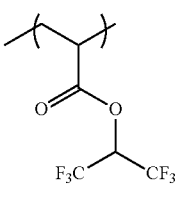 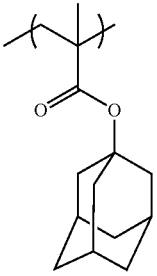
(HR-22) 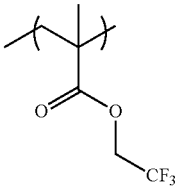 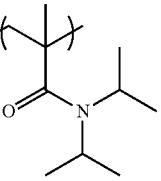
(HR-23) 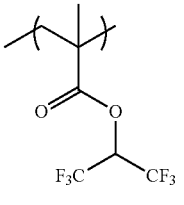 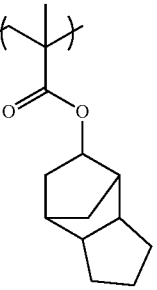

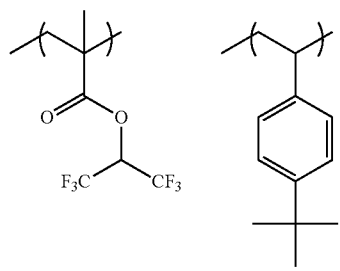
(HR-24)
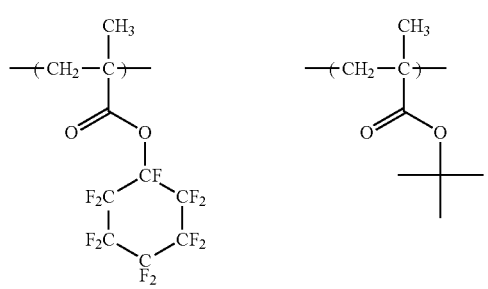
(HR-25)
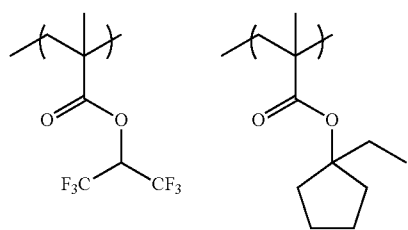
(HR-26)
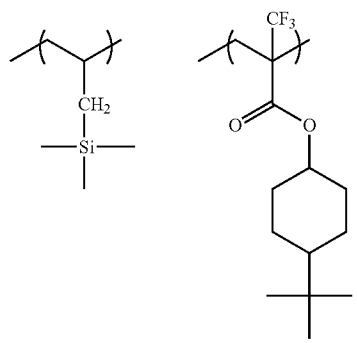
(HR-27)
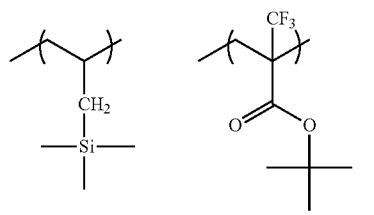
(HR-28)
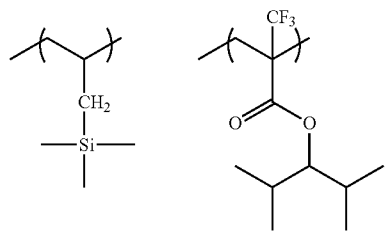
(HR-29)
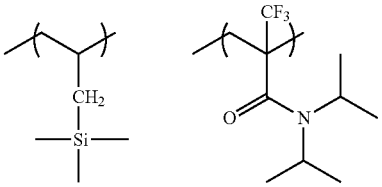
(HR-30)
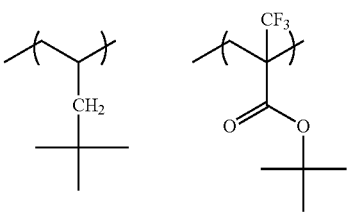
(HR-31)
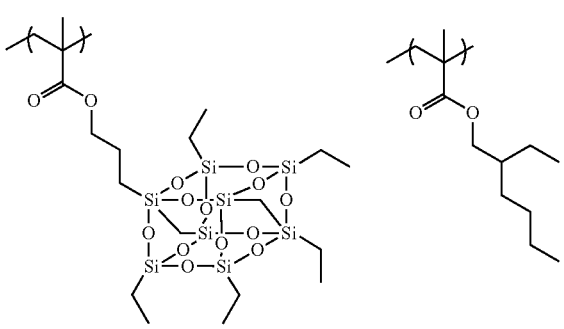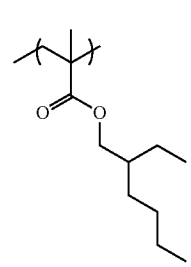
(HR-32)
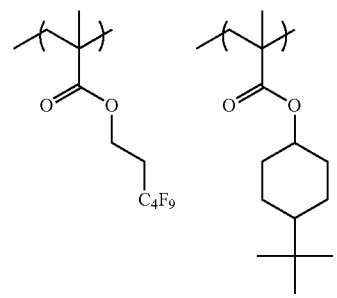
(HR-33)
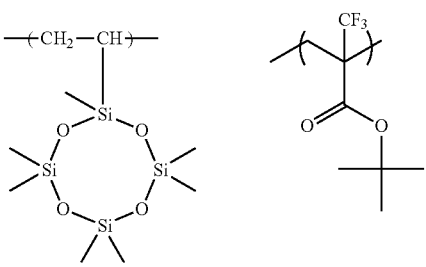
(HR-34)
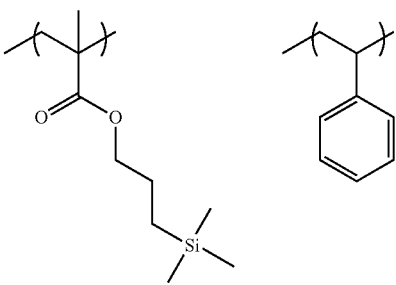
(HR-35)

(HR-36)
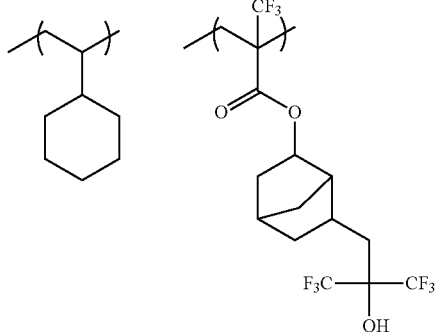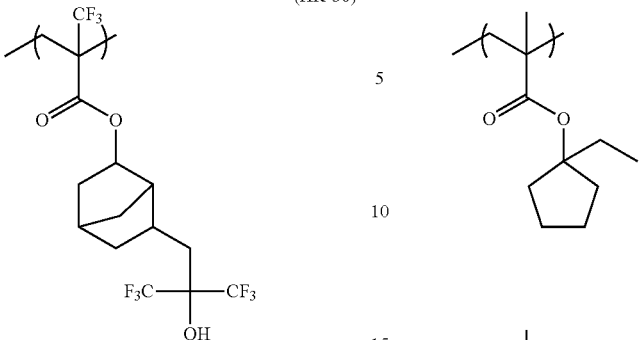
(HR-37)
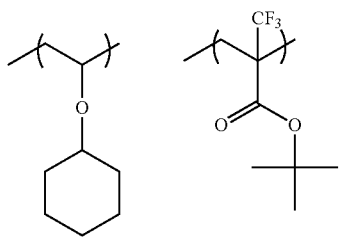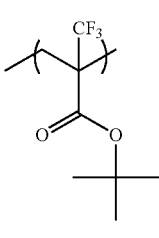
(HR-38)
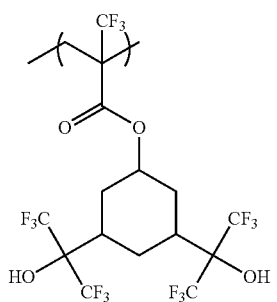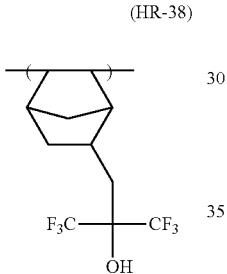
(HR-39)
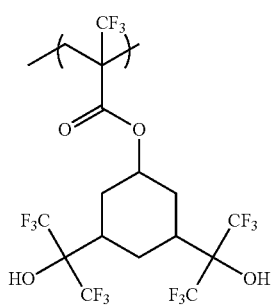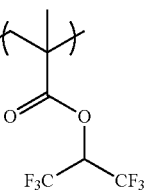
(HR-40)
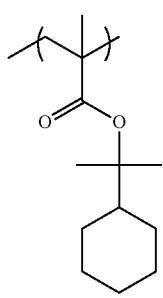
(HR-41)
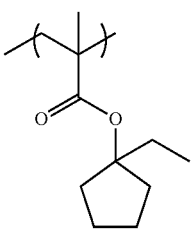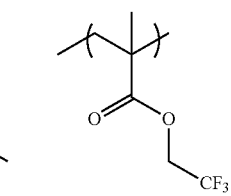
(HR-42)
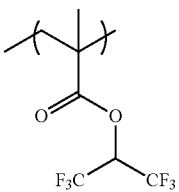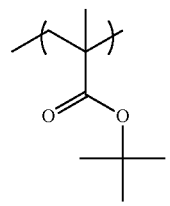
(HR-43)
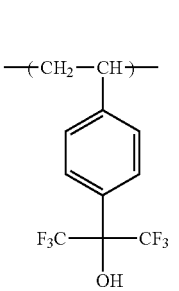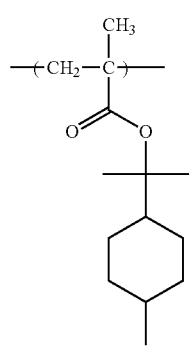
(HR-44)
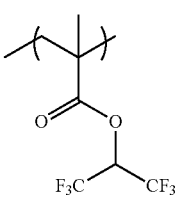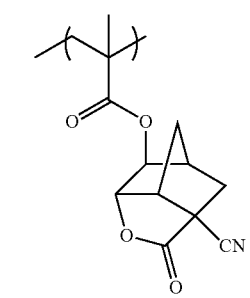
(HR-45)
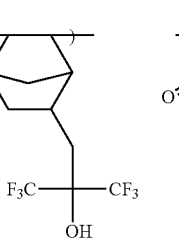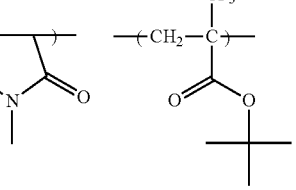

(HR-46)
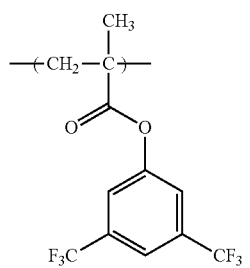
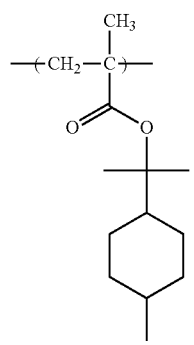
(HR-47)
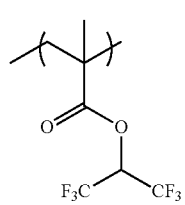
(HR-48)
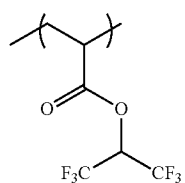
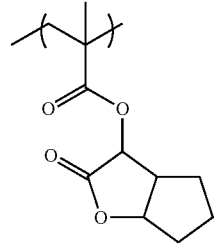
(HR-49)
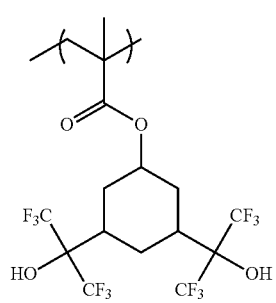
(HR-50)
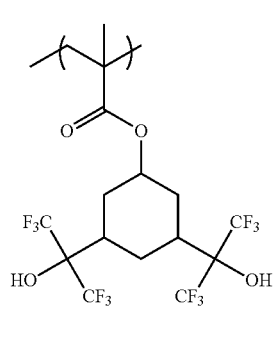
(HR-51)
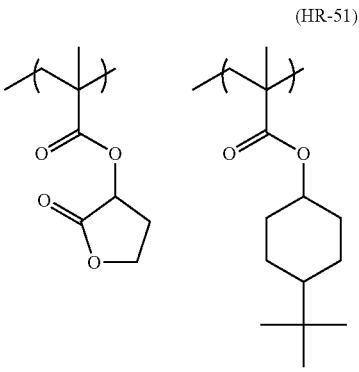
(HR-52)
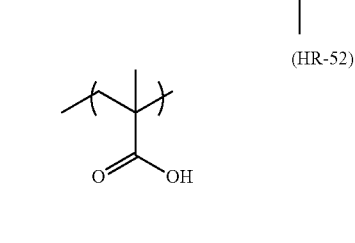
(HR-53)
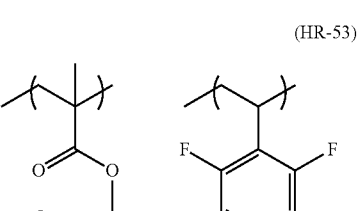
(HR-54)
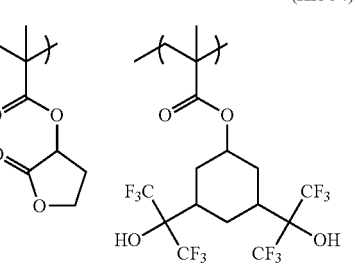
(HR-55)
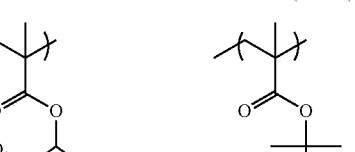
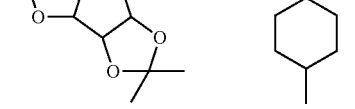
(HR-56)
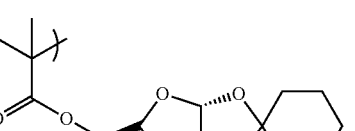

(HR-57)
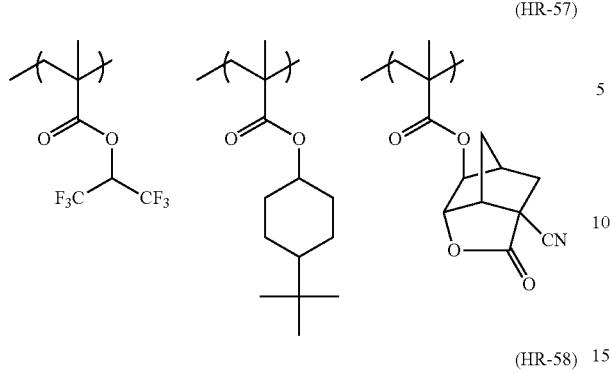
(HR-62)
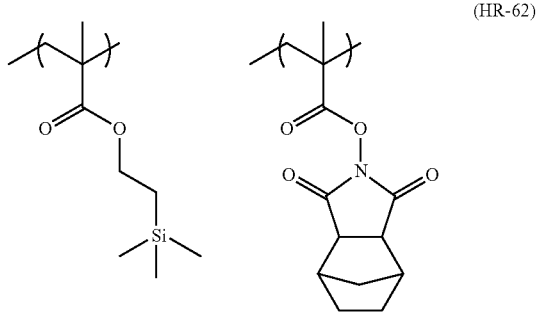
(HR-58)
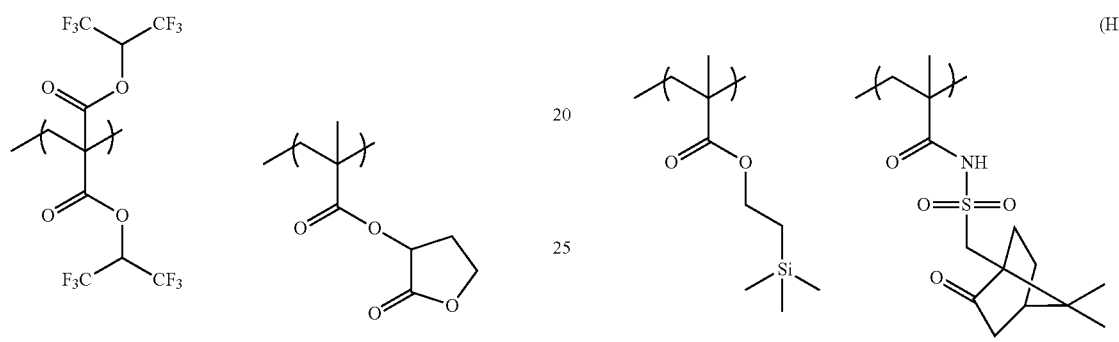
(HR-63)
(HR-59)
(HR-64)
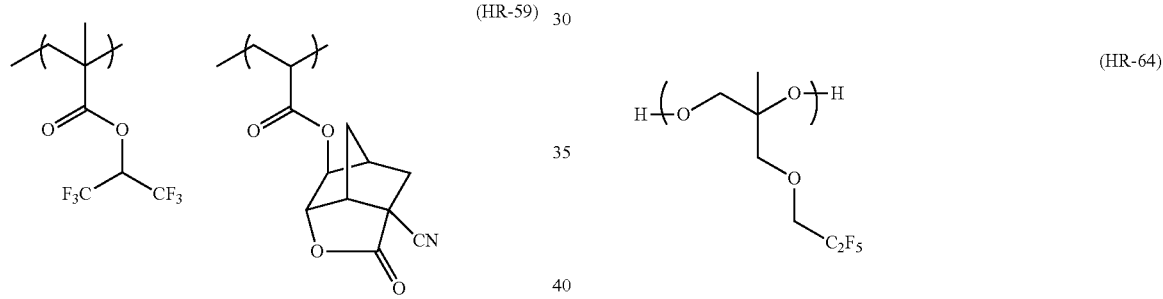
(HR-60)
(HR-65)
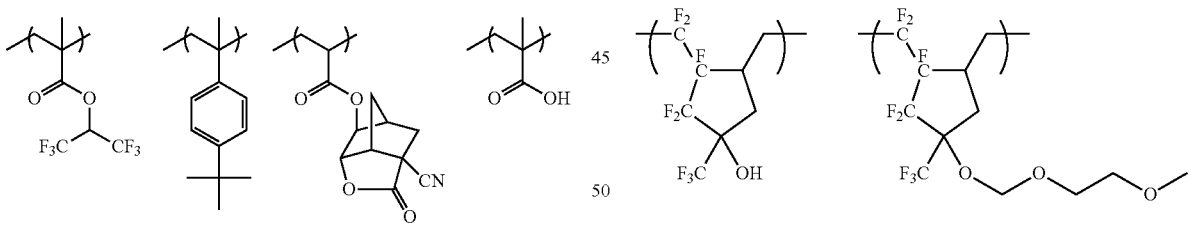
(HR-61)
(HR-66)
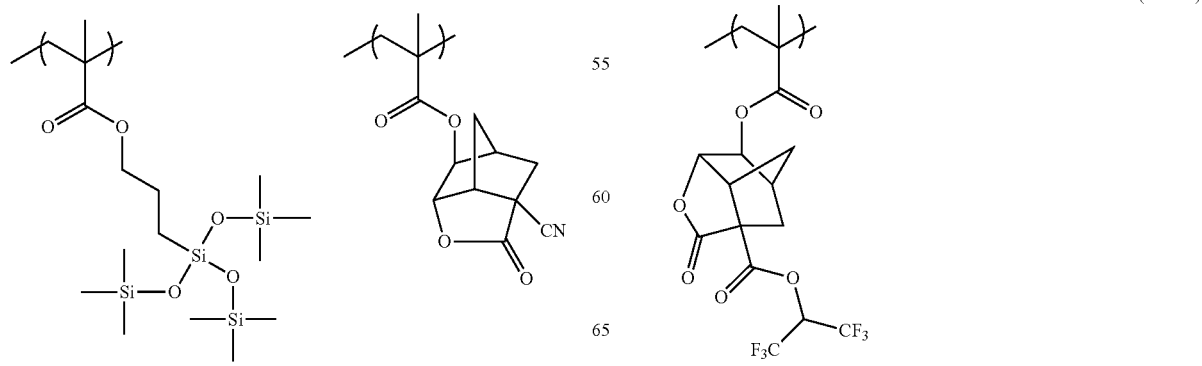

(HR-67) 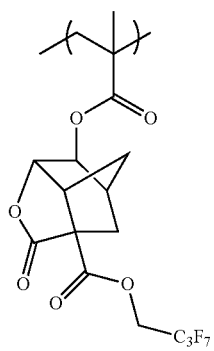
(HR-68) 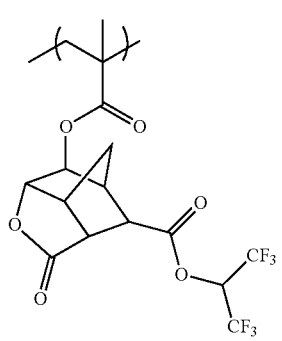
(HR-69) 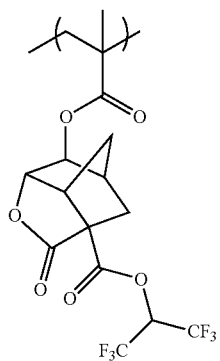
(HR-70) 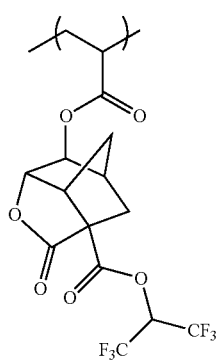
(HR-71) 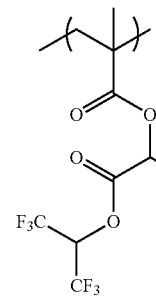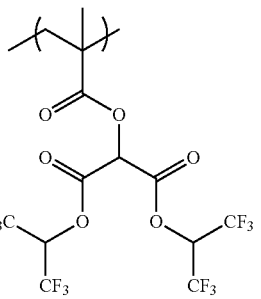
(HR-72) 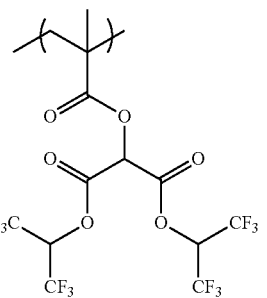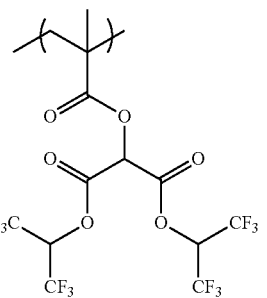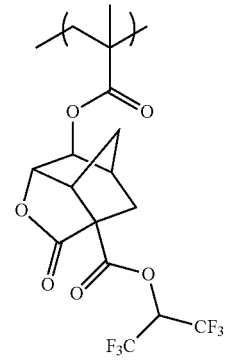
(HR-73) 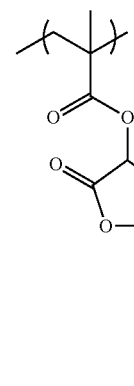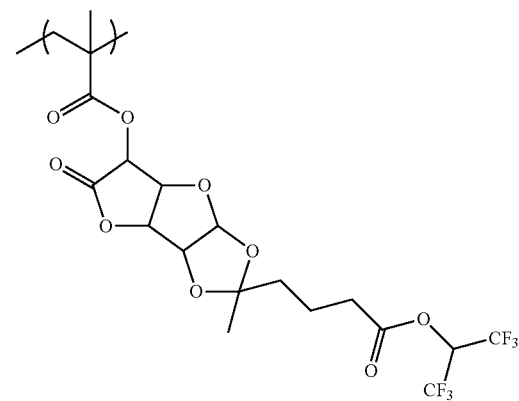
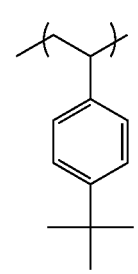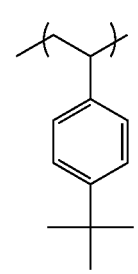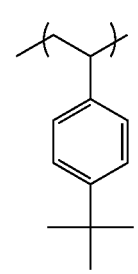

(HR-74)
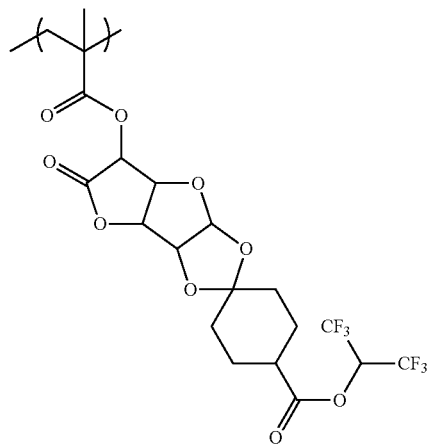
(HR-75)
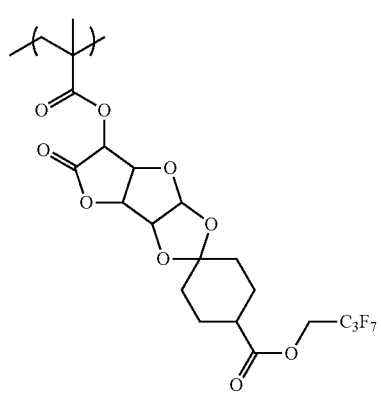 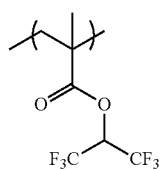
(HR-76)
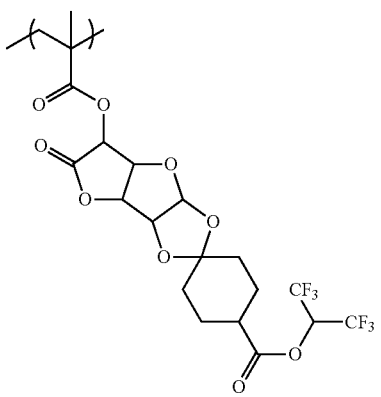 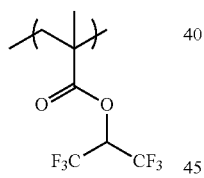
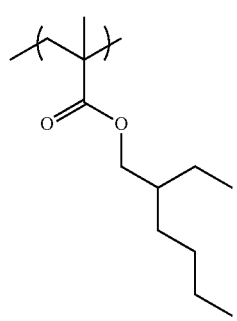
(HR-77)
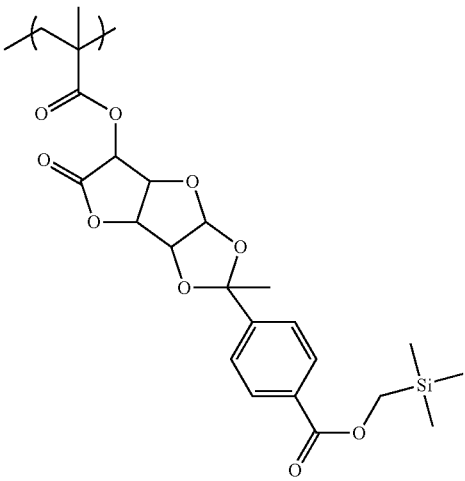
(HR-78)
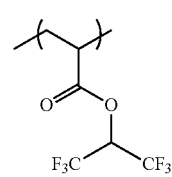
(HR-79)
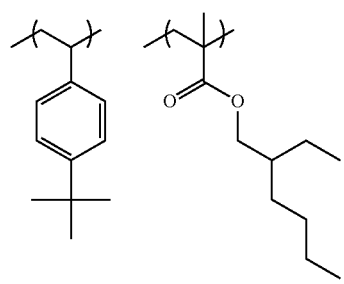
(HR-80)
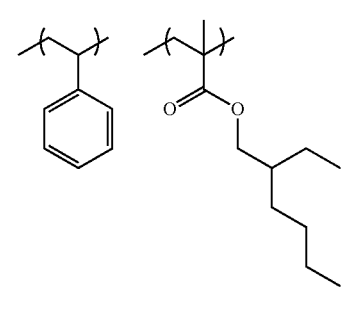

(HR-81)
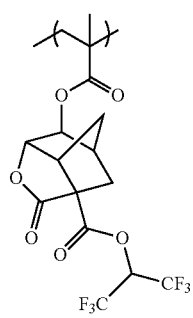 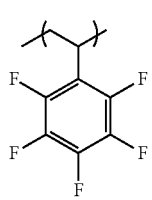 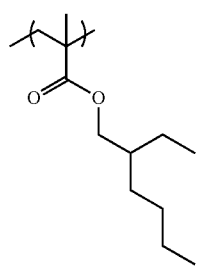
(HR-85)
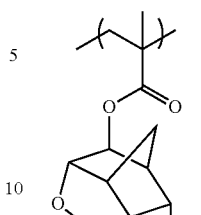 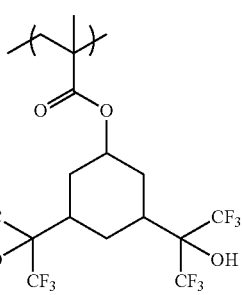
(HR-82)
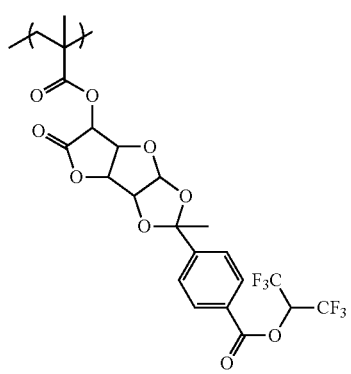 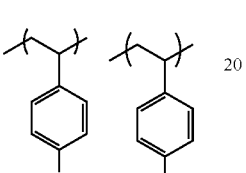
(HR-86)
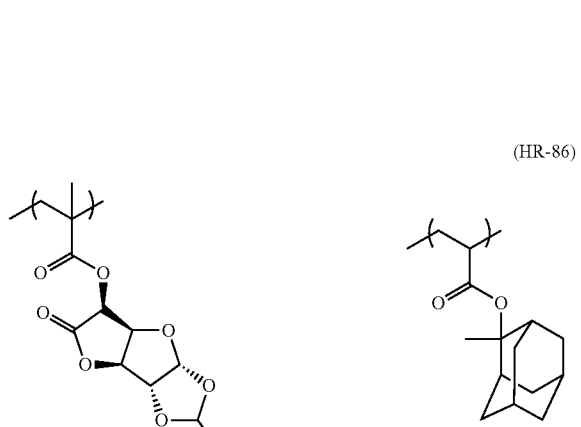
(HR-83)
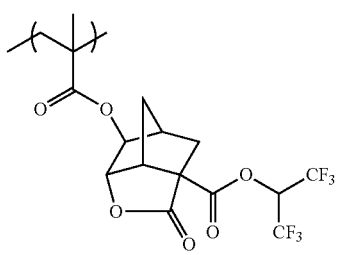 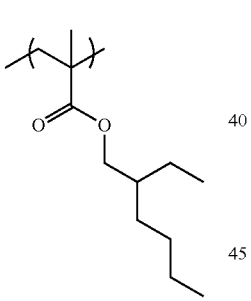
(HR-84)
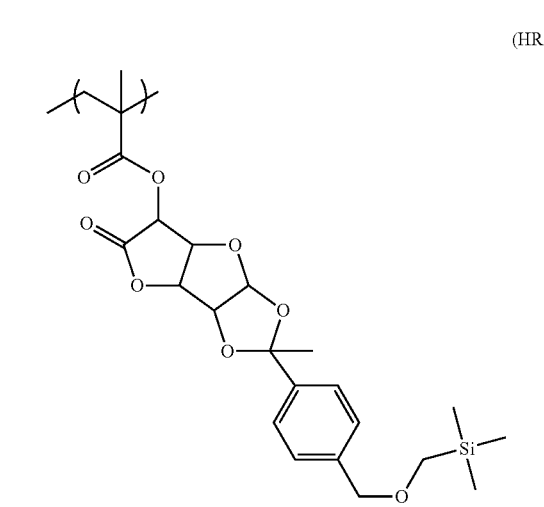
(HR-87)
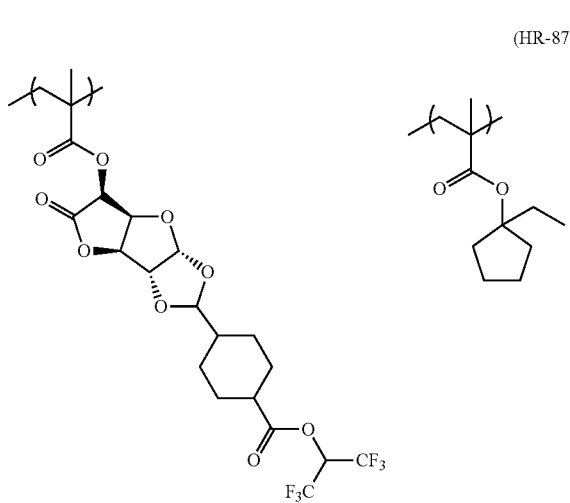

-continued

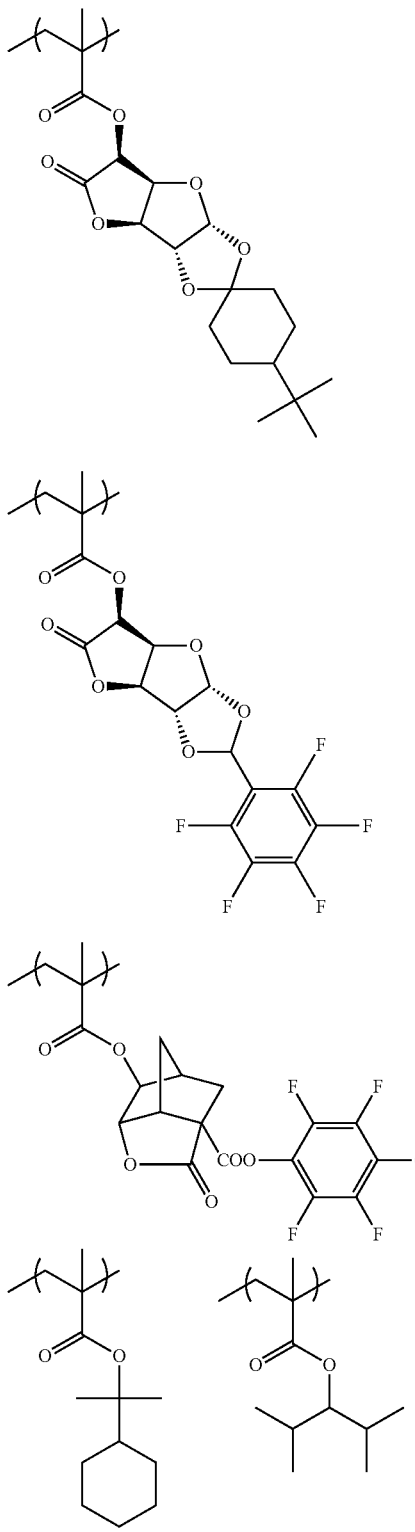

TABLE 1

| Resin | Composition | Mw | Mw/Mn |
|---|---|---|---|
| HR-1 | 50/50 | 4900 | 1.4 |
| HR-2 | 50/50 | 5100 | 1.6 |

TABLE 1-continued

| Resin | Composition | Mw | Mw/Mn |
|---|---|---|---|
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

TABLE 2

| Resin | Composition | Mw | Mw/Mn |
|---|---|---|---|
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |

TABLE 2-continued

| Resin | Composition | Mw | Mw/Mn |
|---|---|---|---|
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

[4] Solvent

Examples of the solvent which can be used at the time of preparing the actinic ray-sensitive or radiation-sensitive resin composition by dissolving the above-described components include an organic solvent such as alkylene glycol, alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate, alkyl pyruvate, alkyl acetate, amide-based solvent and dialkyl sulfoxide.

Preferred examples of the alkylene glycol include ethylene glycol and propylene glycol.

Preferred examples of the alkylene glycol monoalkyl ether carboxylate include propylene glycol monomethyl ether acetate (PGMEA, another name: 1-methoxy-2-acetoxypropane), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether (PGME, another name: 1-methoxy-2-propanol), propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

Preferred examples of the alkyl acetate include ethyl acetate and butyl acetate.

Preferred examples of the amide-based solvent include N-methyl-2-pyrrolidone, N,N-dimethylacetamide, N,N-dimethylformamide, hexamethylphosphoric triamide and 1,3-dimethyl-2-imidazolidinone.

Preferred examples of the dialkyl sulfoxide include dimethyl sulfoxide and diethyl sulfoxide.

The solvent that can be preferably used includes a solvent having a boiling point of 130° C. or more at ordinary temperature under atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more kinds thereof may be used in combination.

In the present invention, a mixed solvent prepared by mixing a solvent containing a hydroxyl group in the structure and a solvent containing no hydroxyl group may be used as the organic solvent.

The solvent containing a hydroxyl group and the solvent containing no hydroxyl group may be appropriately selected from the compounds illustrate above, but the solvent containing a hydroxyl group is preferably an alkylene glycol, an alkylene glycol monoalkyl ether, an alkyl lactate or the like, and examples thereof include ethylene glycol, ethylene glycol monomethyl ether, ethylene glycol monoethyl ether, propylene glycol, propylene glycol monomethyl ether, propylene glycol monoethyl ether and ethyl acetate. Among these, propylene glycol monomethyl ether and ethyl lactate are preferred.

The solvent containing no hydroxyl group is preferably an alkylene glycol monoalkyl ether carboxylate, an alkyl alkoxypropionate, a monoketone compound that may contain a ring, a cyclic lactone, an alkyl acetate, an amide-based solvent, a dialkyl sulfoxide or the like, and examples thereof include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Among these, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate and 2-heptanone are most preferred.

The mixing ratio (by mass) of the solvent containing a hydroxyl group to the solvent containing no hydroxyl group is from 1/99 to 99/1, preferably from 10/90 to 90/10, more preferably from 20/80 to 60/40. A mixed solvent in which the solvent containing no hydroxyl group is contained in a ratio of 50 mass % or more is particularly preferred in view of coating uniformity.

The solvent preferably contains propylene glycol monomethyl ether acetate and is preferably a single solvent of propylene glycol monomethyl acetate or a mixed solvent of two or more kinds of solvents containing propylene glycol monomethyl acetate.

[5] Basic Compound

The actinic ray-sensitive or radiation-sensitive resin composition of the present invention preferably contains a basic compound so as to reduce the change in performance with aging from exposure to heating.

Preferred basic compounds include a basic compound having a structure represented by the following formulae (A) to (E):

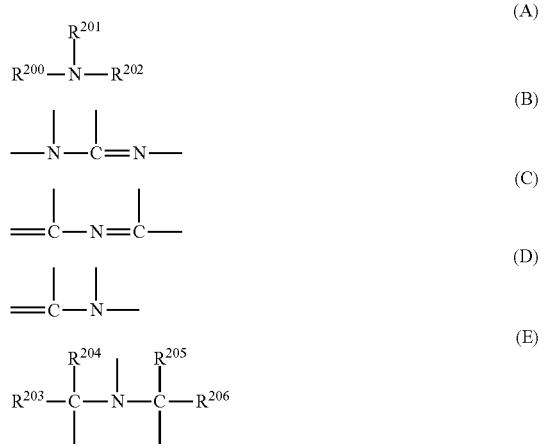

In formulae (A) and (E), each of $R^{200}$, $R^{201}$, and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine together to form a ring.

Each of $R^{203}$, $R^{204}$, $R^{205}$ and $R^{206}$, which may be the same or different, represents an alkyl group having a carbon number of 1 to 20.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

The alkyl group in formulae (A) and (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, benzimidazole and 2-phenylbenzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a tetrabutylammonium hydroxide, a triarylsulfonium hydroxide, a phenacylsulfonium hydroxide, and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure becomes a carboxylate, and examples thereof include an acetate, an adamantane-1-carboxylate and a perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine, N-phenyldiethanolamine and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound and a sulfonic acid ester group-containing ammonium salt compound.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The amine compound preferably has an oxygen atom in the alkyl chain to form an oxyalkylene group. The number of oxyalkylene groups within molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—CH(CH$_3$)CH$_2$O— or —CH$_2$CH$_2$CH$_2$O—) are preferred, and an oxyethylene group is more preferred.

Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. Examples of the organic sulfonate include an alkylsulfonate having a carbon number of 1 to 20 and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring may have a substituent, and the substituent is preferably a linear or branched alkyl group having a carbon number of 1 to 6, or a cycloalkyl group having a carbon number of 3 to 6. Specific examples of the linear or branched alkyl group and cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The phenoxy group-containing amine compound and the phenoxy group-containing ammonium salt compound are an amine compound or ammonium salt compound having a phenoxy group at the terminal opposite the nitrogen atom of the alkyl group. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range of 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group (—CH$_2$CH$_2$O—) and an oxypropylene group (—CH(CH$_3$)CH$_2$O— or —CH$_2$CH$_2$CH$_2$O—) are preferred, and an oxyethylene group is more preferred.

The sulfonic acid ester group in the sulfonic acid ester group-containing amine compound and the sulfonic acid ester group-containing ammonium salt compound may be any of an alkylsulfonic acid ester, a cycloalkylsulfonic acid ester and an arylsulfonic acid ester. In the case of an alkylsulfonic acid ester, the alkyl group preferably has a carbon number of 1 to 20; in the case of a cycloalkylsulfonic acid ester, the cycloalkyl group preferably has a carbon number of 3 to 20; and in the case of an arylsulfonic acid ester, the aryl group preferably has a carbon number of 6 to 12. The alkylsulfonic acid ester, cycloalkylsulfonic acid ester and arylsulfonic acid ester may have a substituent, and the substituent is preferably a halogen atom, a cyano group, a nitro group, a carboxyl group, a carboxylic acid ester group or a sulfonic acid ester group.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group (—CH$_2$CH$_2$O—) and an oxypropylene group (—CH(CH$_3$) CH$_2$O— or —CH$_2$CH$_2$CH$_2$O—) are preferred, and an oxyethylene group is more preferred.

The compounds shown below are also preferred as the basic compound.

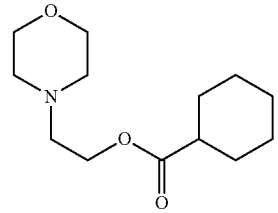

(MO-1)

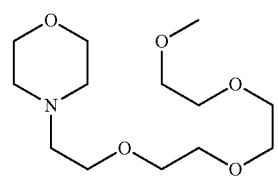

(MO-2)

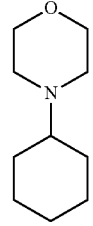

(MO-3)

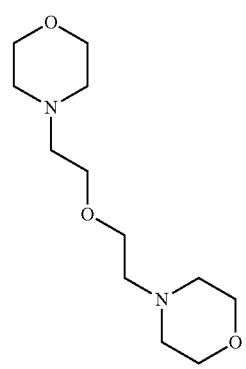

(MO-4)

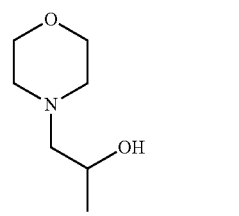

(MO-5)

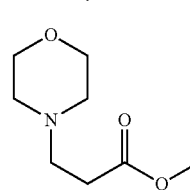

(MO-6)

One of these basic compounds is used alone, or two or more thereof are used in combination.

The composition of the present invention may or may not contain a basic compound, but in the case of containing a basic compound, the content thereof is usually from 0.001 to 10 mass %, preferably from 0.01 to 5 mass %, based on the solid content of the actinic ray-sensitive or radiation-sensitive resin composition.

The ratio between the acid generator and the basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/basic compound (by mol) is more preferably from 5.0 to 200, still more preferably from 7.0 to 150.

Such a basic compound is preferably used, based on (D) a low molecular compound having a group capable of leaving by the action of an acid, in a molar ratio of (D) a low molecular compound having a group capable of leaving by the action of an acid/a basic compound=from 100/0 to 10/90, more preferably (D) a low molecular compound having a group capable of leaving by the action of an acid/a basic compound=from 100/0 to 30/70, still more preferably (D) a low molecular compound having a group capable of leaving by the action of an acid/a basic compound=from 100/0 to 50/50.

Incidentally, the basic compound as used herein does not include (D) a low molecular compound having a group capable of leaving by the action of an acid when this is also a basic compound.

[6] (D) Low Molecular Compound Having a Group Capable of Leaving by the Action of an Acid The composition of the present invention may contain (D) a low molecular compound having a group capable of leaving by the action of an acid (hereinafter, sometimes referred to as a "low molecular compound (D)" or "compound (D)"). The group capable of leaving by the action of an acid is not particularly limited but is preferably an acetal group, a carbonate group, a carbamate group, a tertiary ester group, a tertiary hydroxyl group or a hemiaminal ether group, more preferably a carbamate group or a hemiaminal ether group.

The molecular weight of the low molecular compound having a group capable of leaving by the action of an acid is preferably from 100 to 1,000, more preferably from 100 to 700, still more preferably from 100 to 500.

The low molecular compound (D) is preferably an amine derivative having on the nitrogen atom a group capable of leaving by the action of an acid.

The low molecular compound (D) may have a protective group-containing carbamate group on the nitrogen atom. The protective group constituting the carbamate group can be represented by the following formula (d-1):

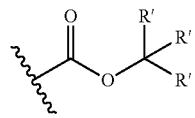

(d-1)

In formula (d-1), each R' independently represents a hydrogen atom, a linear or branched alkyl group, a cycloalkyl group, an aryl group, an aralkyl group or an alkoxyalkyl group. Two R's may combine with every other to form a ring.

R' is preferably a linear or branched alkyl group, a cycloalkyl group or an aryl group, more preferably a linear or branched alkyl group or a cycloalkyl group.

The low molecular compound (D) may be also composed by arbitrarily combining the above-described basic compound and the structure represented by formula (d-1).

The low molecular compound (D) is more preferably a compound having a structure represented by the following formula (A).

Incidentally, the low molecular compound (D) may be a compound corresponding to the above-described basic compound as long as it is a low molecular compound having a group capable of leaving by the action of an acid.

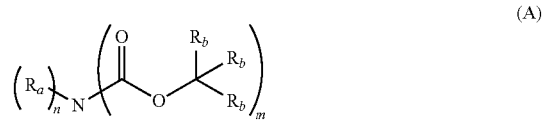

(A)

In formula (A), each Ra independently represents a hydrogen atom, an alkyl group, a cycloalkyl group, an aryl group or an aralkyl group. Also, when n=2, two Ra's may be the same or different, and two Ra's may combine with each other to form a heterocyclic hydrocarbon group (preferably having a carbon number of 20 or less) or a derivative thereof.

Each Rb independently represents a hydrogen atom, an alkyl group, a cycloalkyl group, an aryl group or an aralkyl group.

Two Rb's may combine to form an alicyclic hydrocarbon group, an aromatic hydrocarbon group, a heterocyclic hydrocarbon group, or a derivative thereof.

n represents an integer of 0 to 2, m represents an integer of 1 to 3, and n+m=3.

In formula (A), each of the alkyl group, cycloalkyl group, aryl group and aralkyl group of Ra and Rb may be substituted with a functional group such as hydroxyl group, cyano group, amino group, pyrrolidino group, piperidino group, morpholino group and oxo group, an alkoxy group or a halogen atom.

Examples of the alkyl group, cycloalkyl group, aryl group and aralkyl group (each of these alkyl group, cycloalkyl group, aryl group and aralkyl group may be substituted with the above-described functional group, an alkoxy group or a halogen atom) of Ra and Rb include:

a group derived from a linear or branched alkane such as methane, ethane, propane, butane, pentane, hexane, heptane, octane, nonane, decane, undecane and dodecane, or a group where the group derived from an alkane is substituted with one or more kinds of or one or more groups of cycloalkyl group such as cyclobutyl group, cyclopentyl group and cyclohexyl group;

a group derived from a cycloalkane such as cyclobutane, cyclopentane, cyclohexane, cycloheptane, cyclooctane, norbornane, adamantane and noradamantane, or a group where the group derived from a cycloalkane is substituted with one or more kinds of or one or more groups of linear or branched alkyl group such as methyl group, ethyl group, n-propyl group, i-propyl group, n-butyl group, 2-methylpropyl group, 1-methylpropyl group and tert-butyl group;

a group derived from an aromatic compound such as benzene, naphthalene and anthracene, or a group where the group derived from an aromatic compound is substituted with one or more kinds of or one or more groups of linear or branched alkyl group such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from a heterocyclic compound is substituted with one or more kinds of or one or more groups of linear or branched alkyl group or aromatic compound-derived group; a group where the group derived from a linear or branched alkane or the group derived from a cycloalkane is substituted with one or more kinds of or one or more groups of aromatic compound-derived group such as phenyl group, naphthyl group and anthracenyl group; and a group where the substituent above is substituted with a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra's with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group where the group derived from a heterocyclic compound is substituted with one or more kinds of or one or more groups of linear or branched alkane-derived group, cycloalkane-derived group, aromatic compound-derived group, heterocyclic compound-derived group, and functional group such as hydroxyl group, cyano group, amino group, pyrrolidino group, piperidino group, morpholino group and oxo group.

Specific examples of the low molecular compound (D) particularly preferred in the present invention are illustrated below, but the present invention is not limited thereto.

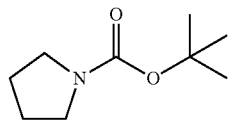

(D-1)

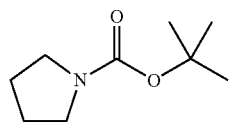

(D-2)

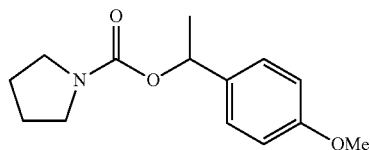

(D-3)

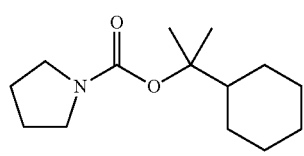

(D-4)

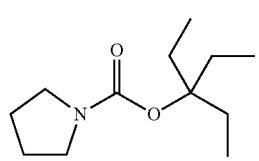

(D-5)

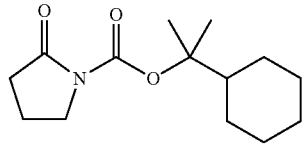

(D-6)

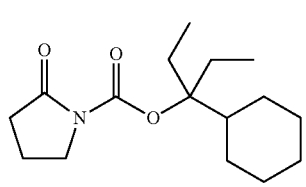

(D-7)

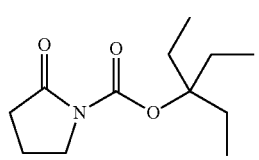

(D-8)

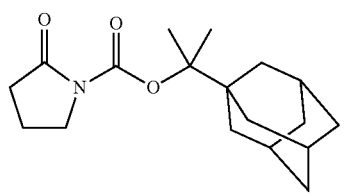

(D-9)

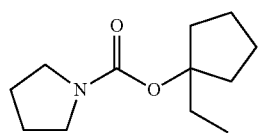

(D-10)

(D-11)

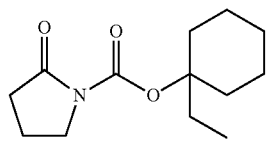

(D-12)

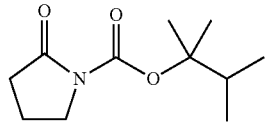

(D-13)

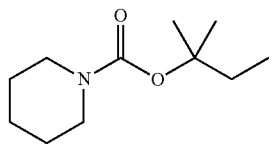

(D-14)

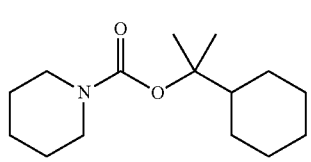

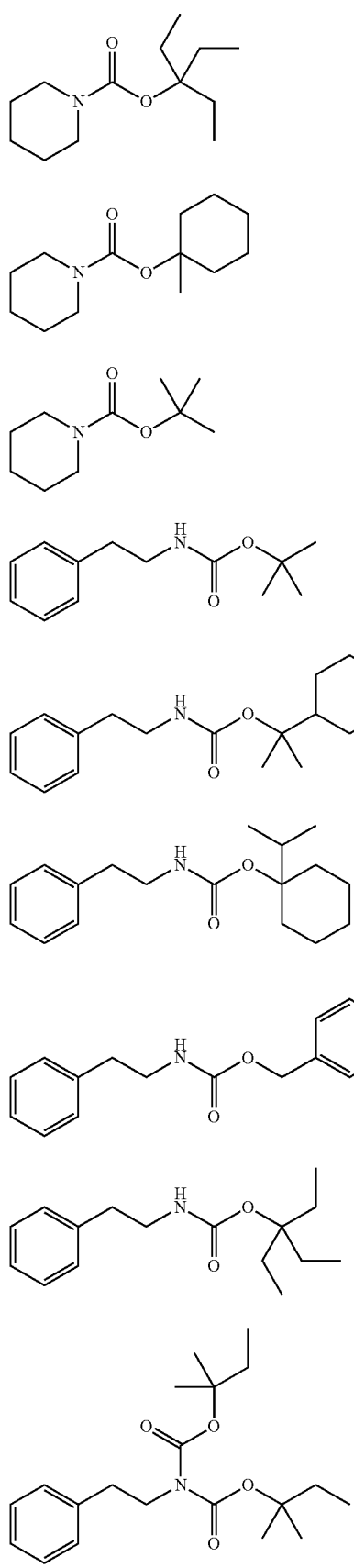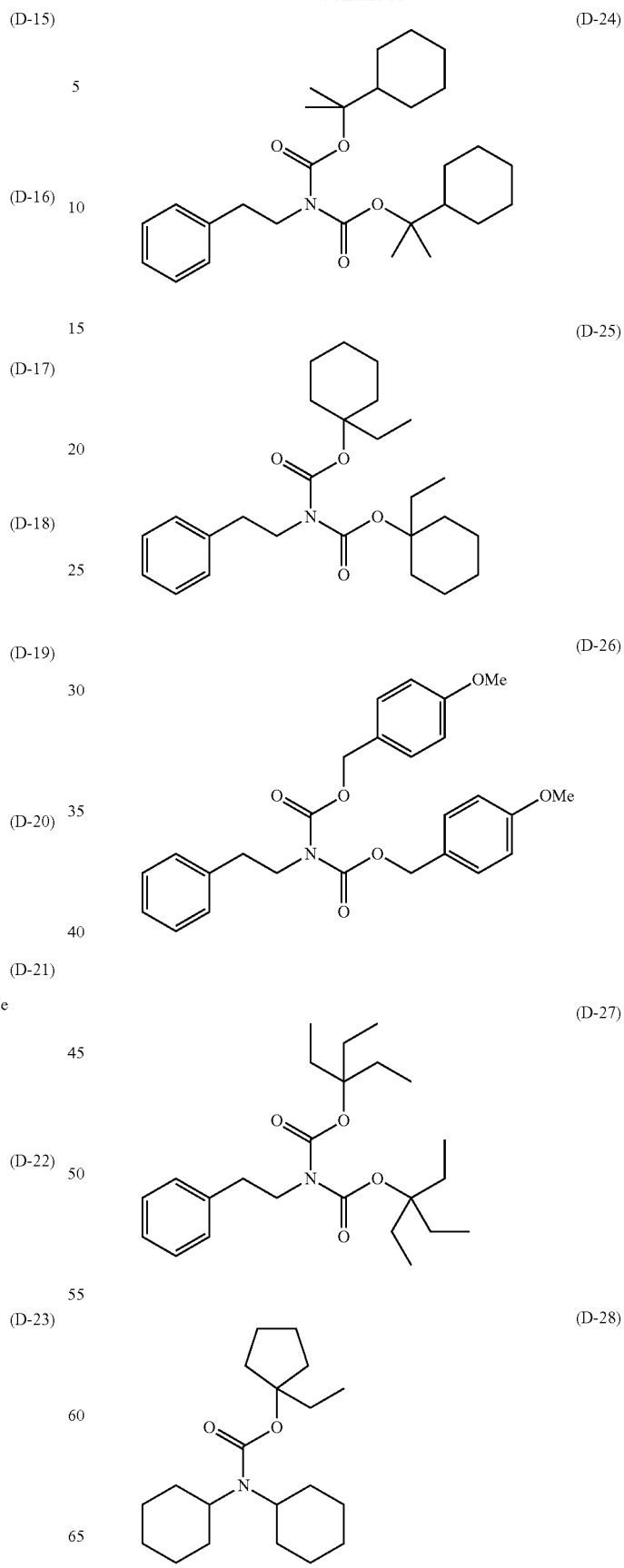

(D-29) 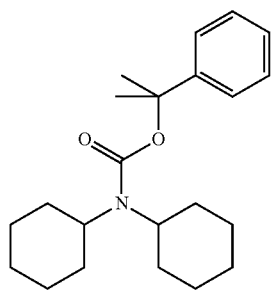
(D-30) 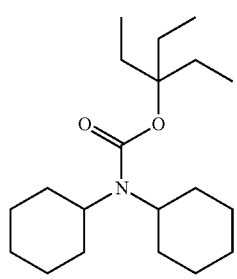
(D-31) 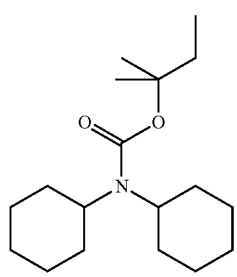
(D-32) 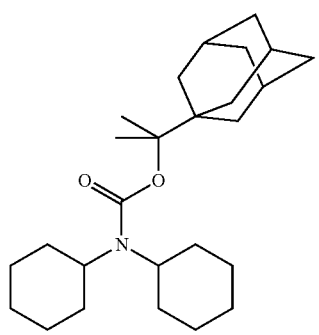
(D-33) 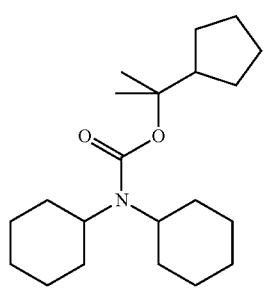
(D-34) 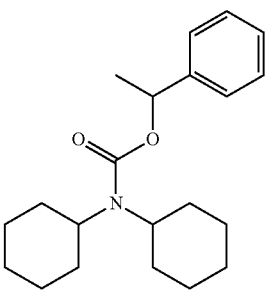
(D-35) 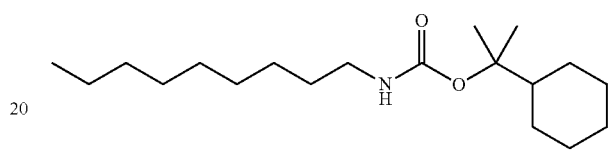
(D-36) 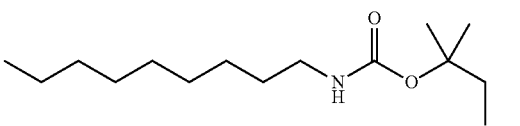
(D-37) 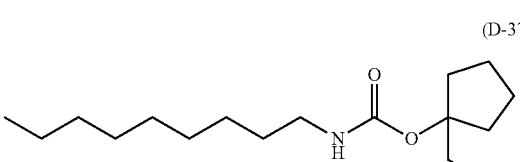
(D38) 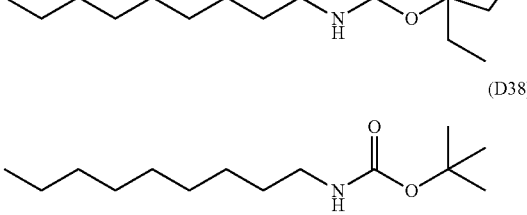
(D-39) 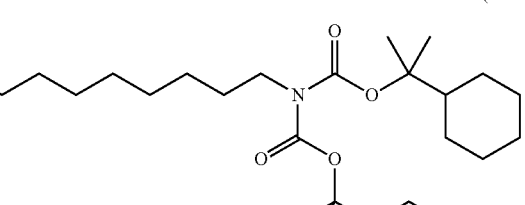
(D-40) 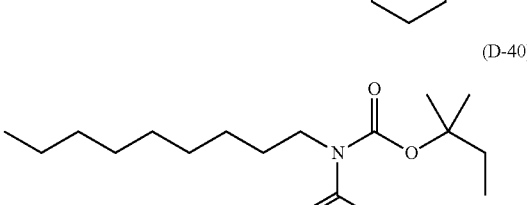

(D-41)
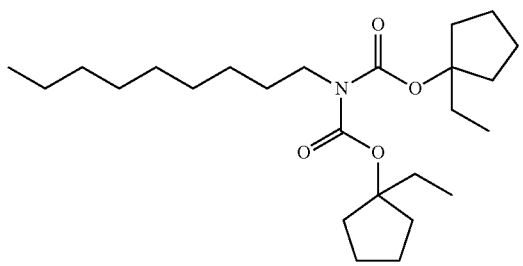

(D-42)
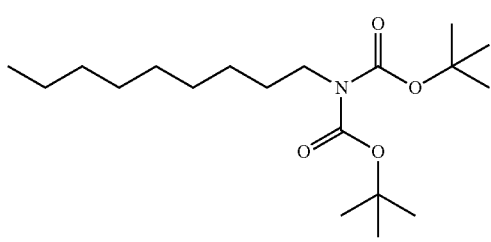

(D-43)
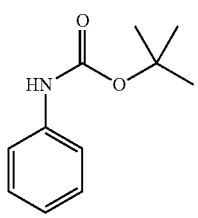

(D-44)
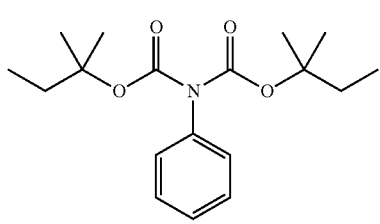

(D-45)
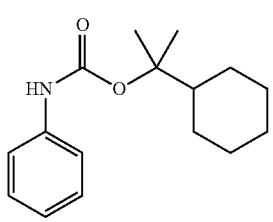

(D-46)
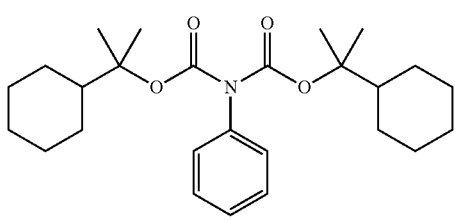

(D-47)
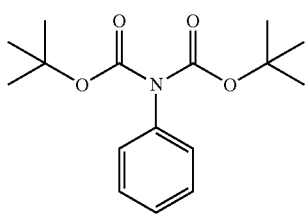

(D-48)
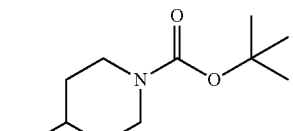

(D-49)
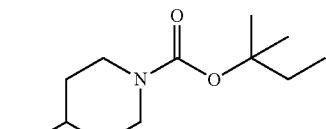

(D-50)
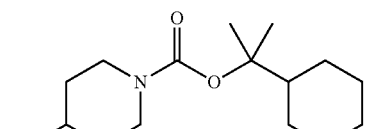

(D-51)
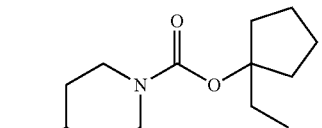

(D-52)
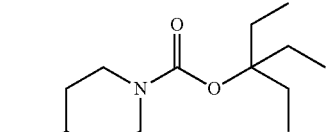

The compound represented by formula (A) can be easily synthesized from a commercially available amine by the method described, for example, in *Protective Groups in Organic Synthesis,* 4th edition. A most general method is a method of causing a dicarbonic acid ester or a haloformic acid ester to act on a commercially available amine to obtain the compound. In the formulae, X represents a halogen atom, and Ra and Rb have the same meanings as Ra and Rb in formula (A).

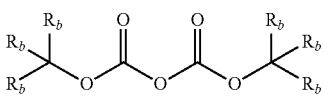

or $R_a$\
$\phantom{R}$NH $\longrightarrow$\
$R_a$

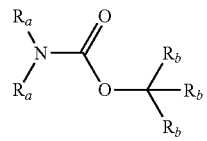

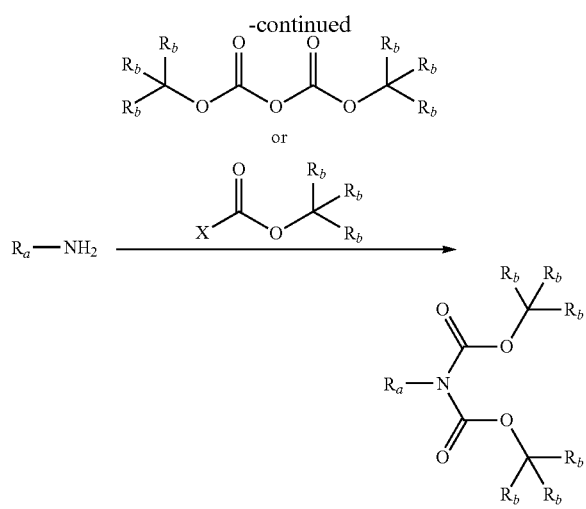

In the present invention, as for the (D) low molecular compound having a group capable of leaving by the action of an acid, one kind of a compound may be used alone, or two or more kinds of compounds may be mixed and used.

The composition of the present invention may or may not contain (D) a low molecular compound having a group capable of leaving by the action of an acid, but in the case of containing the low molecular compound (D), the content thereof is usually from 0.001 to 20 mass %, preferably from 0.001 to 10 mass %, more preferably from 0.01 to 5 mass %, based on the entire solid compound of the composition combined with the basic compound.

The ratio between the acid generator and the (D) low molecular compound having a group capable of leaving by the action of an acid, used in the composition, is preferably acid generator/[(D) low molecular compound having a group capable of leaving by the action of an acid+basic compound] (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/[(D) low molecular compound having a group capable of leaving by the action of an acid+basic compound] (by mol) is more preferably from 5.0 to 200, still more preferably from 7.0 to 150.

[7] Surfactant

The actinic ray-sensitive or radiation-sensitive resin composition of the present invention may or may not further contain a surfactant, but in the case of containing a surfactant, it is preferred to contain any one of fluorine-containing and/or silicon-containing surfactants (a fluorine-containing surfactant, a silicon-containing surfactant and a surfactant containing both a fluorine atom and a silicon atom), or two or more thereof.

By containing the above-described surfactant, the composition of the present invention can give a resist pattern enhanced in the sensitivity, resolution and adherence and reduced in the development defect when using an exposure light source with a wavelength of 250 nm or less, particularly a wavelength of 220 nm or less.

Examples of the fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may be also used as it is.

Examples of the commercially available surfactant which can be used include a fluorine-containing or silicon-containing surfactant such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, Polysiloxane Polymer KP-341 (produced by Shin-Etsu Chemical Co., Ltd.) may be also used as the silicon-containing surfactant.

Other than those known surfactants, a surfactant using a polymer having a fluoroaliphatic group derived from a fluoroaliphatic compound which is produced by a telomerization process (also called a telomer process) or an oligomerization process (also called an oligomer process), may be used. The fluoroaliphatic compound can be synthesized by the method described in JP-A-2002-90991.

The polymer having a fluoroaliphatic group is preferably a copolymer of a fluoroaliphatic group-containing monomer with a (poly(oxyalkylene)) acrylate and/or a (poly(oxyalkylene)) methacrylate, and the copolymer may have an irregular distribution or may be a block copolymer. Examples of the poly(oxyalkylene) group include a poly(oxyethylene) group, a poly(oxypropylene) group and a poly(oxybutylene) group. This group may be also a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoroaliphatic group-containing monomer and a (poly(oxyalkylene)) acrylate (or methacrylate) is not limited only to a binary copolymer but may be also a ternary or higher copolymer obtained by simultaneously copolymerizing two or more different fluoroaliphatic group-containing monomers or two or more different (poly(oxyalkylene)) acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactant may be also used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylaryl ethers (e.g., polyoxyethylene oetylphenol ether, polyoxyethylene nonylphenol ether), polyoxyethylene.polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of these surfactants may be used alone, or some of them may be used in combination.

In the case where the composition of the present invention contains a surfactant, the content of the surfactant is preferably from 0.0001 to 2 mass %, more preferably from 0.001 to 1 mass %, based on the entire solid content of the actinic ray-sensitive or radiation-sensitive resin composition (excluding the solvent).

On the other hand, by setting the amount added of the surfactant to 10 ppm or less based on the entire amount of the composition (excluding the solvent), the hydrophobic resin is more unevenly distributed to the surface, so that the resist film surface can be made more hydrophobic and the followability of water at the immersion exposure can be enhanced.

[8] Onium Carboxylate

The actinic ray-sensitive or radiation-sensitive resin composition of the present invention may contain an onium carboxylate. Examples of onium carboxylate include sulfonium carboxylate, iodonium carboxylate and ammonium carboxylate. In particular, the onium carboxylate is preferably an iodonium salt or a sulfonium salt. Also, it is preferred that the carboxylate residue group of the onium carboxylate does not contain an aromatic group and a carbon-carbon double bond. The anion moiety is preferably a linear or branched, monocyclic or polycyclic alkylcarboxylate anion having a carbon number of 1 to 30, more preferably the carboxylate anion in which the alkyl group is partially or entirely fluorine-substituted. The alkyl chain may contain an oxygen atom. Thanks to such a configuration, the transparency to light at 220 nm or less is ensured, the sensitivity and resolution are enhanced, and the iso/dense bias and exposure margin are improved.

Examples of the fluorine-substituted carboxylate anion include fluoroacetate, difluoroacetate, trifluoroacetate, pentafluoropropionate, heptafluorobutyrate, nonafluoropentanoate, perfluorododecanoate, perfluorotridecanoate, perfluorocyclohexanecarboxylate and 2,2-bistrifluoromethylpropionate anions.

Such an onium carboxylate can be synthesized by reacting a sulfonium, iodonium or ammonium hydroxide and a carboxylic acid with silver oxide in an appropriate solvent.

The composition of the present invention may or may not contain an onium carboxylate, but in the case of containing an onium carboxylate, the content thereof is generally from 0.1 to 20 mass %, preferably from 0.5 to 10 mass %, more preferably from 1 to 7 mass %, based on the entire solid content of the composition.

[9] Other Additives

The actinic ray-sensitive or radiation-sensitive resin composition of the present invention may further contain, for example, a dye, a plasticizer, a photosensitizer, a light absorber, and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art by referring to the method described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

[10] Pattern Forming Method

The composition of the present invention is preferably used in a film thickness of 30 to 250 nm, more preferably from 30 to 200 nm, from the standpoint of enhancing the resolution. Such a film thickness can be obtained by setting the solid content concentration in the composition to an appropriate range, thereby imparting an appropriate viscosity and enhancing the coatability and film-forming property.

The entire solid content concentration in the actinic ray-sensitive or radiation-sensitive resin composition is generally from 1 to 10 mass %, preferably from 1 to 8.0 mass %, more preferably from 1.0 to 6.0 mass %.

The composition of the present invention is used by dissolving the components above in a predetermined organic solvent, preferably in the above-described mixed solvent, filtering the solution, and coating it on a predetermined support as follows. The filter used for filtration is preferably a polytetrafluoroethylene-, polyethylene- or nylon-made filter having a pore size of 0.1 µm or less, more preferably 0.05 µm or less, still more preferably 0.03 µm or less.

For example, the actinic ray-sensitive or radiation-sensitive resin composition is coated on a substrate (e.g., silicon/silicon dioxide-coated substrate) as used in the production of a precision integrated circuit device, by an appropriate coating method such as spinner or coater and dried to form a film (resist film).

The resist film is irradiated with an actinic ray or radiation through a predetermined mask, then preferably baked (heated), and subjected to development and rinsing, whereby a good pattern can be obtained.

The pattern forming method also preferably contains, after film formation, a pre-baking step (PB) before entering the exposure step.

Furthermore, the pattern forming method also preferably contains a post-exposure baking step (PEB) after the exposure step but before the development step.

As for the heating temperature, both PB and PEB are preferably performed at 70 to 150° C., more preferably at 80 to 140° C.

The heating time is preferably from 30 to 300 seconds, more preferably from 30 to 180 seconds, still more preferably from 30 to 90 seconds.

The heating can be performed using a device attached to an ordinary exposure/developing machine or may be performed using a hot plate or the like.

Thanks to baking, the reaction in the exposed area is accelerated, and the sensitivity and pattern profile are improved.

Examples of the actinic ray or radiation include infrared light, visible light, ultraviolet light, far ultraviolet light, extreme-ultraviolet light, X-ray and electron beam, but the radiation is preferably far ultraviolet light at a wavelength of 250 nm or less, more preferably 220 nm or less, still more preferably from 1 to 200 nm. Specific examples thereof include KrF excimer laser (248 nm), ArF excimer laser (193 nm), $F_2$ excimer laser (157 nm), X-ray, EUV (13 nm), and electron beam, with ArF excimer laser, $F_2$ excimer laser, EUV and electron beam being preferred.

Before forming the resist film, an antireflection film may be previously provided by coating on the substrate.

The antireflection film used may be either an inorganic film type such as titanium, titanium dioxide, titanium nitride, chromium oxide, carbon and amorphous silicon, or an organic film type composed of a light absorber and a polymer material. As for the organic antireflection film, a commercially available organic antireflection film such as DUV30 Series and DUV-40 Series produced by Brewer Science, Inc. and AR-2, AR-3 and AR-5 produced by Shipley Co., Ltd. may be also used.

In the development step, an alkali developer is used as follows. As for the alkali developer of the actinic ray-sensitive or radiation-sensitive resin composition, an alkaline aqueous solution containing, for example, inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, and cyclic amines such as pyrrole and piperidine, can be used. Usually, a quaternary ammonium salt typified by an aqueous tetramethylammonium hydroxide solution (2.38 mass %) is used.

This alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

Furthermore, the alkaline aqueous solution may be used after adding thereto alcohols and a surfactant each in an appropriate amount.

As for the rinsing solution, pure water is used, and an appropriate amount of a surfactant may be added to the pure water before use.

After the development or rinsing, a treatment of removing the developer or rinsing solution adhering on the pattern by a supercritical fluid may be performed.

For the film formed using the actinic ray-sensitive or radiation-sensitive resin composition of the present invention, the exposure may also be performed by filling a liquid (immersion medium) having a refractive index higher than that of air between the film and the lens at the irradiation with an actinic ray or radiation (immersion exposure). By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid being transparent to light at the exposure wavelength and having as small a temperature coefficient of refractive index as possible in order to minimize the distortion of an optical image projected on the resist film. Particularly, when the exposure light source is an ArF excimer laser (wavelength: 193 nm), water is preferably used in view of easy availability and easy handleability in addition to the above-described aspects.

Furthermore, a medium having a refractive index of 1.5 or more can be also used from the standpoint that the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the undersurface of the lens element, may be added in a small ratio.

The additive is preferably an aliphatic alcohol having a refractive index nearly equal to that of water, and specific examples thereof include methyl alcohol, ethyl alcohol and isopropyl alcohol. By adding an alcohol having a refractive index nearly equal to that of water, even when the alcohol component in water is evaporated and its content concentration is changed, the change in the refractive index of the entire liquid can be advantageously made very small. On the other hand, if a substance opaque to light at 193 nm or an impurity greatly differing in the refractive index from water is intermixed, this incurs distortion of the optical image projected on the resist film. Therefore, the water used is preferably distilled water. Pure water obtained by further filtering the distilled water through an ion exchange filter or the like may be also used.

The electrical resistance of water used as the immersion liquid is preferably 18.3 MΩcm or more, and TOC (total organic carbon) is preferably 20 ppb or less. Also, the water is preferably subjected to a deaeration treatment.

The lithography performance can be enhanced by raising the refractive index of the immersion liquid. From such a standpoint, an additive for raising the refractive index may be added to water, or heavy water ($D_2O$) may be used in place of water.

In the case where the film formed using the composition of the present invention is exposed through an immersion medium, the hydrophobic resin (C) may be further added, if desired. The receding contact angle on the surface is enhanced by the addition of the hydrophobic resin (C). The receding contact angle of the film is preferably from 60 to 90°, more preferably 70° or more.

In the immersion exposure step, the immersion liquid must move on a wafer following the movement of an exposure head that is scanning the wafer at a high speed and forming an exposure pattern. Therefore, the contact angle of the immersion liquid for the resist film in a dynamic state is important, and the resist is required to have a performance of allowing a liquid droplet to follow the high-speed scanning of an exposure head with no remaining.

In order to prevent the film from directly contacting with the immersion liquid, a film (hereinafter, sometimes referred to as a "topcoat") sparingly soluble in an immersion liquid may be provided between the film formed using the composition of the present invention and the immersion liquid. The functions required of the topcoat are suitability for coating as an overlayer of the resist, transparency to radiation, particularly, radiation having a wavelength of 193 nm, and sparing solubility in the immersion liquid. The topcoat is preferably unmixable with the resist and uniformly coatable as an overlayer of the resist.

In view of transparency to light at 193 nm, the topcoat is preferably an aromatic-free polymer.

Specific examples of such a polymer include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resin (C) is suitable also as the topcoat. If impurities are dissolved out into the immersion liquid from the topcoat, the optical lens is contaminated. In this viewpoint, residual monomer components of the polymer is preferably little contained in the topcoat.

On peeling off the topcoat, a developer may be used or a releasing agent may be separately used. The releasing agent is preferably a solvent less permeating the film. From the standpoint that the peeling step can be performed simultaneously with the development step of the film, the topcoat is preferably peelable with an alkali developer and from the standpoint of peeling with an alkali developer, the topcoat is preferably acidic, but in view of non-intermixing with the film, the topcoat may be neutral or alkaline.

The difference in the refractive index between the topcoat and the immersion liquid is preferably null or small. In this case, the resolution can be enhanced. In the case where the exposure light source is an ArF excimer laser (wavelength: 193 nm), water is preferably used as the immersion liquid and therefore, the topcoat for ArF immersion exposure preferably has a refractive index close to the refractive index (1.44) of water. Also, in view of transparency and refractive index, the topcoat is preferably a thin film.

The topcoat is preferably unmixable with the film and further unmixable with the immersion liquid. From this standpoint, when the immersion liquid is water, the solvent used for the topcoat is preferably a medium that is sparingly soluble in the solvent used for the composition of the present invention and is insoluble in water. Furthermore, when the immersion liquid is an organic solvent, the topcoat may be either water-soluble or water-insoluble.

EXAMPLES

The present invention is described below by referring to Examples, but the present invention should not be construed as being limited thereto.

Synthesis Example 1

Synthesis of PAG-B

Compound PAG-B was synthesized according to the following synthesis scheme (here, other compounds coming under the compound (A) can be also synthesized according to the following synthesis scheme by appropriately changing the kind or the like of the reaction reagent). In the following synthesis scheme, TEA stands for triethylamine, THF stands for tetrahydrofuran, WSC stands for 1-ethyl-3-(3-dimethylaminopropyl)carbodiimide hydrochloride, and DMAP stands for 4-dimethylaminopyridine.

Compounds PAG-A and PAG-C to PAG-J shown below were synthesized in the same manner as in Synthesis Example 1.

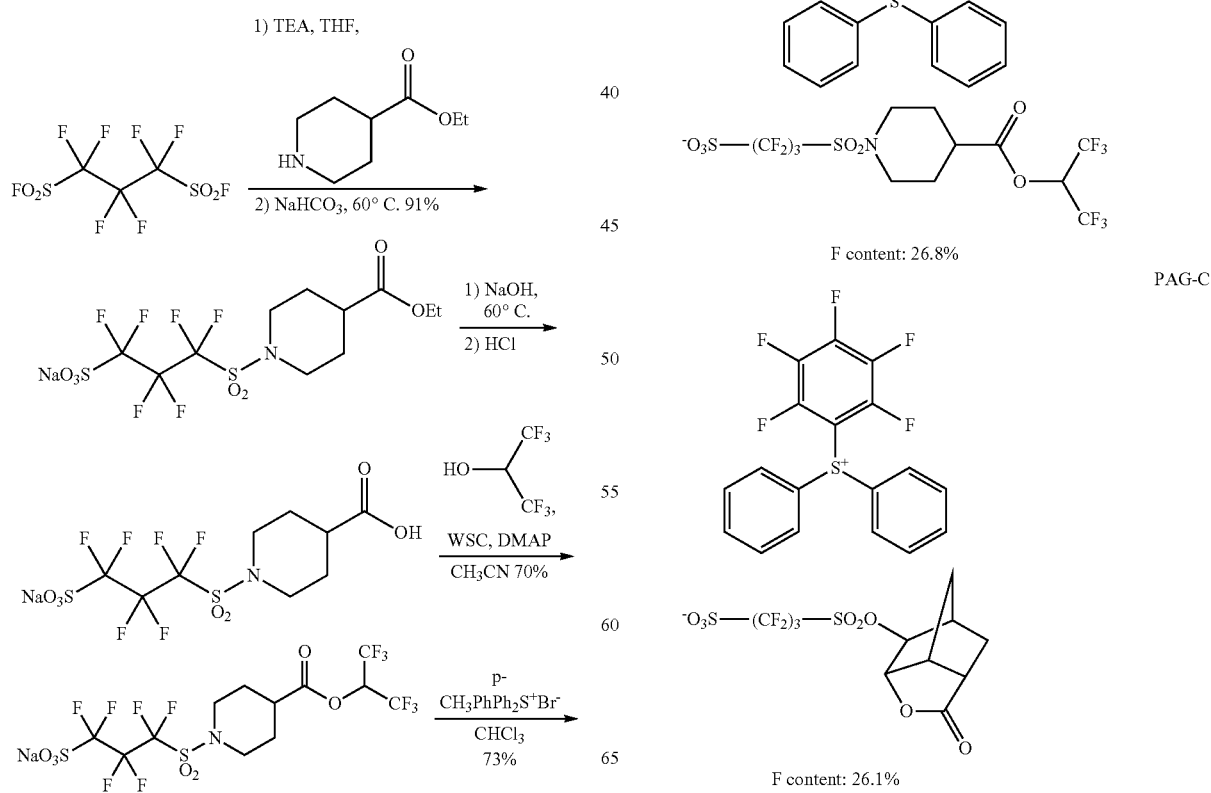

PAG-D
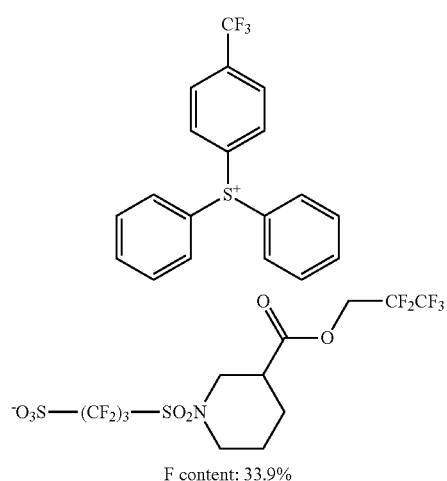
F content: 33.9%
PAG-E
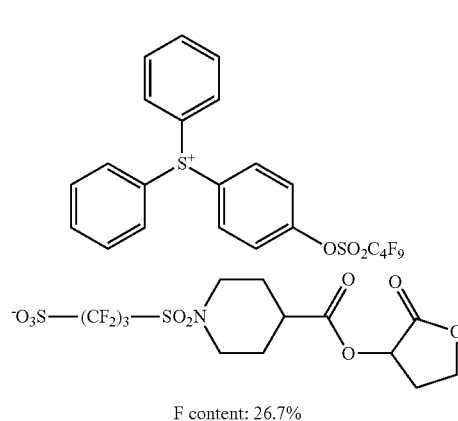
F content: 26.7%
PAG-F
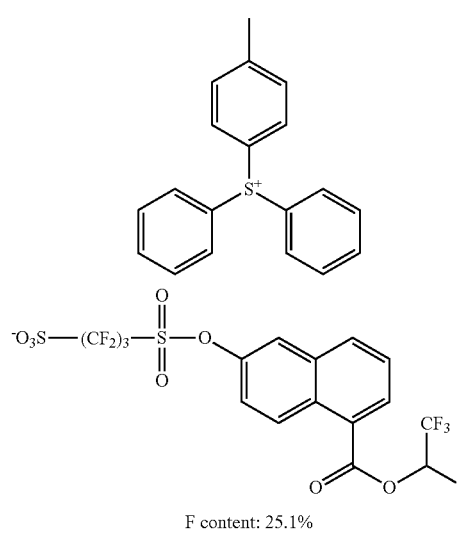
F content: 25.1%
PAG-G
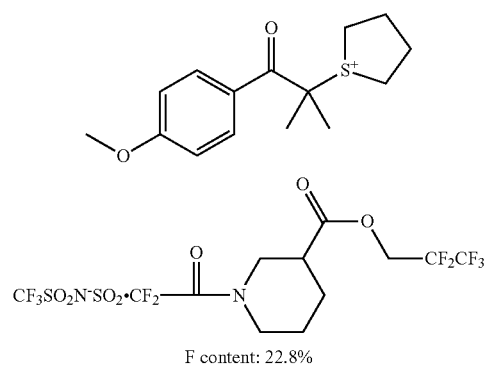
F content: 22.8%
PAG-H
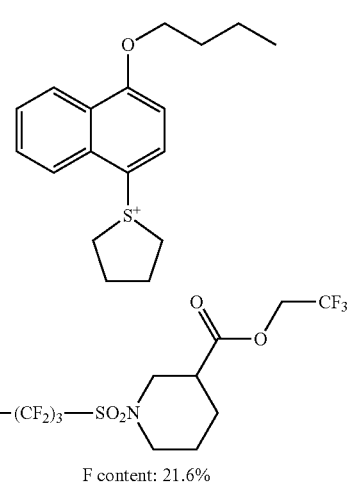
F content: 21.6%
PAG-I
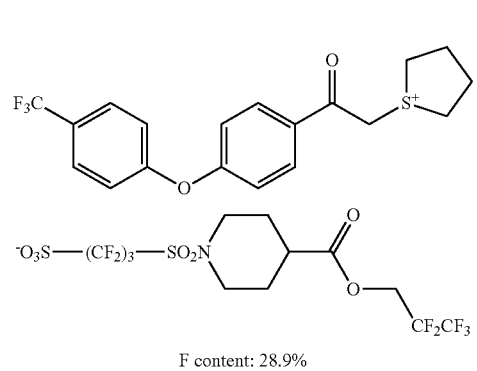
F content: 28.9%

-continued

PAG-J

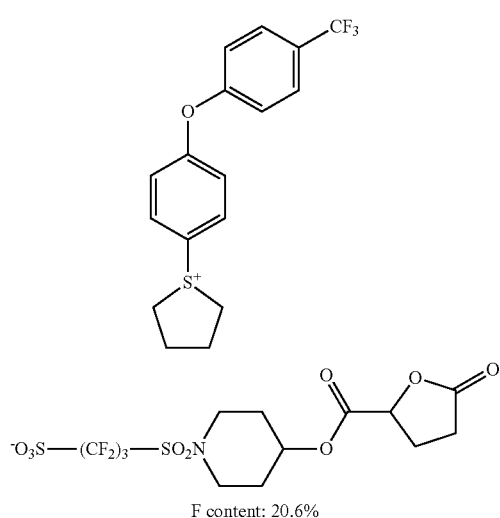

F content: 20.6%

Synthesis Example 2

Synthesis of Resin a

In a nitrogen stream, a three-neck flask was charged with 40 g of a 6/4 (by mass) mixed solvent of propylene glycol monomethyl ether acetate and propylene glycol monomethyl ether and heated at 80° C. (Solvent 1). Monomers corresponding to the following repeating units were dissolved in a molar ratio of 45/30/10/15 (starting from the left) in a 6/4 (by mass) mixed solvent of propylene glycol monomethyl ether acetate and propylene glycol monomethyl ether to prepare a 22 mass % monomer solution (400 g), and polymerization initiator V-601 (produced by Wako Pure Chemical Industries, Ltd.) in a concentration of 8 mol % based on all monomers was added thereto and dissolved. The resulting solution was added dropwise to Solvent 1 over 6 hours. After the completion of dropwise addition, the reaction was further allowed to proceed at 80° C. for 2 hours. The reaction solution was left standing to cool and then poured in 3,600 ml of hexane/400 ml of ethyl acetate, and the powder precipitated was collected by filtration and dried, as a result, 74 g of Resin a was obtained. The weight average molecular weight of the obtained Resin a was 10,200 in terms of standard polystyrene and the polydispersity (Mw/Mn) was 1.64.

Resin a

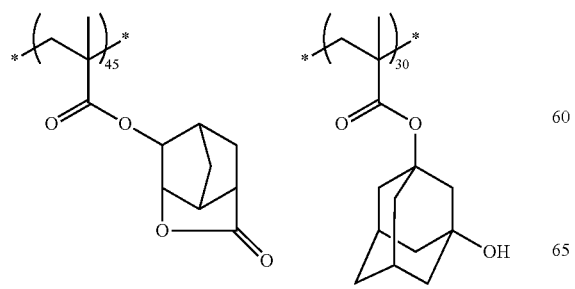

-continued

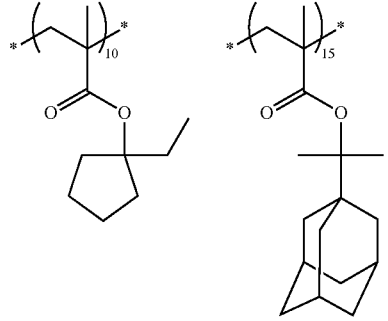

Mw = 10200
Mw/Mn = 1.64

Resins b to j shown below were synthesized in the same manner as in Synthesis Example 2.

Resin b

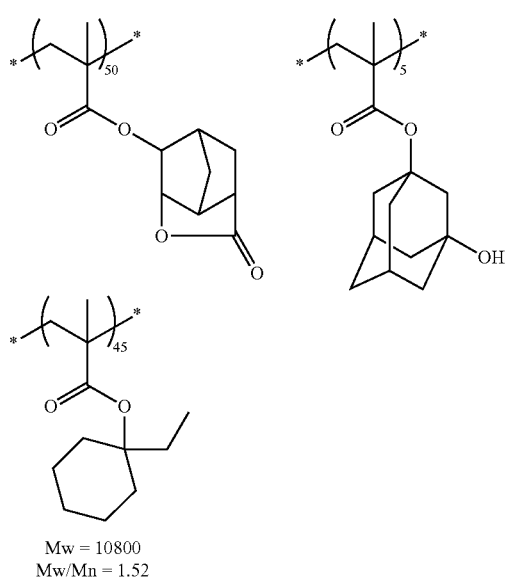

Mw = 10800
Mw/Mn = 1.52

Resin c

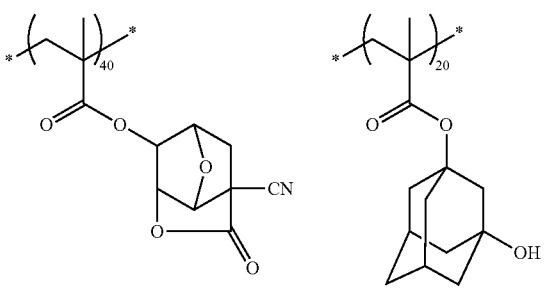

Mw = 9200
Mw/Mn = 1.55

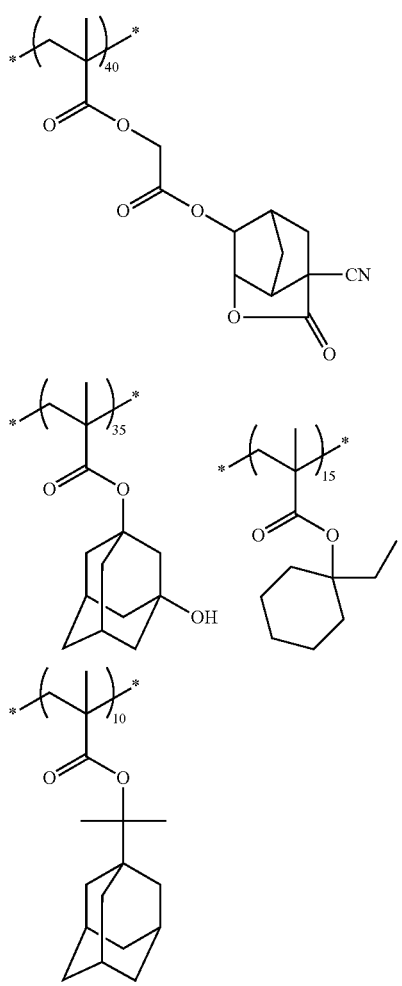
Resin d
Mw = 8200
Mw/Mn = 1.59
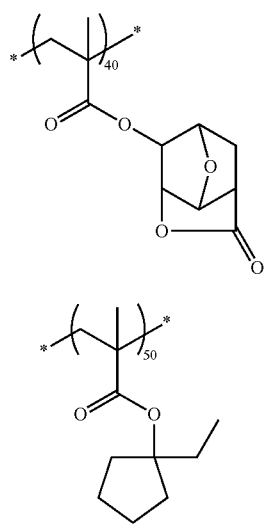
Resin e
Mw = 9200
Mw/Mn = 1.58
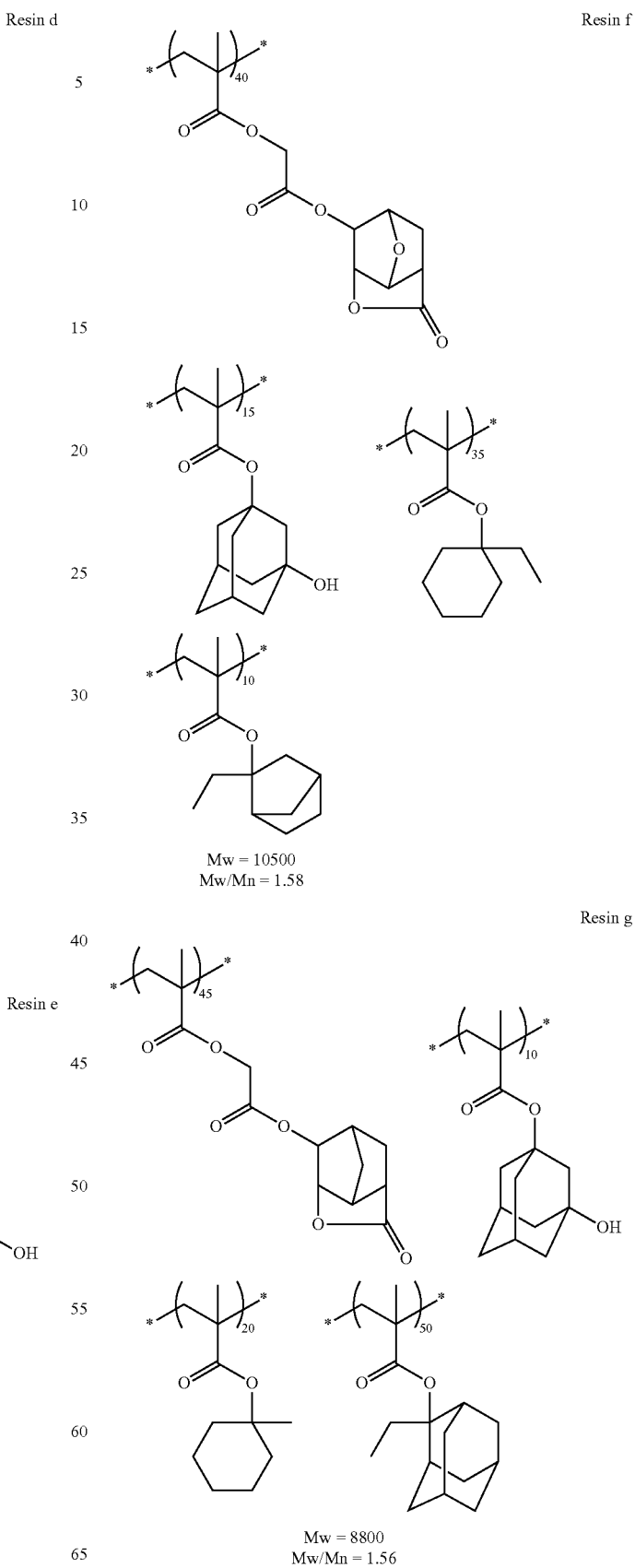
Resin f
Mw = 10500
Mw/Mn = 1.58
Resin g
Mw = 8800
Mw/Mn = 1.56

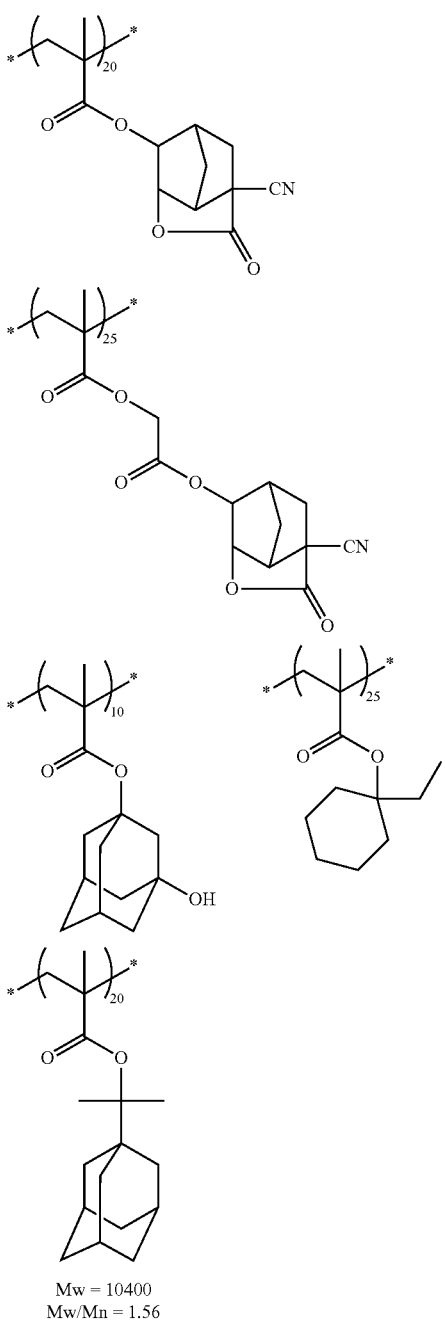

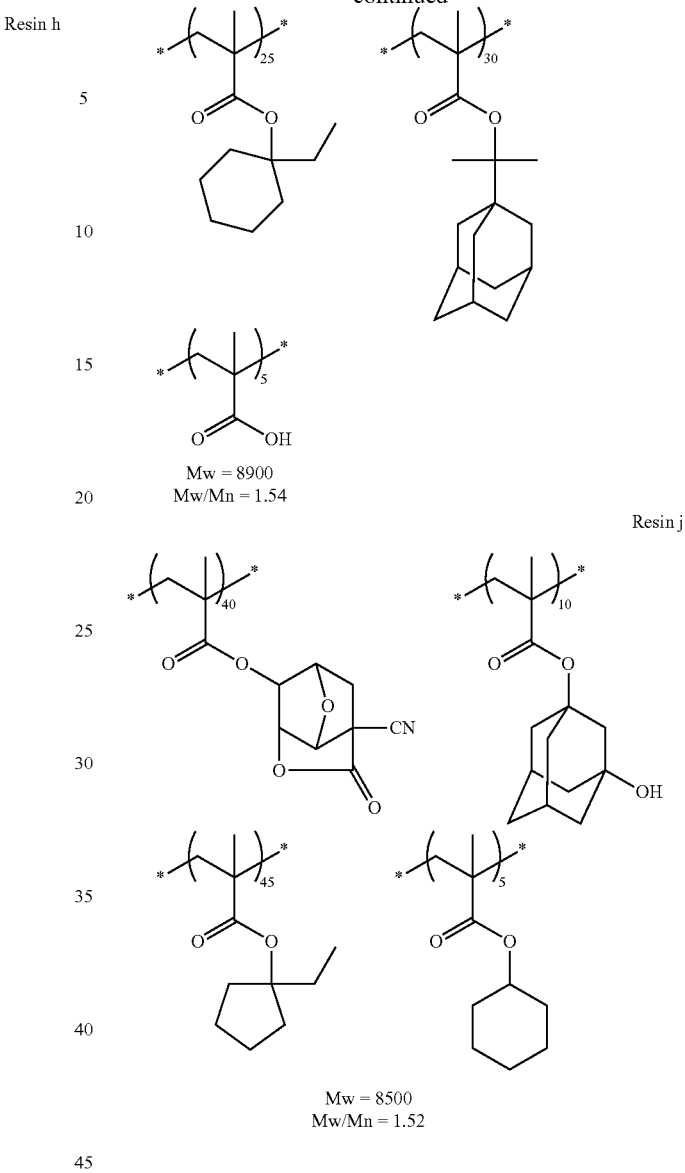

Synthesis Example 3

Synthesis of Hydrophobic Resin HR-69

Compound (1) shown below was synthesized by the method described in International Publication No. 07/037213, pamphlet.

150.00 g of water was added to 35.00 g of Compound (1), and 27.30 g of NaOH was further added. The mixture was stirred for 9 hours under heating and refluxing conditions. The resulting reaction solution was made acidic by adding hydrochloric acid and then extracted with ethyl acetate. The organic layers were combined and concentrated to obtain 36.90 g of Compound (2) (yield: 93%).

$^1$H-NMR (400 MHz in (CD$_3$)$_2$CO): σ (ppm)=1.56-1.59 (1H), 1.68-1.72 (1H), 2.13-2.15 (1H), 2.13-2.47 (2H), 3.49-3.51 (1H), 3.68 (1H), 4.45-4.46 (1H).

Subsequently, 200 ml of CHCl$_3$ was added to 20.00 g of Compound (2), and 50.90 g of 1,1,1,3,3,3-hexafluoroisopropyl alcohol and 30.00 g of 4-dimethylaminopyridine were further added, followed by stirring. To the resulting solution, 22.00 g of 1-ethyl-3-(3-dimethylaminopropyl)carbodiimide

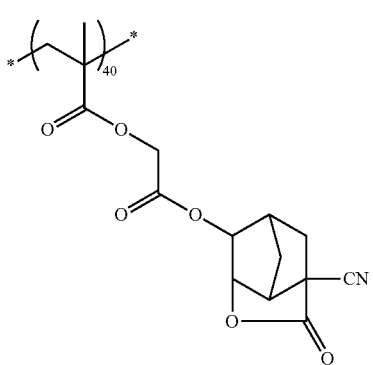

hydrochloride was added, and the mixture was stirred for 3 hours. This reaction solution was added to 500 ml of 1 N HCl to stop the reaction, and the organic layer was washed further with 1 N HCl and then washed with water. The obtained organic layer was concentrated to obtain 30.00 g of Compound (3) (yield: 85%).

$^1$H-1-NMR (400 MHz in $(CD_3)_2CO$): σ (ppm)=1.62 (1H), 1.91-1.95 (1H), 2.21-2.24 (1H), 2.45-2.53 (2H), 3.61-3.63 (1H), 3.76 (1H), 4.32-4.58 (1H), 6.46-6.53 (1H).

Thereafter, 300.00 g of toluene was added to 15.00 g of Compound (3), and 3.70 g of methacrylic acid and 4.20 g of p-toluenesulfonic acid monohydrate were further added. The mixture was refluxed for 15 hours while azeotropically removing the water produced, and the resulting reaction solution was concentrated. The concentrate was purified by column chromatography to obtain 11.70 g of Compound (4) (yield: 65%).

$^1$H-NMR (400 MHz in $(CD_3)_2CO$): σ (ppm)=1.76-1.79 (1H), 1.93 (3H), 2.16-2.22 (2H), 2.57-2.61 (1H), 2.76-2.81 (2H), 3.73-3.74 (1H), 4.73 (1H), 4.84-4.86 (1H), 5.69-5.70 (1H), 6.12 (1H), 6.50-6.56 (1H).

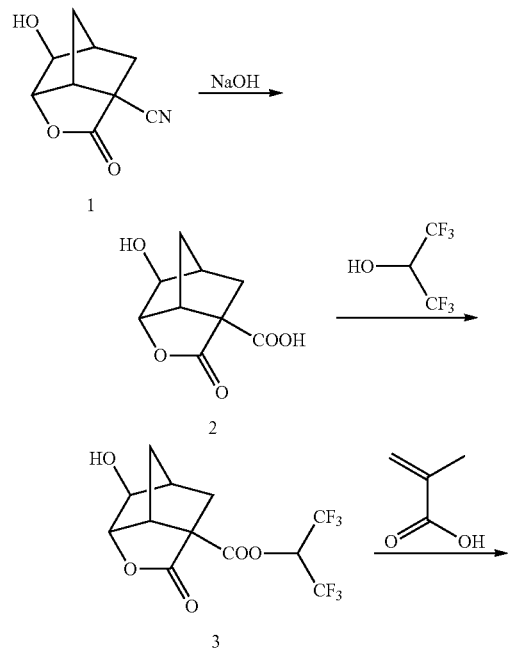

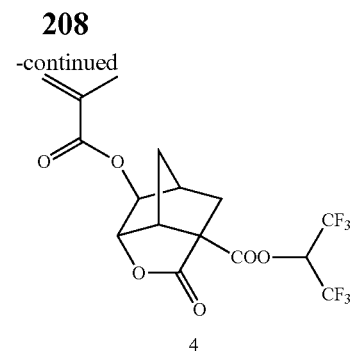

In a nitrogen stream, a three-neck flask was charged with 6.4 g of propylene glycol monomethyl ether acetate (PGMEA) and heated at 80° C. Thereto, a solution prepared by dissolving 17.5 g of Compound (4), 4.0 g of tert-butyl methacrylate, and polymerization initiator V-601 (produced by Wako Pure Chemical Industries, Ltd.) in a concentration of 5.0 mol % based on the monomers, in 58.0 g of PGMEA was added dropwise over 4 hours. After the completion of dropwise addition, the reaction was further allowed to proceed at 80° C. for 4 hours. The resulting reaction solution was left standing to cool and then added dropwise to a mixed solution of 1,300 g of methanol/150 g of distilled water over 20 minutes, and the powder precipitated was collected by filtration and dried to obtain 15.2 g of Resin (HR-69).

The weight average molecular weight of Resin (HR-69) was 8,000 in terms of standard polystyrene, and the polydispersity (Mw/Mn) was 1.3.

<Preparation of Resist Composition>

The components shown in Tables 3 and 4 below were dissolved in a solvent to prepare a solution having a solid content concentration of 5 mass %, and the obtained solution was filtered through a polyethylene filter having a pore size of 0.05 μm to prepare an actinic ray-sensitive or radiation-sensitive resin composition (positive resist composition). The positive resist compositions prepared were evaluated by the following methods, and the results are shown together in Tables 3 and 4.

TABLE 3

| | Acid Generator (0.8 g) | F Content (mass %) | Resin (B) (4.4 g) | Hydrophobic Resin (C) (0.4 g) | Solvent (mass ratio) | Basic Compound or Compound (D) (0.05 g) | Surfactant (0.02 g) | Blob Defect Density (defects/cm²) | LWR (nm) | Sensitivity (mJ/cm²) |
|---|---|---|---|---|---|---|---|---|---|---|
| Example 1 | PAG-A | 25.6 | a | none | S1/S3 = 95/5 | DBA | W-1 | 0.8 | 6.3 | 47 |
| Example 2 | PAG-A | 25.6 | b | none | S1 = 100 | DIA | W-2 | 0.7 | 6.4 | 46 |
| Example 3 | PAG-A | 25.6 | c | none | S1/S5 = 80/20 | DBA | W-3 | 0.7 | 6.4 | 46 |
| Example 4 | PAG-B | 26.8 | a | none | S1 = 100 | DIA | W-1 | 0.8 | 6.5 | 47 |
| Example 5 | PAG-C | 26.1 | c | none | S1 = 100 | TEA | W-1 | 0.7 | 6.6 | 49 |
| Example 6 | PAG-A/PAG-C (0.4 g/0.4 g) | 25.6/26.1 | d | none | S1 = 100 | D-1 | none | 0.8 | 6.5 | 48 |
| Example 7 | PAG-D | 33.9 | e | none | S1/S4 = 90/10 | TEA | W-3 | 0.9 | 6.9 | 49 |
| Example 8 | PAG-B/PAG-D (0.4 g/0.4 g) | 26.8/33.9 | b | none | S1/S6 = 80/20 | TMEA | W-4 | 0.8 | 6.7 | 45 |
| Example 9 | PAG-C/PAG-E (0.4 g/0.4 g) | 26.1/26.7 | f | none | S1 = 100 | PEA | W-3 | 0.7 | 6.6 | 47 |
| Example 10 | PAG-F | 25.1 | g | none | S1 = 100 | D-1 | W-2 | 1.1 | 6.8 | 46 |
| Example 11 | PAG-G | 22.8 | h | none | S1/S2 = 90/10 | DIA | none | 4 | 6.6 | 47 |
| Example 12 | PAG-A/PAG-G (0.4 g/0.4 g) | 25.6/22.8 | i | none | S1/S6 = 80/20 | PBI | W-1 | 1.5 | 6.4 | 47 |

TABLE 3-continued

| | Acid Generator (0.8 g) | F Content (mass %) | Resin (B) (4.4 g) | Hydrophobic Resin (C) (0.4 g) | Solvent (mass ratio) | Basic Compound or Compound (D) (0.05 g) | Surfactant (0.02 g) | Blob Defect Density (defects/cm$^2$) | LWR (nm) | Sensitivity (mJ/cm$^2$) |
|---|---|---|---|---|---|---|---|---|---|---|
| Example 13 | PAG-H | 21.6 | e | none | S1/S7 = 80/20 | TMEA | W-3 | 8 | 6.4 | 48 |
| Example 14 | PAG-A/PAG-H (0.4 g/0.4 g) | 25.6/21.6 | j | none | S1 = 100 | PBI | W-1 | 6 | 6.4 | 48 |
| Example 15 | PAG-I | 28.9 | b/c (2.2 g/2.2 g) | none | S1/S4 = 80/20 | TEA/TBA (0.025 g/0.025 g) | W-1 | 0.9 | 6.5 | 46 |
| Example 16 | PAG-J | 20.6 | d | none | S1/S5 = 50/50 | TEA | W-3 | 7.7 | 6.7 | 48 |
| Comparative Example 1 | PAG-K | 26.0 | a | none | S1 = 100 | DBA | W-1 | 24 | 8.2 | 42 |
| Comparative Example 2 | PAG-L | 6.5 | b | none | S1 = 100 | DIA | W-3 | 61.0 | 7.5 | 48 |
| Comparative Example 3 | PAG-M | 19.7 | c | none | S1/S6 = 90/10 | DBA | W-1 | 84 | 7.4 | 47 |
| Comparative Example 4 | PAG-N | 17.5 | f | none | S1/S4 = 90/10 | TMEA | W-2 | 33 | 7.4 | 46 |

TABLE 4

| | Acid Generator (0.8 g) | F Content (mass %) | Resin (B) (4 g) | Hydrophobic Resin (C) (0.4 g) | Solvent (mass ratio) | Basic Compound or Compound (D) (0.05 g) | Surfactant (0.02 g) | Blob Defect Density (defects/cm$^2$) | LWR (nm) | Sensitivity (mJ/cm$^2$) |
|---|---|---|---|---|---|---|---|---|---|---|
| Example 17 | PAG-A | 25.6 | a | HR-69 | S1/S3 = 95/5 | DBA | W-1 | 3.1 | 3.7 | 51 |
| Example 18 | PAG-A | 25.6 | b | HR-42 | S1 = 100 | DIA | W-2 | 2.5 | 3.8 | 48 |
| Example 19 | PAG-A | 25.6 | c | HR-13 | S1/S5 = 80/20 | DBA | W-3 | 2.9 | 4.1 | 49 |
| Example 20 | PAG-B | 26.8 | a | HR-41 | S1 = 100 | DIA | W-1 | 3.2 | 3.9 | 50 |
| Example 21 | PAG-C | 26.1 | c | HR-19 | S1 = 100 | TEA | W-1 | 3.4 | 3.9 | 53 |
| Example 22 | PAG-B/PAG-C (0.4 g/0.4 g) | 26.8/26.1 | d | HR-69 | S1 = 100 | D-1 | none | 3.2 | 4 | 51 |
| Example 23 | PAG-D | 33.9 | e | HR-15 | S1/S4 = 90/10 | TEA | W-3 | 3.3 | 4.1 | 54 |
| Example 24 | PAG-B/PAG-D (0.4 g/0.4 g) | 26.8/33.9 | b | HR-28 | S1/S6 = 80/20 | TMEA | W-4 | 3.1 | 4 | 48 |
| Example 25 | PAG-E | 26.7 | f | HR-10 | S1 = 100 | PEA | W-3 | 2.9 | 3.8 | 50 |
| Example 26 | PAG-F | 25.1 | g | HR-69 | S1 = 100 | D-1 | W-2 | 4.3 | 4.1 | 48 |
| Example 27 | PAG-G | 22.8 | h | HR-41 | S1/S2 = 90/10 | DIA | none | 15 | 4 | 52 |
| Example 28 | PAG-A/PAG-G (0.4 g/0.4 g) | 25.6/22.8 | i | HR-80 | S1/S6 = 80/20 | PBI | W-1 | 6.0 | 4.3 | 51 |
| Example 29 | PAG-H | 21.6 | e | HR-50 | S1/S7 = 80/20 | TMEA | W-3 | 37 | 4.1 | 53 |
| Example 30 | PAG-A/PAG-H (0.4 g/0.4 g)1 | 25.6/21.6 | j | HR-19 | S1 = 100 | PBI | W-1 | 23 | 4.3 | 52 |
| Example 31 | PAG-I | 28.9 | b/c (2.0 g/2.0 g) | HR-57 | S1/S4 = 80/20 | TEA/TBA (0.025 g/0.025 g) | W-1 | 3.5 | 3.9 | 48 |
| Example 32 | PAG-J | 20.6 | d | HR-10 | S1/S5 = 50/50 | TEA | W-3 | 30 | 4.1 | 49 |
| Comparative Example 5 | PAG-K | 26.0 | a | HR-69 | S1 = 100 | DBA | W-1 | 96 | 5.6 | 45 |
| Comparative Example 6 | PAG-L | 6.5 | b | HR-57 | S1 = 100 | DIA | W-3 | 242.0 | 4.8 | 49 |
| Comparative Example 7 | PAG-M | 19.7 | c | HR-42 | S1/S6 = 90/10 | DBA | W-1 | 338 | 4.9 | 50 |
| Comparative Example 8 | PAG-N | 17.5 | f | HR-40 | S1/S4 = 90/10 | TMEA | W-2 | 136 | 5 | 50 |

Abbreviations in Tables 3 and 4 are as follows.

[Acid Generator]

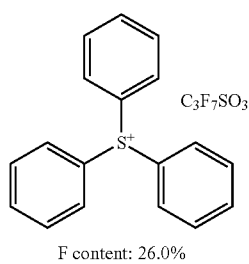

PAG-K

F content: 26.0%

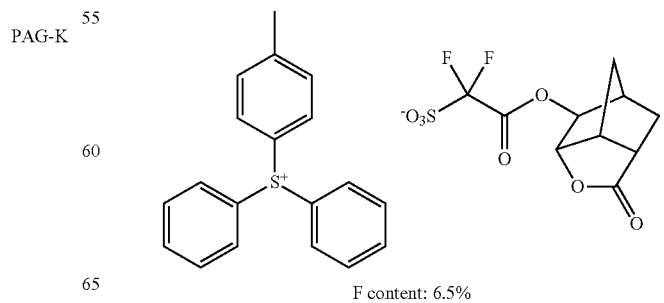

PAG-L

F content: 6.5%

PAG-M

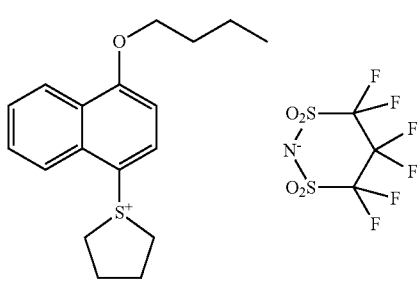

F content: 19.7%

PAG-N

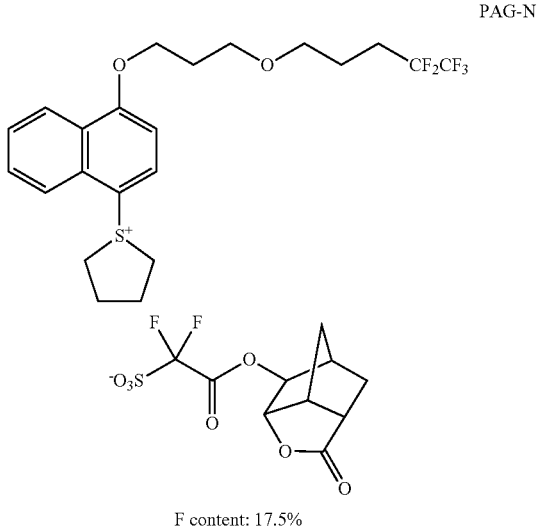

F content: 17.5%

[Basic Compound]
DIA: 2,6-Diisopropylaniline
TEA: Triethanolamine
DBA: N,N-Dibutylaniline
PBI: 2-Phenylbenzimidazole
TMEA: Tris(methoxyethoxyethyl)amine
PEA: N-Phenyldiethanolamine
TBA: Tri(n-butyl)amine
[Compound Having a Group Capable of Leaving by the Action of an Acid (Compound (D))]

(D-1)

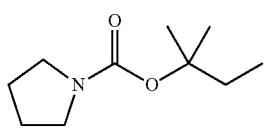

[Hydrophobic Resin]
The hydrophobic resins denoted by abbreviations in Tables 3 and 4 are the same as those in specific examples above of the hydrophobic resin (C).
[Surfactant]
W-1: Megaface F176 (produced by Dainippon Ink & Chemicals, Inc.) (fluorine-containing)
W-2: Megaface R08 (produced by Dainippon Ink & Chemicals, Inc.) (fluorine- and silicon-containing)
W-3: Polysiloxane Polymer KP-341 (produced by Shin-Etsu Chemical Co., Ltd.) (silicon-containing)
W-4: Troysol S-366 (produced by Troy Chemical)

[Solvent]
S1: Propylene glycol monomethyl ether acetate (PGMEA, another name: 1-methoxy-2-acetoxypropane)
S2: 2-Heptanone
S3: Cyclohexanone
S4: γ-Butyrolactone
S5: Propylene glycol monomethyl ether (PGME, another name: 1-methoxy-2-propanol)
S6: Ethyl lactate
S7: Propylene carbonate
(Exposure Condition 1: Examples 1 to 16 and Comparative Examples 1 to 4: ArF Dry Exposure)
An organic antireflection film, ARC29A (produced by Nissan Chemical Industries, Ltd.), was coated on a silicon wafer and baked at 205° C. for 90 seconds to form a 78 nm-thick antireflection film, and the positive resist composition prepared above was coated thereon and baked at 100° C. for 60 seconds to form a resist film having a thickness of 100 nm. The obtained wafer was exposed through a 6% halftone mask having a 1:1 line-and-space pattern with a line width of 75 nm by using an ArF excimer laser scanner (PAS5500/1100, manufactured by ASML, NA: 0.75). Thereafter, the wafer was heated at 90° C. for 60 seconds, developed with an aqueous tetramethylammonium hydroxide solution (2.38 mass %) for 40 seconds, rinsed with pure water and spin-dried to obtain a resist pattern.
(Exposure Condition 2: Examples 17 to 32 and Comparative Examples 5 to 8: ArF Immersion Exposure)
An organic antireflection film, ARC29SR (produced by Nissan Chemical Industries, Ltd.), was coated on a silicon wafer and baked at 205° C. for 90 seconds to form a 95 nm-thick antireflection film, and the positive resist composition prepared was coated thereon and baked at 85° C. for 60 seconds to form a resist film having a thickness of 100 nm. The obtained wafer was exposed through a 6% halftone mask having a 1:1 line-and-space pattern with a line width of 48 nm by using an ArF excimer laser immersion scanner (XT-1700i, manufactured by ASML, NA: 1.20, σo/σi=0.94/0.74). As for the immersion liquid, ultrapure water was used. Thereafter, the wafer was heated at 85° C. for 60 seconds, developed with an aqueous tetramethylammonium hydroxide solution (2.38 mass %) for 40 seconds, rinsed with pure water and spin-dried to form a resist pattern.
<Evaluation Method>
[Sensitivity]
The line width of the obtained pattern was observed through a scanning electron microscope (SEM; S-9380II, manufactured by Hitachi, Ltd.), and the irradiation energy when resolving a 1:1 line-and-space resist pattern with a line width of 75 nm in the case of Exposure Condition 1 and when resolving a 1:1 line-and-space resist pattern with a line width of 48 nm in the case of Exposure Condition 2 was taken as Sensitivity (Eopt). As this value is smaller, the sensitivity is higher.
[Line Width Roughness (LWR)]
A 1:1 line-and-space resist pattern with a line width of 75 nm in the case of Exposure Condition 1 and a 1:1 line-and-space resist pattern with a line width of 48 nm in the case of Exposure condition 2 were observed using a Critical Dimension scanning electron microscope (SEM; S-9380II, manufactured by Hitachi Ltd.), and the line width was measured at 50 points at regular intervals in the range of 2 μm in the longitudinal direction of the space pattern. From the standard deviation thereof, 3σ (nm) was computed, whereby the line width roughness was measured. A smaller value indicates higher performance.

[Blob Defect]

The resist pattern was measured using a defect inspection apparatus, KLA2360 (trade name), manufactured by KLA Tencor Ltd., in a random mode by setting the pixel size of the defect inspection apparatus to 0.16 μm and the threshold value to 20. Blob defects extracted from differences generated by superimposition between a comparative image and the pixel unit were detected, and the number of development defects per unit area (1 cm$^2$) was calculated.

The results in Tables 3 and 4 reveal the followings. In Comparative Examples 1 to 8 where the fluorine-containing compound (A) according to the present invention is not used, the blob defect is large, the LWR value is large and the performance is inferior.

On the other hand, in Examples 1 to 32 where the fluorine-containing compound (A) according to the present invention is used, the blob defects are remarkably reduced and the LWR value is low. Particularly, in Examples 1 to 10, 12, 14, 15, 17 to 26, 28, 30 and 31 where a fluorine-containing compound (A) having a fluorine content of 25% or more is used, the number of block defects tends to be small.

According to such the pattern forming performance, it is apparent that the pattern forming method and the chemical amplification resist composition of the present invention are remarkably effective in the production of an electronic device.

The entire disclosure of each and every foreign patent application from which the benefit of foreign priority has been claimed in the present application is incorporated herein by reference, as if fully set forth.

What is claimed is:

1. An actinic ray-sensitive or radiation-sensitive resin composition comprising (A) a fluorine-containing compound capable of generating an acid upon irradiation with an actinic ray or radiation, wherein
    the acid has a polarity converting group,
    the fluorine content of the fluorine-containing compound (A) is 20% or more based on the molecular weight of the fluorine-containing compound (A),
    the polarity converting group is a group represented by —C(=X)O— in the partial structure represented by the following formula (1) or a group represented by —C(=O)O— in a lactone structure:

(1)

wherein X represents an oxygen atom or a sulfur atom and EWG represents an electron-withdrawing group; and
    the electron-withdrawing group in formula (1) is a nonionic partial structure represented by the following formula (EW):

(EW)

wherein
each of $R_{ew1}$ and $R_{ew2}$ independently represents an arbitrary substituent,
$n_{ew}$ represents an integer of 0 or 1, $Y_{ew1}$ is a halogen atom, a cyano group, a nitro group, a halo(cyclo)alkyl group represented by —C($R_{f1}$)($R_{f2}$)—$R_{f3}$, a haloaryl group, an oxy group, a carbonyl group, a sulfonyl group, a sulfinyl group, or a combination thereof,
$R_{f1}$ represents a halogen atom, a perhaloalkyl group, a perhalocycloalkyl group or a perhaloaryl group, and
each of $R_{f2}$ and $R_{f3}$ independently represents a hydrogen atom, a halogen atom or an organic group,
provided that when $Y_{ew1}$ is a halogen atom, a cyano group or a nitro group, $n_{ew}$ is 1.

2. The actinic ray-sensitive or radiation-sensitive resin composition as claimed in claim 1, wherein the fluorine content of the fluorine-containing compound (A) is 25% or more based on the molecular weight of the fluorine-containing compound (A).

3. The actinic ray-sensitive or radiation-sensitive resin composition as claimed in claim 1, wherein the acid generated upon irradiation with an actinic ray or radiation is represented by the following formula (2):

wherein E represents a group containing a polarity converting group;
Q represents a divalent linking group; and
A represents a sulfonic acid group or a group represented by —SO$_2$—NH—SO$_2$—$R_{F1}$, wherein $R_{F1}$ represents a fluorine atom or a fluoroalkyl group.

4. The actinic ray-sensitive or radiation-sensitive resin composition as claimed in claim 1, wherein the fluorine-containing compound (A) is an ionic compound having an anion represented by the following formula (3):

wherein E represents a group containing a polarity converging group;
L represents a single bond or a divalent linking group;
each of $R_{F2}$ and $R_{F3}$ independently represents a fluorine atom or a fluoroalkyl group and when a plurality of $R_{F2}$'s or $R_{F3}$'s are present, each $R_{F2}$ or $R_{F3}$ may be the same as or different from every other $R_{F2}$ or $R_{F3}$;
A$^-$ represents a sulfonate anion or a sulfonylamide anion represented by —SO$_2$—N$^-$—SO$_2$—$R_{F1}$, wherein $R_{F1}$ represents a fluorine atom or a fluoroalkyl group; and
n represents an integer of 1 or more.

5. The actinic ray-sensitive or radiation-sensitive resin composition as claimed in claim 1, which further contains (B) a resin capable of increasing solubility for an alkali developer by the action of an acid.

6. The actinic ray-sensitive or radiation-sensitive resin composition as claimed in claim 5, wherein the resin (B) contains a repeating unit having a lactone structure.

7. The actinic ray-sensitive or radiation-sensitive resin composition as claimed in claim 1, which further contains (C) a hydrophobic resin.

8. A resist film formed from the actinic ray-sensitive or radiation-sensitive resin composition claimed in claim 1.

9. A pattern forming method comprising:
coating the actinic ray-sensitive or radiation-sensitive resin composition according to claim 1 on a support to form a resist film;
exposing the resist film; and
developing the exposed film.

10. The pattern forming method as claimed in claim 9, wherein the exposure in the step of exposing the resist film is an immersion exposure.

11. A method for producing an electronic device, comprising the pattern forming method claimed in claim 9.

12. The actinic ray-sensitive or radiation-sensitive resin composition as claimed in claim 1, wherein in formula (EW), each of $R_{ew1}$ and $R_{ew2}$ independently represents a hydrogen atom, an alkyl group, a cycloalkyl group, or an aryl group; and $Y_{ew1}$ is a halo(cyclo)alkyl group represented by —$C(R_{f1})(R_{f2})$—$R_{f3}$ or a haloaryl group.

* * * * *